(12) United States Patent
Imaizumi et al.

(10) Patent No.: US 11,515,896 B2
(45) Date of Patent: *Nov. 29, 2022

(54) MEMORY SYSTEM

(71) Applicant: KIOXIA Corporation, Tokyo (JP)

(72) Inventors: Yasuyuki Imaizumi, Kanagawa (JP);
Satoshi Shoji, Kanagawa (JP);
Mitsunori Tadokoro, Kanagawa (JP);
Takashi Ishiguro, Kanagawa (JP);
Yifan Tang, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/376,013

(22) Filed: Jul. 14, 2021

(65) Prior Publication Data

US 2021/0344360 A1 Nov. 4, 2021

Related U.S. Application Data

(63) Continuation of application No. 16/727,648, filed on Dec. 26, 2019, now Pat. No. 11,101,823.

(30) Foreign Application Priority Data

May 24, 2019 (JP) .............................. JP2019-097984

(51) Int. Cl.
*H03M 13/29* (2006.01)
*G06F 11/10* (2006.01)
(Continued)

(52) U.S. Cl.
CPC ..... *H03M 13/2948* (2013.01); *G06F 11/1032* (2013.01); *G06F 11/1044* (2013.01); *G06F 11/3037* (2013.01); *H03M 13/1108* (2013.01); *H03M 13/1111* (2013.01); *H03M 13/3746* (2013.01)

(58) Field of Classification Search
CPC ................................................. H03M 13/2948
See application file for complete search history.

(56) References Cited

U.S. PATENT DOCUMENTS 5,974,580 A * 10/1999 Zook ................. H03M 13/1515
714/755
8,271,862 B2 9/2012 Kobayashi
(Continued)

FOREIGN PATENT DOCUMENTS

JP 2004288310 A 10/2004

*Primary Examiner* — Joseph D Torres
(74) *Attorney, Agent, or Firm* — Kim & Stewart LLP

(57) ABSTRACT

A memory system includes a non-volatile memory and a controller. The controller is configured to perform iterative correction on a plurality of frames of data read from the non-volatile memory. The iterative correction includes performing a first error correction on each of the frames including a first frame having errors not correctable by the first error correction, generating a syndrome on a set of second frames that include the first frame, performing a second error correction on the second frames using the syndrome, and performing a third error correction on the first frame. Each of the frames includes user data and first parity data used in the first error correction, the first parity data of the first frame also being used in the third error correction.

16 Claims, 81 Drawing Sheets

(51) Int. Cl.
    *H03M 13/11*     (2006.01)
    *H03M 13/37*     (2006.01)
    *G06F 11/30*     (2006.01)

(56) References Cited

U.S. PATENT DOCUMENTS

| | | | |
|---|---|---|---|
| 8,959,418 B1 * | 2/2015 | Pfister | H03M 13/2948 |
| | | | 714/746 |
| 9,160,373 B1 * | 10/2015 | Varnica | H03M 13/2957 |
| 9,166,627 B2 | 10/2015 | Cideciyan et al. | |
| 9,413,392 B1 * | 8/2016 | Bentley | H03M 13/3738 |
| 9,577,673 B2 | 2/2017 | Parthasarathy et al. | |
| 9,673,839 B2 * | 6/2017 | Cideciyan | H03M 13/2975 |
| 10,333,558 B2 * | 6/2019 | Kifune | H03M 13/2927 |
| 2006/0179400 A1 | 8/2006 | Qian et al. | |
| 2006/0236210 A1 * | 10/2006 | Touzni | H03M 13/6356 |
| | | | 714/776 |
| 2016/0013814 A1 * | 1/2016 | Cideciyan | H03M 13/293 |
| | | | 714/755 |
| 2017/0187395 A1 | 6/2017 | Watanabe et al. | |

* cited by examiner

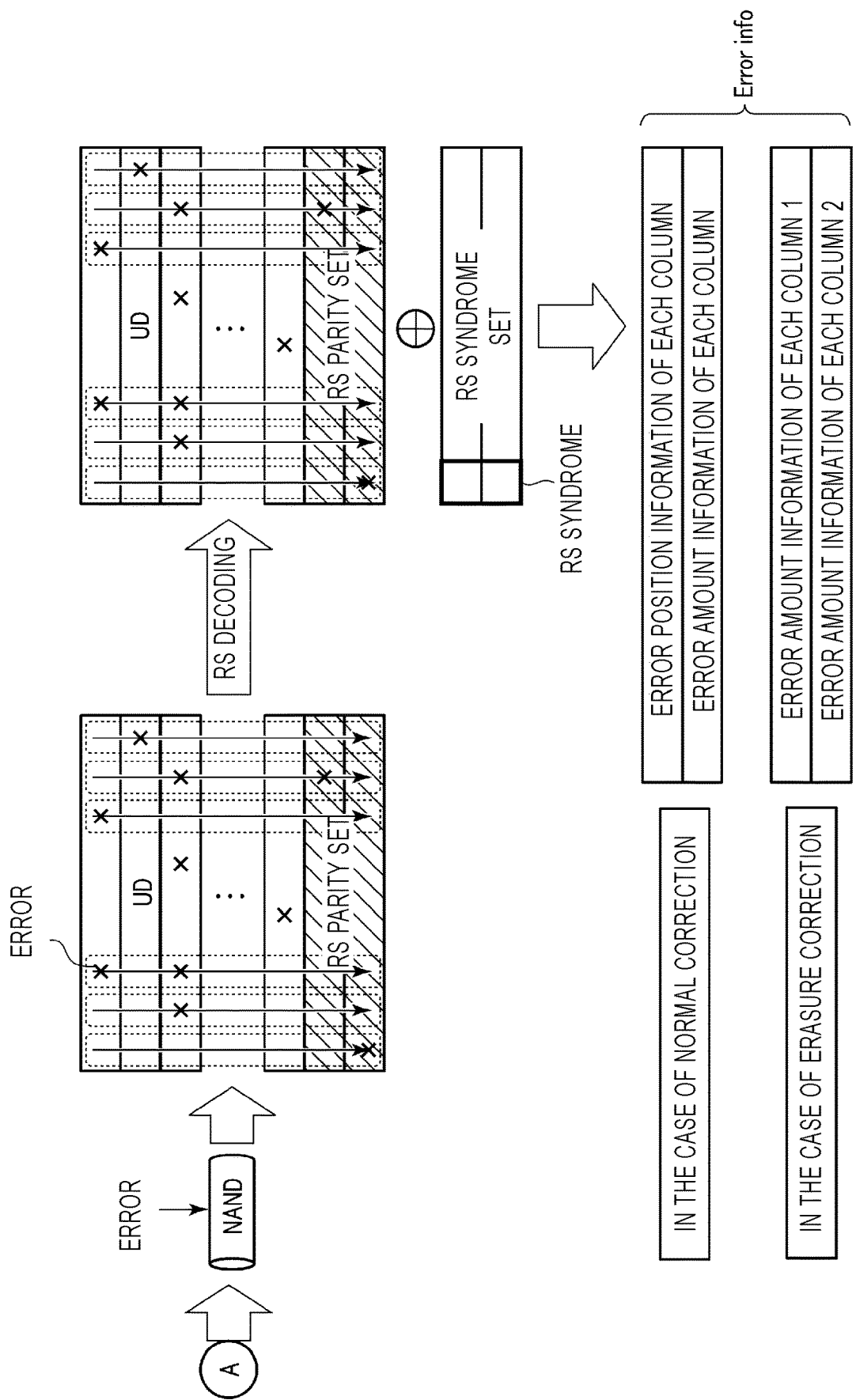

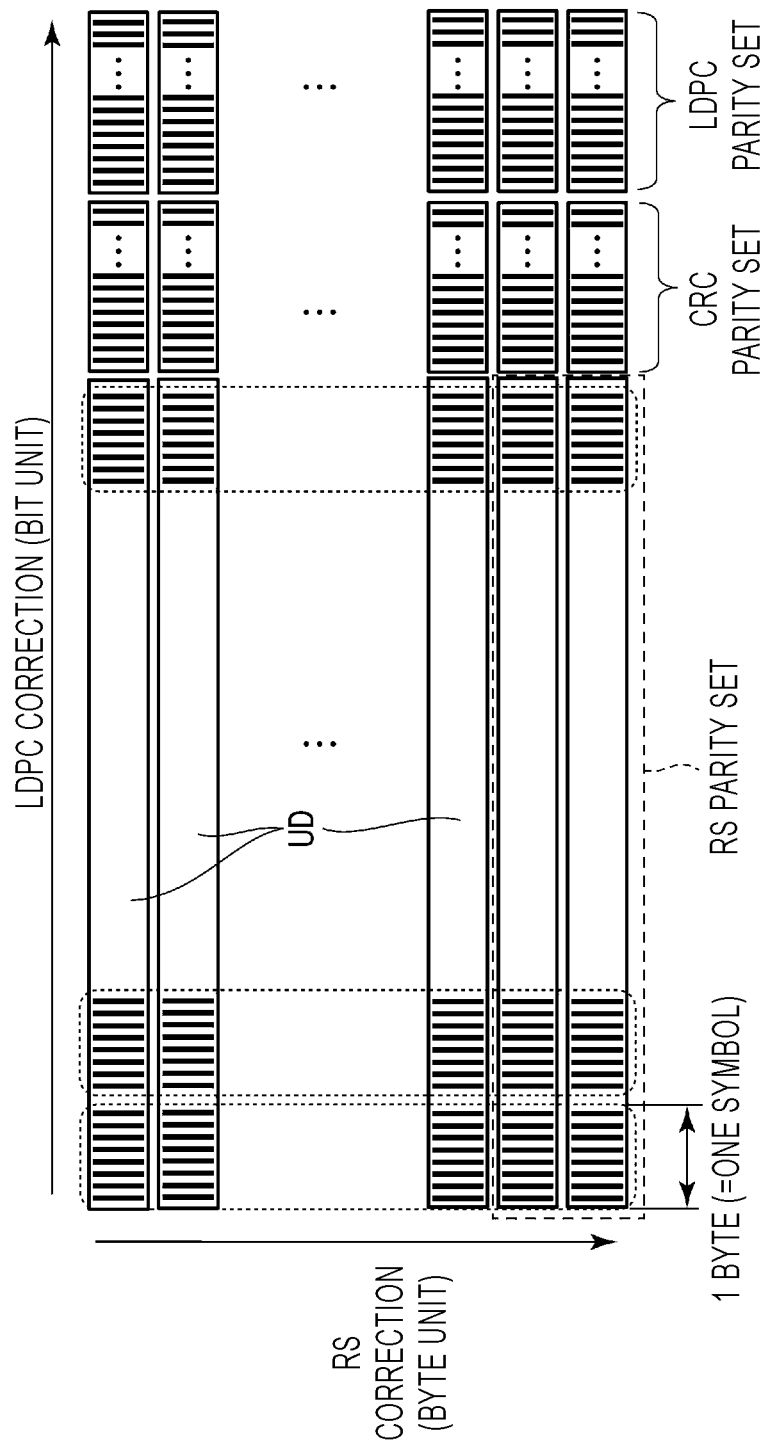

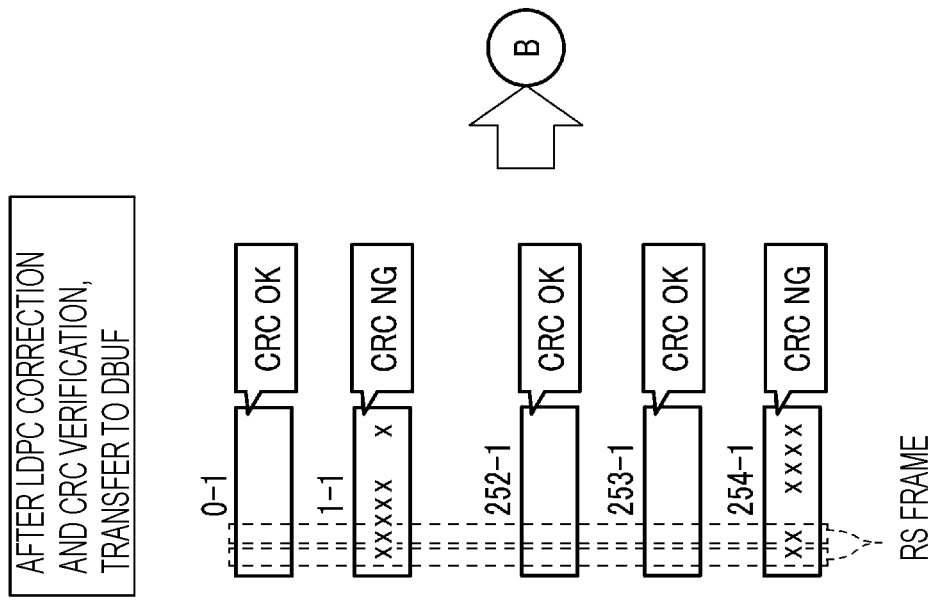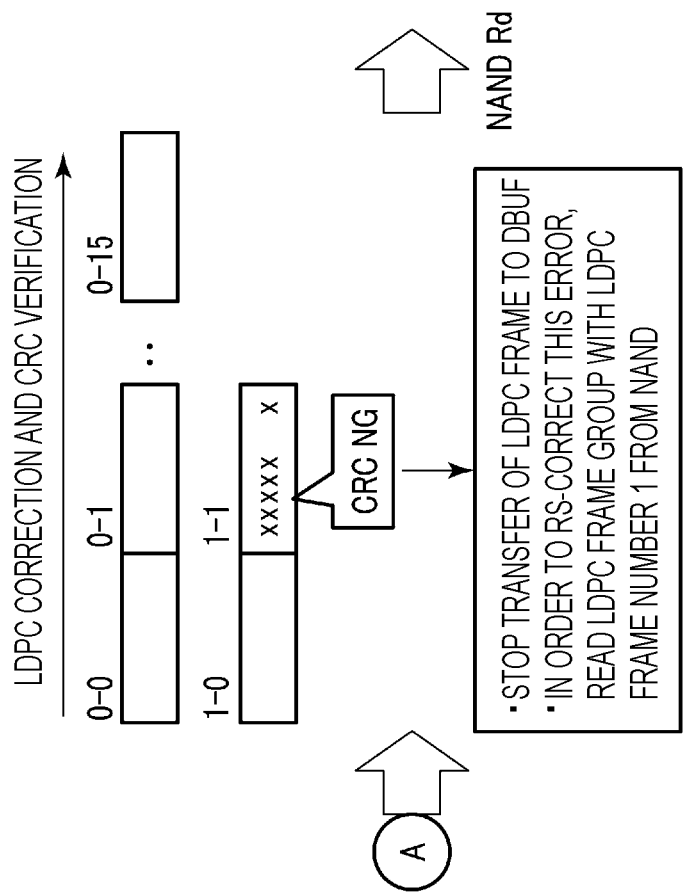

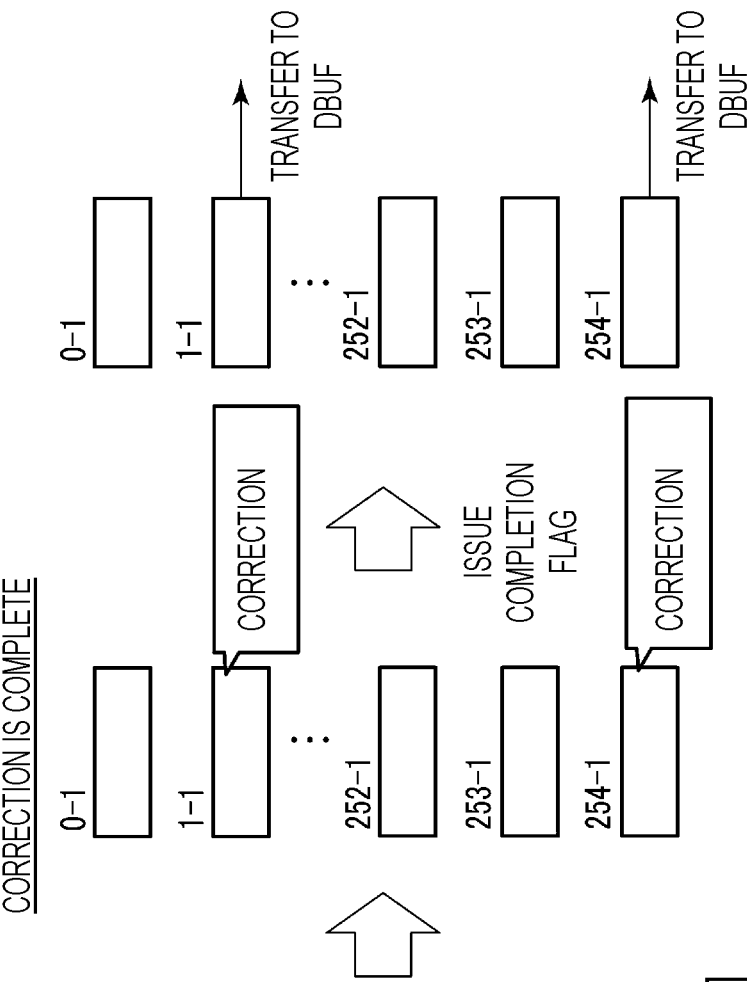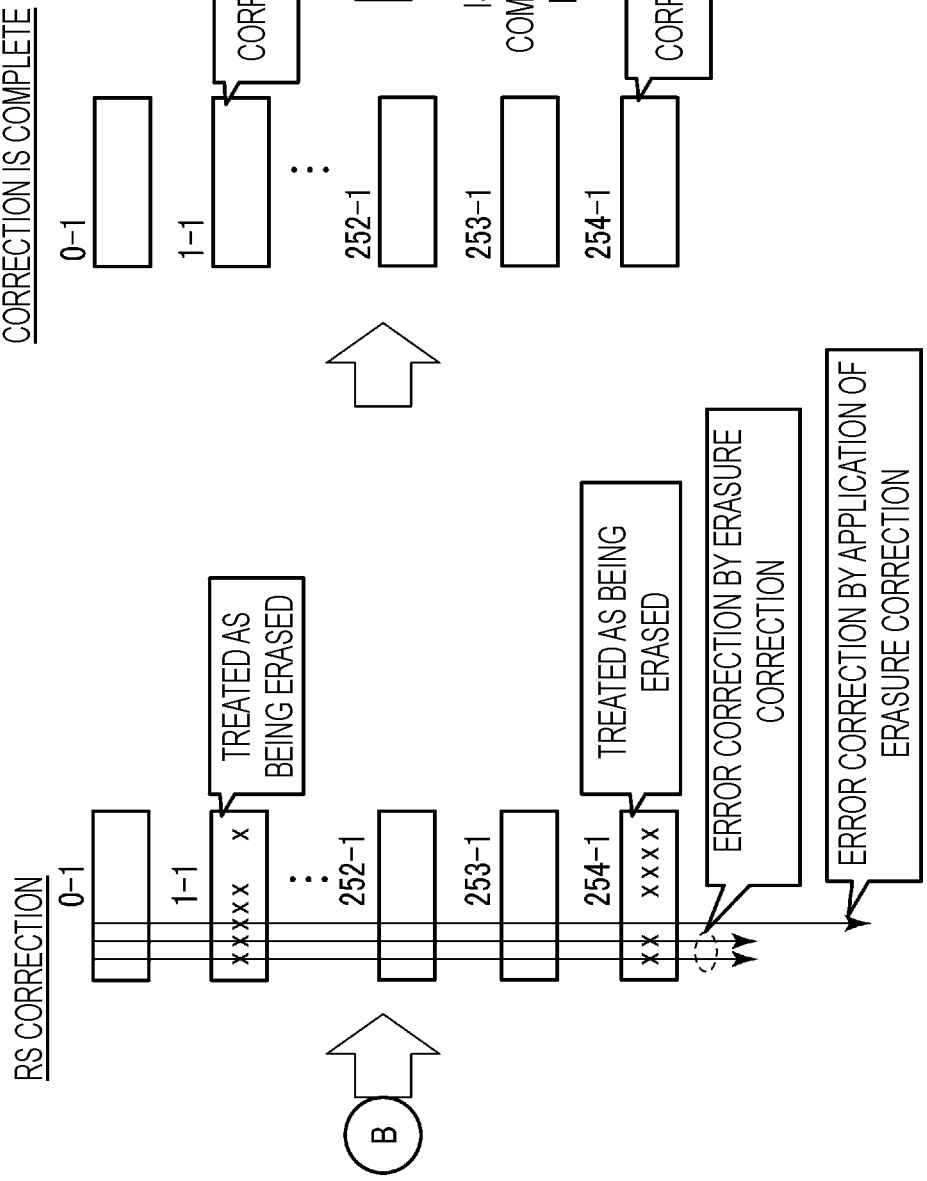

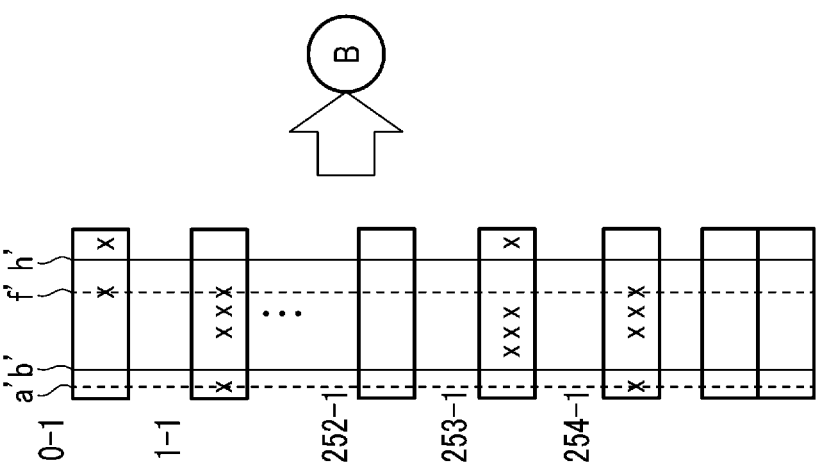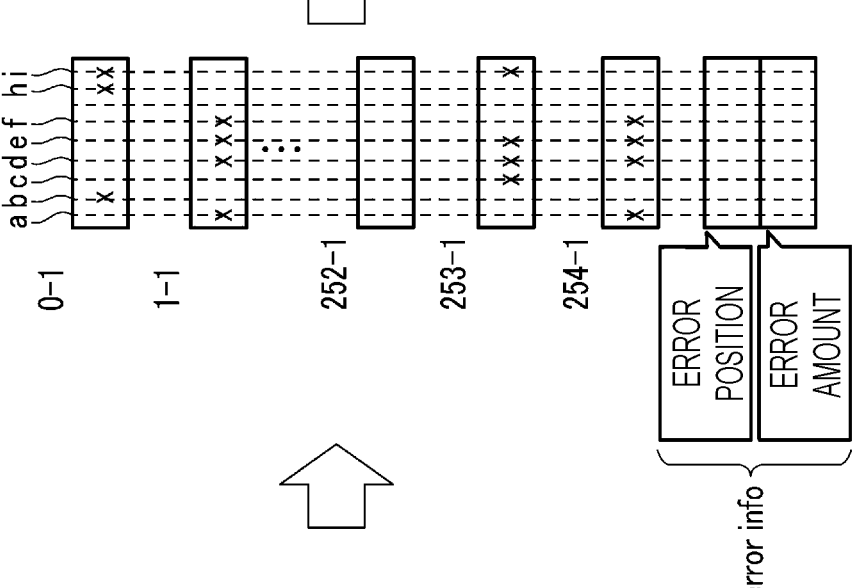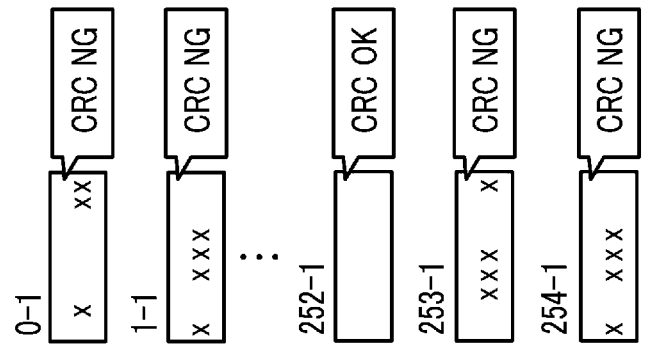

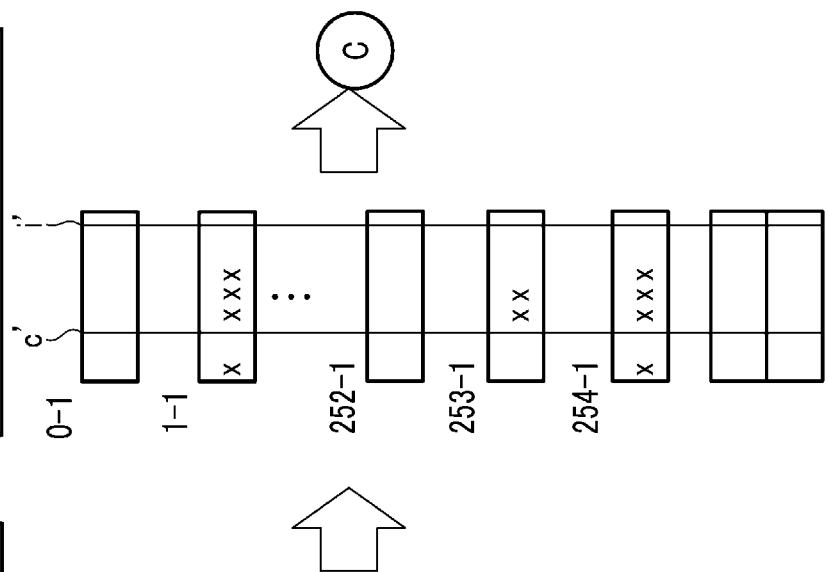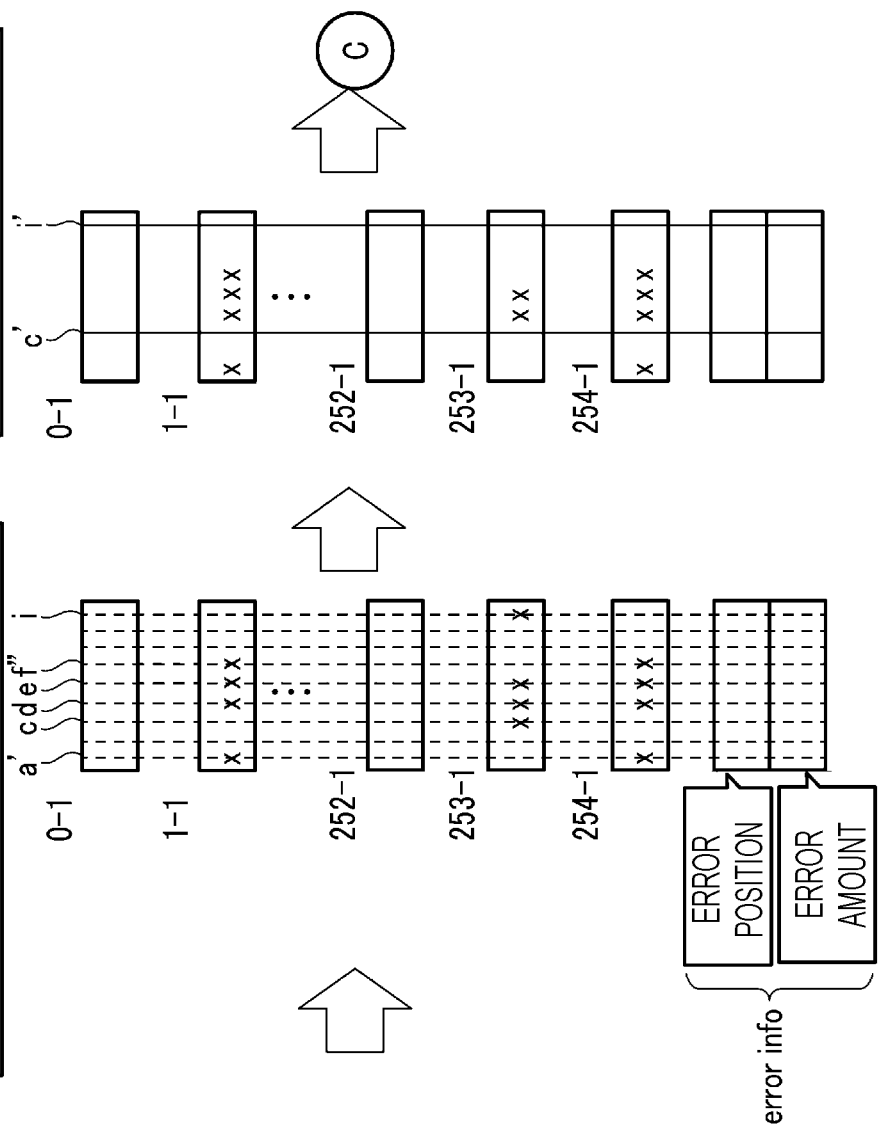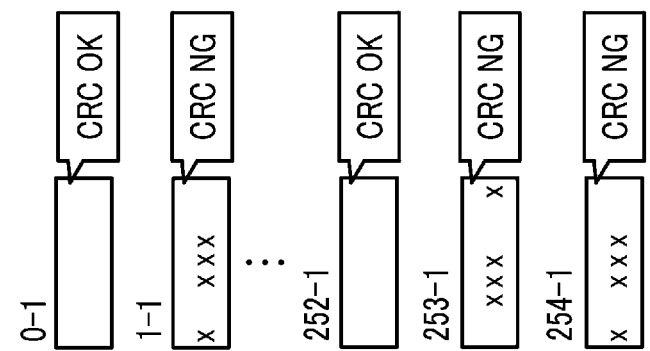

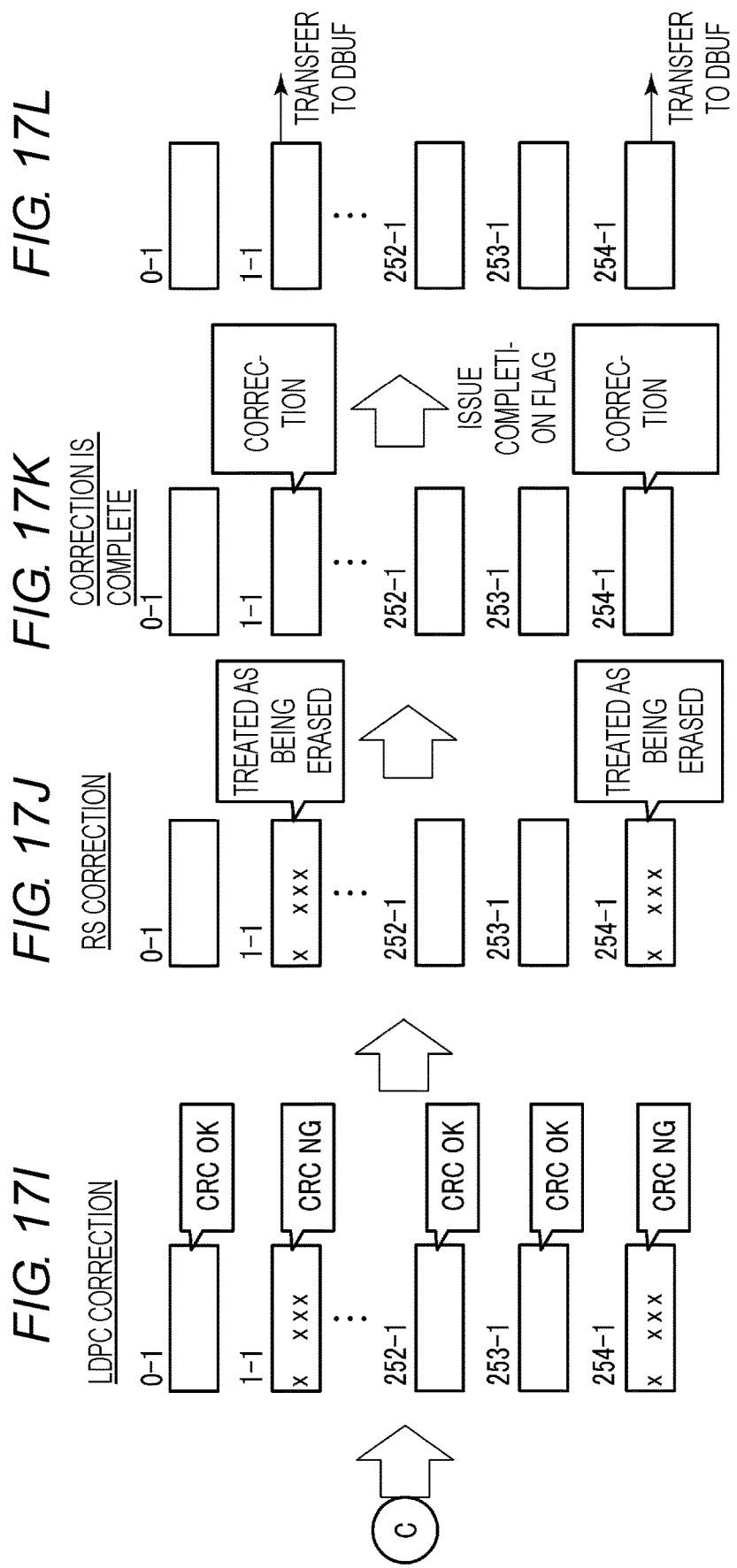

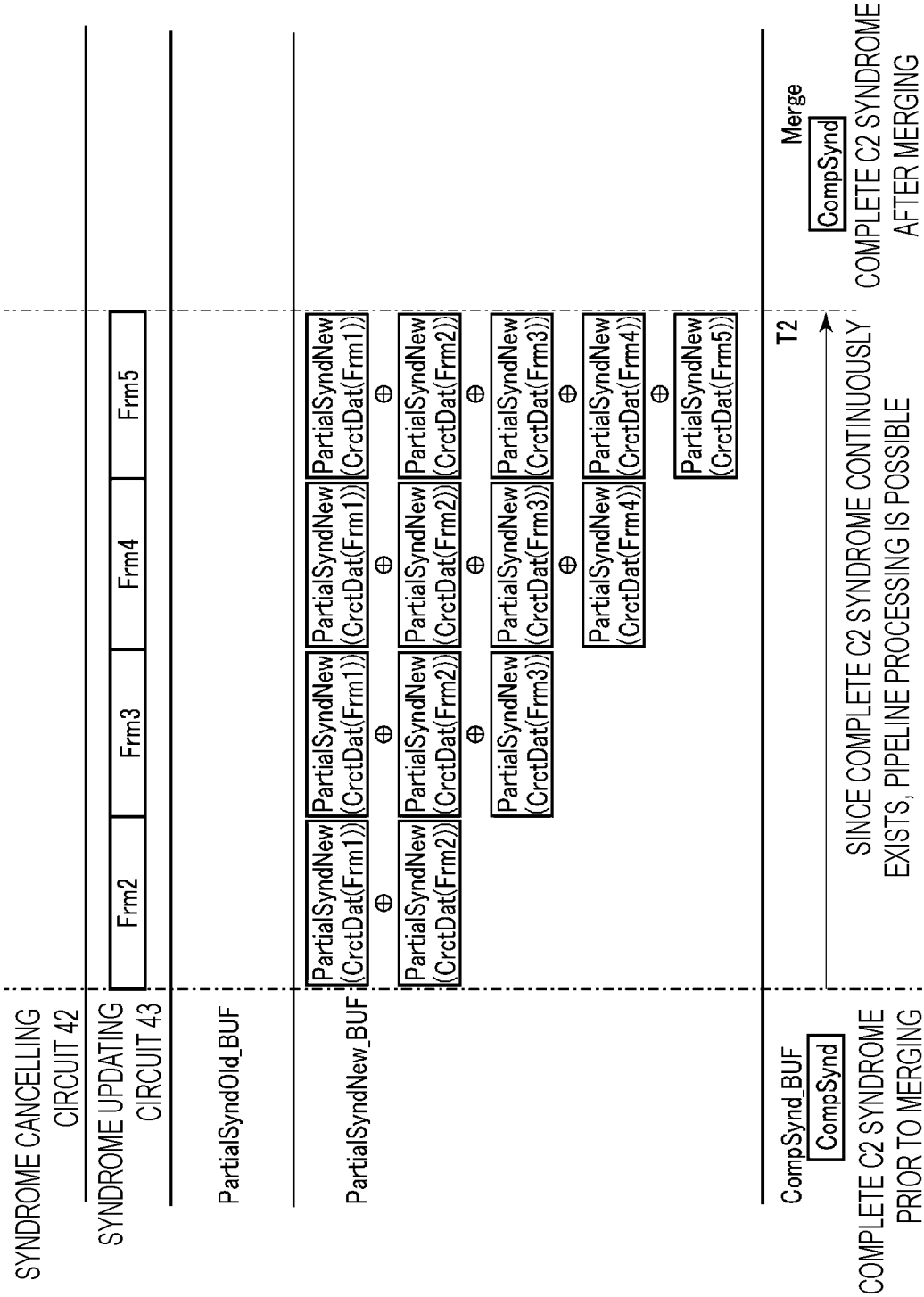

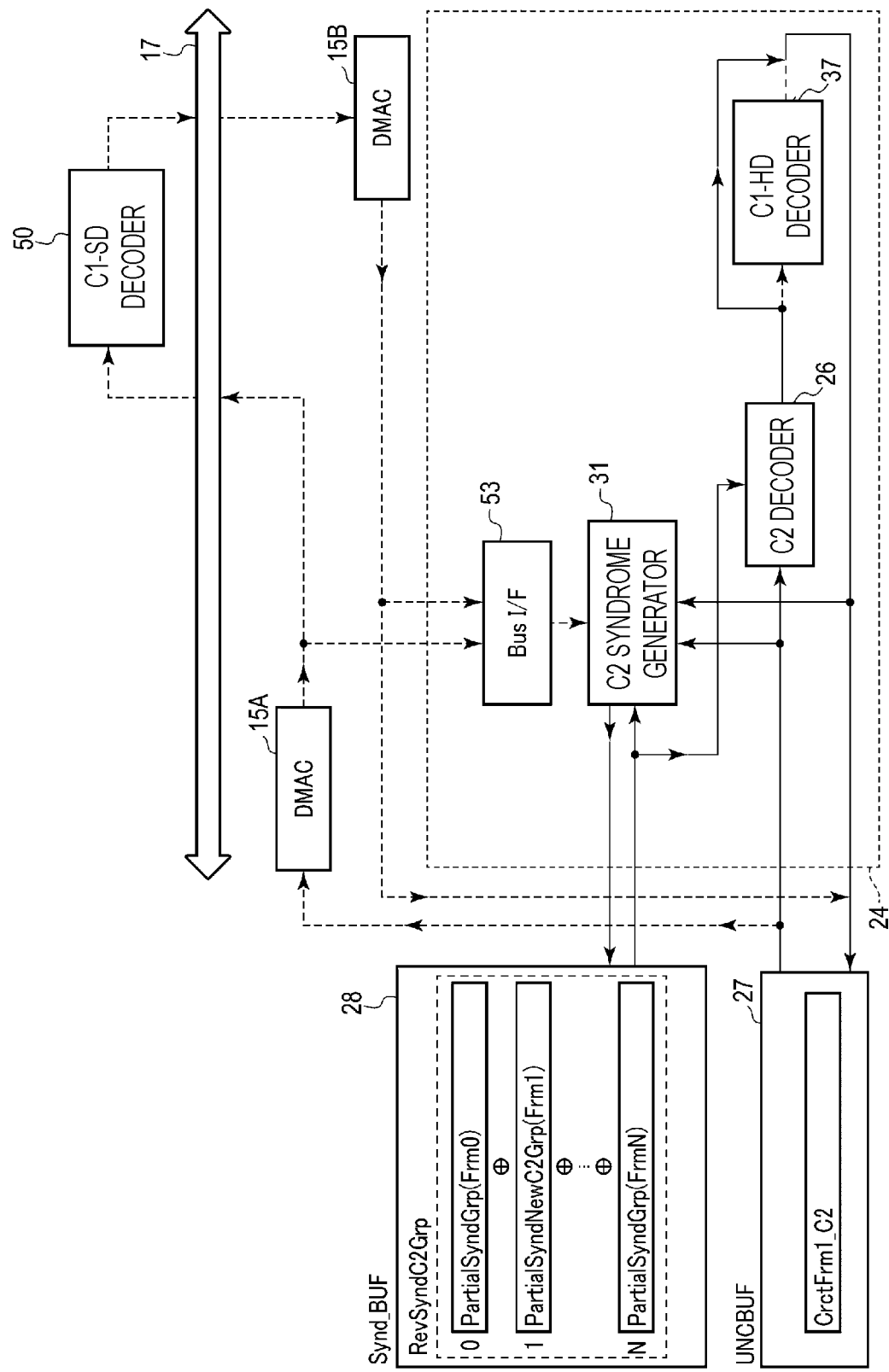

MEMORY SYSTEM

CROSS-REFERENCE TO RELATED APPLICATION(S)

This application is a continuation of U.S. patent application Ser. No. 16/727,648, filed on Dec. 26, 2019, which is based upon and claims the benefit of priority from Japanese Patent Application No. 2019-097984, filed on May 24, 2019, the entire contents of which are incorporated herein by reference.

FIELD

Embodiments described herein relate generally to a memory system.

BACKGROUND

In digital communication, error correction codes are used in order to improve data reliability. In addition, a product code using two types of error correction codes is known. Error correction using the product code may improve error correction capability.

A C1 code (also referred to as an inner code) and a C2 code (also referred to as an outer code) which make up the product code differ in the direction of a correction processing. The C1 code and the C2 code differ in the data unit used in the correction processing. When an error correction using the C1 code and an error correction using the C2 code are repeated, the time taken for the correction processing becomes long.

BRIEF DESCRIPTION OF THE DRAWINGS

FIG. 6B is a view illustrating two-dimensionally arranged RS frames and a decoding according to the first embodiment.

FIG. 9 is a view illustrating a unit of LDPC correction and a unit of RS correction according to the first embodiment.

FIGS. 16A-16G are views illustrating an example of an error correction by an LDPC correction and an RS correction according to the first embodiment.

FIGS. 17A-17L are views illustrating another example of the error correction by the LDPC correction and the RS correction according to the first embodiment.

FIG. 35B is a view illustrating the error correction operation according to the third embodiment.

FIG. 47F is a block diagram illustrating a state after a completion of the soft decision pre-processing according to the fifth embodiment.

FIG. 59 is a view illustrating an example of a product code information part to be transferred through a bus, according to the eighth embodiment.

FIG. 61 is a view illustrating another example of the product code information part to be transferred through a bus, according to the eighth embodiment.

DETAILED DESCRIPTION

Figure 1:
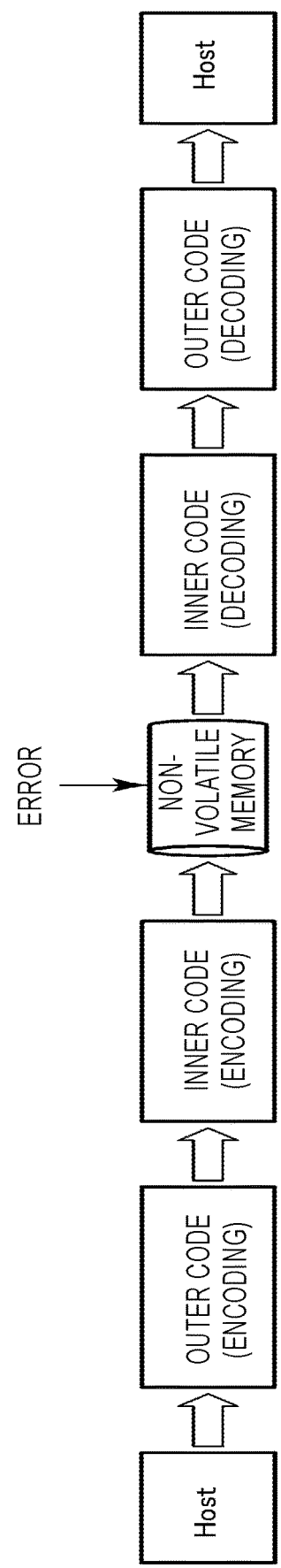
FIG. 1 is a view illustrating encoding and decoding flow according to a first embodiment.

Embodiments provide a memory system in which it is possible to improve the reliability of data stored therein.

In general, according to one embodiment, a memory system includes a non-volatile memory and a controller. The controller is configured to perform iterative correction on a plurality of frames of data read from the non-volatile memory. The iterative correction includes performing a first error correction on each of the frames including a first frame having errors not correctable by the first error correction, generating a syndrome on a set of second frames that include the first frame, performing a second error correction on the second frames using the syndrome, and performing a third error correction on the first frame. Each of the frames includes user data and first parity data used in the first error correction, the first parity data of the first frame also being used in the third error correction.

Hereinafter, embodiments will be described with reference to the drawings. Some embodiments to be described hereinbelow illustrate an apparatus and a method for embodying the technical spirit of the present disclosure, and the technical spirit of the present disclosure is not specified by a shape, a structure, an arrangement, etc. of components. Each functional block may be implemented in either hardware or software or a combination of both. It is not necessary that functional blocks be distinguished as in the following example. For example, some functions may be executed by functional blocks other than the exemplified functional blocks. In addition, the exemplified functional block may be further divided into detailed functional sub-blocks. Further, in the following description, components having the same functions and configurations will be denoted by the same reference numerals, and overlapping descriptions thereof will be made only when necessary.

It is proper that all descriptions on an embodiment are applied as descriptions on another embodiment unless explicitly or obviously excluded. In addition, steps in the flow of the method in the embodiments are not limited to the exemplified order, and may be executed in an order different from the exemplified order and (or) in parallel with other steps unless indicated otherwise.

[1] First Embodiment

[1-1] Outline of Error Correction Unit

In the embodiment, a general concatenated code or a product code, including a combination of two types of error correction codes is used. Since the embodiment is applicable to any type of code, a case where the product code is used will be described below. FIG. 1 is a view illustrating a communication path of a product code according to the embodiment.

Data transmitted from a host device (Host) is encoded by an outer code, and subsequently encoded by an inner code. The data encoded by the outer code and the inner code is stored in a non-volatile memory. In the data stored in the non-volatile memory, errors may occur due to various factors (e.g., noise).

The data read from the non-volatile memory is decoded by the inner code, and subsequently decoded by the outer code. The data decoded by the inner code and the outer code is transmitted to the host device.

Figure 2:
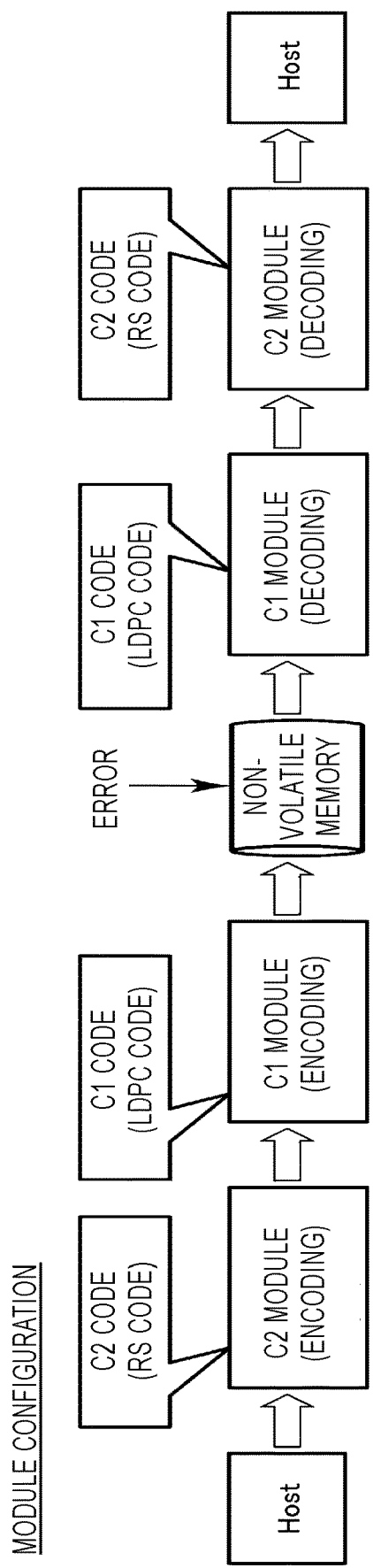
FIG. 2 is a view illustrating a module configuration for implementing an error correction by the product code according to the first embodiment.

FIG. 2 is a view illustrating a module configuration for implementing an error correction by the product code according to the embodiment. As described above, the inner code may also be called a C1 code, and the outer code may also be called a C2 code. An error correction capability has, for example, a relationship of "C1 code>C2 code." The error correction capability is a ratio of the number of correctable error bits in data consisting of a plurality of bits. In the embodiment, as the C1 code, for example, a low-density parity-check (LDPC) code is used, and as the C2 code, for example, a Reed-Solomon (RS) code is used. The C1 code is not limited to the LDPC code, and a Bose-Chaudhuri-Hocquenghem (BCH) code, etc. may be used. The C2 code is not limited to the RS code as long as it is a code of a class called a linear code.

In the linear code, the parity of each codeword may be obtained by obtaining parities of symbols that make up the codeword, and cumulatively adding the parities. Hereinafter, the parity for some symbols that make up a part of the codeword will be referred to as a partial parity. In particular, a partial parity for the C2 code will be referred to as a partial C2 parity. In the linear code, the syndrome of each codeword may be obtained by obtaining syndromes of symbols that make up the codeword, and cumulatively adding the syndromes. Hereinafter, the syndrome for some symbols that make up a part of the codeword will be referred to as a partial syndrome. In particular, a partial syndrome for the C2 code will be referred to as a partial C2 syndrome.

As illustrated in FIG. 2, data transmitted from a host device is encoded by a C2 module, and subsequently encoded by a C1 module. The data encoded by the C2 code (RS code) and the C1 code (LDPC code) is stored in a non-volatile memory. The data read from the non-volatile memory is decoded by the C1 module, and subsequently decoded by the C2 module. The data decoded by the C1 code and the C2 code is transmitted to the host device.

[1-2] Configuration of Memory System

Figure 3:
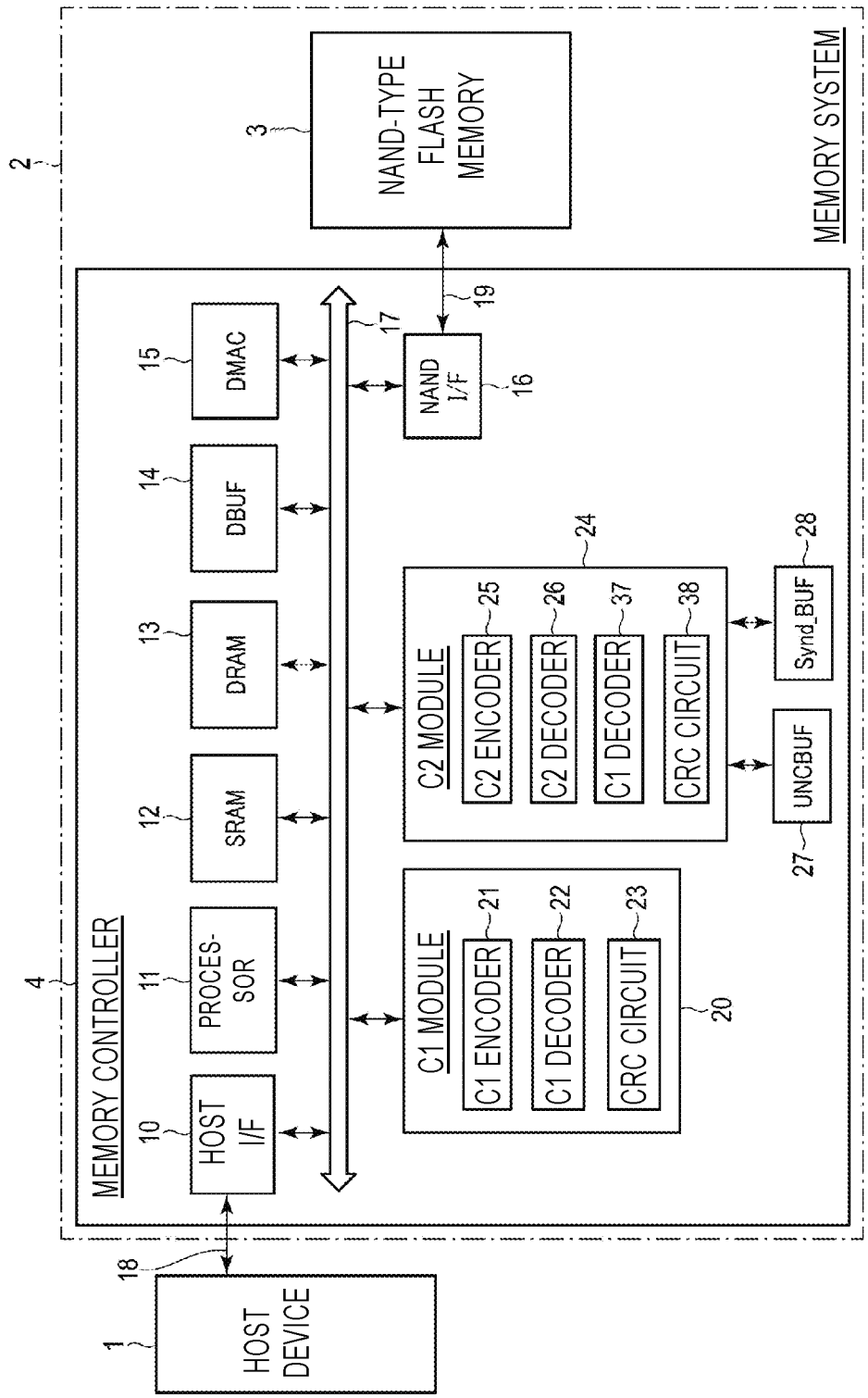
FIG. 3 is a block diagram of a memory system according to the first embodiment.

FIG. 3 is a block diagram of a memory system 2 according to the embodiment. The memory system 2 may be connected to a host device 1. The host device 1 is, for example, a processor or a chip set mounted in an information processing apparatus such as a server or a personal computer.

The memory system 2 may be implemented by mounting a plurality of chips of the memory system 2, on a main board on which the host device 1 is mounted. The memory system 2 may be configured as a system large-scale integrated circuit (LSI) implemented in one module, or a system on a chip (SoC). The memory system 2 may be implemented by a solid state drive (SSD), a memory card such as an SD™ card, an embedded multimedia card (eMMC) or the like. In the embodiment, the memory system 2 is implemented by the SSD.

As illustrated in FIG. 3, the memory system 2 includes a non-volatile memory 3 and a memory controller 4.

In the embodiment, a NAND-type flash memory will be described as an example of the non-volatile memory. The non-volatile memory 3 may also be referred to as a NAND-type flash memory 3, NAND memory 3, or NAND 3. As the non-volatile memory, a magnetoresistive random access memory (MRAM), a resistive random access memory (ReRAM), a phase-change random access memory (PCRAM) or the like may also be employed.

The NAND-type flash memory 3 includes a plurality of memory cells, and stores data in a non-volatile manner. FIG. 3 illustrates one NAND-type flash memory 3 for simplifying the description. The memory system 2 may include a plurality of NAND-type flash memories 3. In such a case, the plurality of NAND-type flash memories 3 may be operated in parallel. As the internal configuration of the NAND-type flash memory 3, a known configuration may be applied.

The memory controller 4 instructs the NAND-type flash memory 3 to perform writing, reading, erasing, etc. in response to, for example, an instruction from the host device 1. Further, the memory controller 4 manages a memory space of the NAND-type flash memory 3. The memory controller 4 includes a host interface circuit (host I/F) 10, a processor 11, a static random access memory (SRAM) 12, a dynamic random access memory (DRAM) 13, a data buffer (DBUF) 14, a direct memory access controller (DMAC) 15, a NAND interface circuit (NAND I/F) 16, a bus 17, a C1 module 20 which is an error checking and correcting (ECC) circuit, a C2 module 24 which is another ECC circuit, an uncorrectable data buffer (UNCBUF) 27, a syndrome buffer (Synd_BUF) 28, etc. The memory controller 4 may be implemented as an SoC.

The host interface circuit 10 is connected to the host device 1 via a host bus 18. The host interface circuit 10 communicates with the host device 1 according to a predetermined protocol. As such, the host interface circuit transmits/receives instructions, addresses, and data to/from the host device 1. The host interface circuit 10 communicates with the host device 1 based on, for example, Serial Advanced Technology Attachment (SATA), Serial Attached SCSI (SAS), Peripheral Component Interconnect Express (PCIe®) and Non-Volatile Memory Express (NVMe®).

The processor 11 is implemented by, for example, a central processing unit (CPU). The processor 11 controls the overall operation of the memory controller 4. For example, when a write instruction is received from the host device 1, in response, the processor 11 issues a write instruction according to a NAND interface standard, to the NAND-type flash memory 3. The same also applies to cases of reading and erasing. In addition, the processor 11 executes various processes for managing the NAND-type flash memory 3, such as wear leveling, garbage collection (compaction), etc.

The SRAM 12 is a type of volatile memory. The SRAM 12 is used as a work area of the processor 11. The SRAM 12 stores firmware, etc. loaded from the NAND-type flash memory 3.

The DRAM 13 is a type of volatile memory. The DRAM 13 stores a table loaded from the NAND-type flash memory 3 or a table created by the memory controller 4 during operation. The DRAM 13 may be provided outside the memory controller 4 via a DRAM interface.

The data buffer (DBUF) 14 is used as a write buffer for temporarily storing data to be written to the NAND-type flash memory 3. The DBUF 14 may also be used as a read buffer for temporarily storing data read from the NAND-type flash memory 3. The DBUF 14 is implemented by, for example, a SRAM. In some embodiments, DRAM 13 may be omitted, and the DBUF 14 having a sufficient storage capacity may take the role of the DRAM 13.

The DMAC 15 is a circuit dedicated for performing data transfer. The DMAC 15 executes the control of data transfer instead of the processor 11. The DMAC 15 performs the data transfer using hardware, and thus, large-capacity data may be transferred at a high speed. Further, since the load of the processor 11 may be reduced, it is possible to improve the overall performance of a system. In some embodiments, DMAC 15 may be omitted, and the processor 11 may take charge of the data transfer for which the DMAC 15 is responsible.

The NAND interface circuit 16 is connected to the NAND-type flash memory 3 via a NAND bus 19. The NAND interface circuit 16 communicates with the NAND-type flash memory 3 according to a predetermined protocol. The NAND interface circuit 16 transmits/receives instructions, addresses, and data to/from the NAND-type flash memory 3.

The C1 module 20 performs an error correction by using a C1 code (e.g., an LDPC code). The C1 module 20 includes a C1 encoder 21, a C1 decoder 22, and a cyclic redundancy check (CRC) circuit 23. The C1 encoder 21 generates a C1 error correction codeword by using, for example, data (referred to as user data) sent from the host device 1 at a write operation. The C1 decoder 22 corrects an error of the user data by using an error correction algorithm at a read operation. Details of the C1 module 20 will be described below.

The CRC circuit 23 generates an error detection codeword (e.g., a CRC parity) by using the user data at the write operation. The CRC circuit 23 detects an error of the user data by using an error detection algorithm at the read operation. The CRC circuit 23 may be disposed separately from the C1 module 20.

The C2 module 24 performs an error correction by using a C2 code (e.g., an RS code). The C2 module 24 includes a C2 encoder 25, and a C2 decoder 26. The C2 encoder 25 generates a C2 error correction codeword by using user data at a write operation. The C2 decoder 26 corrects an error of the user data by using an error correction algorithm at a read operation.

The C2 module 24 further includes a C1 decoder 37 and a CRC circuit 38. The C1 decoder 37 and the CRC circuit 38 are modules needed for an iterative correction to be described later. The C1 decoder 37 corrects an error of the user data by using an error correction algorithm. The CRC circuit 38 detects an error of the user data by using an error detection algorithm. Details of the C2 module 24 will be described later.

The uncorrectable data buffer (UNCBUF) 27 and the syndrome buffer (Synd_BUF) 28 are connected to the C2 module 24. The UNCBUF 27 and the Synd_BUF 28 are implemented by, for example, SRAMs. The UNCBUF 27 and the Synd_BUF 28 temporarily store data. Details of the UNCBUF 27 and the Synd_BUF 28 will be described later.

The bus 17 connects a plurality of modules in the memory controller 4 to each other. The bus 17 includes a data bus, an address bus, and a control bus.

[1-3] Data Structure

[1-3-1] Data Structure of RS Frame

Figure 4:
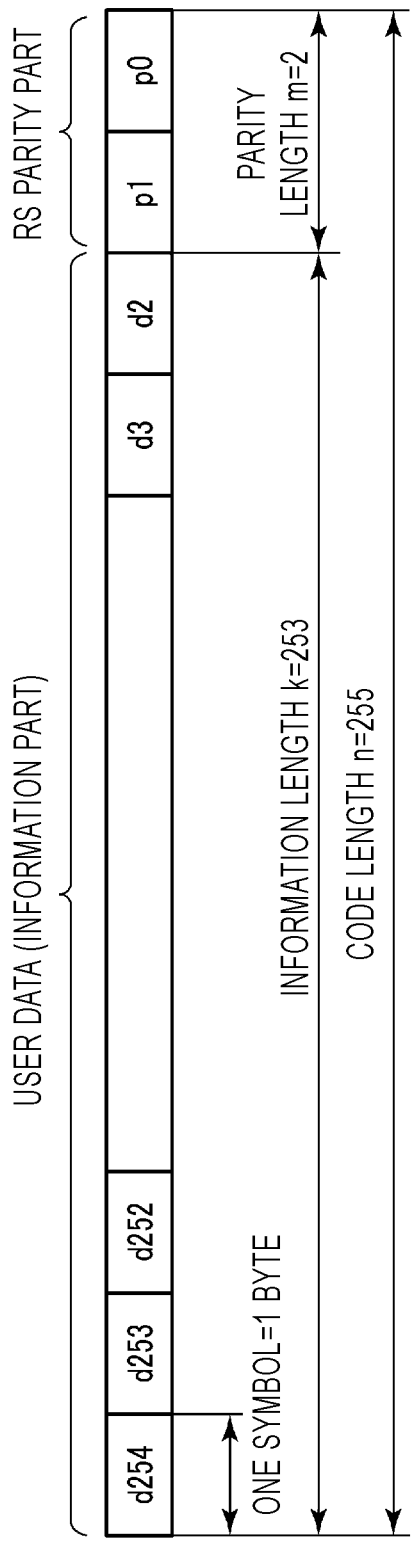
FIG. 4 is a view illustrating a data structure of an RS code according to the first embodiment.

Next, a data structure will be described. First, an example of a code parameter of an RS code (a C2 code) will be described. FIG. 4 is a view illustrating a data structure of an RS code according to the embodiment.

The RS code of the example below is an RS code on GF ($2^8$) which is an eight-order extension field of a finite field GF (2). It is assumed that the RS code of the example below has a code length n=255 symbols, an information length k=253 symbols, and a design distance (minimum distance) d=3, as code parameters. In the RS code of the example below, one symbol is 8 bits (1 byte). When the minimum distance d=3, a parity length m=two symbols.

The RS code consists of an information part and an RS parity part. The information part includes user data. The information part consists of 253 symbols (data d254 to d2), and the RS parity part consists of two symbols (data p1 and p0). Each of data p1 and p0 is a parity generated on the basis of data d254 to d2. Each of data d254 to d2, p1, and p0 has a size of one symbol. In the RS code in the embodiment, since one symbol is 1 byte, each of data d254 to d2, p1, and p0 has a size of 1 byte. A total of 255 symbols including the information part of 253 symbols and the RS parity part of two symbols make up an RS frame. The RS parity part may also be referred to as a C2 parity part. The RS frame may also be referred to as a C2 frame.

Figure 5:
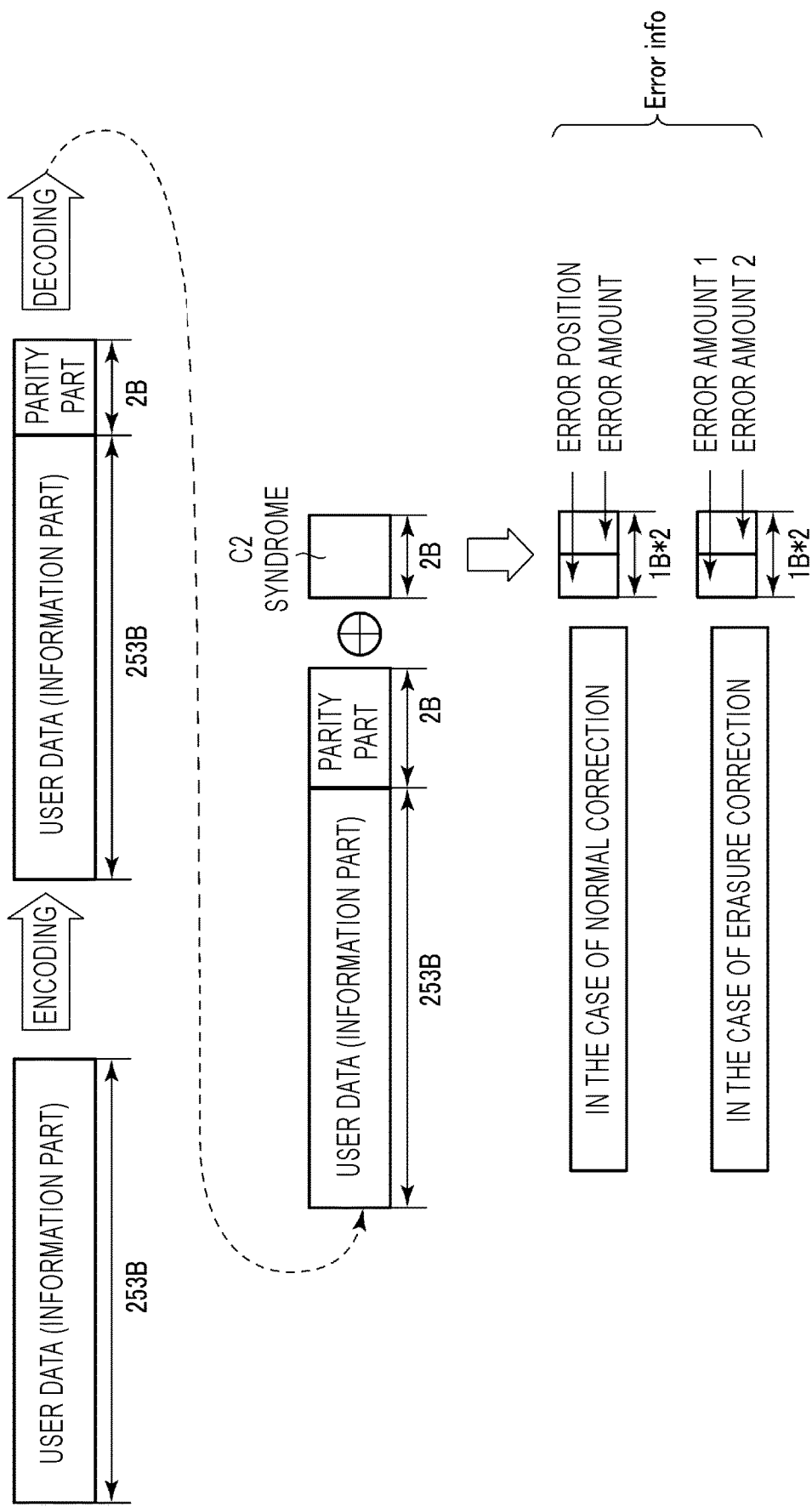
FIG. 5 is a view illustrating encoding and decoding of the RS code according to the first embodiment.

Next, descriptions will be made on an encoding and a decoding of the RS code according to the embodiment, with reference to FIG. 5.

During encoding, user data of 253 bytes is encoded by the C2 module 24 to generate an RS parity part of 2 bytes.

During decoding, a set of the user data and the RS parity part is decoded by the C2 module 24 to generate a C2 syndrome of 2 bytes. The C2 syndrome may also be referred to as an RS syndrome.

Subsequently, the C2 module 24 performs an error correction of the user data and the RS parity part by using the C2 syndrome. The error correction of the RS code includes a normal correction (also referred to as RS normal correction or C2 normal correction), and an erasure correction (also referred to as RS erasure correction or C2 erasure correction). Details of the normal correction and the erasure correction will be described later.

The number of symbols correctable by the normal correction is calculated by "int((d−1)/2)" using a design distance d, and is 1 when d=3. That is, during normal correction, one symbol may be corrected. Here, "int((d−1)/2)" means the largest integer that does not exceed "(d−1)/2." The number of symbols correctable by the erasure correction is calculated by "d−1," and is 2 when d=3. That is, during erasure correction, two symbols may be corrected. In both cases of the erasure correction and the normal correction, it is possible to correct an error of a symbol to be corrected no matter how many bits are erroneous in one symbol, in the number of correctable symbols.

During normal correction, error information (error info) including 1 byte of error position information and 1 byte of error amount information is generated. During erasure correction, error information including 1 byte of first error amount information (error amount 1) and 1 byte of second error amount information (error amount 2) is generated. By using the error information, the C2 module 24 performs an error correction.

Figure 6A:
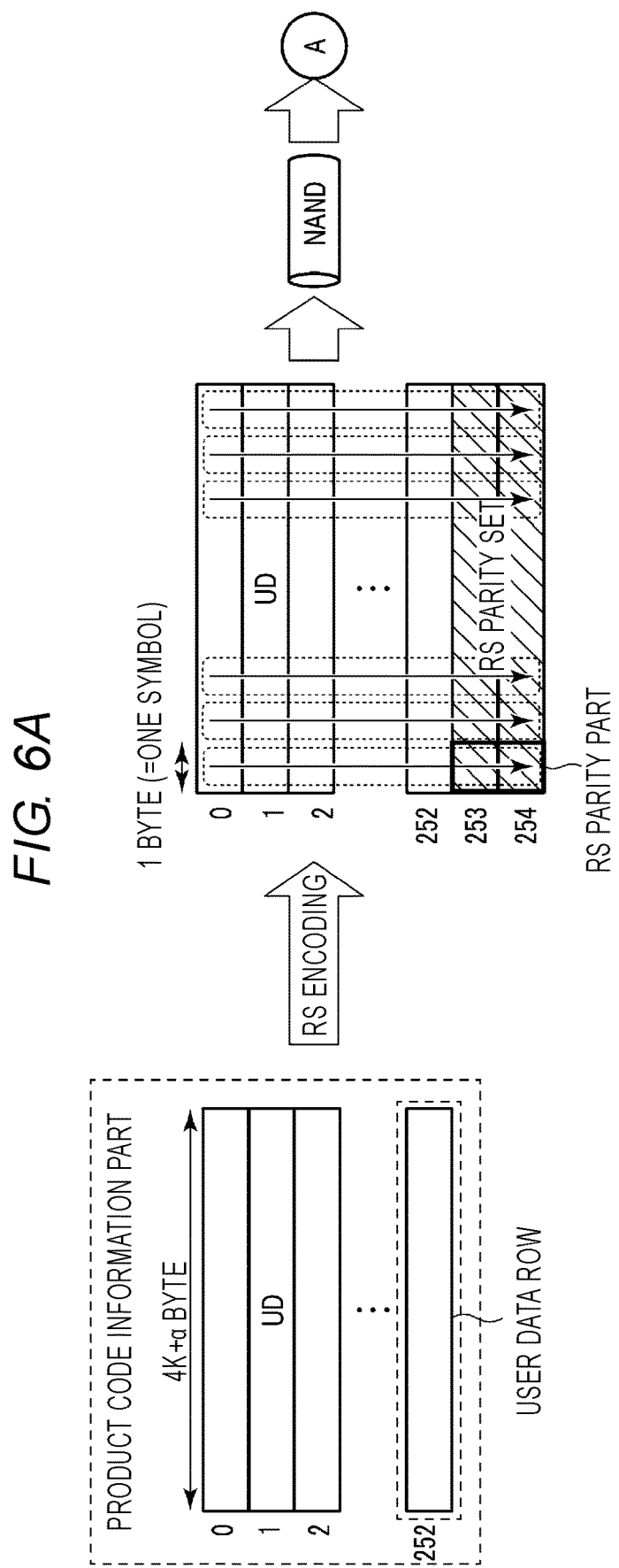
FIG. 6A is a view illustrating two-dimensionally arranged RS frames and an encoding according to the first embodiment.

Next, descriptions will be made on a relationship between two-dimensionally arranged user data and RS frames corresponding thereto. FIG. 6A is a view illustrating two-dimensionally arranged RS frames and an encoding according to the embodiment. FIG. 6B is a view illustrating two-dimensionally arranged RS frames and a decoding according to the embodiment.

FIG. 6A illustrates an example of a data structure of two-dimensionally arranged user data UD. The user data UD includes, for example, 253 rows of data in which each row is 4K+α(=4*1024+α) bytes. The α is a management information part added to the user data that is instructed to be stored in the memory system 2 by the host device 1. Hereinafter, one row portion in the user data UD may be referred to as a user data row. A set of 253 user data rows may be referred to as a product code information part. The size of the product code information part is, for example, 1 MB.

The product code information part is encoded by the C2 module 24 in column units. In the product code information part, "column" indicates the width of 1 byte (which is the size of one symbol). As a result of the encoding, an RS parity part consisting of 2 bytes is generated in each column. As a result of the generation of the RS parity part in each column, a set of RS parity parts making up a total of two rows is added to $253^{rd}$ and $254^{th}$ rows. The set of the RS parity parts for the two rows added in this manner may be referred to as an RS parity set or a C2 parity set. A data column consisting of the user data part (253 bytes) and the RS parity part (2 bytes) corresponding thereto, which are arranged in the column direction corresponds to the RS frame (255 bytes) in FIG. 4. The product code information part and the RS parity set are stored in the NAND-type flash memory 3.

As illustrated in FIG. 6B, the product code information part and the RS parity set read from the NAND-type flash memory 3 may include an error (marked with an "x"). During decoding, the C2 module 24 performs a decoding on each column of the product code information part in column units, and an RS syndrome of 2 bytes is generated in each column. As a result of the generation of the RS syndrome in each column, a set of RS syndromes for two rows is generated. The set of the RS syndromes for the two rows generated in this manner may be referred to as an RS syndrome set or a C2 syndrome set.

Subsequently, the C2 module 24 performs an error correction on each column by using the RS syndrome. That is, for each column, the C2 module 24 corrects an error in the user data and the RS parity part in the corresponding column, by using the RS syndrome corresponding to the corresponding column. When this correction is a normal correction, error information including error position information of each column and error amount information of each column is generated. On the other hand, when this correction is an erasure correction, error information including first error amount information of each column (error amount information 1), and second error amount information of each column (error amount information 2) is generated. By using the error information, the C2 module 24 performs the error correction.

[1-3-2] Data Structure of LDPC Frame

Figure 7:
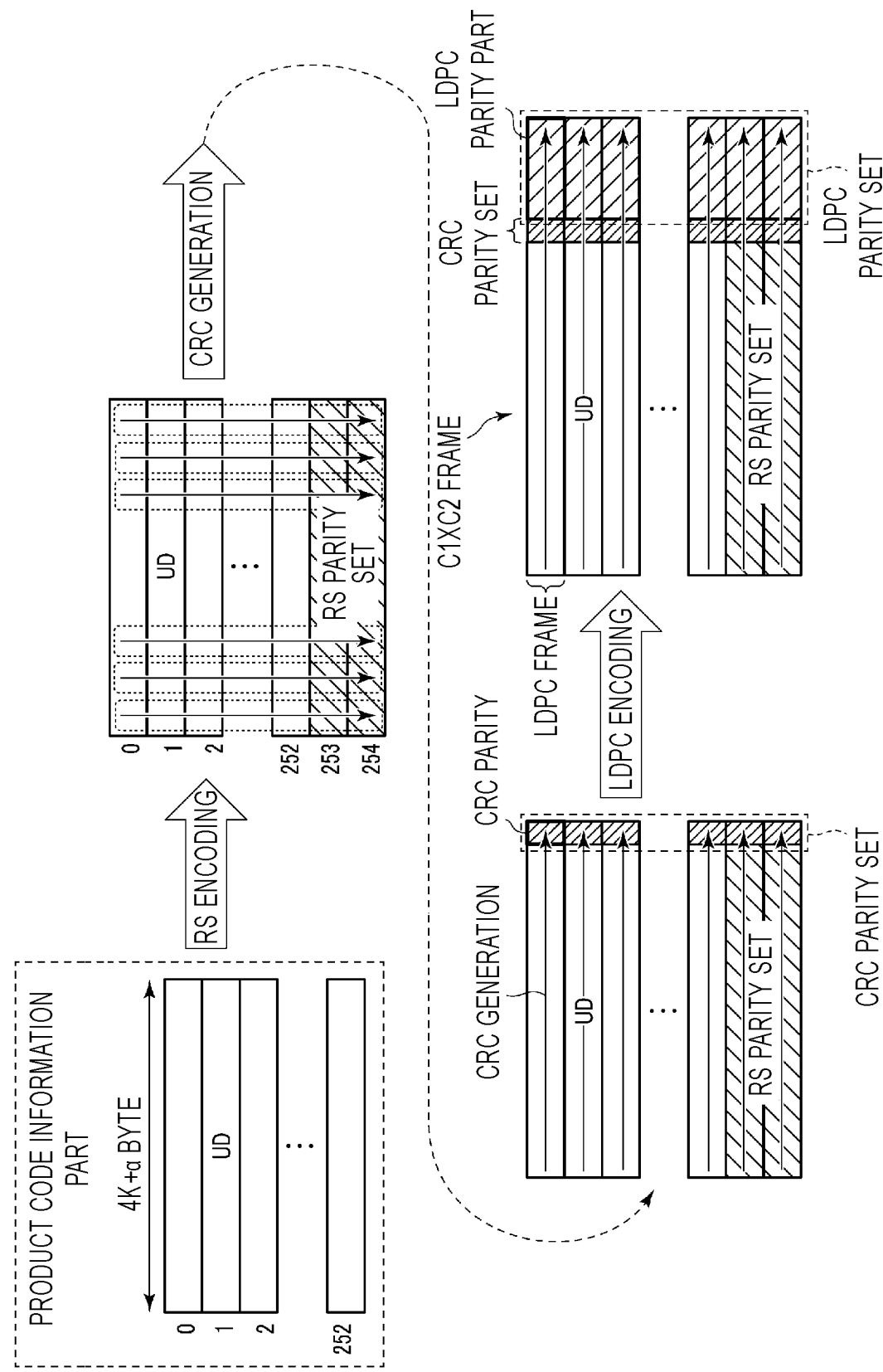
FIG. 7 is a view illustrating LDPC frames and an encoding according to the first embodiment.

Next, a data structure of an LDPC frame will be described. FIG. 7 is a view illustrating LDPC frames and an encoding according to the embodiment. The solid-line arrow in FIG. 7 indicates the direction of an encoding processing.

The RS encoding is the same as in FIG. 6A. Subsequently, for each row of the user data UD (i.e., the product code information part) and the RS parity set, a CRC parity is generated by the CRC circuit 23 in the C1 module 20. The CRC parity is a parity portion of a codeword of an error detection code using a cyclic redundancy check (CRC) scheme. A set of 255 CRC parities generated in this manner may be referred to as a CRC parity set.

Each row in a data structure including the product code information part, the RS parity set, and the CRC parity set is encoded by the C1 module 20 to generate an LDPC parity part (also referred to as a C1 parity part). That is, the LDPC parity part is generated for each set of each row of the user data rows included in the product code information part and the corresponding CRC parity. Further, the LDPC parity part is generated for each set of each row of the RS parity set included in the product code information part and the corresponding CRC parity. A set of 255 LDPC parity parts generated in this manner may be referred to as an LDPC parity set or a C1 parity set. The product code information part or the RS parity set for one row, the corresponding CRC parity, and the corresponding LDPC parity part constitute the LDPC frame. The LDPC frame may also be referred to as a C1 frame. The data structure consisting of the product code information part, the RS parity set, the CRC parity set, and the LDPC parity set, that is, the LDPC frames for 255 rows, may also be referred to as a C1×C2 frame. The C1×C2 frame is stored in the NAND-type flash memory 3.

Figure 8:
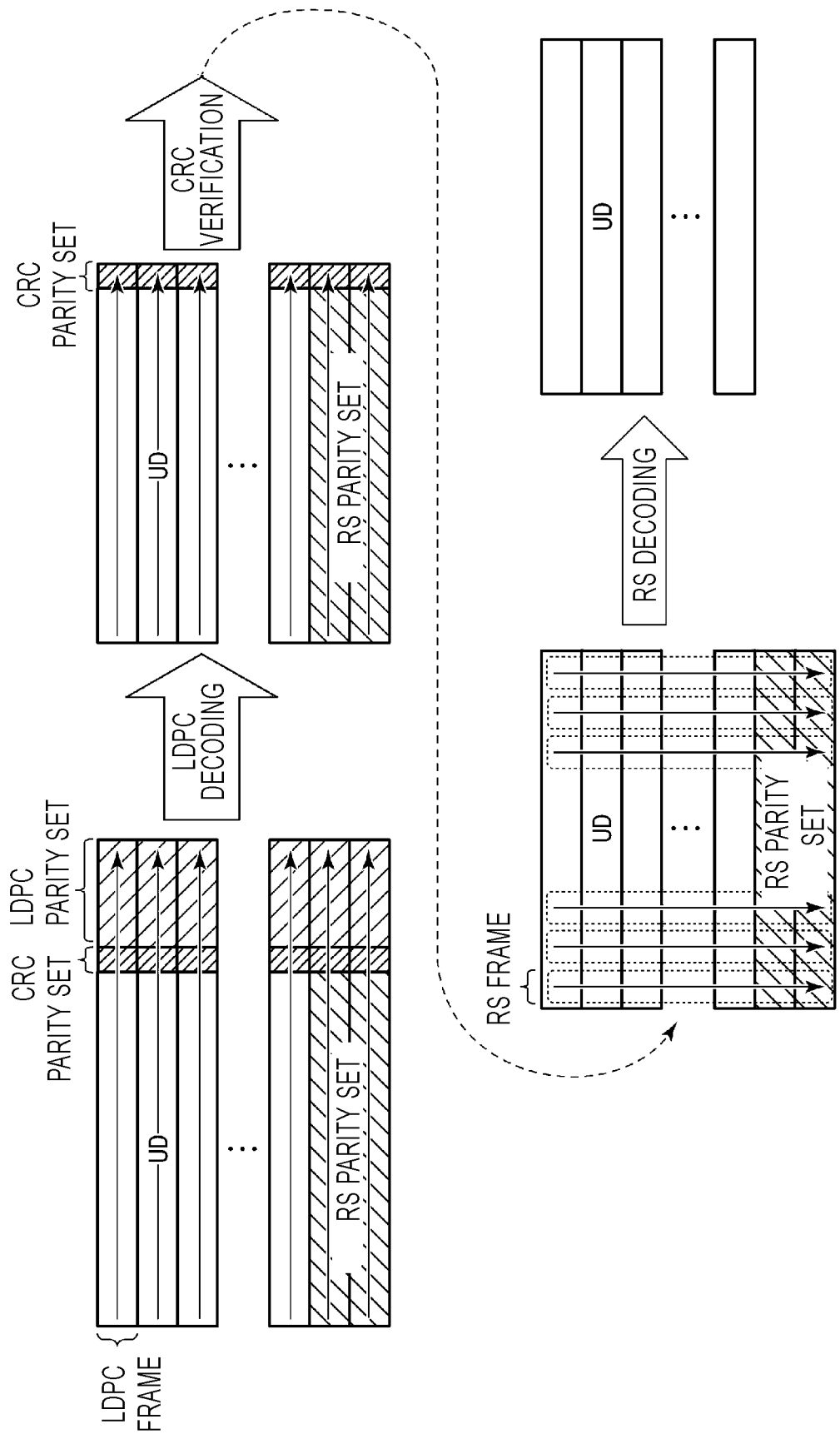
FIG. 8 is a view illustrating LDPC frames and a decoding according to the first embodiment.

FIG. 8 is a view illustrating the LDPC frames and decoding according to the embodiment. The C1×C2 frame is read from the NAND-type flash memory 3.

Each LDPC frame is decoded by the C1 module 20, and an error correction is performed. For each row of the user data rows included in the error-corrected product code information part, and each row of the RS parity set, error detection (also referred to as CRC verification) is performed by using the corresponding CRC parity, by the CRC circuit 23. Each column (corresponding to RS frame) in the user data rows and the RS parity set subjected to the CRC verification is decoded by the C2 module 24, and an error correction is performed.

FIG. 9 is a view illustrating units of an error correction processing (also referred to as an LDPC correction or a C1 correction) using an LDPC parity part, and an error correction processing (also referred to as an RS correction or a C2 correction) using an RS parity part, according to the embodiment. The LDPC correction is performed on each row in a data structure, in bit units. The RS correction is performed on each column in the data structure, in byte units.

Figure 10A:
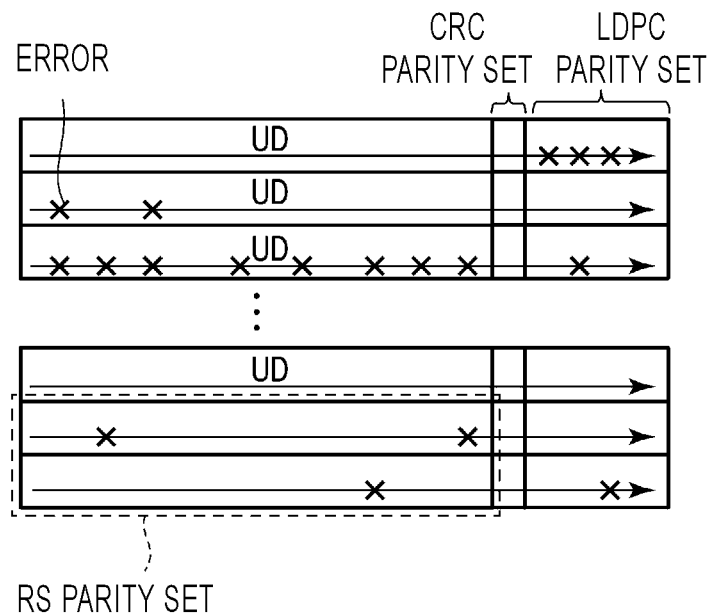
FIGS. 10A to 10C are views illustrating an example of an error correction using a product code according to the first embodiment.
Figure 10B:
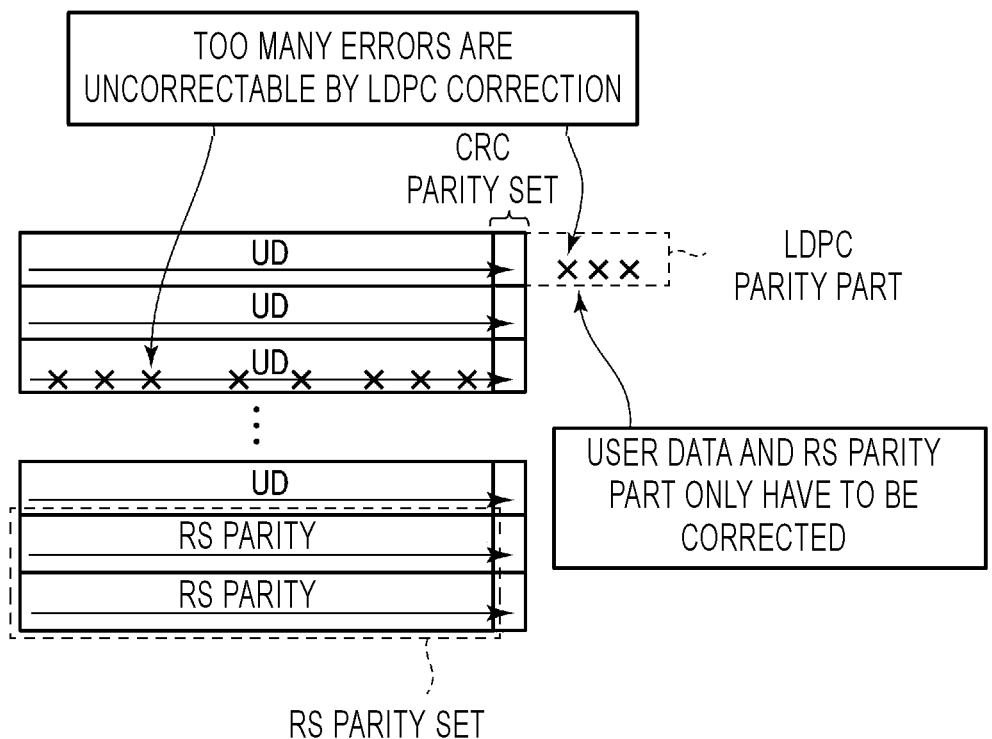
Figure 10C:
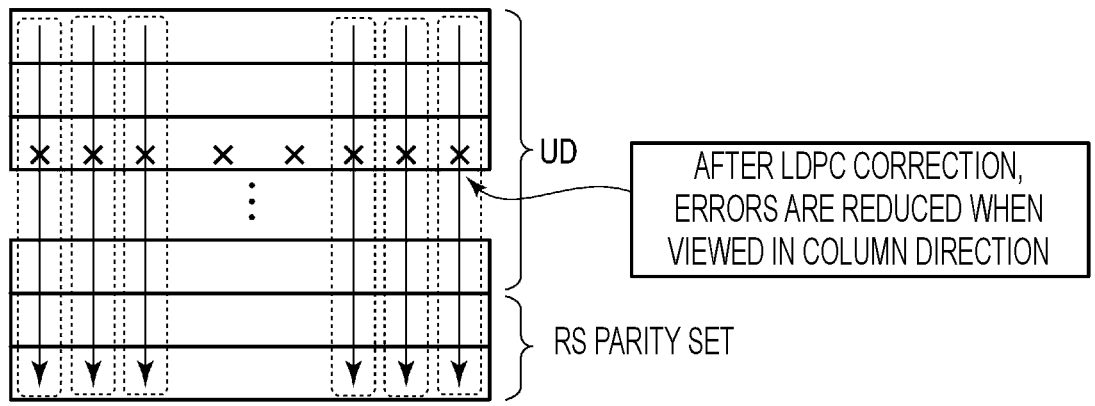

FIGS. 10A to 10C are views illustrating an example of an error correction using a product code according to the embodiment. FIG. 10A illustrates a data structure read from the NAND-type flash memory 3. The "x" in FIG. 10A indicates an erroneous RS symbol among RS symbols each consisting of 1 byte. The erroneous RS symbol includes 1 to 8 bits of errors. Here, a symbol that is a unit of RS correction is referred to as an RS symbol. The RS symbol may also be referred to as a C2 symbol.

FIG. 10B illustrates the data structure in which an error correction is performed by an LDPC correction. When the number of error bits in a certain row is small, it is possible to perform the correction by the LDPC correction. Here, in order to simplify the explanation, it is assumed that an error correction capability of the LDPC correction is up to 16 bits per LDPC frame. That is, it is assumed that an LDPC frame having two or less "x" is correctable by the LDPC correction, and an LDPC frame having three or more "x" is uncorrectable by the LDPC correction. In addition, in some cases, an error remains only in an LDPC parity part. However, only user data and a RS parity part need to be corrected by the LDPC correction. For this reason, an error remaining only in the LDPC parity part may be disregarded. Therefore, a row in which an error remains only in the LDPC parity part is treated as one on which error correction is normally performed by the LDPC correction.

FIG. 10C illustrates an RS correction. The RS correction is performed in the column direction of the data structure. After the LDPC correction, when viewed in the column direction, errors are reduced. Therefore, an error correction may be possible even with the RS correction having a low correction capability.

[1-4] Correction Capability of RS Correction

Next, a correction capability of RS correction will be described. As described above, the RS correction includes a normal correction and an erasure correction.

Figure 11:
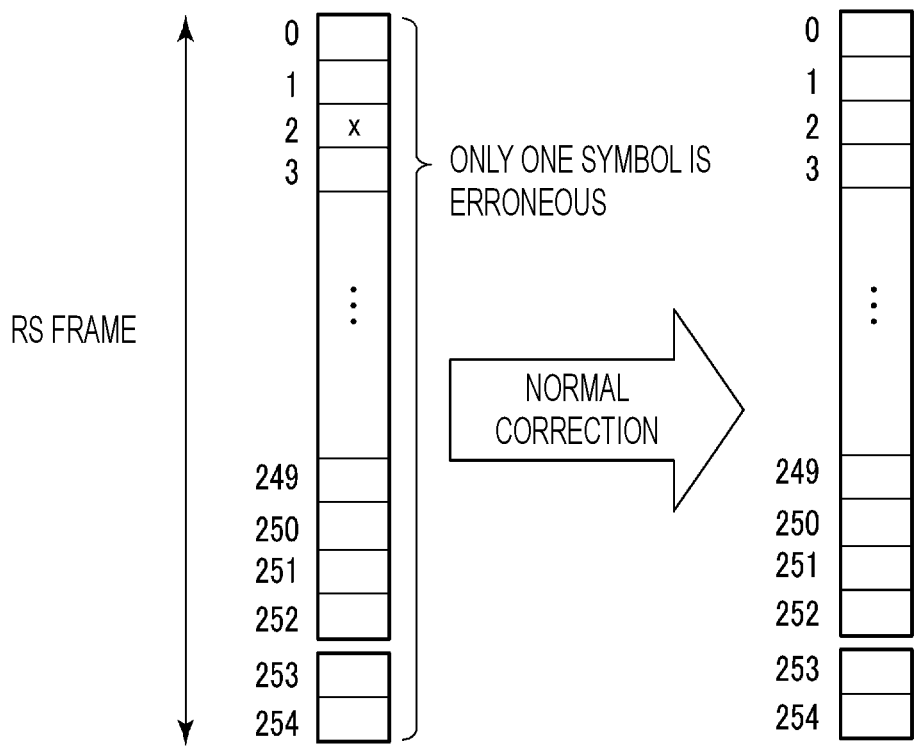
FIG. 11 is a view illustrating an RS normal correction according to the first embodiment.

FIG. 11 is a view illustrating an RS normal correction according to the embodiment. FIG. 11 illustrates an RS frame. The RS normal correction in the embodiment is capable of correcting only one symbol. In the RS normal correction, it is not necessary to specify an error position. As illustrated in FIG. 5, error information generated by the RS normal correction includes error position information and error amount information each having 1 byte. The error amount information includes information on an error pattern for correcting data of one symbol.

Figure 12:
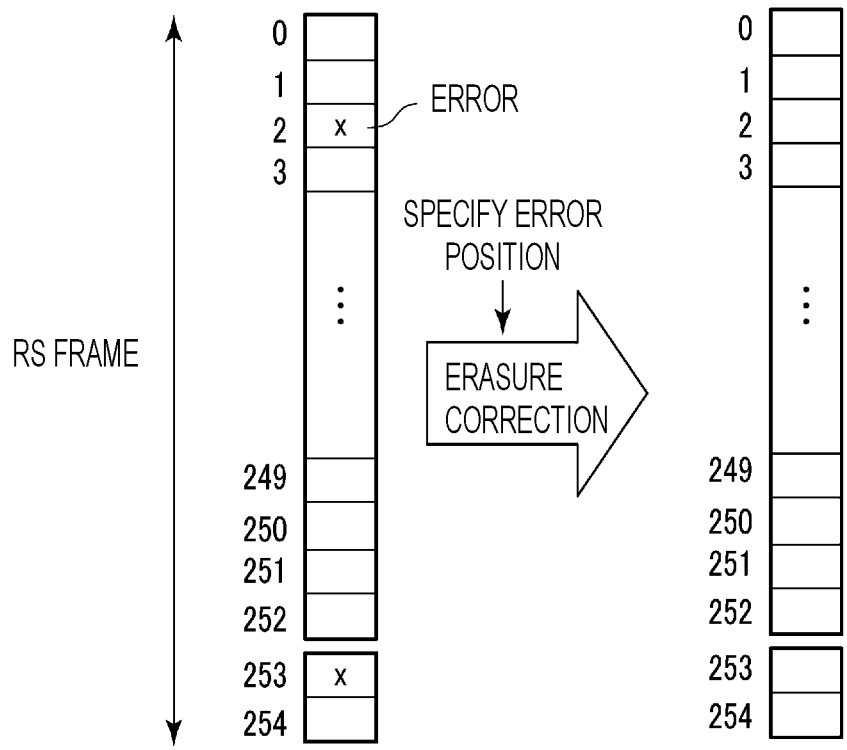
FIG. 12 is a view illustrating an RS erasure correction according to the first embodiment.

FIG. 12 is a view illustrating an RS erasure correction according to the embodiment. The RS erasure correction in the embodiment is capable of correcting up to a maximum of two symbols. However, in the RS erasure correction, it is necessary to specify an error position. As illustrated in FIG. 5, error information generated by the RS erasure correction includes error amount information of 2 bytes. That is, the error information does not include error position information. Accordingly, the RS erasure correction would be capable of correcting up to a maximum of two symbols by specifying the error position.

Figure 13:
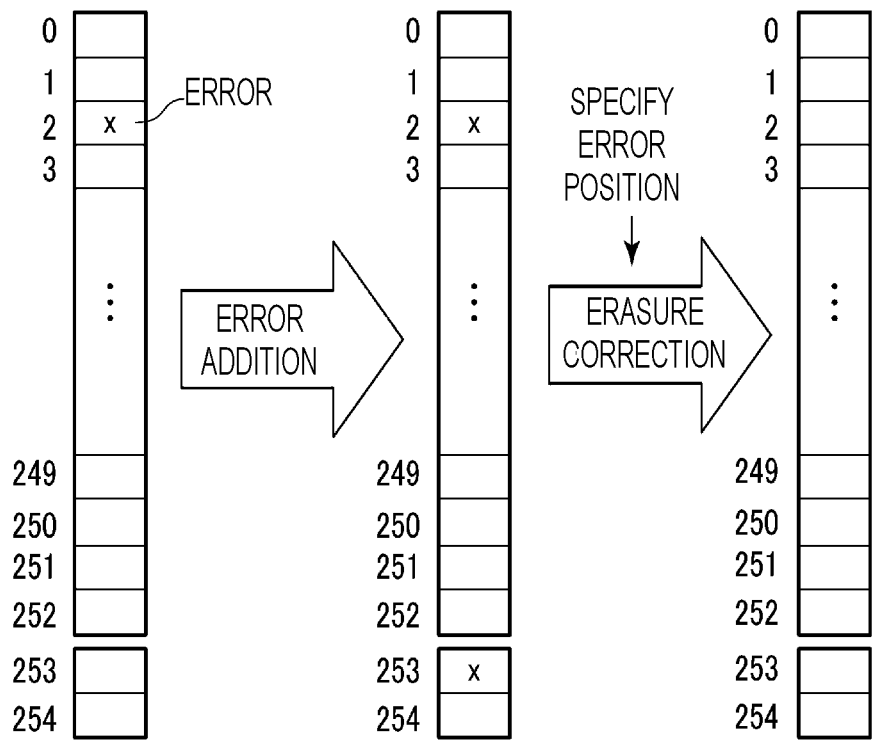
FIG. 13 is a view illustrating an application of the RS erasure correction according to the first embodiment.

FIG. 13 is a view illustrating an application of the RS erasure correction according to the embodiment. The erasure correction may be applied even when the number of erroneous symbols is 1 or less (a symbol with a symbol number 2 in the example of FIG. 13) and an error position is known. That is, a non-erroneous symbol (a symbol with a symbol number 253 in the example of FIG. 13) may be treated as an error symbol so that a total of two symbols are considered to be erroneous. Then, the erasure correction may be applied to the corresponding two symbols.

A CRC verification may be carried out with the RS correction so that error information detected by the CRC verification may be used in the RS correction. That is, an error detected by the CRC verification is set as an error whose error position is known, and then, is considered as a target of the RS erasure correction. At the RS normal correction, data that is found to be non-erroneous by the CRC verification is excluded from a target of the RS normal correction.

[1-5] Data Flow of Encoding

Figure 14:
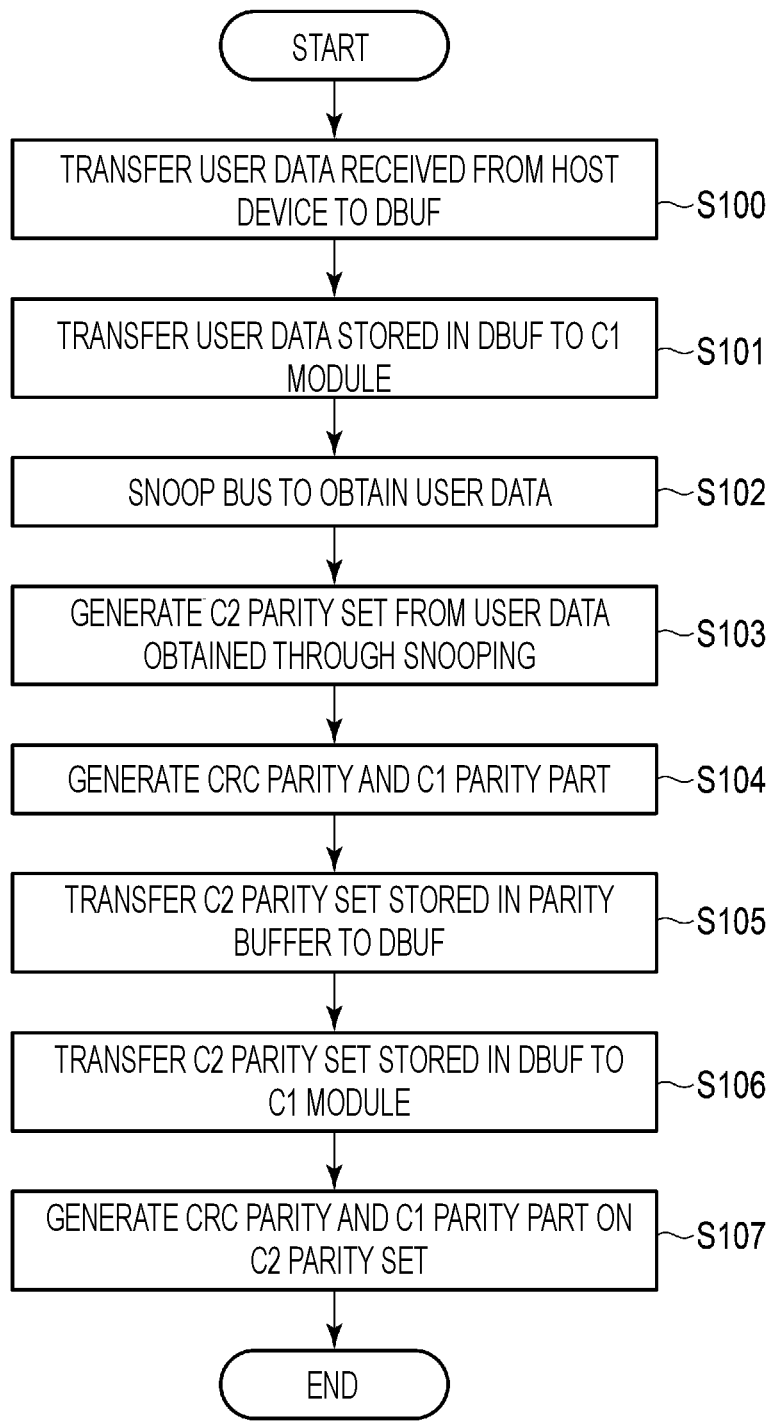
FIG. 14 is a flowchart illustrating an encoding operation of a memory controller according to the first embodiment.
Figure 15:
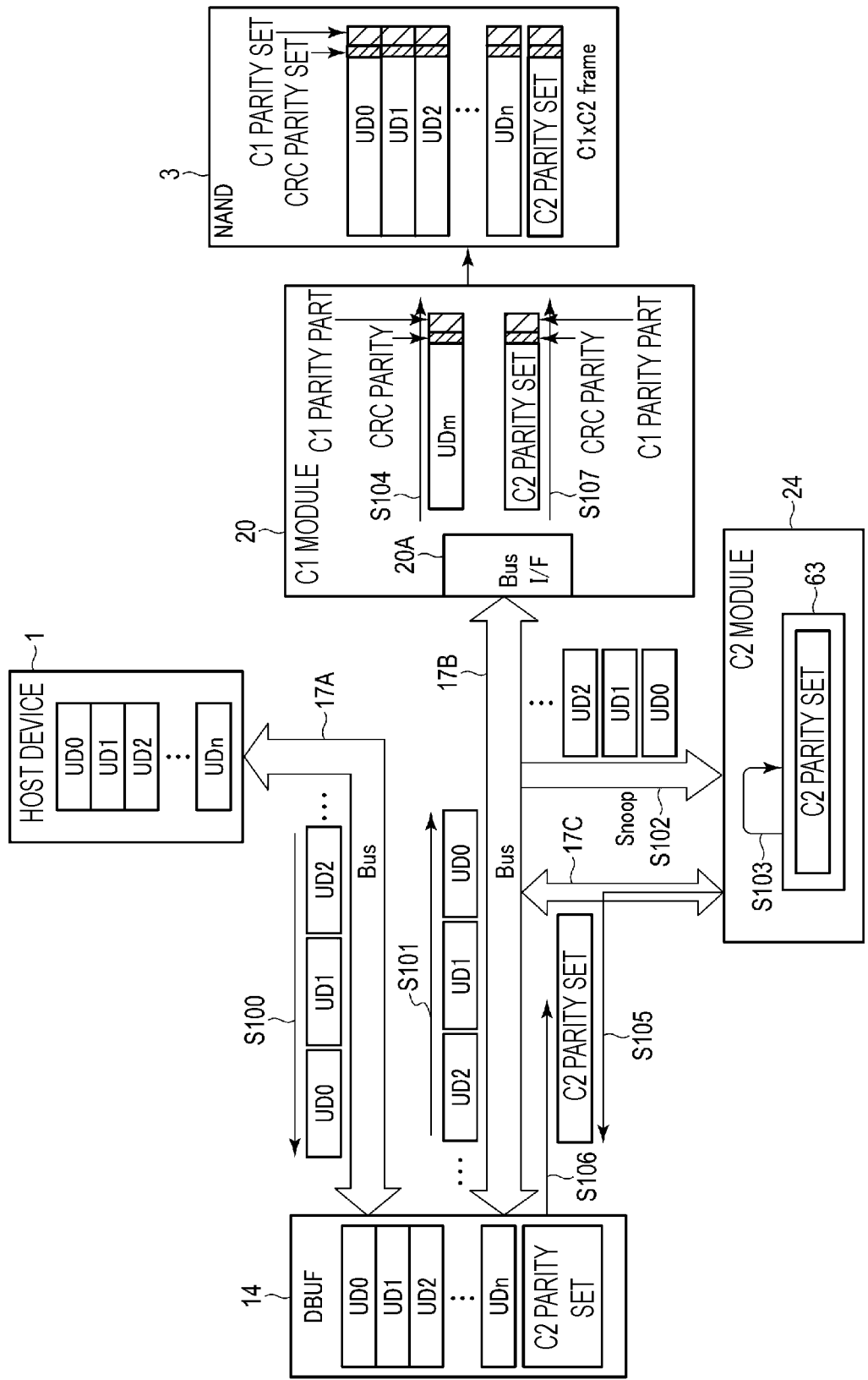
FIG. 15 is a view illustrating a data flow of an encoding according to the first embodiment.

Next, a data flow of an encoding will be described. FIG. 14 is a flowchart illustrating an encoding operation of the memory controller 4 according to the embodiment. FIG. 15 is a view illustrating a data flow of an encoding according to the embodiment.

FIG. 15 mainly illustrates circuits related to the data flow of the encoding. The host device 1 is connected to the data buffer (DBUF) 14 via the host interface circuit 10 (not illustrated) and the bus 17A. The DBUF 14 is connected to the C1 module 20 via the bus 17B. The C1 module 20 includes, for example, a bus interface circuit (Bus I/F) 20A connected to the bus 17B. The C2 module 24 is connected to the DBUF 14 and the C1 module 20 via the buses 17B and 17C. The C2 module 24 includes a parity buffer 63 that temporarily stores a C2 parity set. The parity buffer 63 is implemented by, for example, a SRAM.

The host device 1 stores user data UD0 to UDn. The "n" is, for example, 252. For example, as described above with reference to FIG. 6A, each of user data UD0 to UDn has a size of 4K+a byte. The processor 11 receives the user data UD0 to UDn from the host device 1 together with, for example, a write instruction and an address. The processor 11 transfers the user data UD0 to UDn received from the host device 1, to the DBUF 14 via the bus 17A (step S100).

The processor 11 transfers the user data UD0 to UDn stored in the DBUF 14 to the C1 module 20 via the bus 17B (step S101). The C2 module 24 snoops the bus 17B to obtain the user data UD0 to UDn transferred through the bus 17B (step S102). That is, the C2 module 24 is capable of receiving the user data UD0 to UDn via the bus 17B.

The C2 module 24 generates a C2 parity set from the user data UD0 to UDn obtained by snooping (step S103). The C2 module 24 temporarily stores the C2 parity set, in the parity buffer 63.

The CRC circuit 23 in the C1 module 20 generates a CRC parity for user data UDm (m is one integer of 0 to n). The C1 encoder 21 in the C1 module 20 generates a C1 parity part for the user data UDm and the CRC parity corresponding thereto (step S104). The processor 11 writes a C1 frame consisting of the user data UDm, the corresponding CRC parity, and the corresponding C1 parity part, to the NAND-type flash memory 3.

After the C2 parity set is generated by the C2 module 24, the processor 11 transfers the C2 parity set stored in the parity buffer 63 to the DBUF 14 via the buses 17B and 17C (step S105). The processor 11 transfers the C2 parity set stored in the DBUF 14 to the C1 module 20 via the bus 17B (step S106).

The CRC circuit 23 in the C1 module 20 generates a CRC parity for each row of the C2 parity set. The C1 encoder 21 in the C1 module 20 generates a C1 parity part for each row of the C2 parity set and the corresponding CRC parity (step S107). The processor 11 writes each C1 frame including each row of the C2 parity set, to the NAND-type flash memory 3. At this point in time, the NAND-type flash memory 3 stores a C1×C2 frame.

[1-6] Outline of LDPC Correction and RS Correction

Next, descriptions will be made on the outline of an LDPC correction and an RS correction.

First Example

FIGS. 16A to 16G are views illustrating an example (first example) of an error correction by an LDPC correction and an RS correction according to the embodiment. The first example illustrates an example with relatively few errors.

Figure 16B:
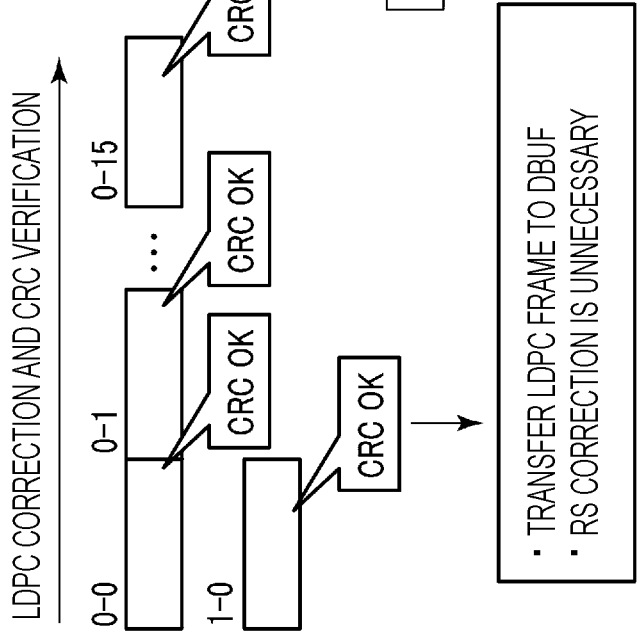
Figure 16A:
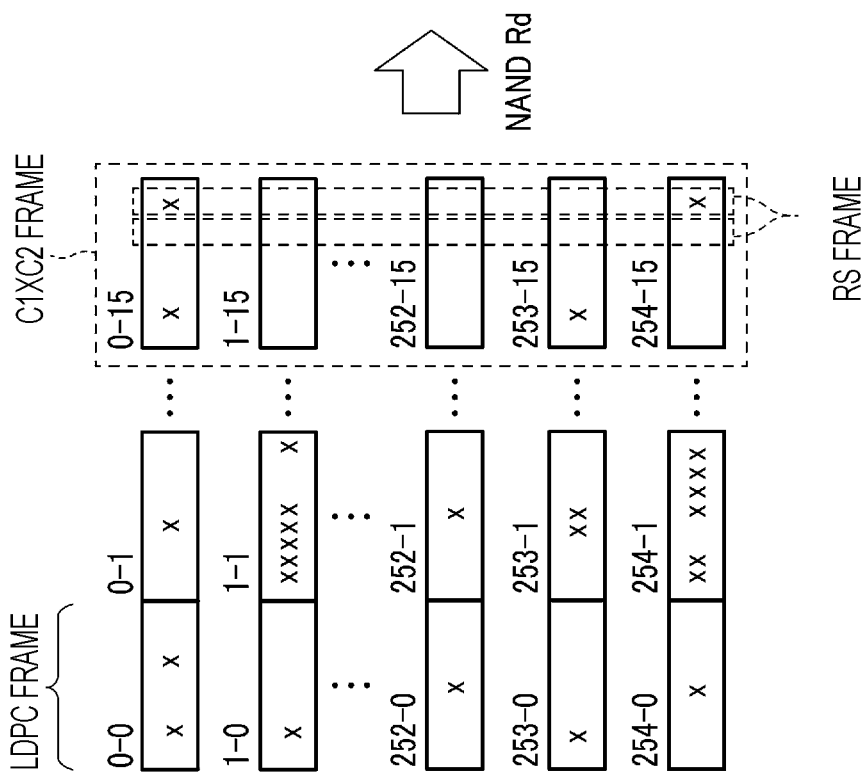

FIG. 16A is a depiction of data stored in the NAND-type flash memory 3. The data structure in FIG. 16A is a read target. For example, when a read instruction is received from the host device 1, the memory controller 4 reads data from the NAND-type flash memory 3. One rectangle in FIG. 16A indicates one LDPC frame. One row in the data structure illustrated in FIG. 16A consists of 16 LDPC frames. When the data structure is divided per byte in the column direction, an RS frame consisting of 255 bytes (255 symbols) is obtained. 255 LDPC frames arranged in the column direction constitutes a C1×C2 frame. Among numbers (e.g., "1-0") described in each LDPC frame, the leading number (e.g., "1" in "1-0") is the symbol number of the RS frame (also referred to as an RS symbol number), and the trailing number (e.g., "0" in "1-0") is the LDPC frame number that distinguishes among 16 LDPC frames. The "x" illustrated in the drawing indicates an erroneous RS symbol as in FIG. 10A.

The memory controller 4 reads data from the NAND-type flash memory 3, in LDPC frame units (denoted as "NAND Rd" in the drawing). The C1 module 20 performs an LDPC correction on each LDPC frame. The memory controller 4 reads a plurality of LDPC frames in order along the row direction of the data structure.

As illustrated in FIG. 16B, the C1 module 20, more specifically, the CRC circuit 23 performs a CRC verification on the LDPC frames. As a result of the CRC verification by the CRC circuit 23, when no error is detected, the processor 11 transfers the corresponding LDPC frame to the DBUF 14. In FIG. 16B, no error was detected in LDPC frames "0-0" to "0-15," and "1-0" (denoted as "CRC OK" in the drawing). RS symbols included in the LDPC frame as "CRC OK" do not require an RS correction.

The memory controller 4 continues to read data from the NAND-type flash memory 3. As illustrated in FIG. 16C, as a result of the CRC verification by the CRC circuit 23, when an error is detected (denoted as "CRC NG" in the drawing), the processor 11 temporarily stops the transfer of the LDPC frames to the DBUF 14. In the example of FIG. 16C, the LDPC frame "1-1" is "CRC NG." The memory controller 4 reads an LDPC frame group with an LDPC frame number 1 (i.e., LDPC frames "0-1" to "254-1") from the NAND-type flash memory 3 in order to RS-correct the RS symbols included in the LDPC frame in which the error is detected.

As illustrated in FIG. 16D, the C1 module 20 performs an LDPC correction and a CRC verification on LDPC frames in the LDPC frame group with the LDPC frame number 1, in order. As a result of the CRC verification, LDPC frames as "CRC OK" are distinguished from LDPC frames as "CRC NG." For the LDPC frame as "CRC OK," it is guaranteed that all RS symbols constituting the LDPC frame are not erroneous. Meanwhile, for the LDPC frame as "CRC NG," some of RS symbols included in the LDPC frame are erroneous. In the example of FIG. 16D, LDPC frames "1-1" and "254-1" are "CRC NG." The C1 module 20 transfers the LDPC frames subjected to the LDPC correction and the CRC verification to the C2 module 24 and the DBUF 14.

As illustrated in FIG. 16E, when the number of LDPC frames determined to be "CRC NG" is 2 or less, the C2 module 24 considers that all RS symbols constituting the corresponding LDPC frame are erroneous. That is, the C2 module 24 considers that the corresponding RS symbols are erased, and performs an error correction by the erasure correction. The LDPC frame including an error is specified by the CRC verification. In the RS correction, when an error position (error symbol) is known, errors of up to two symbols are correctable by the erasure correction. When one symbol is erroneous, the C2 module 24 may still perform the application of the erasure correction. Therefore, when the number of LDPC frames determined to be "CRC NG" is 1 or 2, error correction is possible by the RS correction.

As illustrated in FIG. 16F, all errors of two LDPC frames (LDPC frames "1-1" and "254-1") including RS symbols treated as being erased are corrected by the RS correction. Accordingly, a correction processing is completed.

The C2 module 24 issues a correction processing completion flag and transmits the flag to the processor 11. As illustrated in FIG. 16G, the processor 11 transfers the corrected LDPC frames "1-1" and "254-1" to the DBUF 14.

Second Example

FIGS. 17A to 17L are views illustrating another example (second example) of the error correction by the LDPC correction and the RS correction according to the embodiment. The second example illustrates an example with a relatively large number of errors.

Figure 17B:
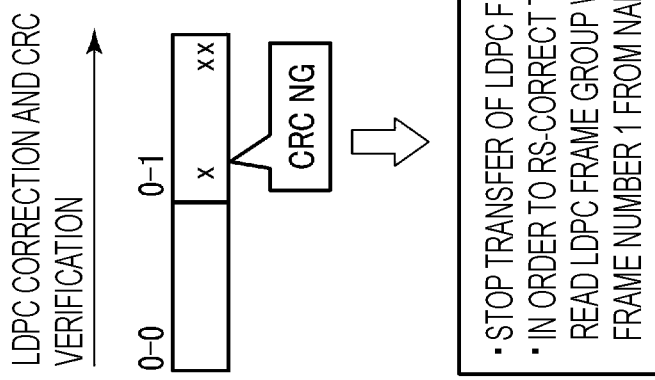
Figure 17A:
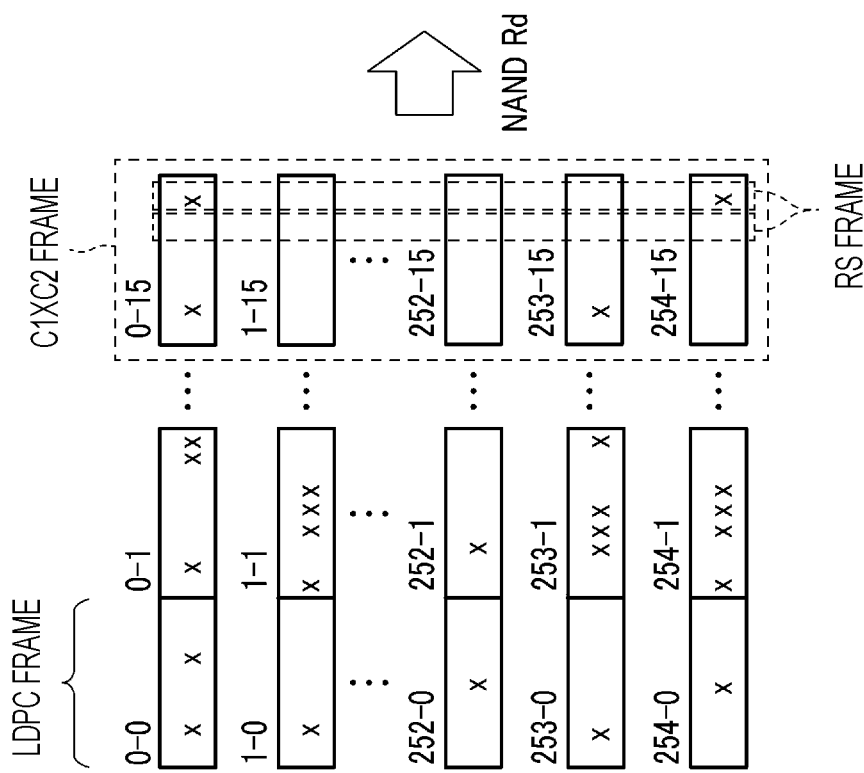

FIG. 17A is depiction of data stored in the NAND-type flash memory 3. For example, when a read instruction is received from the host device 1, the memory controller 4 reads data from the NAND-type flash memory 3. The memory controller 4 reads data from the NAND-type flash memory 3, in LDPC frame units.

As illustrated in FIG. 17B, the C1 module 20 performs an LDPC correction on each LDPC frame. The CRC circuit 23 performs a CRC verification on the LDPC frames. As a result of the CRC verification by the CRC circuit 23, when an error is detected, the processor 11 temporarily stops the transfer of the LDPC frames to the DBUF 14. In the example of FIG. 17B, an LDPC frame "0-1" is "CRC NG." The memory controller 4 reads an LDPC frame group with an LDPC frame number 1 (i.e., LDPC frames "0-1" to "254-1") from the NAND-type flash memory 3 in order to RS-correct the RS symbols included in the LDPC frame in which the error is detected.

As illustrated in FIG. 17C, the C1 module 20 performs an LDPC correction and a CRC verification on LDPC frames in the LDPC frame group with the LDPC frame number 1, in order. As a result of the CRC verification, LDPC frames as "CRC NG" are specified. In the example of FIG. 17C, LDPC frames "0-1," "1-1," "253-1," and "254-1" are "CRC NG." The C1 module 20 transfers the LDPC frames subjected to the LDPC correction and the CRC verification, to the C2 module 24 and the DBUF 14.

As illustrated in FIG. 17D, since the number of LDPC frames determined to be "CRC NG" is 3 or more, the C2 module 24 cannot use erasure correction. However, even for the LDPC frames determined to be "CRC NG," not all bits are erroneous. Even for the LDPC frames determined to be "CRC NG," when viewed in the column direction after division per byte (that is, when viewed in the RS frame unit), none of symbols may include any error, only one symbol may be erroneous, or two or more symbols may be erroneous. Among them, when only one symbol is erroneous, a correction is possible by a normal correction.

When the number of LDPC frames determined to be "CRC NG" is 3 or more, the C2 module 24 performs an error correction processing by applying a normal correction first. Here, for an RS frame in which two or more symbols are erroneous, since the number of the error symbols exceeds a correction capability of the normal correction, an erroneous correction may possibly occur. Even when the erroneous correction occurs, a correction may be correctly made again by repeatedly applying an LDPC correction and an RS correction after that time. Thus, the erroneous correction is acceptable in this stage. A process in which the erroneous correction occurs and is correctly corrected again by the subsequent-stage correction processing will be exemplified later.

The vertically extending broken line illustrated in FIG. 17D indicates a processing unit of RS correction, that is, an RS frame. The C2 module 24 generates an RS syndrome, and generates error information (error info) including error position information and error amount information. An operation for error correction is performed on all RS frames included in the LDPC frame group with the LDPC frame number 1.

As illustrated in FIG. 17E, the C2 module 24 sequentially outputs only LDPC frames determined to be "CRC NG." The C2 module 24 sequentially gradually corrects RS symbols included in the corresponding LDPC frames, by using error information on each RS frame. The order of LDPC frames to be output is, for example, the ascending order of RS symbol numbers. Specifically, an error correction for RS symbols included in an LDPC frame "0-1" having the smallest RS symbol number is attempted by performing RS correction for each RS frame. Next, similarly, for an LDPC frame "1-1," an RS correction is performed for each RS frame. A similar correction processing is sequentially performed on all the LDPC frames determined to be "CRC NG." This RS correction is performed only when error position information calculated for each RS frame matches the RS symbol number of the LDPC frame as a target of the correction processing.

FIGS. 17D and 17E illustrate an example when the above described sequential correction processing is applied to the LDPC frame "0-1." In each of RS frames indicated by "b" and "h" in FIG. 17D, only one symbol includes an error (symbols included in the LDPC frame with an RS symbol number 0). Therefore, an error position and an error amount calculated by the normal correction have right values. In particular, the error position is correctly calculated as "0." Thus, in the error correction processing for the LDPC frame "0-1," when the C2 module 24 processes the RS frames indicated by "b" and "h," the RS symbol number "0" of the LDPC frame "0-1" matches the calculated error position. Accordingly, since the error amount included in each RS frame matches the calculated error amount, the correction processing is correctly performed. That is, it is possible to correctly correct the errors as in "b" and "h" in FIG. 17E.

An RS frame indicated by "a" in FIG. 17D includes two symbols as error symbols (symbols included in LDPC frames with RS symbol numbers 1 and 254), which exceeds the correction capability of the RS normal correction. Thus, the error position calculated by the RS normal correction is wrong. However, for example, when the C2 module 24 processes the LDPC frame "0-1," the correction processing is not performed unless the calculated error position matches the RS symbol number "0" of the corresponding LDPC frame. FIG. 17D illustrates a case where the calculated error position does not match the RS symbol number "0" of the corresponding LDPC frame. Here, as illustrated in an RS frame "a'" in FIG. 17E, the correction processing is not performed, and erroneous correction does not occur.

Meanwhile, an RS frame indicated by "f" in FIG. 17D also includes two symbols as error symbols (symbols included in LDPC frames with RS symbol numbers 1 and 254), which exceeds the correction capability of the RS normal correction. Thus, the error position calculated by the RS normal correction is wrong. For example, when the C2 module 24 processes the LDPC frame "0-1," when the calculated error position matches the RS symbol number "0" of the corresponding LDPC frame by chance, erroneous correction occurs as illustrated in an RS frame "f'" in FIG. 17E. That is, an erroneous correction is occurring in an RS symbol that belongs to the RS frame "f" and is included in the LDPC frame "0-1." Here, the number of error bits occurring due to the erroneous correction is 1 bit to 8 bits, that is, 1 RS symbol or less.

Next, as illustrated in FIG. 17F, the C1 decoder 37 in the C2 module 24 performs an error correction on the LDPC frame "0-1." Here, although an error increase was caused due to occurrence of the erroneous correction in the RS frame "f'" in FIG. 17E, errors were eliminated in the RS frames "b'" and "h'" in FIG. 17E. When the number of error bits occurring due to the erroneous correction in the RS frame "f'" is smaller than the number of corrected error bits in the RS frames "b'" and "h'," the number of error bits is reduced in the LDPC frame "0-1" as a whole. Therefore, the LDPC frame "0-1" may be possibly correctable by an LDPC correction. FIG. 17F illustrates a case where the LDPC frame "0-1" is correctable by the LDPC correction. The CRC circuit 38 in the C2 module 24 performs a CRC verification on the LDPC frame "0-1." Accordingly, it is verified that all errors in the LDPC frame "0-1" are corrected. Then, the C2 module 24 re-generates RS syndromes by using the RS symbols included in the corrected LDPC frame "0-1." The processor 11 transfers the corrected LDPC frame "0-1" to the DBUF 14.

As illustrated in FIG. 17G, since the number of LDPC frames determined to be "CRC NG" is still 3 or more (LDPC frames "1-1," "253-1," and "254-1"), the C2 module 24 performs normal correction. Specifically, since the LDPC frame "1-1" in FIG. 17G is still "CRC NG," the C2 module 24 performs an RS normal correction on each RS symbol included in the LDPC frame "1-1." Here, the C2 module 24 performs an error correction on RS symbols in which the error position of error information matches the RS symbol number "1" of the LDPC frame "1-1," and does not perform an error correction on other RS symbols. Even when the RS normal correction is performed, since two or more symbols include errors in each of RS frames ("a'", "d," "e," and "f'") to which each RS symbol having an error in the LDPC frame "1-1" belongs, the errors are uncorrectable by the RS normal correction. Therefore, the LDPC frame "1-1" still includes errors. The C2 module 24 generates an RS syndrome, and generates error information (error info).

Even after the RS normal correction is executed on each RS symbol included in the LDPC frame "1-1," the number of LDPC frames determined to be "CRC NG" is still 3 or more (the LDPC frames "1-1," "253-1," and "254-1"). As illustrated in FIG. 17H, the C2 module 24 performs RS normal correction on each RS symbol included in the next LDPC frame "253-1" determined to be "CRC NG." Here, the C2 module performs error correction on RS symbols in which the error position of error information matches the RS symbol number "253" of the LDPC frame "253-1," and does not perform an error correction on other RS symbols. In each of RS frames indicated by "c" and "i" of FIG. 17G, since only one symbol includes an error symbol, the errors are corrected as illustrated in RS frames indicted by "c'" and "i'" of FIG. 17H.

As illustrated in FIG. 17I, the C1 decoder 37 in the C2 module 24 performs an LDPC correction on the LDPC frame "253-1." The CRC circuit 38 performs a CRC verification on the LDPC frame "253-1." Therefore, it is verified that all errors in the LDPC frame "253-1" are corrected. Then, the C2 module 24 re-generates syndromes by using the RS symbols included in the corrected LDPC frame "253-1." The processor 11 transfers the corrected LDPC frame "253-1" to the DBUF 14.

As illustrated in FIG. 17J, the number of LDPC frames determined to be "CRC NG" is 2 or less (the LDPC frames "1-1" and "254-1"). The C2 module 24 performs an RS correction by treating RS symbols included in the corresponding LDPC frame, as being erased. The LDPC frames including errors are specified by the CRC verification. In the RS correction, when the error position is known, errors of up to two symbols are correctable by an erasure correction.

As illustrated in FIG. 17K, errors of two LDPC frames including the RS symbols treated as being erased (the LDPC frames "1-1" and "254-1" are completely corrected by the RS correction. Accordingly, a correction processing is completed.

The C2 module 24 issues a correction processing completion flag, and transmits the flag to the processor 11. As illustrated in FIG. 17L, the processor 11 transfers the corrected LDPC frames "1-1" and "254-1" to the DBUF 14.

[1-7] Details of Error Correction Operation

Next, descriptions will be made on details of an error correction operation. In the embodiment, in an error correction using a product code, an iterative correction is performed. The iterative correction indicates that an error correction is performed by repeating a C1 correction (LDPC correction) and a C2 correction (RS correction).

[1-7-1] Circuit Configuration for Iterative Correction

Figure 18:
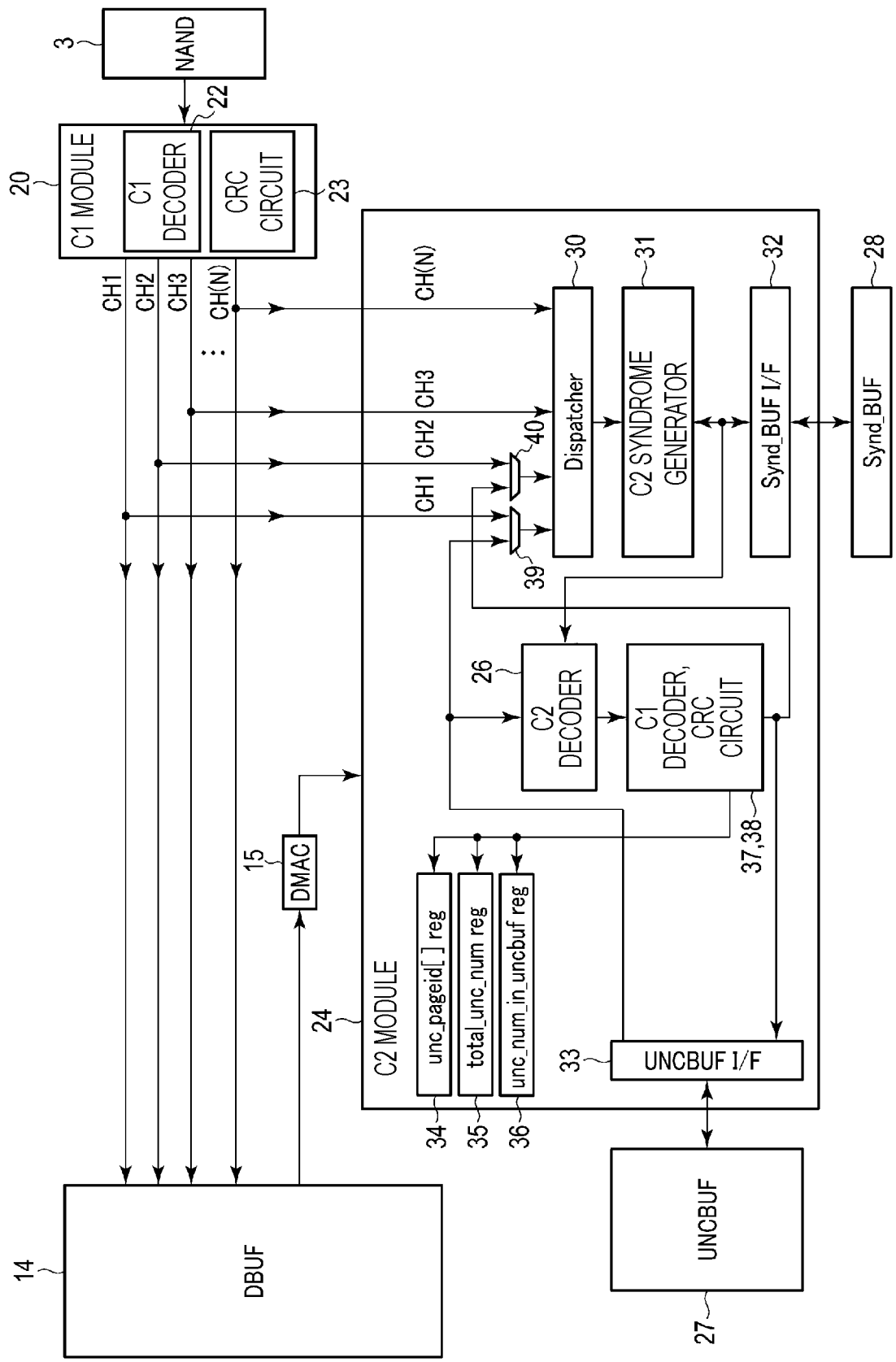
FIG. 18 is a block diagram illustrating a circuit configuration in which an iterative correction is performed, according to the first embodiment.

FIG. 18 is a block diagram illustrating a circuit configuration in which an iterative correction is performed, according to the embodiment. FIG. 18 mainly illustrates a circuit configuration in which an iterative correction is performed.

The C1 decoder 22 in the C1 module 20 performs a C1 correction on a C1 frame read from the NAND-type flash memory 3. The CRC circuit 23 in the C1 module 20 performs a CRC verification on the C1 frame whose error is corrected by the C1 decoder 22.

The C1 module 20 is connected to the data buffer (DBUF) 14 via N channels CH1 to CH(N). The N is an integer of 2 or more. The channels CH1 to CH(N) constitute a bus. The DBUF 14 stores the C1 frame subjected to the C1 correction and the CRC verification. In addition, the C1 module 20 is connected to the C2 module 24 via the N channels CH1 to CH(N). In the embodiment, a plurality of C1 frames is transferable in parallel by using the channels CH1 to CH(N).

The C2 module 24 includes the C2 decoder 26, a dispatcher 30, a C2 syndrome generator 31, a syndrome buffer (Synd_BUF) interface circuit (Synd BUF I/F) 32, an uncorrectable data buffer (UNCBUF) interface circuit (UNCBUF I/F) 33, a register array (unc_pageid[ ] reg) 34, a register (total_unc_num reg) 35, a register (unc_num_in_uncbuf reg) 36, the C1 decoder 37, the CRC circuit 38, and selectors 39 and 40.

The C2 module 24 includes the C1 decoder 37 for an LDPC code and the CRC circuit 38 so as to perform an iterative correction. The function of the C1 decoder 37 is the same as that of the C1 decoder 22 in the C1 module 20. The function of the CRC circuit 38 is the same as that of the CRC circuit 23 in the C1 module 20.

The dispatcher 30 receives data from the channels CH1 to CH(N) and the selectors 39 and 40. The dispatcher 30 controls the order of data to be transferred. The data output from the dispatcher 30 is transmitted to the C2 syndrome generator 31.

The C2 syndrome generator 31 generates a C2 syndrome. The C2 decoder 26 generates error information by using the C2 syndrome. The C2 syndrome generator 31 is connected to the interface circuit 32 and the C2 decoder 26.

The interface circuit 32 transmits/receives data to/from the syndrome buffer (Synd_BUF) 28. The Synd_BUF 28 temporarily stores the C2 syndrome generated by the C2 syndrome generator 31.

The interface circuit 33 transmits/receives data to/from the UNCBUF 27. The UNCBUF 27 temporarily stores data as a target of the iterative correction.

The selector 39 switches, for example, the channel CH1 and a path of the UNCBUF 27. The output of the selector 39 is connected to the dispatcher 30. The selector 40 switches the output of, for example, the channel CH2, the C1 decoder 37, and the CRC circuit 38. The output of the selector 40 is connected to the dispatcher 30. The selection operation of the selectors 39 and 40 is controlled by a selection signal sent from, for example, the processor 11.

A group of the registers 34 to 36 stores C1 frame information that is uncorrectable (also referred to as C1-uncorrectable information). Details of the information stored by the group of the registers 34 to 36 will be described later.

[1-7-2] Syndrome Generation Operation

Figure 19:
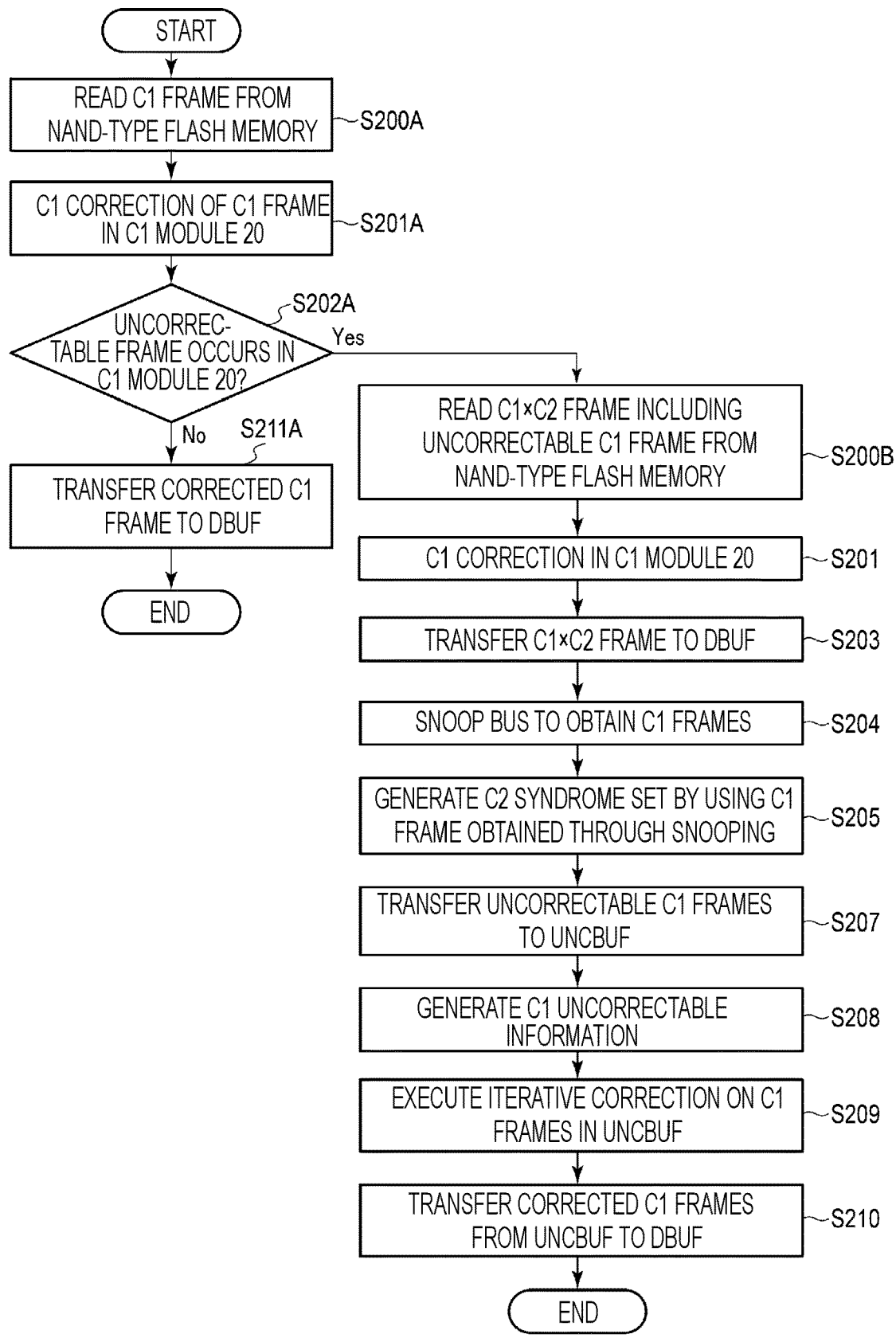
FIG. 19 is a flowchart illustrating the outline of the iterative correction according to the first embodiment.
Figure 20:
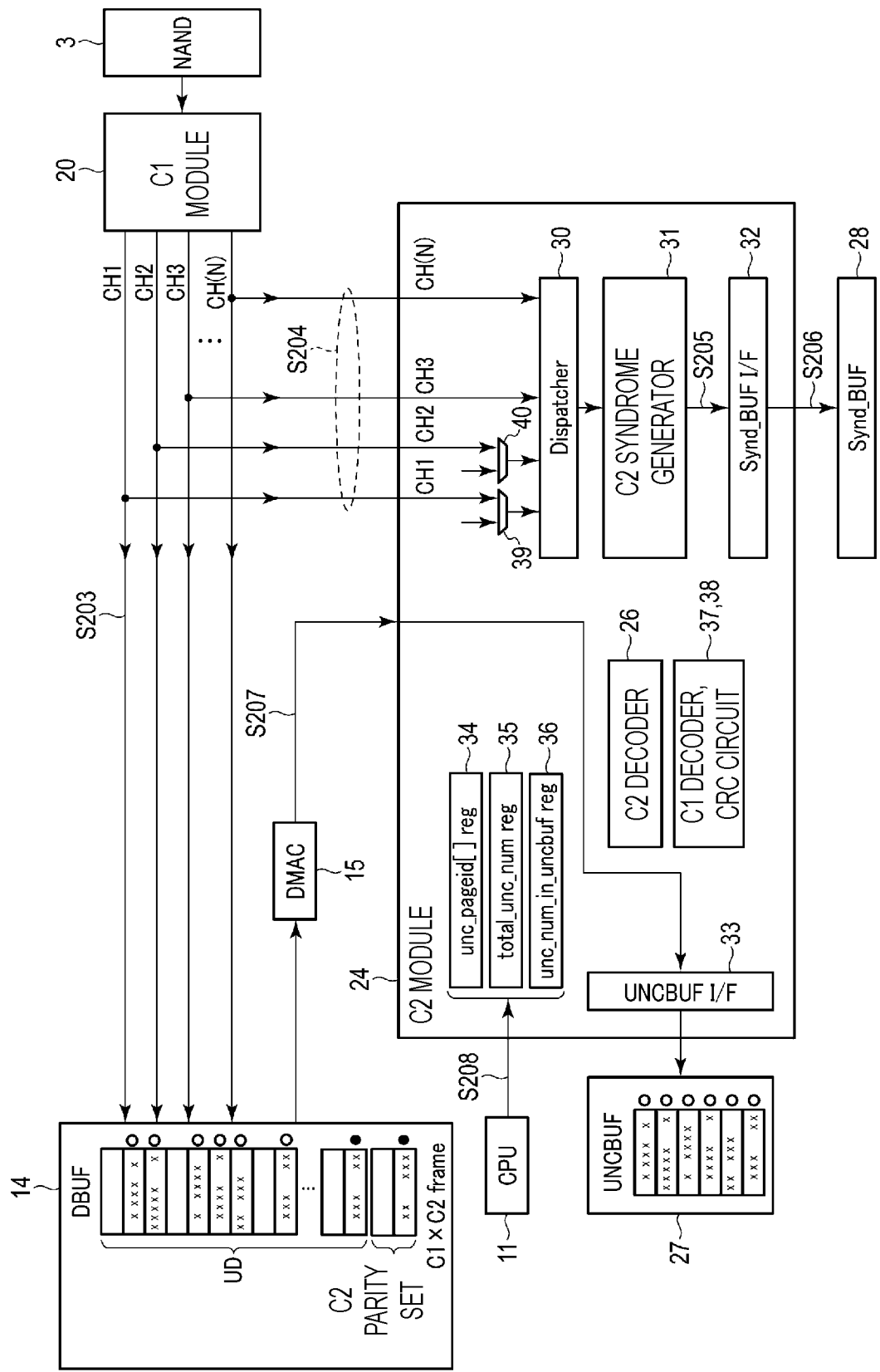
FIG. 20 is a view illustrating a data flow of a C2 syndrome generation according to the first embodiment.

FIG. 19 is a flowchart illustrating the outline of the iterative correction according to the embodiment. FIG. 20 is a view illustrating a data flow of a C2 syndrome generation according to the embodiment.

As illustrated in FIG. 19, the memory controller 4 reads a C1 frame from the NAND-type flash memory 3 (step S200A). The C1 module 20 performs a C1 correction on the read C1 frame (step S201A). When the corresponding C1 frame is correctable by the C1 correction (step S202A=No), the corresponding corrected C1 frame is transferred to the DBUF, and the process is ended (S211A). Meanwhile, when the corresponding C1 frame is uncorrectable by the C1 correction (step S202A=Yes), the memory controller 4 performs an iterative correction on a C1×C2 frame including the corresponding uncorrectable C1 frame. When the iterative correction is performed, a generation of a C2 syndrome is performed first, as preparation, by executing steps S200B, S201, S203, S204, and S205.

The processor 11 reads the C1×C2 frame including the corresponding uncorrectable C1 frame, from the NAND-type flash memory 3, in C1 frame units (step S200B).

The C1 module 20 performs a C1 correction (and CRC verification) on each C1 frame included in the read C1×C2 frame (step S201). The processor 11 transfers the C1×C2 frame to the DBUF 14 (step S203).

The C2 module 24 snoops the bus (channels CH1 to CH(N)) to obtain 255 C1 frames (constituting the C1×C2 frame) that are transferred through the bus (step S204). The C2 syndrome generator 31 generates a C2 syndrome set by using RS symbols included in the C1 frames obtained by snooping (step S205).

A specific operation of step S205 is as follows. The C2 module 24 snoops the bus to obtain a C1 frame in the first row in the C1×C2 frame including the correctable C1 frame and the uncorrectable C1 frame. The C2 module 24 generates a partial C2 syndrome on the RS symbol included in the C1 frame in the first row, which is obtained through snooping. The C2 module 24 stores the generated partial C2 syndrome in the Synd_BUF 28. The C2 module 24 snoops the bus to obtain a C1 frame in the second row in the C1×C2 frame. The C2 module 24 generates a partial C2 syndrome on the RS symbol included in the C1 frame in the second row, which is obtained through snooping. The C2 module 24 reads the partial C2 syndrome corresponding to the C1 frame in the first row, from the Synd_BUF 28. The C2 module 24 cumulatively adds the partial C2 syndrome corresponding to the C1 frame in the second row and the partial C2 syndrome corresponding to the C1 frame in the first row. The partial C2 syndrome as the cumulative sum will be referred to as a cumulative partial C2 syndrome, and is stored in the Synd_BUF 28. Similarly, the C2 module 24 generates partial C2 syndromes on RS symbols included in C1 frames in $3^{rd}$ to $255^{th}$ rows in the C1×C2 frame, and cumulatively adds the partial C2 syndromes and the cumulative partial C2 syndrome stored in the Synd_BUF 28 to update the cumulative partial C2 syndrome. A generation of the partial C2 syndrome on the RS symbol included in each C1 frame, and a cumulative addition of the generated partial C2 syndrome to the present cumulative partial C2 syndrome are performed on the 255 C1 frames included in the C1×C2 frame. The cumulative partial C2 syndrome obtained by executing the cumulative addition on the 255 C1 frames is a C2 syndrome.

The C2 syndrome is generated for each C2 frame in columns that make up the C1×C2 frame. A set of the C2 syndromes in the columns obtained in this manner corresponds to the C2 syndrome set described above.

The DMAC 15 transfers a portion of a plurality of uncorrectable C1 frames (i.e., errors are uncorrectable by the C1 module 20) from the DBUF 14 to the UNCBUF 27 (step S207). In the DBUF 14 and the UNCBUF 27 in FIG. 20, among the uncorrectable C1 frames (C1 frames including "x") stored in the DBUF 14, C1 frames transferred to the UNCBUF 27 are indicated by white circles, and C1 frames not transferred to the UNCBUF 27 are indicated by black circles.

The processor 11 generates C1-uncorrectable information (step S208). The processor 11 stores the C1-uncorrectable information in the group of the registers 34 to 36. The register array (unc_pageid[ ] reg) 34 stores an RS symbol number (hereinafter, referred to as a page number) of the C1 frame transferred to the UNCBUF 27, in the C1×C2 frame. An Nth element (unc_pageid[N]) of the register array (unc_pageid[ ] reg) 34 stores a page number of a C1 frame transferred to the UNCBUF 27 for an N-th time. In the example of FIG. 20, the page number stored in the register array 34 corresponds to the page number of the C1 frame indicated by the white circle in the DBUF 14. The register (total_unc_num reg) 35 stores the number (total_unc_num) of all the uncorrectable C1 frames among the C1 frames stored in the DBUF 14. In the example of FIG. 20, the number of the C1 frames stored in the register 35 corresponds to the sum of the numbers of the C1 frames indicated by the black circles and the white circles in the DBUF 14. The register (unc_num_in_uncbuf reg) 36 stores the number (unc_num_in_uncbuf) of the uncorrectable C1 frames transferred to the UNCBUF 27.

[1-7-3] Iterative Correction Operation

Figure 21:
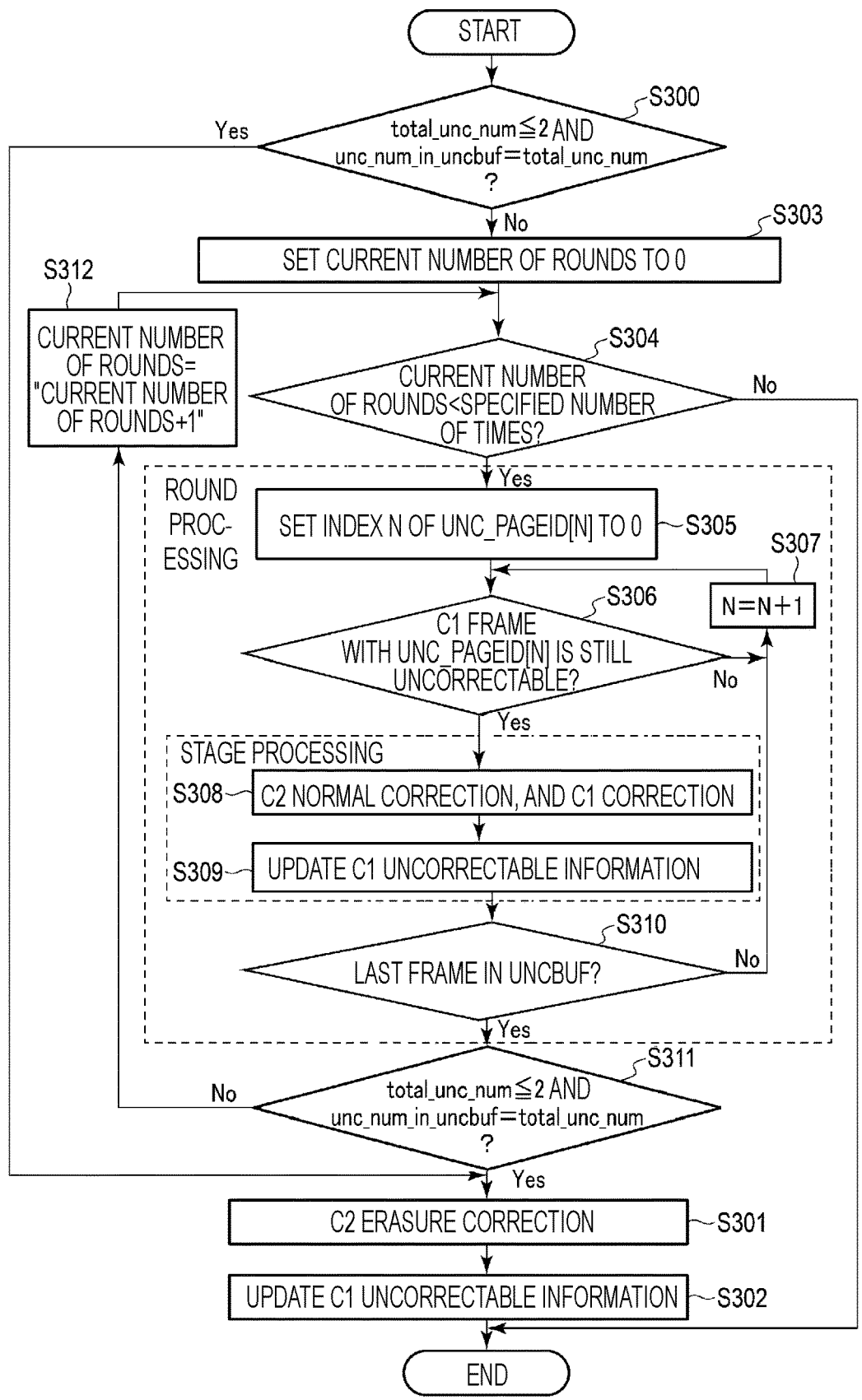
FIG. 21 is a flowchart illustrating the iterative correction operation according to the first embodiment.

FIG. 21 is a flowchart illustrating an iterative correction operation according to the embodiment. FIG. 21 illustrates an iterative correction operation on a C1×C2 frame, which is shown as step S209 in FIG. 19. After the iterative correction is performed, the corrected C1 frames are transferred from the UNCBUF 27 to the DBUF 14. Prior to the start of the iterative correction operation, a C2 syndrome set is created for the C1×C2 frame as a target of the iterative operation, and stored in the Synd_BUF 28.

The C2 module 24 determines whether both of following conditions 1 and 2 are satisfied (step S300).

(Condition 1): The number (total_unc_num) of C1 frames indicated by the value stored in the register 35 is 2 or less.

(Condition 2): The number (unc_num_in_uncbuf) of C1 frames indicated by the value stored in the register 36 is equal to the number (total_unc_num) of C1 frames stored in the register 35.

In the condition 1, it is determined whether the number of uncorrectable C1 frames included in the C1×C2 frame is 2 or less. That is, the condition 1 indicates that a condition for C2 erasure correction is satisfied. The condition 2 indicates that all uncorrectable C1 frames stored in the DBUF 14 are transferred to the UNCBUF 27.

When it is determined that the conditions in step S300 are satisfied (step S300=Yes), the iterative correction is unnecessary, and the C2 decoder 26 executes the C2 erasure correction (step S301). Details of step S301 will be described later. The C2 module 24 updates C1-uncorrectable information stored in the group of the registers 34 to 36 (step S302). The updated C1-uncorrectable information consists of the above described information "unc_pageid[N]," "total_unc_num," and "unc_num_in_uncbuf."

Figure 22:
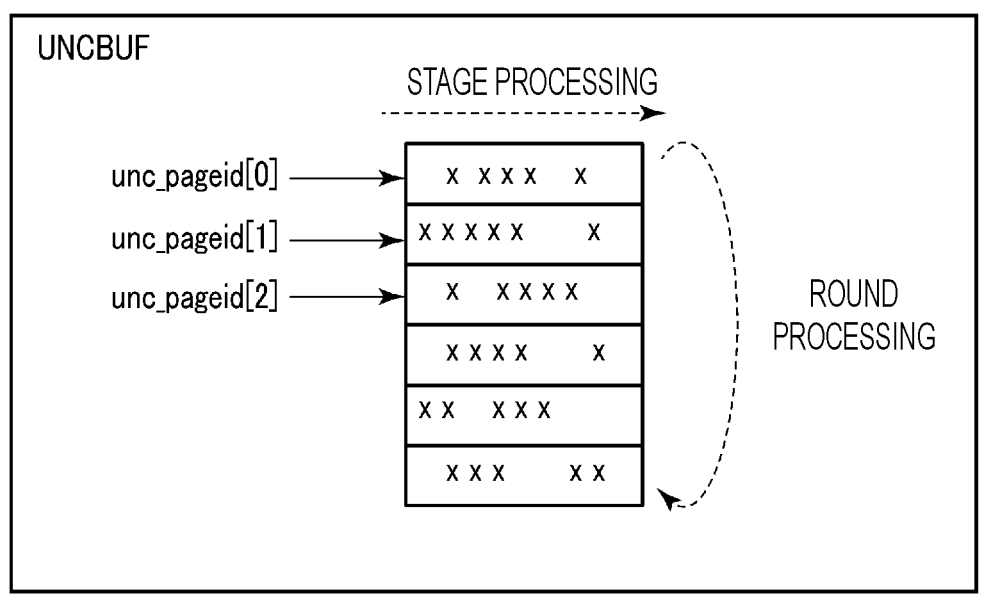
FIG. 22 is a view illustrating a relationship among a page number, a stage processing, and a round processing according to the first embodiment.

When it is determined that the conditions in step S300 are not satisfied (step S300=No), the iterative correction is performed. That is, the C2 module 24 sets the current number of rounds to zero (step S303). FIG. 22 is a view illustrating a relationship between a page number unc_pageid[N], a stage processing, and a round processing according to the embodiment. The stage processing is a processing of performing (A) the C1 correction on one uncorrectable C1 frame, (B) the C2 correction on a C2 frame including a C2 symbol included in the corresponding C1 frame, and (C) update of C1-uncorrectable information on the basis of results of the corresponding C1 correction and the corresponding C2 correction. The round processing is a processing in which the stage processing is applied once to each of all uncorrectable C1 frames in the UNCBUF 27. The current number of rounds indicates the current number of times of the round processing.

Referring back to FIG. 21, the C2 module 24 determines whether the current number of rounds is less than the specified number of times (step S304). When it is determined that the current number of rounds is equal to or larger than the specified number of times (step S304=No), the C2 module 24 ends the iterative correction.

When it is determined that the current number of rounds is less than the specified number of times (step S304=Yes), the C2 module 24 sets an index N of the register array (unc_pageid[ ]) 34 to zero (step S305).

The C2 module 24 determines whether a C1 frame with the page number unc_pageid[N] is still uncorrectable (step S306).

When it is determined that the C1 frame with the page number unc_pageid[N] is still uncorrectable (step S306=Yes), the C2 module 24 performs the C2 normal correction on a C2 frame including a C2 symbol included in the corresponding C1 frame, and the C1 correction on the corresponding C1 frame (step S308). Details of step S308 will be described later.

The C2 module 24 updates information of the register array 34 and the registers 35 and 36, that is, the page number unc_pageid[N], the number of all uncorrectable C1 frames total_unc_num, and the number of uncorrectable C1 frames in the UNCBUF unc_num_in_uncbuf (step S309).

The C2 module 24 determines whether the C1 frame with the page number unc_pageid[N] as a target of the current stage processing is the last C1 frame in the UNCBUF 27, that is, whether one round processing is ended (step S310). When it is determined that one round processing is not ended (step S310=No), the C2 module 24 adds 1 to N of the page number unc_pageid[N] (step S307). Then, the C2 module 24 repeats the stage processing including S308 and S309 in FIG. 21.

When it is determined that the C1 frame with the page number unc_pageid[N] is correctable (step S306=No), the process proceeds to step S307.

When it is determined that one round processing is ended (step S310=Yes), the C2 module 24 determines the condition 1 and the condition 2 described in step S300 again (step S311).

When it is determined that the conditions in step S311 are not satisfied (step S311=No), the C2 module 24 adds 1 to the current number of rounds (step S312). Then, the C2 module 24 repeats the round processing beginning at step S304.

When it is determined that the conditions in step S311 are satisfied (step S311=Yes), the process proceeds to step S301. Although omitted in FIG. 21, C1 frames stored in the DBUF 14 and C1 frames stored in the UNCBUF 27 may be replaced. For example, after step S304=No, it is determined whether to replace contents of the UNCBUF 27. When it is determined to replace the contents of the UNCBUF 27, after some C1 frames stored in the UNCBUF 27 and some C1 frames stored in the DBUF 14 are replaced, the process may be returned to step S300. When it is determined not to replace the contents of the UNCBUF 27, the iterative correction operation is ended at that point.

[1-7-4] Normal Correction Operation

Figure 23:
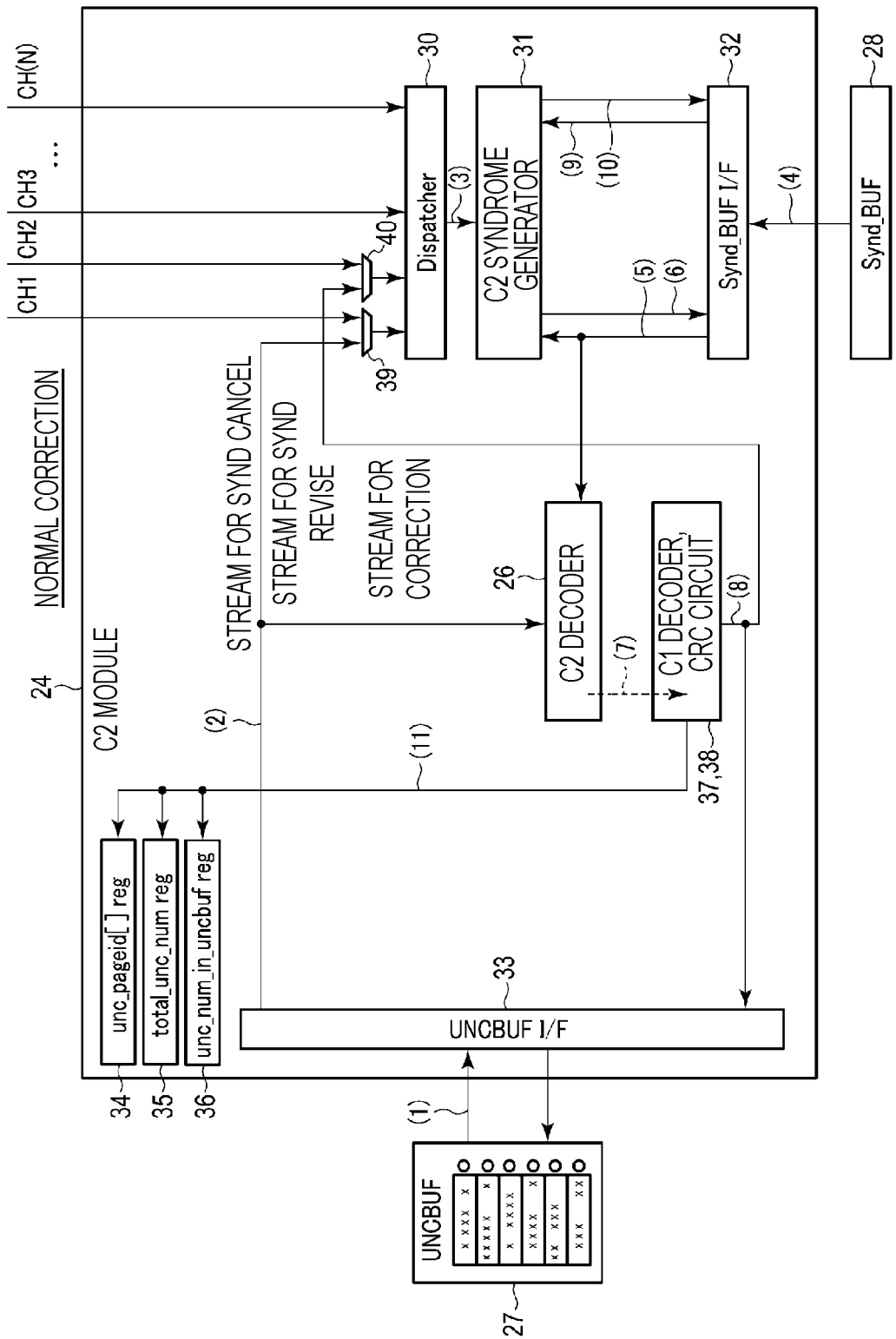
FIG. 23 is a view illustrating a data flow of the C2 normal correction according to the first embodiment.

Next, descriptions will be made on the operation in step S308 in FIG. 21, that is, C2 normal correction and C1 correction. FIG. 23 is a view illustrating a data flow of C2 normal correction according to the embodiment. White circles in the UNCBUF 27 in FIG. 23 correspond to white circles in the UNCBUF 27 in FIG. 20.

The C2 module 24 reads a correction target C1 frame from the UNCBUF 27 (step (1) in FIG. 23). The correction target C1 frame is a C1 frame as a target of a certain stage processing. Then, the C2 module 24 transfers the correction target C1 frame to the C2 decoder 26 and to the selector 39 (step (2) in FIG. 23). In FIG. 23, a path through which the correction target C1 frame is transferred to the C2 decoder 26 is denoted as "stream for correction," and a path through which the correction target C1 frame is transferred to the selector 39 is denoted as "stream for syndrome cancellation (stream for Synd cancel)." The selector 39 and the dispatcher 30 send the correction target C1 frame to the C2 syndrome generator 31 (step (3) in FIG. 23). In the embodiment, as an example, a channel CH1 is used for syndrome cancellation.

For each C2 symbol included in the correction target C1 frame, the C2 module 24 reads a C2 syndrome generated for a C2 frame including the C2 symbol, in a C2 syndrome set stored in the Synd_BUF 28 (step (4) in FIG. 23). Then, the C2 module 24 transfers the corresponding C2 syndrome (hereinafter, also referred to as an original C2 syndrome) from the Synd_BUF 28 to the C2 syndrome generator 31 and the C2 decoder 26 (step (5) in FIG. 23).

The C2 syndrome generator 31 cancels a partial C2 syndrome corresponding to the C2 symbol included in the correction target C1 frame, in the original C2 syndrome, that is, sets the partial C2 syndrome to zero. A C2 syndrome obtained by cancelling the partial C2 syndrome in the original C2 syndrome will be referred to as a cancellation C2 syndrome. Next, the C2 syndrome generator 31 transfers the cancellation C2 syndrome to the Synd_BUF 28 (step (6) in FIG. 23).

The C2 decoder 26 performs the C2 normal correction on the C2 frame including the C2 symbol included in the correction target C1 frame by using the original C2 syndrome. Here, the C2 normal correction by the C2 decoder 26 is performed on only user data in the C1 frame, and is not performed on a CRC parity and a C1 parity part. Then, the C1 decoder 37 performs the C1 correction on the correction target C1 frame (step (7) in FIG. 23).

The C2 module 24 transfers the corrected correction target C1 frame to the UNCBUF 27 and to the selector 40 (step (8) in FIG. 23). In FIG. 23, a path through which the corrected correction target C1 frame is transferred to the selector 40 is denoted as "stream for syndrome update (stream for Synd revise)." In the embodiment, as an example, a channel CH2 is used for syndrome update. The selector 40 and the dispatcher 30 send the corrected correction target C1 frame to the C2 syndrome generator 31.

The C2 module 24 reads the cancellation C2 syndrome from the Synd_BUF 28. Then, the C2 module 24 transfers the cancellation C2 syndrome from the Synd_BUF 28 to the C2 syndrome generator 31 (step (9) in FIG. 23).

The C2 syndrome generator 31 generates a partial C2 syndrome corresponding to a C2 symbol included in the corrected correction target C1 frame received through the stream for syndrome update. The C2 syndrome generator 31 executes an exclusive OR operation of the generated partial C2 syndrome and the cancellation C2 syndrome read in step (9), to update the original C2 syndrome. Details of an operation of updating the original C2 syndrome will be described later. The C2 syndrome generator 31 transfers the updated C2 syndrome to the Synd_BUF 28 (step (10) in FIG. 23).

The C2 module 24 updates C1-uncorrectable information (UNC info) stored in the register array 34 and the registers 35 and 36 (step (11) in FIG. 23).

The C2 module 24 executes step (1) to step (11) of FIG. 23 on all C2 symbols included in the correction target C1 frame.

[1-7-5] Erasure Correction Operation

Figure 24:
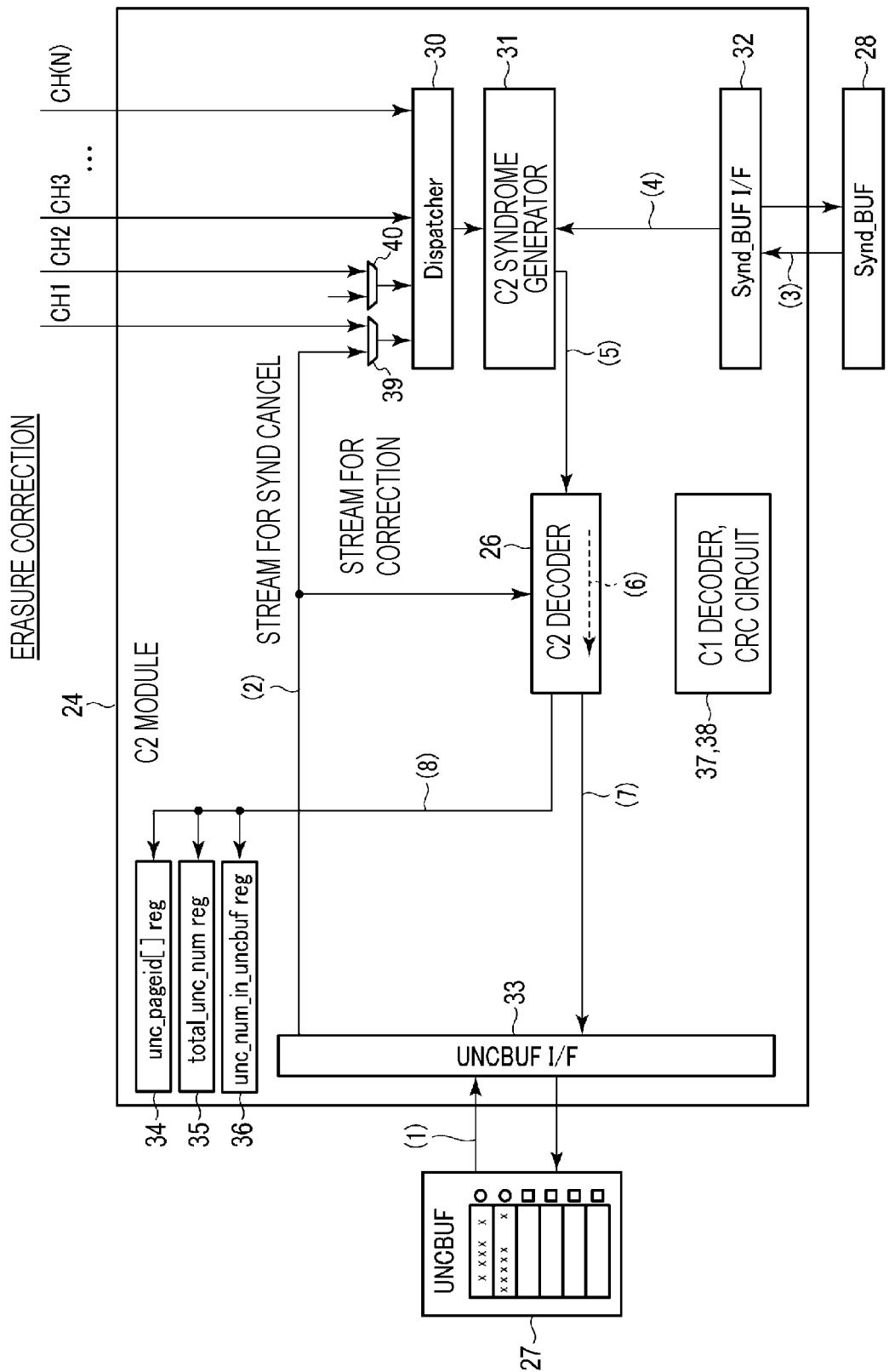
FIG. 24 is a view illustrating a data flow of the C2 erasure correction according to the first embodiment.

Next, descriptions will be made on the operation in step S301 in FIG. 21, that is, a C2 erasure correction. FIG. 24 is a view illustrating a data flow of the C2 erasure correction according to the embodiment. White circles in the UNCBUF 27 in FIG. 24 indicate C1 frames that are still uncorrectable even with the C2 normal correction and the C1 correction. White squares in the UNCBUF 27 in FIG. 24 indicate C1 frames corrected by the C2 normal correction and the C1 correction.

The C2 module 24 reads a correction target C1 frame from the UNCBUF 27 (step (1) in FIG. 24). Then, the C2 module 24 transfers the correction target C1 frame to the C2 decoder 26 through the stream for correction, and to the selector 39 through the stream for syndrome cancellation (step (2) in FIG. 24).

For each C2 symbol included in the correction target C1 frame, the C2 module 24 reads an original C2 syndrome generated for a C2 frame including the C2 symbol, in a C2 syndrome set stored in the Synd_BUF 28 (step (3) in FIG. 24). Then, the C2 module 24 transfers the corresponding original C2 syndrome from the Synd_BUF 28 to the C2 syndrome generator 31 (step (4) in FIG. 24).

The C2 syndrome generator 31 cancels a partial C2 syndrome corresponding to the C2 symbol included in the correction target C1 frame, in the original C2 syndrome, that is, sets the partial C2 syndrome to zero. Then, a cancellation C2 syndrome is obtained. Next, the C2 syndrome generator 31 transfers the cancellation C2 syndrome to the C2 decoder 26 (step (5) in FIG. 24).

The C2 decoder 26 performs the C2 erasure correction on the C2 frame including the C2 symbol included in the correction target C1 frame by using the cancellation C2 syndrome (step (6) in FIG. 24). Here, the C2 erasure correction by the C2 decoder 26 is performed on only user data in the C1 frame, and is not performed on a CRC parity and a C1 parity part.

The C2 module 24 transfers the corrected C1 frame to the UNCBUF 27 (step (7) in FIG. 24).

The C2 module 24 updates C1-uncorrectable information (UNC info) stored in the register array 34 and the registers 35 and 36 (step (8) in FIG. 24).

The C2 module 24 executes step (1) to step (8) of FIG. 24, on all C2 symbols included in the correction target C1 frame.

[1-8] Syndrome Update Operation

Next, detailed descriptions will be made on the C2 syndrome update operation described above with reference FIG. 23. An operation of sequentially updating C2 syndromes will be referred to as the C2 syndrome update operation.

[1-8-1] Circuit Configuration for Syndrome Update

Figure 25:
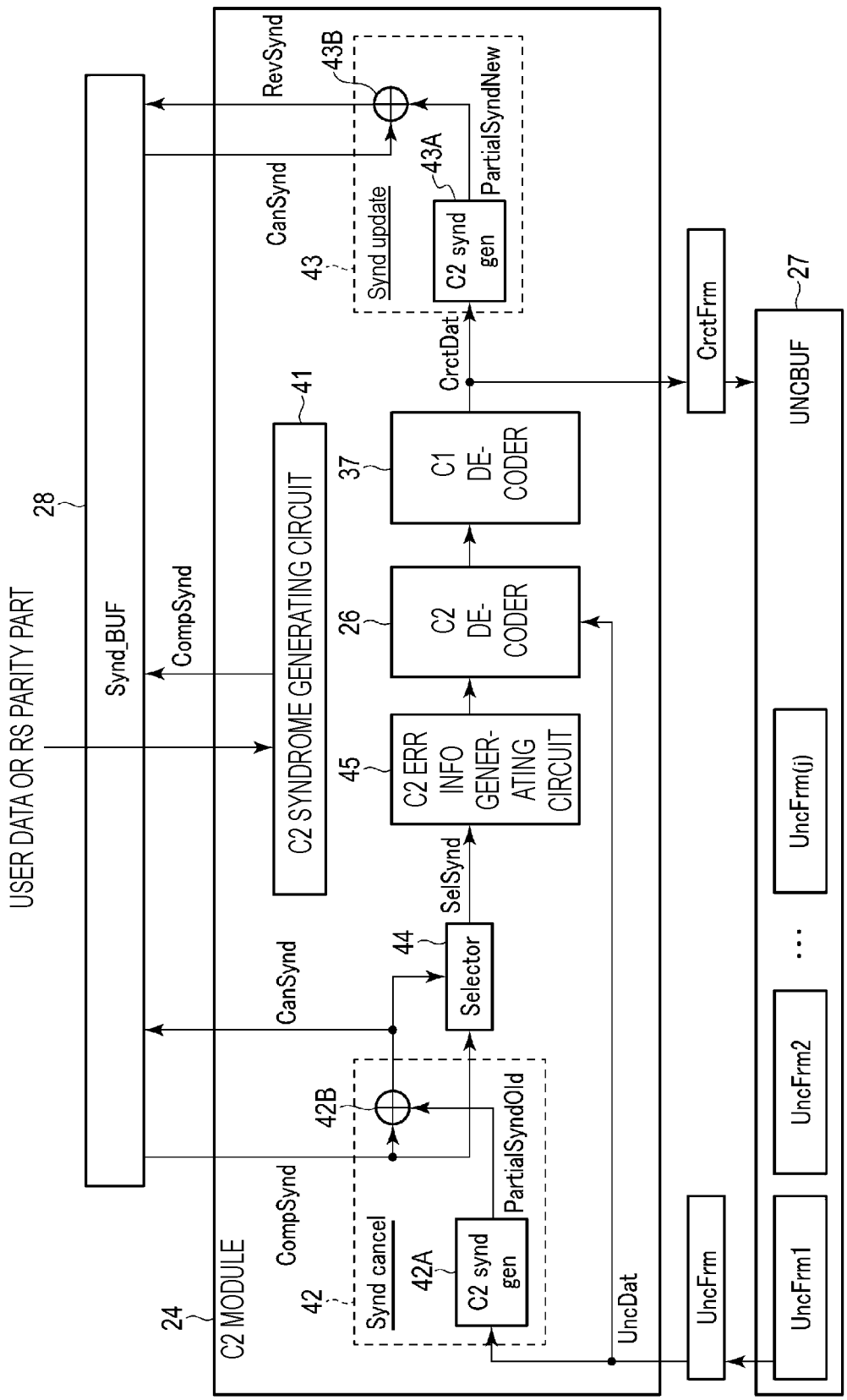
FIG. 25 is a block diagram illustrating circuits that perform a C2 syndrome update operation according to the first embodiment.

FIG. 25 is a block diagram illustrating circuits of performing the C2 syndrome update operation according to the embodiment. FIG. 25 mainly illustrates circuits of performing the syndrome update operation. The C2 syndrome update operation is performed mainly by the C2 module 24.

The C2 module 24 includes a C2 syndrome generating circuit 41, a syndrome cancelling circuit 42, a syndrome updating circuit 43, a selector 44, a C2 error information (C2 err info) generating circuit 45, the C2 decoder 26, and the C1 decoder 37. The C2 syndrome generating circuit 41, the syndrome cancelling circuit 42, and the syndrome updating circuit 43 are provided in the C2 syndrome generator 31 illustrated in FIG. 18.

The C2 module 24 is connected to the UNCBUF 27 and the Synd_BUF 28. The interface circuit 32 for the Synd_BUF 28 and the interface circuit 33 for the UNCBUF 27 are omitted in illustration.

The UNCBUF 27 stores C1 frames uncorrectable by the C1 correction. In the example of FIG. 25, the UNCBUF 27 stores j uncorrectable C1 frames UncFrm1 to UncFrm(j).

The C2 syndrome generating circuit 41 generates an original C2 syndrome for each C2 frame which includes user data in each of a plurality of (e.g., 255) C1 frames obtained through snooping a bus, and an RS parity part. Each original C2 syndrome is generated from each of C2 frames constituting a C1×C2 frame. The original C2 syndrome is obtained by cumulatively adding partial C2 syndromes on all C2 symbols included in each C2 frame by exclusive OR. Therefore, the original C2 syndrome may be referred to as a complete C2 syndrome. The complete C2 syndrome CompSynd is transferred to the Synd_BUF 28.

The syndrome cancelling circuit 42 generates a cancellation C2 syndrome CanSynd. The cancellation C2 syndrome CanSynd is a syndrome obtained by cancelling a partial C2 syndrome corresponding to a C2 symbol included in the correction target C1 frame, in the complete C2 syndrome CompSynd. The syndrome cancelling circuit 42 includes a C2 syndrome generating circuit (C2 synd gen) 42A and an exclusive OR circuit 42B. The C2 syndrome generating circuit 42A is functionally identical to the C2 syndrome generating circuit 41, and the circuit may be shared.

The C2 syndrome generating circuit 42A reads a correction target C1 frame UncFrm from the UNCBUF 27. The correction target C1 frame UncFrm is any one of the uncorrectable C1 frames UncFrm1 to UncFrm(j). The C2 syndrome generating circuit 42A generates each partial C2 syndrome PartialSyndOld from each C2 symbol UncDat included in the correction target C1 frame UncFrm.

The exclusive OR circuit 42B receives the partial C2 syndrome PartialSyndOld from the C2 syndrome generating circuit 42A, and receives the complete C2 syndrome CompSynd from the Synd_BUF 28. The exclusive OR circuit 42B performs an exclusive OR operation by using the complete C2 syndrome CompSynd and the partial C2 syndrome PartialSyndOld. As a result of the exclusive OR operation, in the complete C2 syndrome CompSynd, a portion corresponding to the C2 symbol UncDat included in the correction target C1 frame UnCFrm becomes zero. By the exclusive OR operation, a cancellation C2 syndrome CanSynd is obtained. The exclusive OR circuit 42B outputs the cancellation C2 syndrome CanSynd. The cancellation C2 syndrome CanSynd is stored in the Synd_BUF 28 and sent to the selector 44.

The selector 44 receives the complete C2 syndrome CompSynd from the Synd_BUF 28, and receives the cancellation C2 syndrome CanSynd from the syndrome cancelling circuit 42. The C2 module 24 selects either the complete C2 syndrome CompSynd or the cancellation C2 syndrome CanSynd by the selector 44, according to whether the C2 correction is performed by the normal correction or by the erasure correction. The selector 44 selects the complete C2 syndrome CompSynd in the case of normal correction, or selects the cancellation C2 syndrome CanSynd in the case of erasure correction. As a result of the selection, the selector 44 outputs the selected syndrome SelSynd.

The C2 error information generating circuit 45 receives the selected syndrome SelSynd from the selector 44. The C2 error information generating circuit 45 generates error information (error info) based on a C2 code by using the selected syndrome SelSynd. The contents of the error information are the same as those described above with reference to FIG. 5.

The C2 decoder 26 uses each C2 symbol UncDat included in the correction target C1 frame UncFrm read from the UNCBUF 27, and the error information corresponding to the corresponding C2 symbol UncDat from the C2 error information generating circuit 45, so as to perform the C2 correction on the corresponding C2 symbol UncDat.

The C1 decoder 37 performs the C1 correction on the correction target C1 frame UncFrm. The C1 decoder 37 outputs the C1 frame after the correction (referred to as the corrected C1 frame) CrctFrm. After the C1 correction by the C1 decoder 37, the CRC verification is performed by the CRC circuit 38, which is omitted in the illustration.

The syndrome updating circuit 43 includes a C2 syndrome generating circuit (C2 synd gen) 43A and an exclusive OR circuit 43B. The C2 syndrome generating circuit 43A is functionally identical to the C2 syndrome generating circuit 41, and the circuit may be shared.

The C2 syndrome generating circuit 43A receives each C2 symbol CrctDat included in the corrected C1 frame CrctFrm, from the C1 decoder 37. The C2 syndrome generating circuit 43A generates each partial C2 syndrome PartialSyndNew (hereinafter, also referred to as an updated partial C2 syndrome) corresponding to the corresponding C2 symbol CrctDat.

The exclusive OR circuit 43B receives the updated partial C2 syndrome PartialSyndNew from the C2 syndrome generating circuit 43A, and receives the cancellation C2 syndrome CanSynd from the Synd_BUF 28. The exclusive OR circuit 43B performs an exclusive OR operation by using the cancellation C2 syndrome CanSynd and the updated partial C2 syndrome PartialSyndNew. An updated complete C2 syndrome generated by the exclusive OR operation will be referred to as an updated complete C2 syndrome RevSynd. The exclusive OR circuit 43B outputs the updated complete C2 syndrome RevSynd. The updated complete C2 syndrome RevSynd is stored in the Synd_BUF 28.

[1-8-2] Details of Syndrome Update Operation

Figure 26:
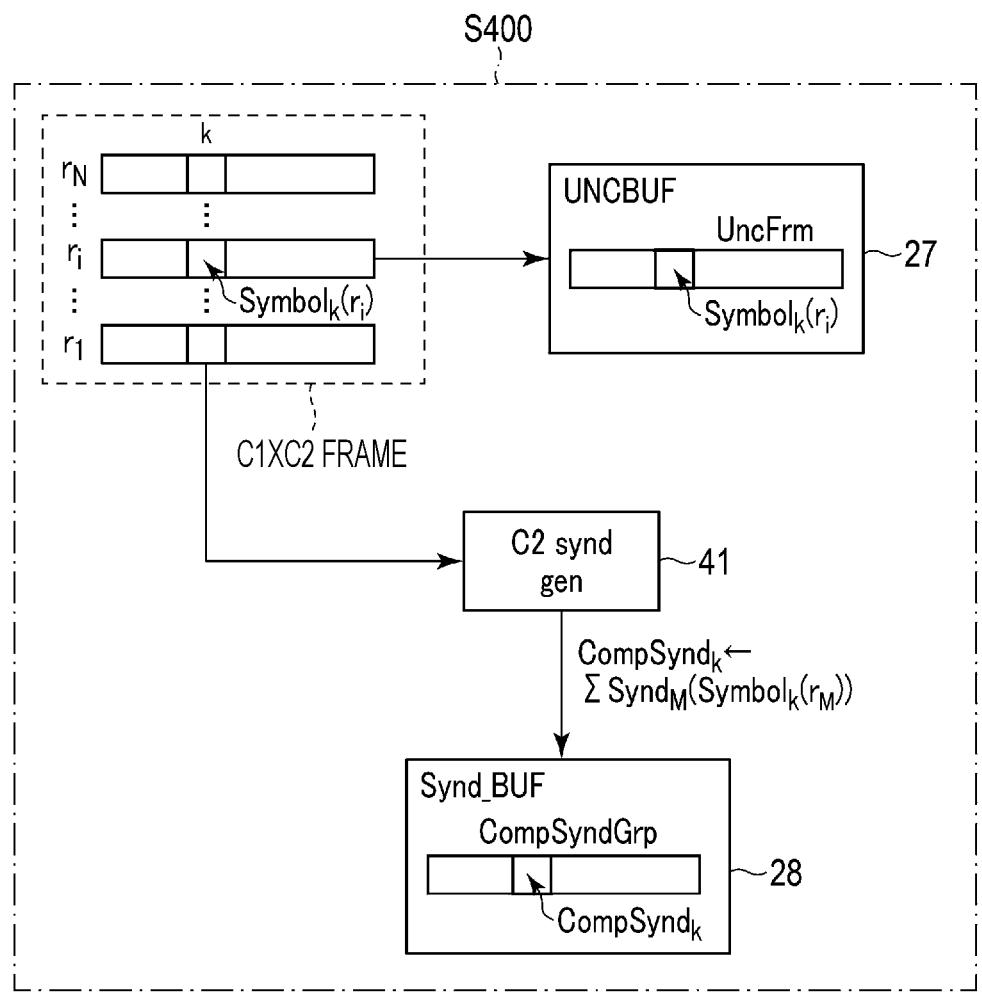
FIG. 26 is a view illustrating the C2 syndrome update operation according to the first embodiment.

Next, descriptions will be made on details of a C2 syndrome update operation according to the embodiment with reference to FIGS. 26 to 28. The C2 syndrome update operation is performed in order of steps S400 to S404 illustrated in FIGS. 26 to 28.

First, a preparation of the iterative correction will be described. As illustrated in FIG. 26, the C2 syndrome generating circuit (C2 synd gen) 41 receives all C1 frames constituting a C1×C2 frame by a snooping operation. The C1 frames constituting the C1×C2 frame will be denoted as $r_0, r_1, \ldots, r_i, \ldots, r_N$. A correction target C1 frame will be denoted as $r_i$. When a C2 code is an RS code, N=254. The C2 syndrome generating circuit 41 generates a complete C2 syndrome (hereinafter, denoted as $CompSynd_k$) generated by a C2 symbol (hereinafter, denoted as $Symbol_k(r_M)$). The "M" is one integer of 0 to N) located at a k-th position of each of the C1 frames $r_0, r_1, \ldots, r_i, \ldots, r_N$. The "k" is one integer of 0 to 4K+α as described above with reference to, for example, FIG. 6A. The C2 syndrome generating circuit 41 transfers the complete C2 syndrome $CompSynd_k$ to the Synd_BUF 28. The generation of the complete C2 syndrome $CompSynd_k$ and the transfer to the Synd_BUF 28 are repeated in the row direction of the corresponding C1×C2 frame. Accordingly, the Synd_BUF 28 stores a complete C2 syndrome set CompSyndGrp that is a set of complete C2 syndromes $CompSynd_k$ on all C2 frames constituting the corresponding C1×C2 frame (step S400 in FIG. 26). The correction target C1 frame $r_i$ is transferred from the DBUF 14 to the UNCBUF 27 by the DMAC 15 illustrated in FIG. 18.

The complete C2 syndrome $CompSynd_k$ may be obtained by the following syndrome polynomials.

$$S_k(x) = Synd_N(Symbol_k(r_N)) + \ldots + Synd_i(Symbol_k(r_i)) + \ldots + Synd_1(Symbol_k(r_1)) + Synd_0(Symbol_k(r_0))$$

That is, the syndrome polynomials are expressed as a sum of polynomials (hereinafter, referred to as partial syndrome polynomials) $Synd_M(Symbol_k(r_M))$ corresponding to C2 symbols located at k-th positions of the correction target C1 frames $r_0, r_1, \ldots, r_i, \ldots, r_N$, and the complete C2 syndrome $CompSynd_k$ may be obtained by putting elements of a finite field into the syndrome polynomials as necessary according to the correction capability, etc. Here, an addition symbol indicates the sum of finite field coefficient polynomials. When a vector expression is employed as an expression of a finite field element, the addition symbol indicates an exclusive OR operation. Hereinafter, it is assumed that a vector expression is employed as an expression of a finite field element.

Subsequently, the iterative correction is performed. As illustrated in step S401 of FIG. 27, the C2 module 24 reads the correction target C1 frame $r_i$ from the UNCBUF 27. Further, the C2 module 24 reads the complete C2 syndrome $CompSynd_k$ corresponding to a k-th C2 frame in the complete C2 syndrome set CompSyndGrp stored in the Synd_BUF 28.

Figure 27:
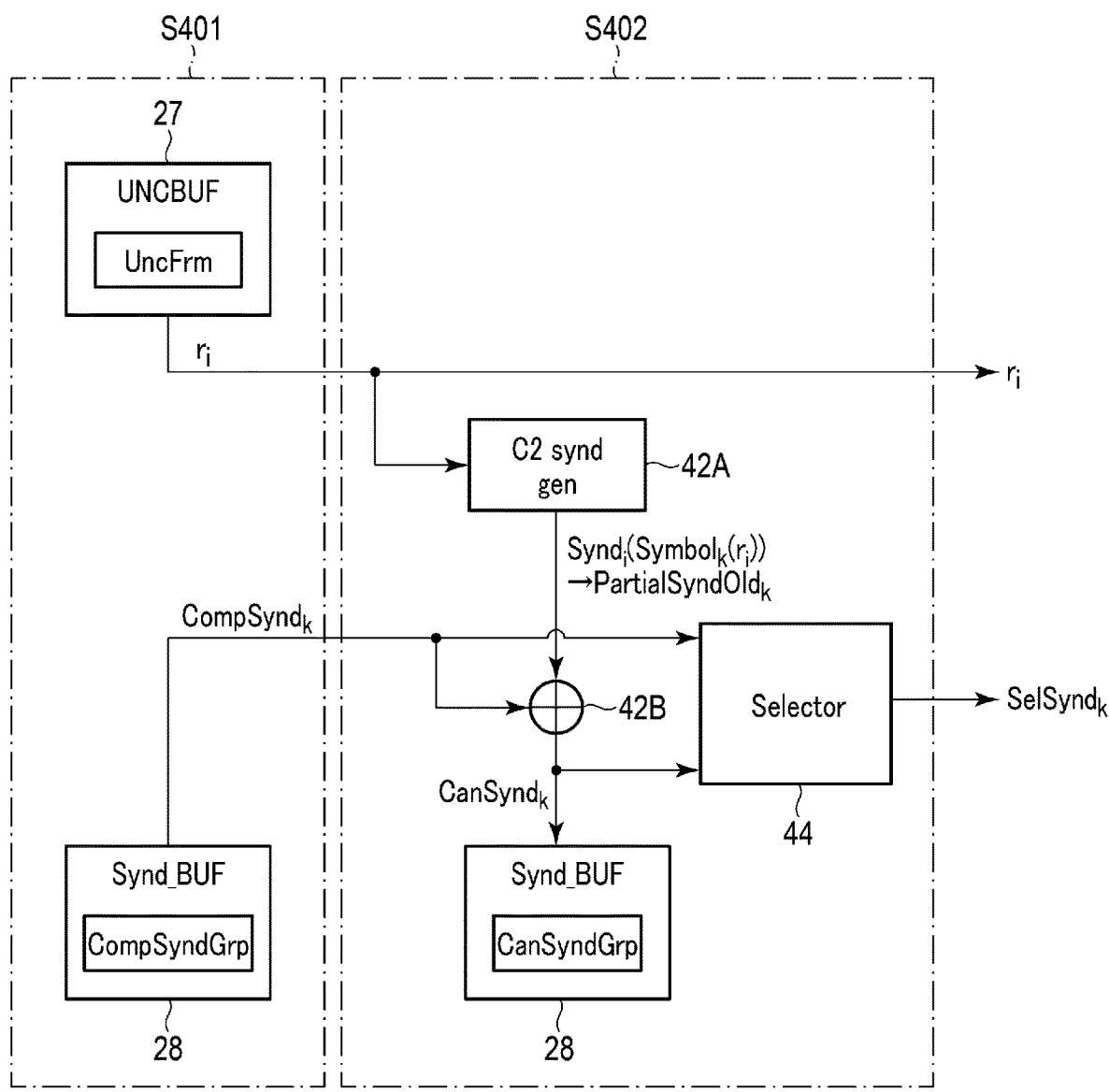
FIG. 27 is a view illustrating the C2 syndrome update operation according to the first embodiment.

As illustrated in step S402 of FIG. 27, the C2 syndrome generating circuit 42A generates a partial syndrome polynomial $Synd_i(Symbol_k(r_i))$ on the C2 symbol located at the k-th position in the correction target C1 frame $r_i$. The C2 syndrome generating circuit 42A generates a partial C2 syndrome $PartialSyndOld_k$ by using the generated partial syndrome polynomial. The exclusive OR circuit 42B performs an exclusive OR operation by using the complete C2 syndrome $CompSynd_k$ and the partial C2 syndrome $PartialSyndOld_k$. Then, the exclusive OR circuit 42B generates a cancellation C2 syndrome $CanSynd_k$.

The cancellation C2 syndrome $CanSynd_k$ may be obtained by the following syndrome polynomials.

$$S_k(x) = Synd_N(Symbol_k(r_N)) + \ldots Synd_{i+1}(Symbol_k(r_{i+1})) + 0 + Syn\ d_{i-1}(Symbol_k(r_{i-1})) + \ldots + Synd_1(Symbol_k(r_1)) + Synd_0(Symbol_k(r_0))$$

That is, polynomials of generating the cancellation C2 syndrome $CanSynd_k$ are obtained by cancelling the partial syndrome polynomial $Synd_i(Symbol_k(r_i))$ corresponding to the C2 symbol included in the correction target C1 frame $r_i$, from the syndrome polynomials of generating the complete C2 syndrome $CompSynd_k$. This may be used to obtain the cancellation C2 syndrome $CanSynd_k$. The exclusive OR circuit 42B transfers the cancellation C2 syndrome $CanSynd_k$ to the selector 44 and the Synd_BUF 28. The generation of the cancellation C2 syndrome $CanSynd_k$ and the transfer to the Synd_BUF 28 are repeated in the row direction of the corresponding C1×C2 frame. Accordingly, the Synd_BUF 28 stores a C2 syndrome set CanSyndGrp that is a set of cancellation C2 syndromes $CanSynd_k$ on all the C2 frames constituting the corresponding C1×C2 frame.

The selector 44 selects either the complete C2 syndrome $CompSynd_k$ or the cancellation C2 syndrome $CanSynd_k$ on the basis of a selection signal sent from the processor 11, and outputs the selected syndrome $SelSynd_k$. As described above, the selector 44 is controlled to select the complete C2 syndrome $CompSynd_k$ in the case of normal correction, and to select the cancellation C2 syndrome $CanSynd_k$ in the case of erasure correction.

In general, when the C2 normal correction is performed, a syndrome is generated by using all C2 symbols. Meanwhile, when the C2 erasure correction is performed, an error correction is performed by using a C2 symbol group from which C2 symbols treated as being erased are excluded. In the cancellation C2 syndrome $CanSynd_k$ in the embodiment, the partial C2 syndrome corresponding to the partial syndrome polynomial $Synd_i(Symbol_k(r_i))$, which is included in the complete C2 syndrome $CompSynd_k$, is cancelled. Therefore, it is possible to perform the C2 erasure correction by using the cancellation C2 syndrome $CanSynd_k$.

Figure 28:
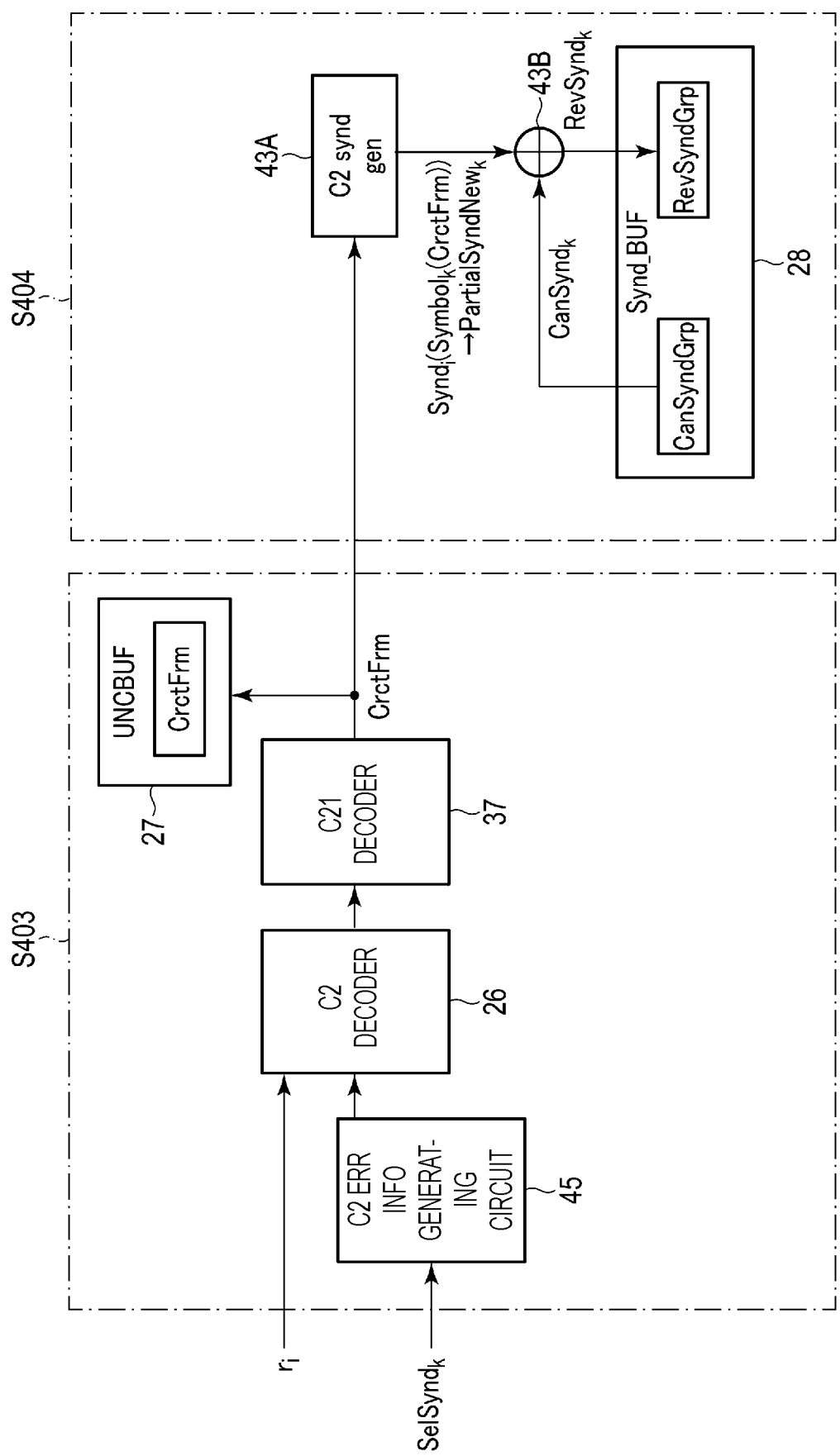
FIG. 28 is a view illustrating the C2 syndrome update operation according to the first embodiment.

As illustrated in step S403 of FIG. 28, the C2 error information generating circuit 45 generates C2 error information by using the selected syndrome $SelSynd_k$.

The C2 decoder 26 corrects an error of the C2 symbol included in the correction target C1 frame $r_i$ by using a C2 correction algorithm. The C1 decoder 37 corrects an error of the correction target C1 frame $r_i$ by using a C1 correction algorithm. The C2 module 24 transfers the corrected C1 frame CrctFrm to the UNCBUF 27.

As illustrated in step S404 of FIG. 28, the C2 syndrome generating circuit 43A generates a partial syndrome polynomial $Synd_i(Symbol_k(CrctFrm))$ corresponding to the C2 symbol located at the k-th position in the corrected C1 frame CrctFrm. The C2 syndrome generating circuit 43A generates an updated partial C2 syndrome $PartialSyndNew_k$ by using the generated partial syndrome polynomial. The exclusive OR circuit 43B performs an exclusive OR operation by using the cancellation C2 syndrome $CanSynd_k$ and the updated partial C2 syndrome $PartialSyndNew_k$. Accordingly, the exclusive OR circuit 43B generates an updated complete C2 syndrome $RevSynd_k$.

The updated complete C2 syndrome $RevSynd_k$ may be obtained by the following syndrome polynomials.

$$S_k(x) = Synd_N(Symbol_k(r_N)) + \ldots + Synd_i(Symbol_k(CrctFrm)) + \ldots + Synd_1(Symbol_k(r_1)) + Synd_0(Symbol_k(r_0))$$

That is, polynomials of generating the updated complete C2 syndrome $RevSynd_k$ are obtained by substituting the partial syndrome polynomial $Synd_i(Symbol_k(r_i))$ corresponding to the C2 symbol located at the k-th position in the correction target C1 frame $r_i$, with the $Synd_i$ ($Symbol_k$ (CrctFrm)) corresponding to the C2 symbol located at the k-th position in the corrected C1 frame CrctFrm, in the syndrome polynomials of generating the complete C2 syndrome $CompSynd_k$. This may be used to obtain the updated complete C2 syndrome $RevSynd_k$. Accordingly, the reliability of the C2 syndrome is improved. That is, through the update of the complete C2 syndrome set, C1 frames other than the original correction target C1 frame $r_i$ may also be possibly correctable.

The exclusive OR circuit 43B transfers the updated complete C2 syndrome $RevSynd_k$ to the Synd_BUF 28. The generation of the updated complete C2 syndrome $RevSynd_k$ and the transfer to the Synd_BUF 28 are repeatedly executed on each of the C2 symbols included in each of the correction target C1 frames in the UNCBUF 27, in the row direction of the C1×C2 frame. Accordingly, the Synd_BUF 28 stores a C2 syndrome set RevSyndGrp that is a set of updated complete C2 syndromes $RevSynd_k$ on all the C2 frames constituting the corresponding C1×C2 frame.

[1-9] Effect of First Embodiment

As described above, in the first embodiment, in an error correction using a product code by a C1 code and a C2 code, the iterative correction is performed in which the C1 correction and the C2 correction are repeated. The C2 code includes a linear code. Then, a characteristic of linearity of the linear code is used so that a C2 syndrome is partially updated while the iterative correction is performed. By using the sequentially updated C2 syndromes, the iterative correction is performed.

According to the first embodiment, the re-generation of a C2 syndrome does not require the entire C1×C2 frame, and the C2 syndrome may be re-generated only with the required minimum data. Accordingly, the procedure of the error correction may be simplified. In addition, at any time during the iterative correction, the C2 syndrome is updated by using the corrected data. Accordingly, the reliability of the C2 syndrome may be improved, and the error correction capability may be improved. As a result, it is possible to improve the reliability of the memory system.

According to the first embodiment, after a C1×C2 frame, as a correction target, is read from a non-volatile memory (e.g., the NAND-type flash memory 3), the C2 syndrome is generated. Then, while the C2 syndrome is updated, the iterative correction is performed. That is, only by reading the C1×C2 frame as the correction target from the non-volatile memory once, it is possible to perform the iterative correction after that time. Accordingly, it is possible to reduce the number of accesses to the non-volatile memory. Further, the generated C2 syndrome is updated as a correction progresses. Here, it is not required to access the non-volatile memory.

According to the first embodiment, at the iterative correction, data transfer via a bus does not occur. That is, the memory controller 4 includes the data buffer (UNCBUF) 27 that stores correction target data (that is, a C1 frame determined to be uncorrectable), and the UNCBUF 27 is connected to the C2 module 24 without passing through a bus (e.g., a bus that connects the NAND-type flash memory 3 to the DBUF 14). Therefore, at the iterative correction, data transfer via a bus does not occur. Accordingly, time taken for the correction processing may be reduced, and firmware for error correction processing may be simplified.

According to the first embodiment, the memory controller 4 includes the syndrome buffer (Synd_BUF) 28 that stores a C2 syndrome set. The Synd_BUF 28 is connected to the C2 module 24 without passing through a bus (e.g., a bus that connects the NAND-type flash memory 3 to the DBUF 14). When C2 normal correction is performed, the C2 syndrome read from the Synd_BUF 28 is used. Meanwhile, a cancellation C2 syndrome in which a partial syndrome corresponding to the correction target data is cancelled is generated, and the cancellation C2 syndrome is used in the C2 erasure correction. Thus, it is not necessary to re-generate the C2 syndrome at switching between the C2 normal correction and the C2 erasure correction. As a result, it is possible to easily switch between the C2 normal correction and the C2 erasure correction.

[2] Second Embodiment

In a second embodiment, after the last C2 erasure correction in a correction processing of an arbitrary C1×C2 frame, the C1 correction by the C1 decoder 37 and the re-generation of a C2 syndrome (that is, generation of an updated complete C2 syndrome) are omitted. Accordingly, time taken for the correction processing is reduced.

[2-1] Configuration of C2 Module 24

Figure 29:
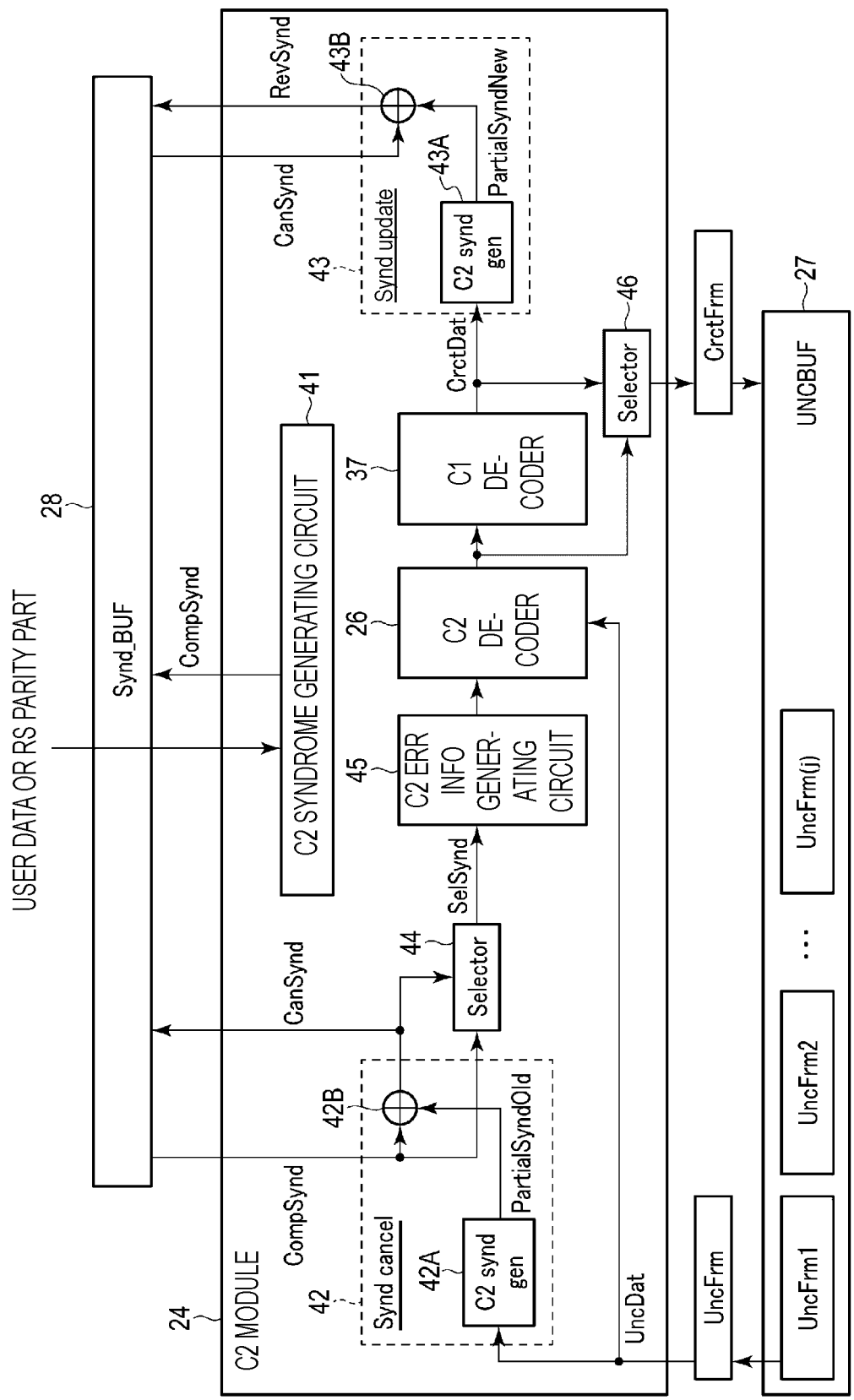
FIG. 29 is a block diagram of a C2 module according to a second embodiment.

FIG. 29 is a block diagram of the C2 module 24 according to the second embodiment. In the C2 module 24 according to the second embodiment, unlike in the first embodiment, a data path from the C2 decoder 26 to the UNCBUF 27 is added. That is, a path that bypasses the C1 decoder 37 in which it takes time for the correction processing is additionally provided.

Besides the components in the C2 module 24 in the first embodiment, the C2 module 24 in the embodiment includes a selector 46. A first input terminal of the selector 46 is connected to the output of the C2 decoder 26. A second input terminal of the selector 46 is connected to the output of the C1 decoder 37. The output terminal of the selector 46 is connected to the UNCBUF 27. The selector 46 transfers either a C1 frame including a C2 symbol C2-corrected by the C2 decoder 26 or a C1 frame C1-corrected by the C1 decoder 37, to the UNCBUF 27. A selection operation by the selector 46 is controlled by a control signal sent to the selector 46, in the C2 module 24.

[2-2] Error Correction Operation

Hereinafter, an error correction operation will be described. A target of an error correction is a C1×C2 frame.

First Example

Figure 30:
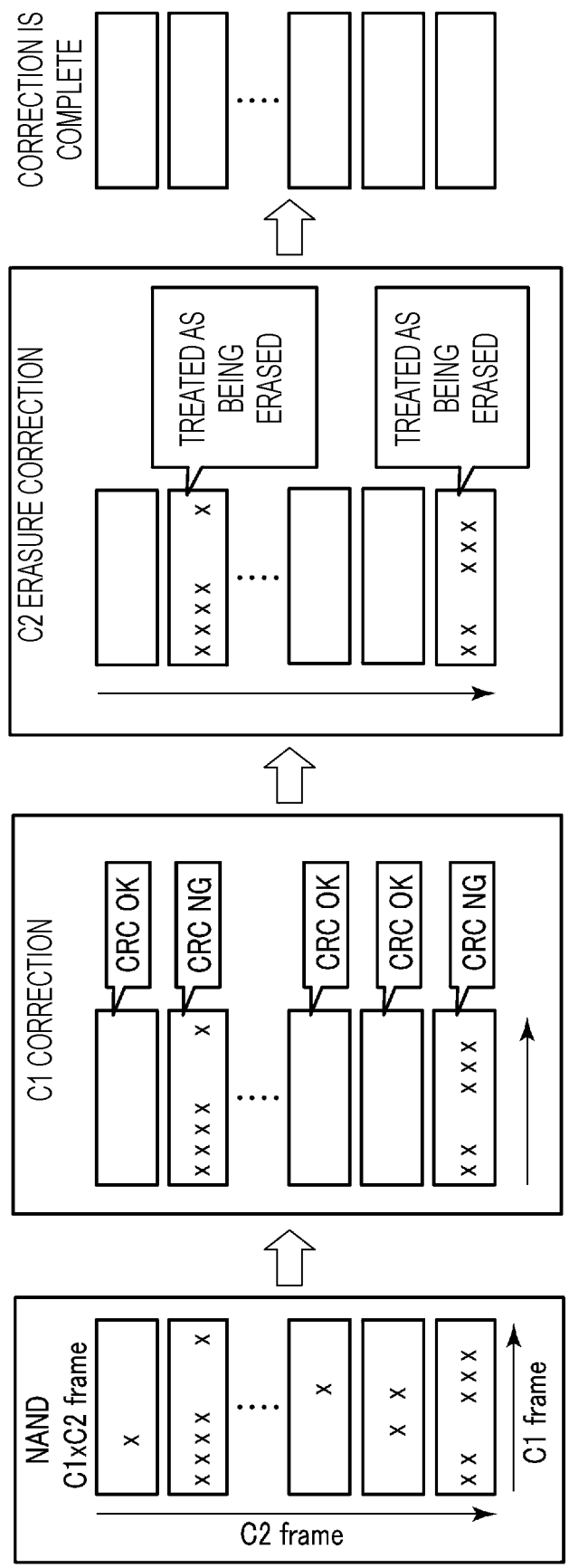
FIG. 30 is a view illustrating an example (first example) of an error correction by a C1 correction and a C2 correction according to the second embodiment.

FIG. 30 is a view illustrating an example (referred to below as the first example) of an error correction by a C1 correction and a C2 correction according to the embodiment. The first example illustrates an example with relatively few errors.

The C1 module 20 performs an error correction on C1 frames ("C1 correction" in FIG. 30). The CRC circuit 23 performs CRC verification on the C1 frames.

As a result of the C1 correction, when a condition "(the number of uncorrectable C1 frames in a C1×C2 frame) (the number of symbols correctable by C2 erasure correction)" is satisfied, the C2 decoder 26 performs a C2 erasure correction by treating error symbols included in the uncorrectable C1 frames, as being erased ("C2 erasure correction" in FIG. 30). In the embodiment, for example, the number of symbols correctable by C2 erasure correction is 2.

Next, the C2 module 24 ends the correction processing. That is, the selector 46 transfers the C1 frames including the C2 symbols subjected to C2 erasure-correction by the C2 decoder 26, to the UNCBUF 27. In addition, the C1 decoder 37 does not perform a correction processing, and the syndrome updating circuit 43 also does not perform a C2 syndrome update operation. That is, after the C2 erasure correction, an updated complete C2 syndrome RevSynd is not generated.

Figure 31:
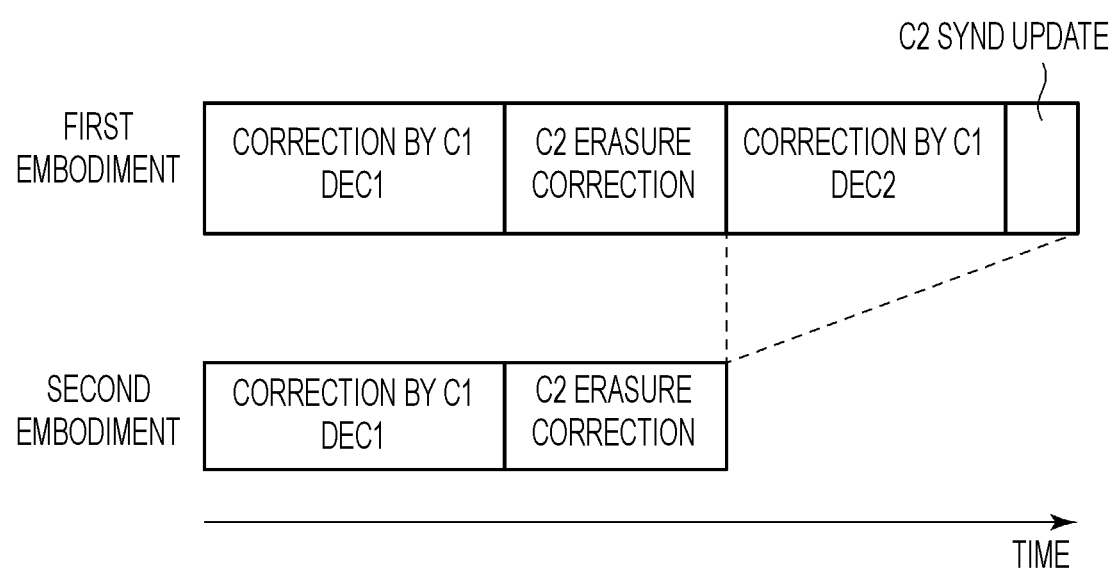
FIG. 31 is a view illustrating a flow of the error correction according to the first example in the second embodiment.

FIG. 31 is a view illustrating a flow of the error correction according to the first example in the embodiment. In FIG. 31, the C1 decoder 22 in the C1 module 20 will be denoted as "C1 dec1," and the C1 decoder 37 in the C2 module 24 will be denoted as "C1 dec2."

In the first embodiment, after the C2 erasure correction, a C1 correction processing is performed by the C1 decoder 37. After the C2 erasure correction, a generation of an updated complete C2 syndrome RevSynd is performed by the syndrome updating circuit 43. Then, the updated complete C2 syndrome RevSynd is stored in the Synd_BUF 28.

Meanwhile, in the second embodiment, after the C2 erasure correction, the correction processing is ended. That is, the C1 correction by the C1 decoder 37, and the generation of the updated complete C2 syndrome RevSynd, as described in the first embodiment, are omitted.

Second Example

Figure 32:
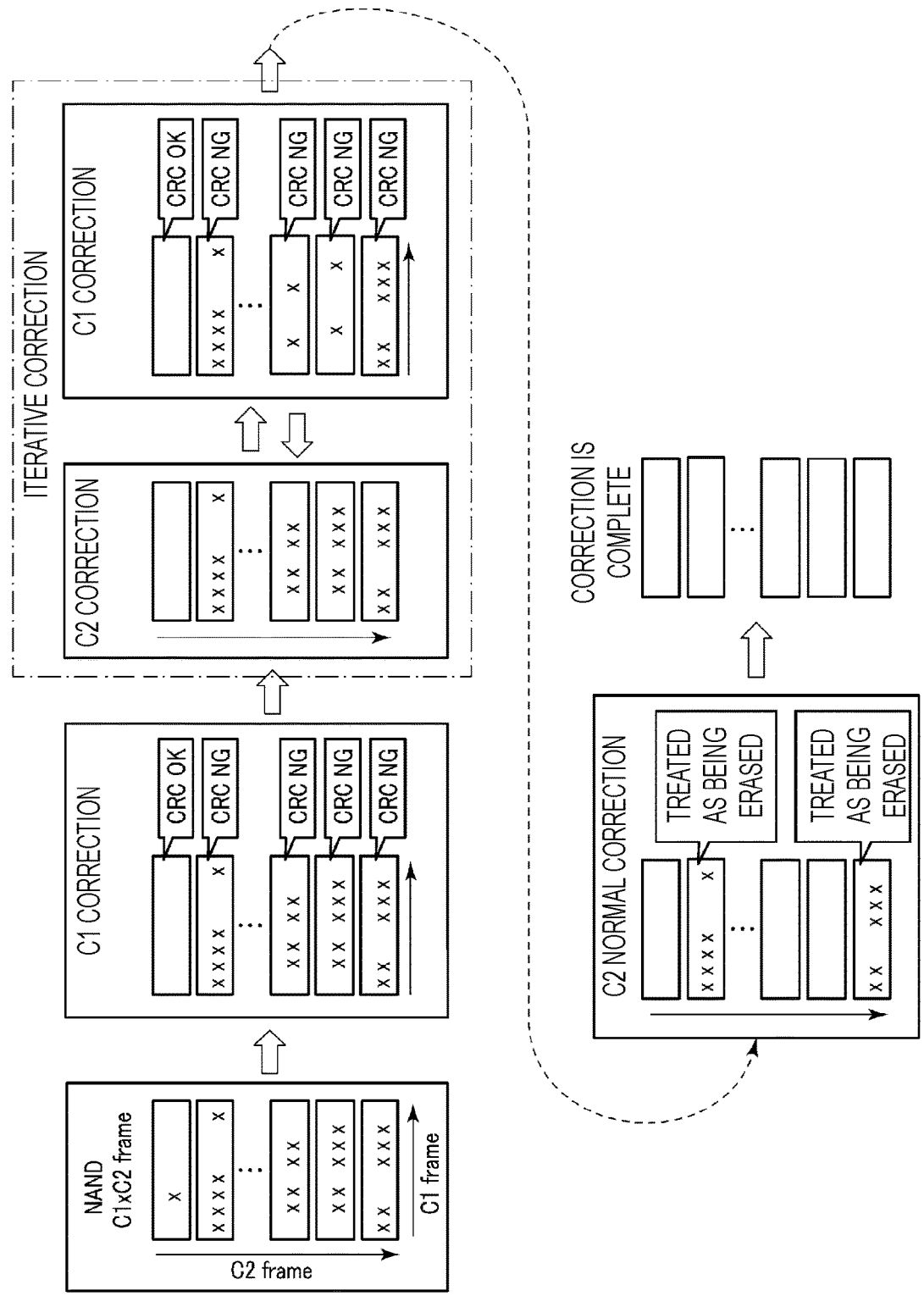
FIG. 32 is a view illustrating another example (second example) of the error correction by the C1 correction and the C2 correction according to the second embodiment.

FIG. 32 is a view illustrating another example (referred to below as the second example) of the error correction by the C1 correction and the C2 correction according to the embodiment. The second example illustrates an example with a relatively large number of errors.

The C1 module 20 performs an error correction on C1 frames ("C1 correction" in FIG. 32). The CRC circuit 23 performs CRC verification on the C1 frames.

As a result of the C1 correction, since a condition "(the number of uncorrectable C1 frames in a C1×C2 frame)≤(the number of symbols correctable by C2 erasure correction)" is not satisfied, the C2 decoder 26 and the C1 decoder 37 perform an iterative correction (the "iterative correction" in FIG. 32).

In the example, after the iterative correction, it is assumed that the condition "(the number of uncorrectable C1 frames in a C1×C2 frame)≤(The number of symbols correctable by C2 erasure correction)" is satisfied. Therefore, the C2 decoder 26 performs an error correction by treating error symbols included in the uncorrectable C1 frames, as being erased (the "C2 erasure correction" in FIG. 32). Then, the C2 module 24 ends the correction processing.

Figure 33:
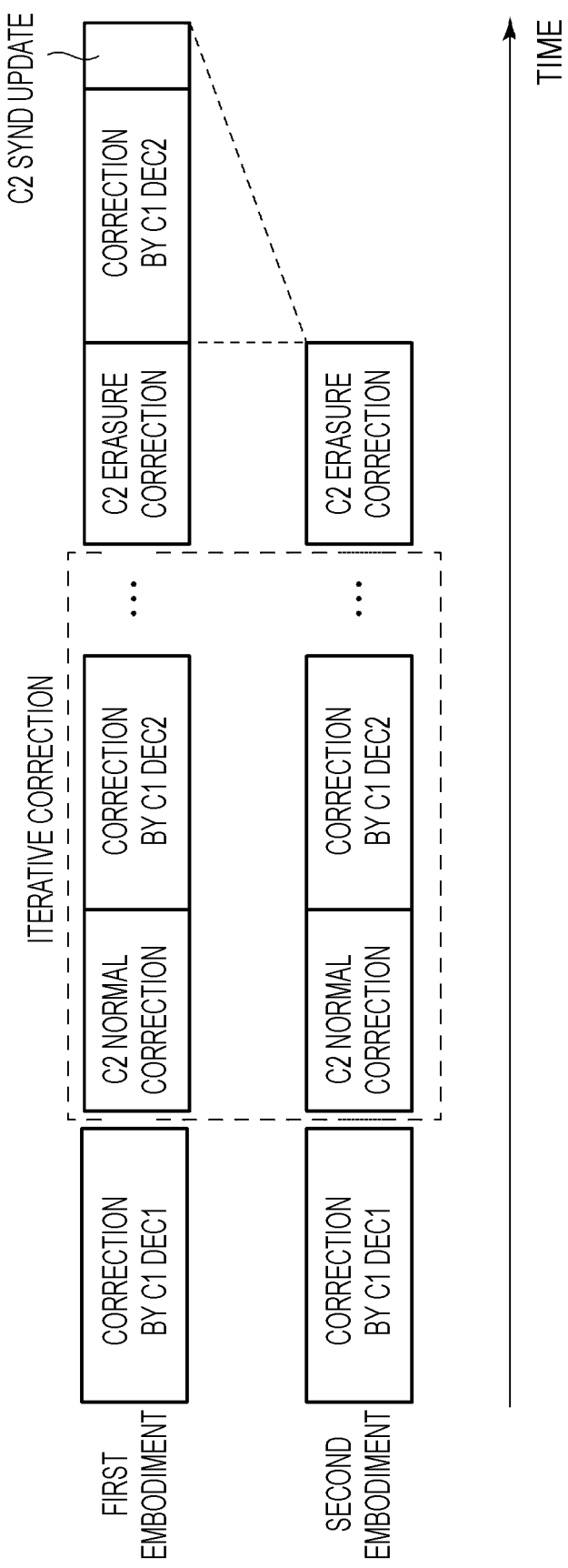
FIG. 33 is a view illustrating a flow of the error correction according to the second example in the second embodiment.

FIG. 33 is a view illustrating a flow of the error correction according to the second example in the embodiment. In the first embodiment, after the iterative correction is performed, the C2 erasure correction is performed. Then, the C1 correction is performed by the C1 decoder 37, and a generation of an updated complete C2 syndrome RevSynd is performed by the syndrome updating circuit 43.

Meanwhile, in the second embodiment, after the C2 erasure correction, the correction processing is ended. That is, the C1 correction by the C1 decoder 37 and the generation of the updated complete C2 syndrome RevpSynd, as described in the first embodiment, are omitted.

[2-3] Effect of Second Embodiment

When an error correction using a product code is performed, in many cases, the error correction capability of a C1 code is set to be higher than the error correction capability of a C2 code. In such a code configuration, in the initial state where a non-volatile memory is not deteriorated, in many cases, an error correction is possible only by the C1 correction. Otherwise, in many cases, a condition "(the number of uncorrectable C1 frames in a C1×C2 frame)(the number of symbols correctable by C2 erasure correction)" is satisfied. Thus, in many cases, for the C2 correction, only performing the C2 erasure correction once is enough.

Even when the iterative correction is applied to a C1×C2 frame as the non-volatile memory is gradually deteriorated, in many cases, in an iterative correction algorithm, the C2 erasure correction is applied as the last one C2 correction.

In such a case, after the C2 erasure correction, since it is guaranteed that a C1 frame including C2 symbols treated as being erased is corrected clean data (that is, non-erroneous data), it is unnecessary to apply the C1 correction after the C2 erasure correction.

According to the second embodiment, the C1 correction after the C2 erasure correction may be omitted, and an update of a complete C2 syndrome after the C1 correction is unnecessary. Accordingly, time taken for the correction processing may be reduced. In particular, since the C1 code requires a long processing time as the error correction capability is high, the effect in reducing the processing time due to the omission of the C1 correction is high.

[3] Third Embodiment

A memory system according to a third embodiment includes three syndrome buffers. A first syndrome buffer stores a complete C2 syndrome on a C2 frame located at a certain column in a C1×C2 frame as a target of iterative correction. A second syndrome buffer stores a cumulative partial C2 syndrome (hereinafter, also referred to as a cumulative cancellation partial C2 syndrome), on the corresponding C2 frame, prior to the iterative correction. A third syndrome buffer holds a cumulative partial C2 syndrome (hereinafter, also referred to as a cumulative updated partial C2 syndrome) on the corresponding C2 frame, after the error correction in the iterative correction. Then, by using the complete C2 syndrome, an error correction is performed on a plurality of C1 frames through a pipeline operation.

Hereinafter, descriptions will be made on a C2 frame located at a certain column in a C1×C2 frame as a target of an iterative correction. The processing to be described below is applied to C2 frames in all columns in the C1×C2 frame as the target of the iterative correction.

[3-1] Circuit Configuration for Syndrome Update

Figure 34A:
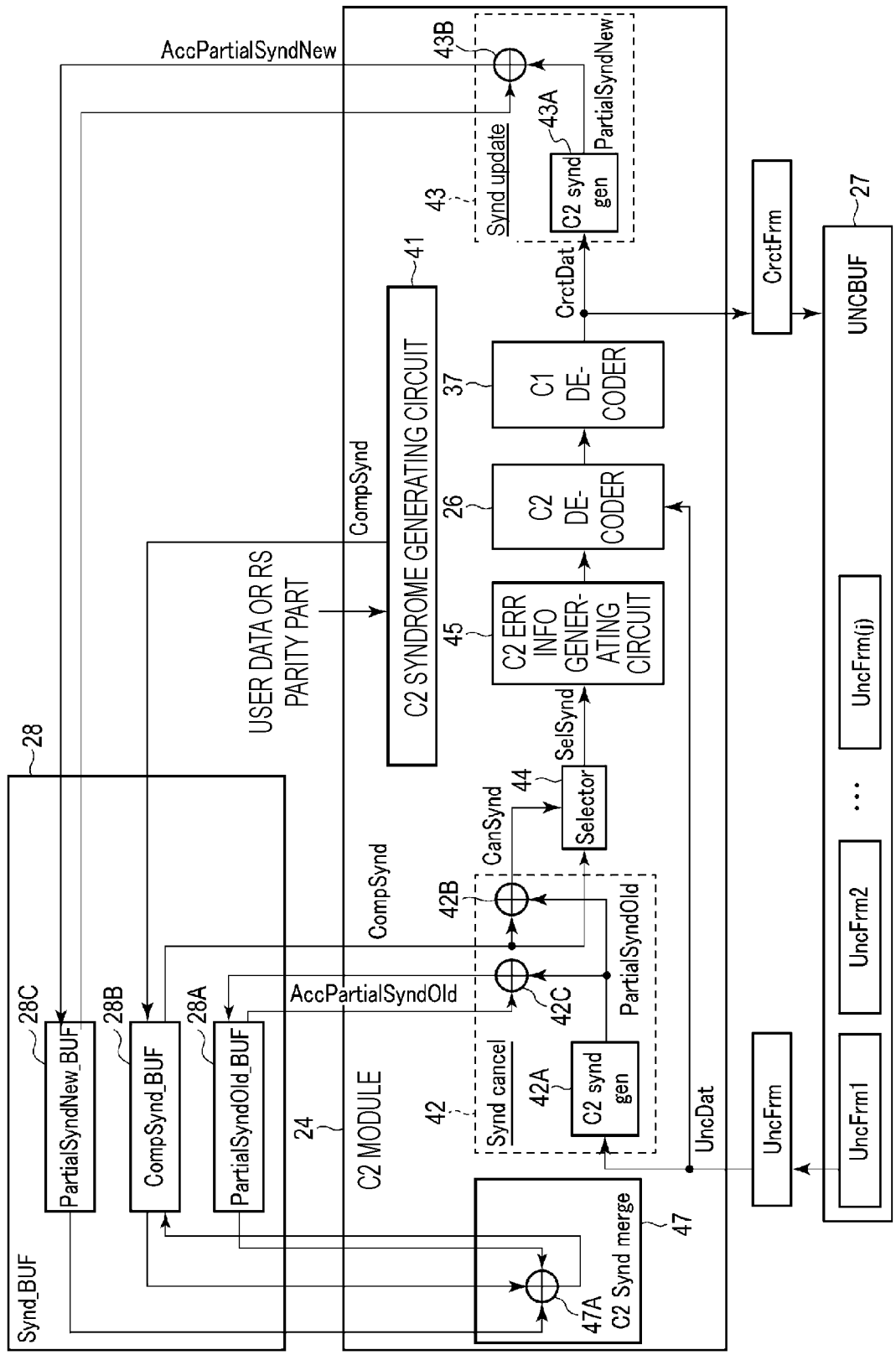
FIG. 34A is a block diagram illustrating circuits that perform a C2 syndrome update operation according to a third embodiment.
Figure 34B:
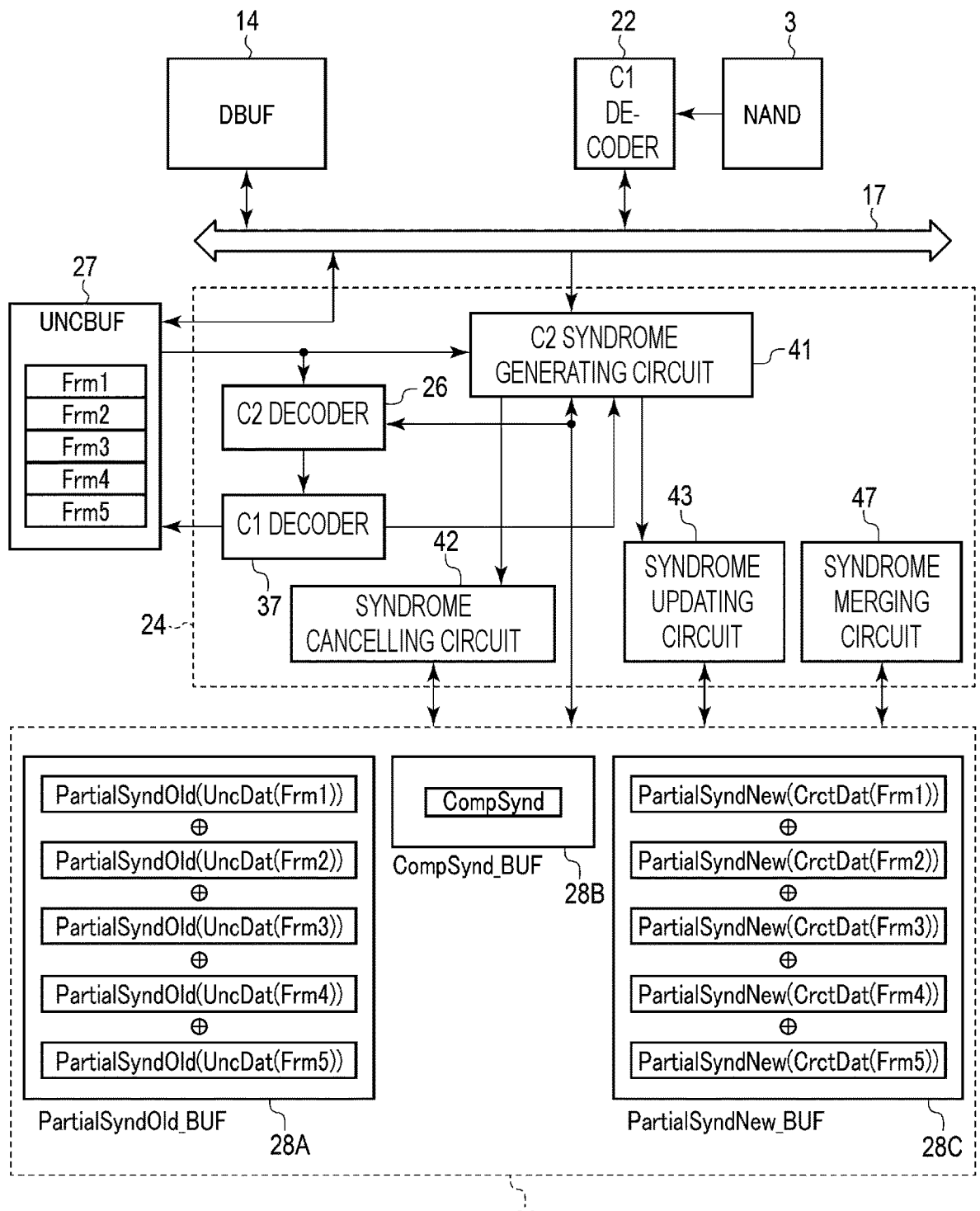
FIG. 34B is a block diagram of a C2 module and Synd_BUF according to the third embodiment.

FIGS. 34A and 34B are block diagrams of the C2 module 24 and the Synd_BUF 28 according to the third embodiment. The C2 module 24 includes the C2 syndrome generating circuit 41, the syndrome cancelling circuit 42, the syndrome updating circuit 43, a syndrome merging circuit 47, the C2 decoder 26, and the C1 decoder 37. The functions of the C2 decoder 26 and the C1 decoder 37 are the same as those in the first embodiment as described above with reference to FIG. 25.

The C2 module 24 according to the third embodiment is different from that in the first embodiment, in that an exclusive OR circuit 42C in the syndrome cancelling circuit 42, an exclusive OR circuit 43B in the syndrome updating circuit 43, and the syndrome merging circuit 47 are provided. The Synd_BUF 28 according to the third embodiment includes a cancellation partial syndrome buffer (PartialSyndOld_BUF) 28A, a complete syndrome buffer (CompSynd_BUF) 28B, and an updated partial syndrome buffer (PartialSyndNew_BUF) 28C.

As illustrated in FIG. 34A, the C2 module 24 is connected to the UNCBUF 27 and the Synd_BUF 28. In addition, the interface circuit 32 for the Synd_BUF 28 and the interface circuit 33 for the UNCBUF 27 are omitted in the illustration.

The UNCBUF 27 stores C1 frames uncorrectable by the C1 correction. In the example of FIG. 34A, the UNCBUF 27 stores j uncorrectable C1 frames UncFrm1 to UncFrm(j).

The C2 syndrome generating circuit 42A reads a correction target C1 frame UncFrm from the UNCBUF 27. The correction target C1 frame UncFrm is any one of the uncorrectable C1 frames UncFrm1 to UncFrm(j). Here, it is assumed that the correction target C1 frame UncFrm is, for example, UncFrm1. The C2 syndrome generating circuit 42A generates a partial C2 syndrome PartialSyndOld (UncDat (UncFrm1)) from a C2 symbol UncDat in the correction target C1 frame UncFrm1. The C2 symbol UncDat is a C2 symbol included in the correction target C1 frame UncFrm1, among C2 symbols constituting a C2 frame located in a certain column (in a k-th column) in a C1×C2 frame as a target of the iterative correction. The partial C2 syndrome PartialSyndOld (UncDat (UncFrm1)) is stored in the cancellation partial syndrome buffer 28A.

The C2 syndrome generating circuit 42A receives a next correction target C1 frame UncFrm from the UNCBUF 27. Here, it is assumed that the next correction target C1 frame UncFrm is, for example, UncFrm2. The C2 syndrome generating circuit 42A generates a partial C2 syndrome PartialSyndOld(UncDat(UncFrm2)) from a k-th C2 symbol UncDat in the correction target C1 frame UncFrm2. The exclusive OR circuit 42C receives the partial C2 syndrome PartialSyndOld(UncDat(UncFrm1)) from the cancellation partial syndrome buffer 28A. The exclusive OR circuit 42C performs an exclusive OR operation by using the partial C2 syndrome PartialSyndOld(UncDat(UncFrm1)) and the partial C2 syndrome PartialSyndOld(UncDat(UncFrm2)). By the exclusive OR operation, a cumulative cancellation partial C2 syndrome AccPartialSyndOld may be obtained. The cumulative cancellation partial C2 syndrome AccPartialSyndOld is stored in the cancellation partial syndrome buffer 28A.

Hereinafter, similarly, the C2 syndrome generating circuit 42A cumulatively adds partial C2 syndromes PartialSyndOld of C2 symbols included in all the correction target C1 frames UncFrm, for the C2 frame located at the k-th position, in the C1×C2 frame as the target of the iterative correction. Accordingly, a cumulative cancellation partial C2 syndrome AccPartialSyndOld of the k-th C2 frame may be obtained.

The exclusive OR circuit 42B receives the partial C2 syndrome PartialSyndOld of the k-th C2 symbol in the correction target C1 frame UncFrm, from the C2 syndrome generating circuit 42A. Further, the exclusive OR circuit 42B receives a complete C2 syndrome CompSynd corresponding to the k-th C2 frame in a complete C2 syndrome set CompSyndGrp stored in the complete syndrome buffer 28B. The exclusive OR circuit 42B performs an exclusive OR operation by using the complete C2 syndrome CompSynd and the partial C2 syndrome PartialSyndOld. As a result of the exclusive OR operation, in the complete C2 syndrome CompSynd, a portion corresponding to the k-th C2 symbol included in the correction target C1 frame UncFrm becomes zero. By the exclusive OR operation, a cancellation C2 syndrome CanSynd corresponding to the k-th C2 frame may be obtained. The exclusive OR circuit 42B outputs the cancellation C2 syndrome CanSynd. The cancellation C2 syndrome CanSynd is sent to the selector 44.

The selector 44 receives the complete C2 syndrome CompSynd corresponding to the k-th C2 frame, from the complete syndrome buffer 28B, and receives the cancellation C2 syndrome CanSynd corresponding to the k-th C2 frame, from the syndrome cancelling circuit 42. The C2 module 24 selects either the complete C2 syndrome CompSynd or the cancellation C2 syndrome CanSynd by the selector 44 according to whether the C2 correction is performed by the normal correction or by the erasure correction. The selector 44 selects the complete C2 syndrome CompSynd in the case of normal correction, and selects the cancellation C2 syndrome CanSynd in the case of erasure correction. As a result of the selection, the selector 44 outputs the selected syndrome SelSynd.

The C2 error information generating circuit 45 receives the selected syndrome SelSynd from the selector 44. The C2 error information generating circuit 45 generates error information (error info) based on a C2 code by using the selected syndrome SelSynd. The contents of the error information are the same as those described above with reference to FIG. 5.

The C2 decoder 26 uses the k-th C2 symbol in the correction target C1 frame UncFrm read from the UNCBUF 27, and the error information corresponding to the corresponding C2 symbol from the C2 error information generating circuit 45, so as to perform the C2 correction on the corresponding C2 symbol.

The C1 decoder 37 performs the C1 correction on the correction target C1 frame UncFrm. The C1 decoder 37 outputs the corrected C1 frame CrctFrm. After the C1 correction by the C1 decoder 37, the CRC verification is performed by the CRC circuit 38, which is omitted in the illustration.

The C2 syndrome updating circuit 43 receives the corrected C1 frame CrctFrm from the C1 decoder 37. The corrected C1 frame CrctFrm is obtained when any one of the uncorrectable C1 frames UncFrm1 to UncFrm(j) is error-corrected by the C2 decoder 26 and the C1 decoder 37. Here, it is assumed that as the corrected C1 frame CrctFrm, for example, UncFrm1 is error-corrected. The C2 syndrome generating circuit 43A generates a partial C2 syndrome PartialSyndNew (CrctDat(UncFrm1)) on a k-th C2 symbol CrctDat in the corrected C1 frame CrctFrm. The partial C2 syndrome PartialSyndNew(CrctDat(UncFrm1)) is stored in the updated partial syndrome buffer 28C.

The C2 syndrome updating circuit 43 receives the next corrected C1 frame CrctFrm from the C1 decoder 37. Here, it is assumed that as the next corrected C1 frame UncFrm, for example, UncFrm2 is error-corrected. The C2 syndrome generating circuit 43A generates a partial C2 syndrome PartialSyndNew(CrctDat(UncFrm2)) on a k-th C2 symbol CrctDat in the corrected C1 frame CrctFrm. The exclusive OR circuit 43C receives the partial C2 syndrome PartialSyndNew(CrctDat(UncFrm1)) from the updated partial syndrome buffer 28C. The exclusive OR circuit 43C performs an exclusive OR operation by using the partial C2 syndrome PartialSyndNew(CrctDat(UncFrm1)) and the partial C2 syndrome PartialSyndNew(CrctDat(UncFrm2)). By the exclusive OR operation, a cumulative updated partial C2 syndrome AccPartialSyndNew may be obtained. The cumulative updated partial C2 syndrome AccPartialSyndNew is stored in the updated partial syndrome buffer 28C.

Hereinafter, similarly, the C2 syndrome generating circuit 43A cumulatively adds partial C2 syndromes PartialSyndNew on C2 symbols included in all the corrected C1 frames CrctFrm, for the C2 frame located at the k-th position, in the C1×C2 frame as the target of the iterative correction. Accordingly, a cumulative updated partial C2 syndrome AccPartialSyndNew of the k-th C2 frame may be obtained.

The syndrome merging circuit 47 will be described later.

FIG. 34B will be described. It is assumed that the UNCBUF 27 holds five correction target C1 frames Frm1 to Frm5 in the C1×C2 frame as the target of the iterative correction.

The C2 syndrome generating circuit 41 generates a complete C2 syndrome CompSynd of a C2 frame located at the k-th position in the C1×C2 frame (including the correction target C1 frames Frm1 to Frm5) received through a snooping operation.

The cancellation partial syndrome buffer 28A receives a cumulative cancellation partial C2 syndrome AccPartialSyndOld of the k-th C2 frame, from the syndrome cancelling circuit 42, and temporarily stores this syndrome. In the example of FIG. 34B, the cancellation partial syndrome buffer 28A stores the cumulative cancellation partial C2 syndrome AccPartialSyndOld that is obtained by cumulatively adding five partial C2 syndromes PartialSyndOld (UncDat(Frm1)) to PartialSyndOld(UncDat(Frm5)).

The complete syndrome buffer 28B receives the complete C2 syndrome CompSynd of the k-th C2 frame, from the C2 syndrome generating circuit 41, and temporarily stores this syndrome. Further, the complete syndrome buffer 28B receives the complete C2 syndrome CompSynd of the k-th C2 frame, which is obtained by a merging to be described later, from the syndrome merging circuit 47, and temporarily stores this syndrome.

The updated partial syndrome buffer 28C receives a cumulative updated partial C2 syndrome AccPartialSyndNew on the corresponding C2 frame, from the syndrome updating circuit 43, and temporarily stores this syndrome. In the example of FIG. 34B, the updated partial syndrome buffer 28C stores the cumulative updated partial C2 syndrome AccPartialSyndNew obtained by cumulatively adding five partial C2 syndromes PartialSyndNew(CrctDat (Frm1)) to PartialSyndNew(CrctDat(Frm5)).

The syndrome merging circuit 47 includes an exclusive OR circuit (not illustrated). The syndrome merging circuit 47 performs an exclusive OR operation on the cumulative cancellation partial C2 syndrome AccPartialSyndOld stored in the cancellation partial syndrome buffer 28A, the cumulative updated partial C2 syndrome AccPartialSyndNew stored in the updated partial syndrome buffer 28C, and the complete C2 syndrome CompSynd stored in the complete syndrome buffer 28B. By this exclusive OR operation, the cumulative cancellation partial C2 syndrome, the cumulative updated partial C2 syndrome, and the complete C2 syndrome are merged, and a new complete C2 syndrome may be obtained. The syndrome merging circuit 47 writes the obtained new complete C2 syndrome back to the complete syndrome buffer 28B.

[3-2] Syndrome Update Operation

FIGS. 35A, 35B, 36, and 37 are views illustrating an error correction operation according to the embodiment. It is assumed that the UNCBUF 27 stores C1 frames Frm1 to Frm5 as targets of an iterative correction, which were C1-uncorrectable.

Figure 35A:
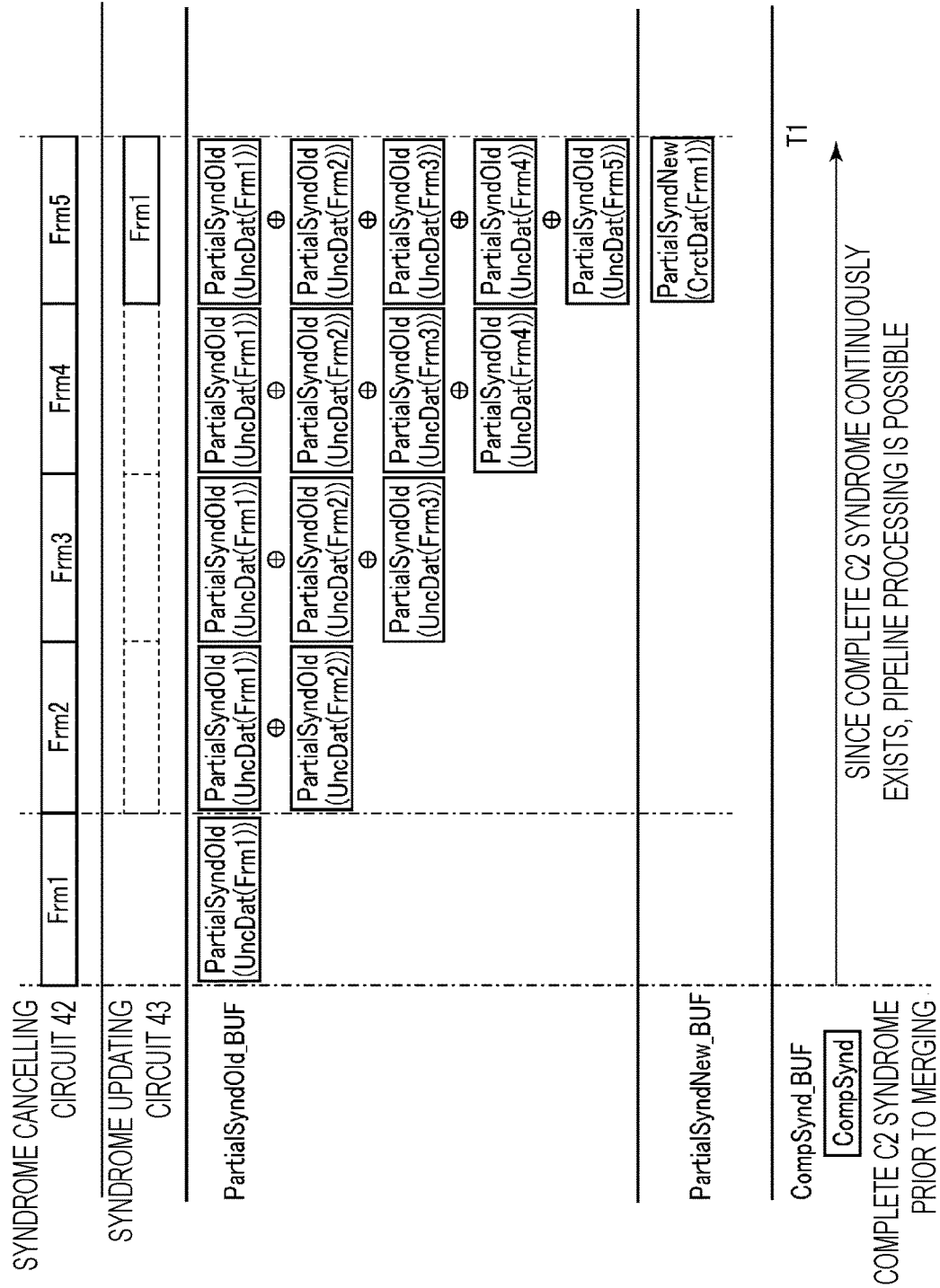
FIG. 35A is a view illustrating an error correction operation according to the third embodiment.
Figure 36:
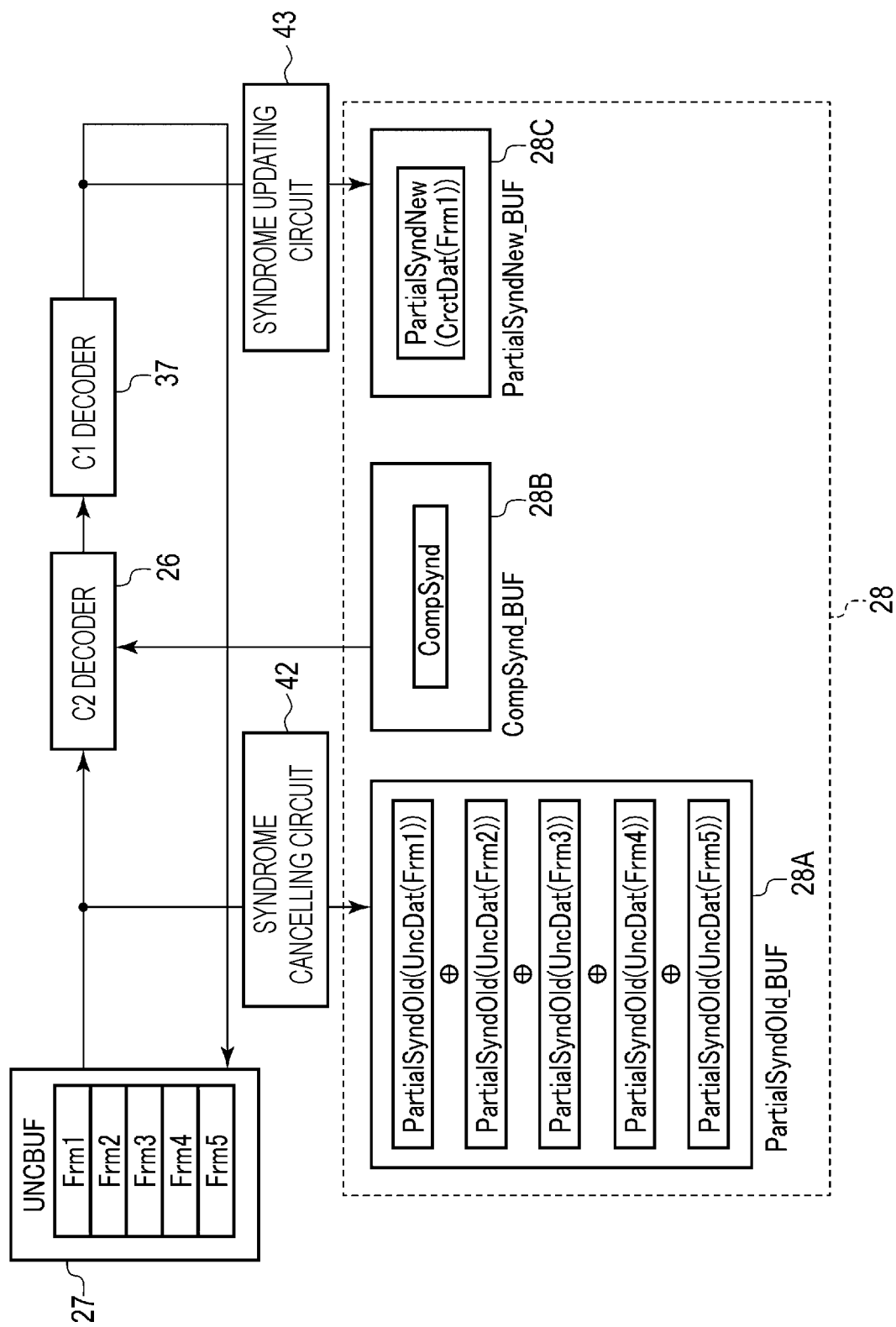
FIG. 36 is a view illustrating the error correction operation according to the third embodiment.

As illustrated in FIGS. 35A and 36, the syndrome cancelling circuit 42 uses the C2 syndrome generating circuit 42A (see FIG. 34A) to generate a partial C2 syndrome PartialSyndOld(UncDat(Frm1)) on a C2 symbol UncDat included in the C1 frame Frm1 before error-correction by the iterative correction. The syndrome cancelling circuit 42 stores the generated partial C2 syndrome PartialSyndOld (UncDat(Frm1)) in the cancellation partial syndrome buffer 28A.

The syndrome cancelling circuit 42 generates a partial C2 syndrome PartialSyndOld(UncDat(Frm2)) on a C2 symbol UncDat included in the C1 frame Frm2 before the error correction by the iterative correction. Then, the syndrome cancelling circuit 42 generates a cumulative cancellation partial C2 syndrome AccPartialSyndOld from the generated partial C2 syndrome PartialSyndOld(UncDat(Frm2)) and the partial C2 syndrome PartialSyndOld(UncDat(Frm1)) stored in the cancellation partial syndrome buffer 28A, and stores the syndrome in the cancellation partial syndrome buffer 28A. Likewise, the syndrome cancelling circuit 42 generates a cumulative cancellation partial C2 syndrome AccPartialSyndOld by using partial C2 syndromes PartialSyndOld(UncDat(Frm3)) to PartialSyndOld(UncDat (Frm5)) on C2 symbols UncDat included in the C1 frames Frm3 to Frm5 before the error correction by the iterative correction, and stores the syndrome in the cancellation partial syndrome buffer 28A.

The C2 decoder 26 corrects errors of the C2 symbols included in the C1 frames Frm1 to Frm5 by using a complete C2 syndrome CompSynd stored in the complete syndrome buffer 28B. The C1 decoder 37 performs a C1 correction on the C1 frame Frm1 whose error is corrected by the C2 decoder 26. The C2 syndrome generating circuit 43A (see FIG. 34A) in the syndrome updating circuit 43 generates a partial C2 syndrome PartialSyndNew(CrctDat(Frm1)) on the C2 symbol CrctDat included in the C1 frame Frm1 after the C1 correction, and stores the syndrome in the updated partial syndrome buffer 28C. The time T1 illustrated in FIG. 35A is the time at which processings have been completed so far. FIG. 36 illustrates a state of the Synd_BUF 28 at the time T1.

Next, the C1 decoder 37 performs a C1 correction on the C1 frame Frm2 whose error is corrected by the C2 decoder 26. The syndrome updating circuit 43 generates a partial C2 syndrome PartialSyndNew(CrctDat(Frm2)) on the C2 symbol CrctDat included in the C1 frame Frm2 after the C1 correction. Then, the syndrome updating circuit 43 generates a cumulative updated partial C2 syndrome AccPartialSyndNew from the generated partial C2 syndrome PartialSyndNew(CrctDat(Frm2)), and the partial C2 syndrome PartialSyndNew(CrctDat(Frm1)) stored in the updated partial syndrome buffer 28C, and stores the syndrome in the updated partial syndrome buffer 28C.

Figure 37:
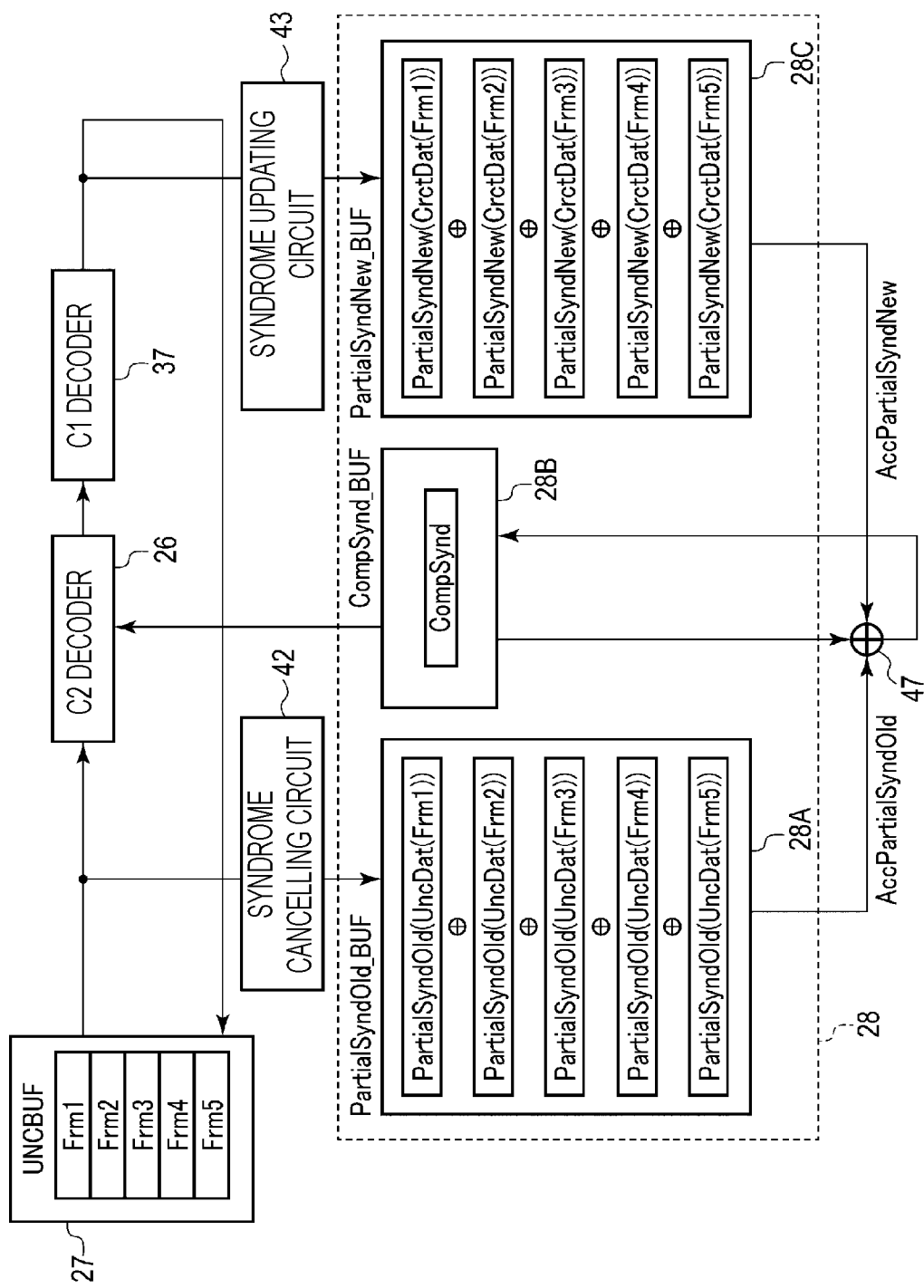
FIG. 37 is a view illustrating the error correction operation according to the third embodiment.

Likewise, the C1 decoder 37 performs a C1 correction on each of the C1 frames Frm3 to Frm5 whose errors are corrected by the C2 decoder 26. Then, the syndrome updating circuit 43 generates a cumulative updated partial C2 syndrome AccPartialSyndNew by using partial C2 syndromes PartialSyndNew(CrctDat(Frm3)) to PartialSyndNew(CrctDat(Frm5)) on the C2 symbols CrctDat included in the C1 frames Frm3 to Frm5 after the C1 correction, and stores this syndrome in the updated partial syndrome buffer 28C. The time T2 illustrated in FIG. 35B is the time at which processings have been completed so far. FIG. 37 illustrates a state of the Synd_BUF 28 at the time T2.

As illustrated in FIGS. 35B and 37, the C2 module 24 transfers the complete C2 syndrome CompSynd, the cumulative cancellation partial C2 syndrome AccPartialSyndOld, and the cumulative updated partial C2 syndrome AccPartialSyndNew, from the Synd_BUF 28 to the syndrome merging circuit 47. The syndrome merging circuit 47 performs an exclusive OR operation of the complete C2 syndrome CompSynd, the cumulative cancellation partial C2 syndrome AccPartialSyndOld, and the cumulative updated partial C2 syndrome AccPartialSyndNew, and merges these. In this manner, the merged complete C2 syndrome CompSynd may be obtained. The complete C2 syndrome CompSynd after the merging is the same as a complete syndrome CompSynd that is obtained by using the C2 symbols included in the C1 frames Frm1 to Frm5 after the C2 correction and the C1 correction are performed, instead of the C2 symbols included in the C1 frames Frm1 to Frm5 before the correction.

The C2 module 24 transfers the merged complete syndrome CompSynd to the complete syndrome buffer 28B. The complete syndrome buffer 28B stores the merged complete syndrome CompSynd. The merged complete syndrome CompSynd is matched with the error-corrected C1 frames stored in the UNCBUF 27. That is, as described above, the merged complete syndrome CompSynd is the same as the complete syndrome CompSynd that is obtained by using the C2 symbols included in the error-corrected C1 frames Frm1 to Frm5, instead of the C2 symbols included in the C1 frames Frm1 to Frm5 before the error correction.

In this manner, during the iterative correction on the C1 frames Frm1 to Frm5, the complete syndrome buffer 28B continuously stores the complete C2 syndrome CompSynd. Thus, it is possible to always perform a correction processing on the C2 symbols included in the C1 frames Frm1 to Frm5 by using the complete C2 syndrome CompSynd.

[3-3] Details of Syndrome Update Operation

Figure 38:
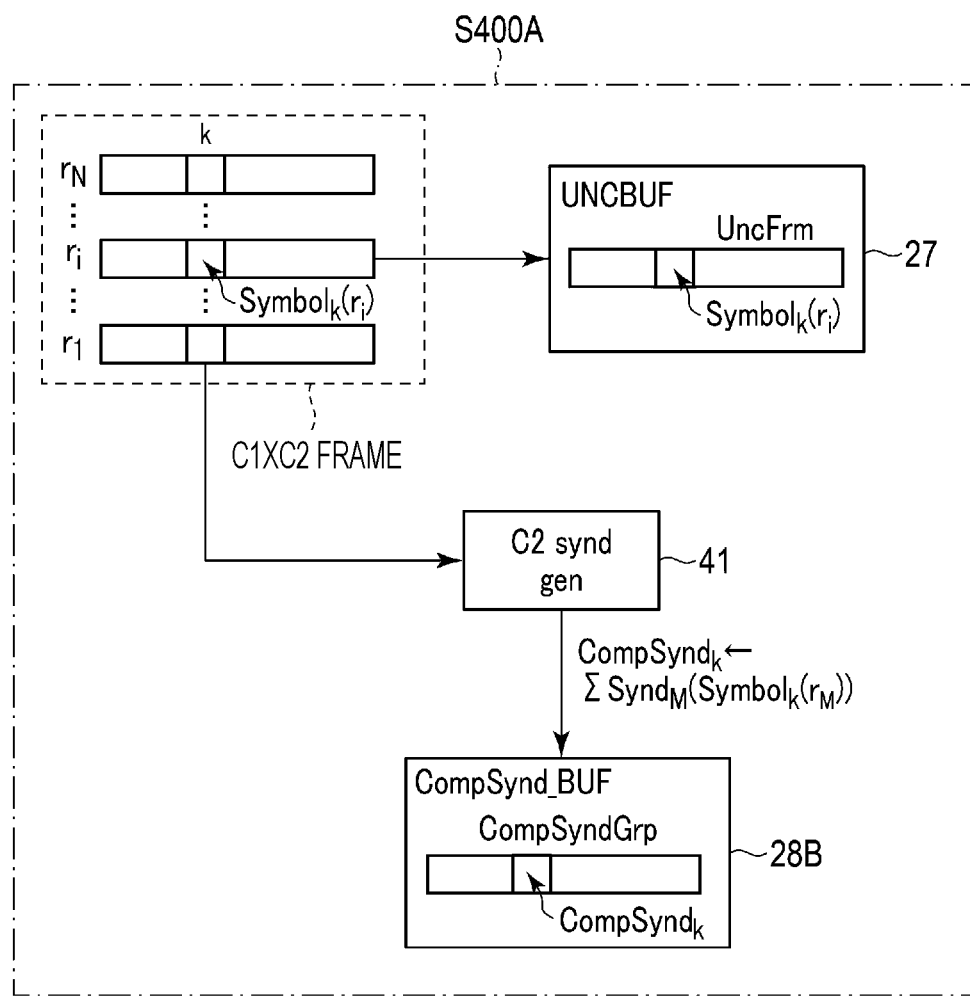
FIG. 38 is a view illustrating the C2 syndrome update operation according to the third embodiment.
Figure 39:
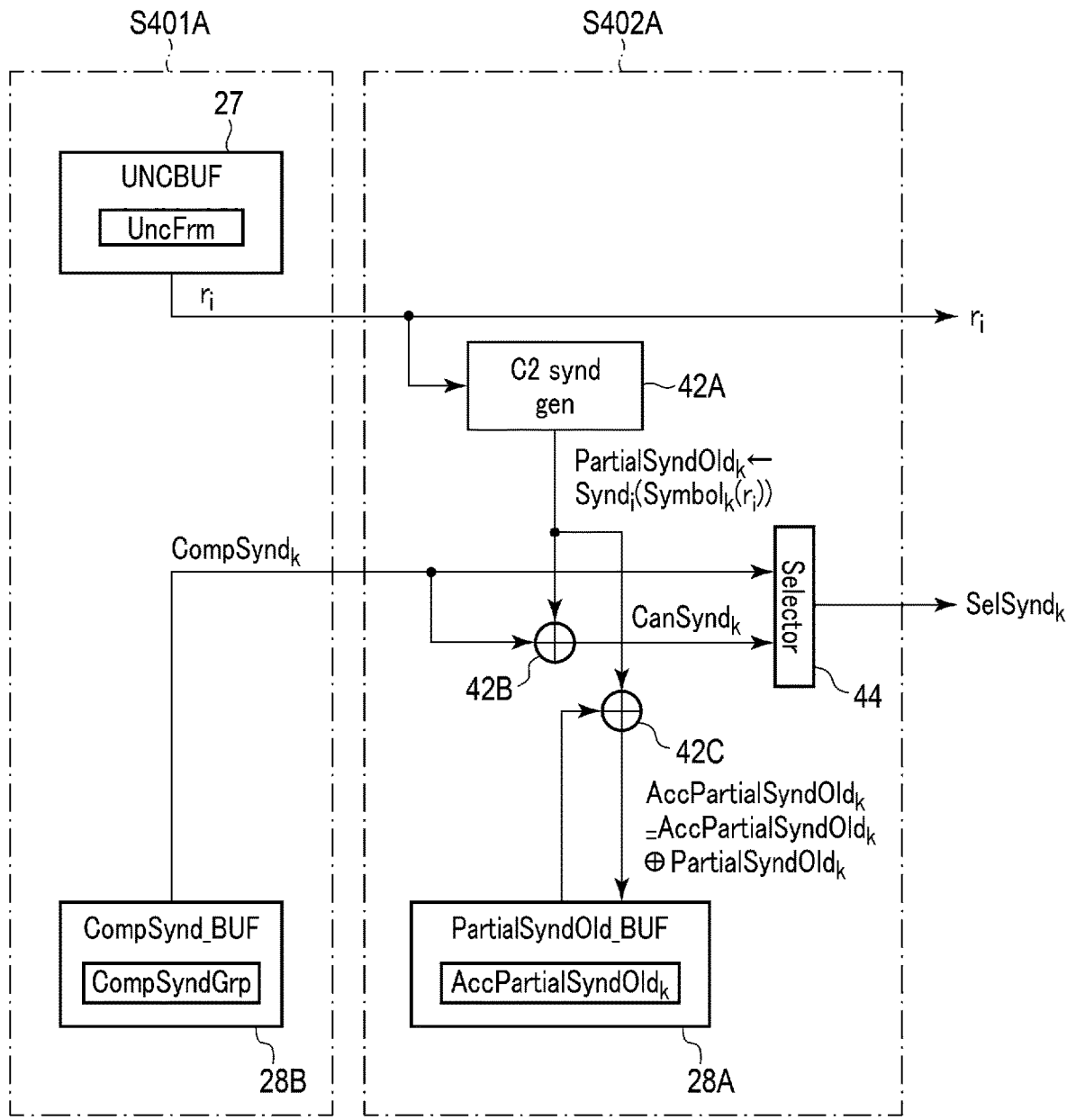
FIG. 39 is a view illustrating the C2 syndrome update operation according to the third embodiment.
Figure 40:
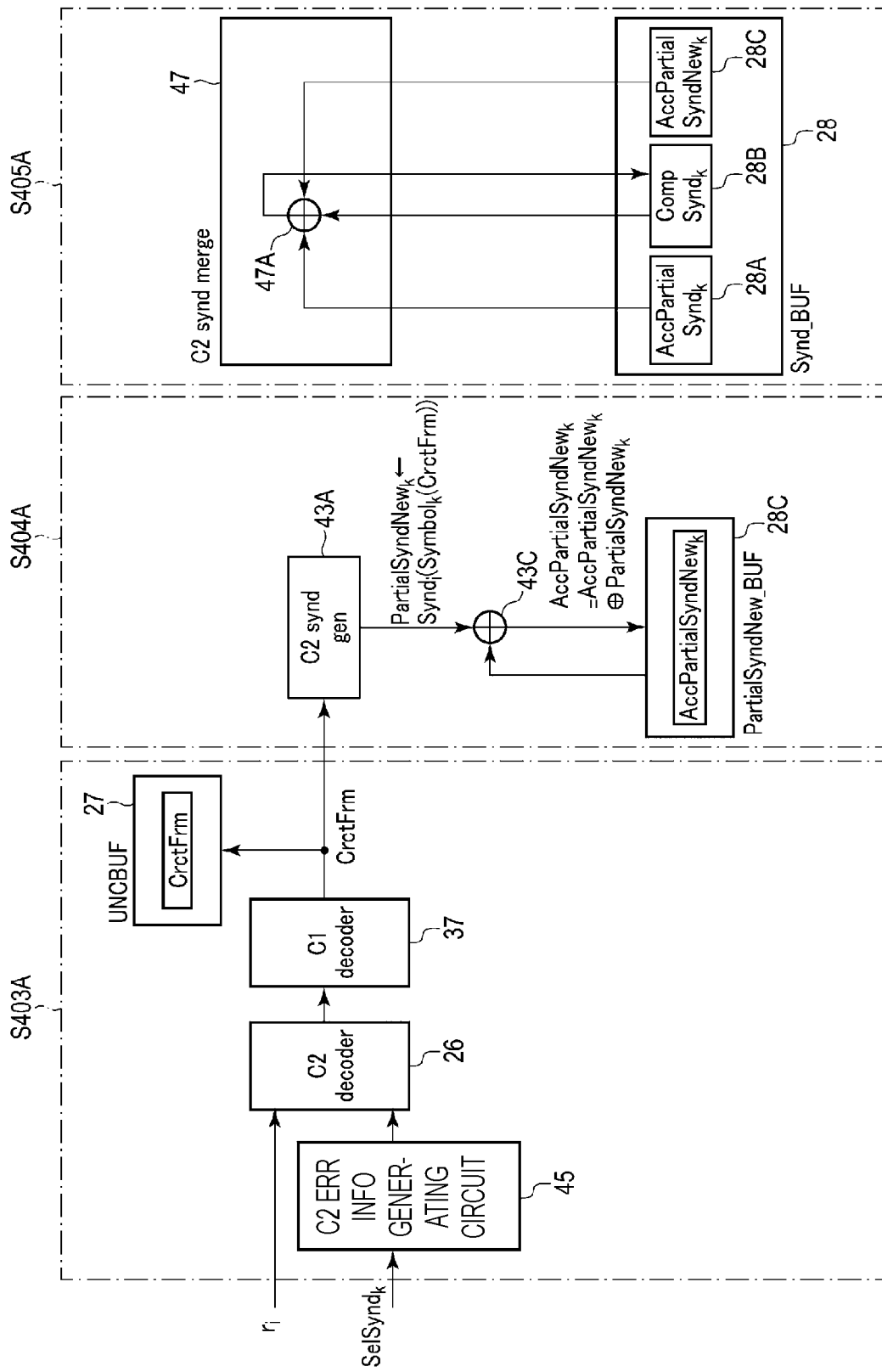
FIG. 40 is a view illustrating the C2 syndrome update operation according to the third embodiment.

Next, details of the C2 syndrome update operation will be described. FIGS. 38 to 40 are views illustrating a C2 syndrome update operation according to the embodiment. The C2 syndrome update operation is performed in order of steps S400A to S405A illustrated in FIGS. 38 to 40.

First, a preparation of an iterative correction will be described. The operation of generating a complete syndrome CompSynd$_k$ as illustrated in FIG. 38 is the same as that in the first embodiment described with reference to FIG. 26. The C2 syndrome generating circuit 41 transfers the generated complete syndrome CompSynd$_k$ to the complete syndrome buffer 28B. The generation of the complete C2 syndrome CompSynd$_k$ and the transfer to the complete syndrome buffer 28B are repeated in the row direction of the corresponding C1×C2 frame. Accordingly, the complete syndrome buffer 28B stores a complete C2 syndrome set CompSyndGrp that is a set of complete C2 syndromes CompSynd$_k$ on all C2 frames constituting the corresponding C1×C2 frame (step S400A in FIG. 38). The correction target C1 frame $r_i$ is transferred from the DBUF 14 to the UNCBUF 27 by the DMAC 15 illustrated in FIG. 18.

Subsequently, an iterative correction is performed. As illustrated in step S401A of FIG. 39, the C2 module 24 reads the correction target C1 frame $r_i$ from the UNCBUF 27. The C2 module 24 reads the complete C2 syndrome CompSynd$_k$ corresponding to a k-th C2 frame in the complete C2 syndrome set CompSyndGrp stored in the complete syndrome buffer 28B.

As illustrated in step S402A of FIG. 39, the C2 syndrome generating circuit 42A generates a partial syndrome polynomial Synd$_i$ (Symbol$_k$ ($r_i$)) on the k-th C2 symbol in the correction target C1 frame $r_i$, and uses the polynomial to generate a partial C2 syndrome PartialSyndOld$_k$. The exclusive OR circuit 42B performs an exclusive OR operation by using the complete C2 syndrome CompSynd$_k$ and the partial C2 syndrome PartialSyndOld$_k$. Accordingly, a cancellation C2 syndrome CanSynd$_k$ is generated.

As in the first embodiment described above with reference to FIG. 27, the cancellation C2 syndrome CanSynd$_k$ may be obtained by the following syndrome polynomials.

$$S_k(x) = \text{Synd}_N(\text{Symbol}_k(r_N)) + \ldots \text{Synd}_{i+1}(\text{Symbol}_k(r_{i+1})) + 0 + \text{Syn } d_{i-1}(\text{Symbol}_k)(r_{i-1})) + \ldots + \text{Synd}_1(\text{Symbol}_k(r_1)) + \text{Synd}_0(\text{Symbol}_k(r_0))$$

The exclusive OR circuit 42B transfers the cancellation C2 syndrome CanSynd$_k$ to the selector 44.

The selector 44 selects either the complete C2 syndrome CompSynd$_k$ or the cancellation C2 syndrome CanSynd$_k$ on the basis of a selection signal sent from the processor 11, and outputs the selected syndrome SelSynd$_k$. As described above, the selector 44 is controlled to select the complete C2 syndrome CompSynd$_k$ in the case of normal correction and to select the cancellation C2 syndrome CanSynd$_k$ in the case of erasure correction.

As illustrated in step S402A of FIG. 39, the exclusive OR circuit 42C performs an exclusive OR operation by using the partial C2 syndrome PartialSyndOld$_k$, and a cumulative cancellation partial C2 syndrome AccPartialSyndOld$_k$ stored in the cancellation partial syndrome buffer 28A. As a result, the generated cumulative cancellation partial C2 syndrome AccPartialSyndOld$_k$ is written back to the cancellation partial syndrome buffer 28A.

The generation of the cumulative cancellation partial C2 syndrome AccPartialSyndOld$_k$ and the transfer to the cancellation partial syndrome buffer 28A are repeatedly executed on each C2 symbol included in each correction target C1 frame in the UNCBUF 27, in the row direction of the C1×C2 frame.

As illustrated in step S403A of FIG. 40, the C2 error information generating circuit 45 generates C2 error information by using the selected syndrome SelSynd$_k$.

The C2 decoder 26 corrects an error of the C2 symbol included in the correction target C1 frame $r_i$ by using a C2 correction algorithm. The C1 decoder 37 corrects an error of the correction target C1 frame $r_i$ by using a C1 correction algorithm. The C2 module 24 transfers the corrected C1 frame CrctFrm to the UNCBUF 27.

As illustrated in step S404A of FIG. 40, the C2 syndrome generating circuit 43A generates a partial syndrome polynomial Synd$_i$ (Symbol$_k$ (CrctFrm)) corresponding to the k-th C2 symbol in the corrected C1 frame CrctFrm, and generates an updated partial C2 syndrome PartialSyndNew$_k$ by using the partial syndrome polynomial. The exclusive OR circuit 43C performs an exclusive OR operation by using the updated partial C2 syndrome PartialSyndNew$_k$, and a cumulative updated partial C2 syndrome AccPartialSyndNew$_k$ stored in the updated partial syndrome buffer 28C. As a result, the generated cumulative updated partial C2 syndrome AccPartialSyndNew$_k$ is written back to the updated partial syndrome buffer 28C.

The generation of the cumulative updated partial C2 syndrome AccPartialSyndNew$_k$ and the transfer to the updated partial syndrome buffer 28C are repeatedly executed on each C2 symbol included in each correction target C1 frame in the UNCBUF 27, in the row direction of the C1×C2 frame.

The cumulative cancellation partial C2 syndrome AccPartialSyndOld$_k$ and the cumulative updated partial C2 syndrome AccPartialSyndNew$_k$ are generated for each C2 symbol included in each correction target C1 frame. Then, as illustrated in step S405A of FIG. 40, the syndrome merging circuit 47 performs an exclusive OR operation by using the complete syndrome CompSynd$_k$ stored in the complete syndrome buffer, the cumulative cancellation partial C2 syndrome AccPartialSyndOld$_k$ stored in the cancellation partial syndrome buffer 28A, and the cumulative updated partial C2 syndrome AccPartialSyndNew$_k$ stored in the updated partial syndrome buffer 28C. Accordingly, the merged complete C2 syndrome CompSynd$_k$ may be obtained. The syndrome merging circuit 47 transfers the merged complete C2 syndrome CompSynd$_k$ to the complete syndrome buffer 28B.

The generation of the merged complete C2 syndrome CompSynd$_k$ and the transfer to the complete syndrome buffer 28B are repeatedly executed on each C2 symbol included in each correction target C1 frame in the UNCBUF 27 in the row direction of the C1×C2 frame. Accordingly, the merged complete C2 syndromes CompSynd$_k$ are generated for all the C2 frames constituting the corresponding C1×C2 frame, and as a set thereof, the complete C2 syndrome set CompSyndGrp is stored in the complete syndrome buffer 28B.

[3-4] Comparative Example

Figure 41:
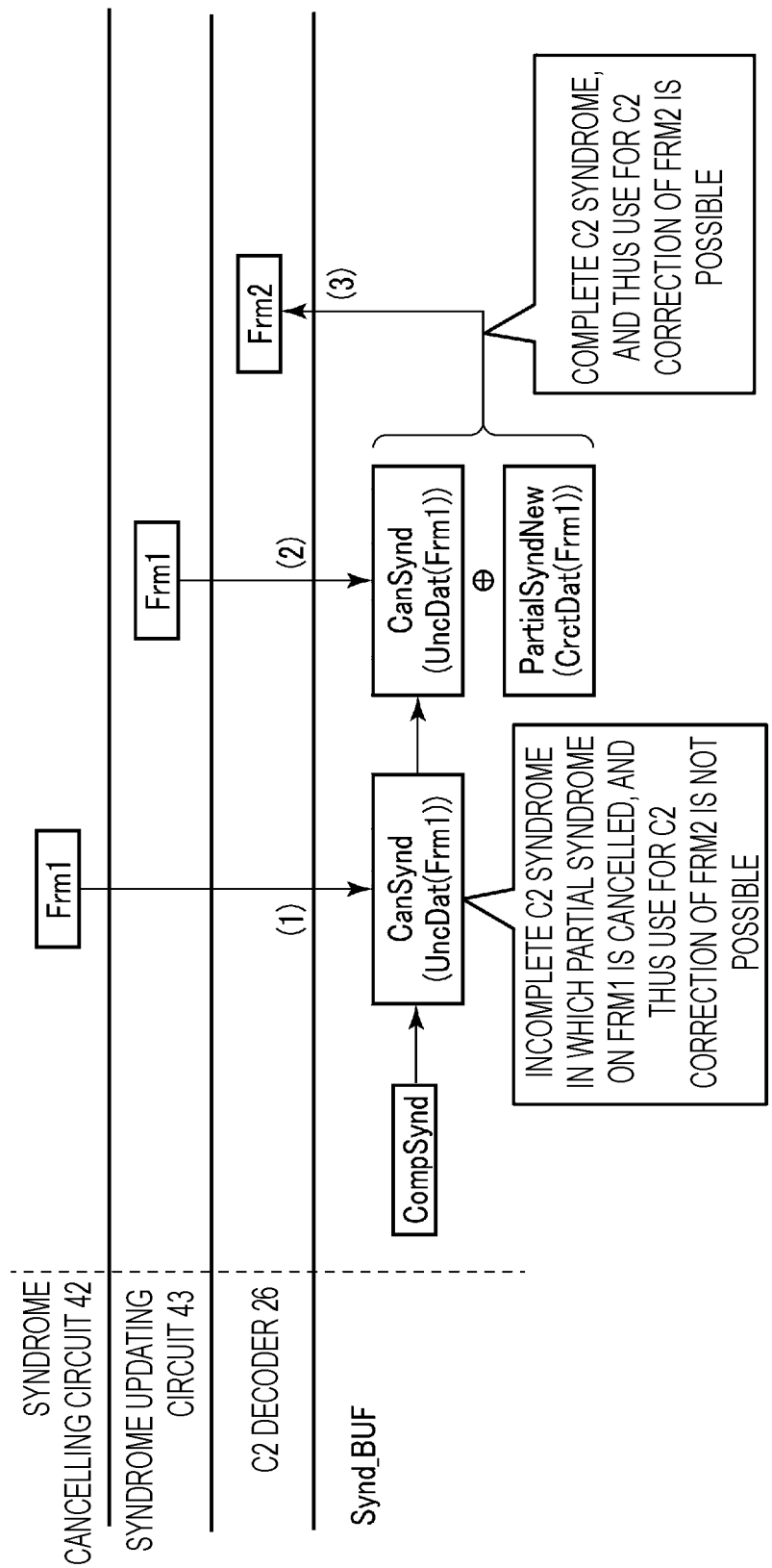
FIG. 41 is a view illustrating an operation according to a Comparative Example.

Next, Comparative Example will be described. FIG. 41 is a view illustrating an operation according to a Comparative Example. In Comparative Example, the Synd_BUF 28 does not include the cancellation partial syndrome buffer 28A, the complete syndrome buffer 28B, or the updated partial syndrome buffer 28C, but stores a transferred syndrome each time.

The syndrome cancelling circuit 42 performs an exclusive OR operation on a partial C2 syndrome on a C2 symbol UncDat included in the C1 frame Frm1 before an error correction by an iterative correction, and a current complete C2 syndrome CompSynd, and transfers the obtained cancellation C2 syndrome CanSynd(UncDat(Frm1)) to the Synd_BUF 28 ((1) in FIG. 41).

At this point in time, the syndrome stored in the Synd_BUF 28 is an incomplete C2 syndrome in which the partial C2 syndrome corresponding to the C1 frame Frm1 is cancelled. Therefore, the C2 decoder 26 may not perform a C2 correction on a C2 symbol included in the C1 frame Frm2 by using the incomplete C2 syndrome.

The C1 decoder 37 performs a C1 correction on the C1 frame Frm1. The syndrome updating circuit 43 updates the incomplete C2 syndrome by using a partial C2 syndrome on the C2 symbol included in the C1 frame Frm1 after the C1 correction. The updated incomplete C2 syndrome becomes a complete C2 syndrome, and is transferred to the Synd_BUF 28 ((2) in FIG. 41). The C2 decoder 26 may perform a C2 correction on the C2 symbol included in the C1 frame Frm2 as a next correction target by using the complete C2 syndrome ((3) in FIG. 41).

In this manner, in the Comparative Example, while the Synd_BUF 28 stores an incomplete C2 syndrome, a C2 correction may not be performed on a C2 symbol included in a next C1 frame. Therefore, a delay in an amount corresponding to this period occurs.

[3-5] Effect of Third Embodiment

According to the third embodiment, during a correction of a correction target C1 frame in the iterative correction, the complete syndrome buffer 28B continuously stores a complete C2 syndrome. Thus, before a C2 correction on a C2 symbol included in a certain correction target C1 frame and C1 correction on the corresponding C1 frame are completed, it is possible to start a C2 correction on a C2 symbol included in a next correction target C1 frame by using the complete C2 syndrome. That is, it is possible to perform an error correction on C2 symbols included in a plurality of uncorrectable C1 frames stored in the UNCBUF 27, through a pipeline operation. As a result, time taken for the correction processing may be reduced.

[4] Fourth Embodiment

In a fourth embodiment, when a C1 correction is performed in an iterative correction, an error correction using a hard decision decoding by an inner module, and an error correction using a soft decision decoding by an outer module may be selected. Then, even when the error correction using the soft decision decoding by the outer module is performed, the consistency of syndromes after the iterative correction may be secured.

[4-1] Circuit Configuration

Figure 42:
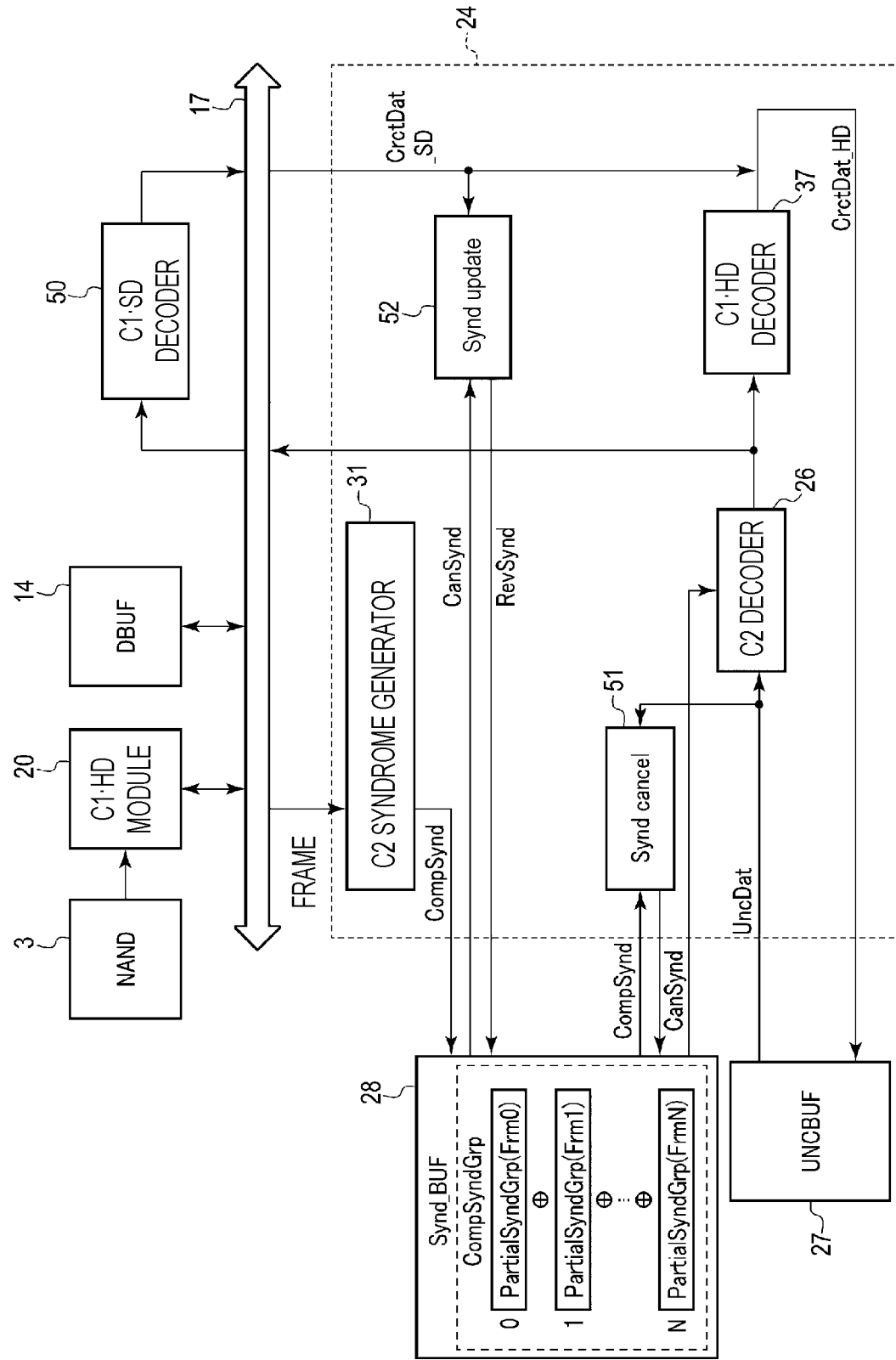
FIG. 42 is a block diagram of a memory system according to a fourth embodiment.

FIG. 42 is a block diagram of the memory system 2 according to the fourth embodiment. FIG. 42 mainly illustrates a circuit configuration related to an error correction.

The memory controller 4 is capable of performing a hard decision decoding and a soft decision decoding. The hard decision (HD) determines data by using information of two values "0" and "1." The soft decision (SD) determines data by using a probability, a likelihood, or a log likelihood ratio (LLR) that indicates the certainty of data. The soft decision decoding has a higher error correction capability than the hard decision decoding. However, the time for a correction processing by the soft decision decoding is longer than the time for a correction processing by the hard decision decoding. In the soft decision decoding, additional information such as a log likelihood ratio is required.

The functions of the C2 syndrome generator 31 and the C2 decoder 26 are the same as described above. A C1 hard decision module (C1-HD module) 20 performs a hard decision decoding. A C1 hard decision decoder (C1-HD decoder) 37 performs a hard decision decoding.

The configuration of the C2 syndrome generator 31 is the same as that in the first embodiment. That is, the C2 syndrome generator 31 includes the syndrome cancelling circuit 42 and the syndrome updating circuit 43. The syndrome cancelling circuit 42 and the syndrome updating circuit 43 update a complete C2 syndrome during the hard decision decoding by the C1 hard decision decoder 37.

The memory controller 4 further includes a C1 soft decision decoder (C1-SD decoder) 50.

The C1 soft decision decoder 50 performs a soft decision decoding by using a C1 code. The C1 soft decision decoder 50 performs an error correction in C1 frame units. The C1 soft decision decoder 50 is connected to the bus 17. The C1 soft decision decoder 50 receives a C1 frame including a C2 symbol corrected by the C2 decoder 26, and performs an error correction on the corresponding C1 frame. The C1 frame corrected by the C1 soft decision decoder 50 is transferred to the C2 module 24 via the bus 17 and transferred to the UNCBUF 27.

The C2 module 24 further includes a syndrome cancelling circuit 51 and a syndrome updating circuit 52. The function and the circuit configuration of the syndrome cancelling circuit 51 are the same as the above-described syndrome cancelling circuit 42, and the circuit may be shared. The function and the circuit configuration of the syndrome updating circuit 52 are also the same as the above-described syndrome updating circuit 43, and the circuit may be shared.

The C2 module 24 sequentially receives C2 symbols UncDat included in correction target C1 frames UncFrm before errors are corrected by the C2 decoder 26, from the UNCBUF 27. The syndrome cancelling circuit 51 receives a complete C2 syndrome CompSynd from the Synd_BUF 28. The syndrome cancelling circuit 51 generates a cancellation C2 syndrome CanSynd in which a partial C2 syndrome on the C2 symbol UncDat is cancelled, from the complete C2 syndrome CompSynd. The cancellation C2 syndrome CanSynd is transferred to the Synd_BUF 28.

The C2 module 24 sequentially receives C2 symbols CrctDat_SD included in correction target C1 frames CrctFrm_SD whose errors are corrected by the C1 soft decision decoder 50. The syndrome updating circuit 52 receives the cancellation C2 syndrome CanSynd from the Synd_BUF 28. The syndrome updating circuit 52 performs an exclusive OR operation on the cancellation C2 syndrome CanSynd, and an updated partial C2 syndrome PartialSyndNew on the corrected C2 symbol CrctDat SD, so as to generate an updated complete C2 syndrome RevSynd. The updated complete C2 syndrome RevSynd is transferred to the Synd_BUF 28.

FIG. 42 illustrates a state where a complete C2 syndrome set CompSyndGrp generated by exclusive OR operations on sets of partial C2 syndromes PartialSynd (hereinafter, also referred to as partial C2 syndrome sets PartialSyndGrp) is stored in the Synd_BUF 28. The partial C2 syndrome set PartialSyndGrp will be described later with reference to FIG. 44.

[4-2] Operation

Figure 43:
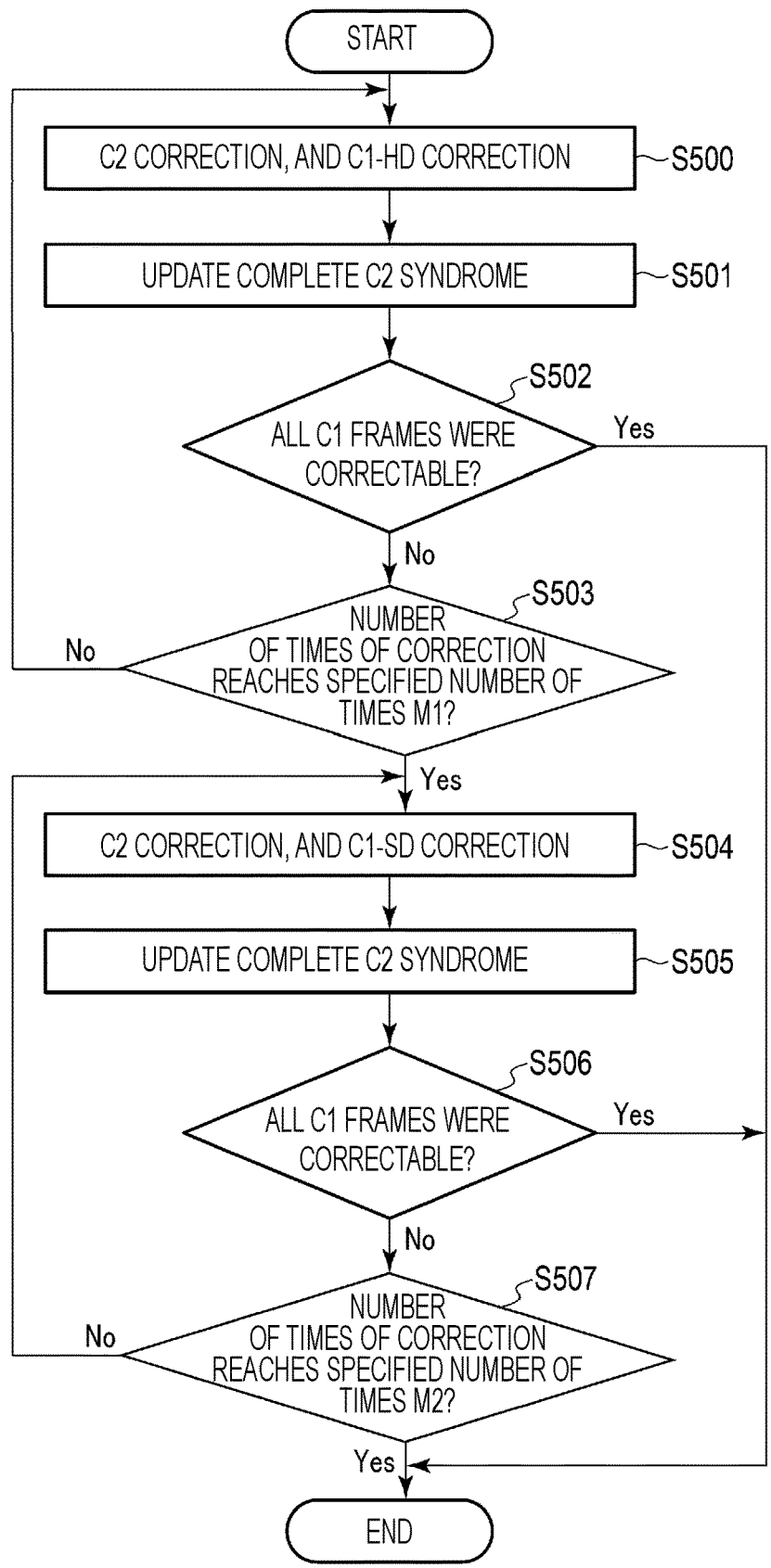
FIG. 43 is a flowchart illustrating an error correction operation according to the fourth embodiment.

Next, an operation of the memory system 2 in the embodiment will be described. FIG. 43 is a flowchart illustrating an error correction operation according to the embodiment. It is assumed that correction target C1 frames are stored in the UNCBUF 27. That is, a preparation for iterative correction is the same as that in the first embodiment.

First, an iterative correction using a hard decision decoding is performed. In the iterative correction using the hard decision decoding, the C2 decoder 26 performs a C2 correction on a C2 symbol included in a correction target C1 frame, and the C1 hard decision decoder 37 performs error correction using hard decision decoding of a C1 code, on the correction target C1 frame (hereinafter, referred to as a C1-HD correction or a hard decision decoding) (step S500).

The syndrome cancelling circuit 42 and the syndrome updating circuit 43 in the C2 syndrome generator 31 update a complete C2 syndrome by using the C2 symbol included in the C1-HD corrected correction target C1 frame (step S501).

The processor 11 determines whether all the correction target C1 frames in the UNCBUF 27 were correctable by the processing in step S500 (step S502). When it is determined that all the correction target C1 frames in the UNCBUF 27 were correctable (step S502=Yes), the correction processing is ended.

When an uncorrectable correction target C1 frame remains in the UNCBUF 27 (step S502=No), the processor 11 determines whether the number of times of iterative correction using the hard decision decoding reaches a specified number of times M1 (step S503). When it is determined that the number of times of iterative correction does not reach the specified number of times M1 (step S503=No), the processor 11 returns to step S500 and repeats the iterative correction using the hard decision decoding.

When it is determined that the number of times of iterative correction reaches the specified number of times M1 (step S503=Yes), after that, an iterative correction using a soft decision decoding is performed. In the iterative correction using the soft decision decoding, the C2 decoder 26 performs a C2 correction on a C2 symbol included in a correction target C1 frame, and the C1 soft decision decoder 50 performs an error correction using a soft decision decoding of a C1 code on the correction target C1 frame (hereinafter, referred to as a C1-SD correction or a soft decision decoding) (step S504).

The syndrome cancelling circuit 51 and the syndrome updating circuit 52 update a complete C2 syndrome by using the C2 symbol included in the C1-SD corrected correction target C1 frame (step S505). An operation of updating the complete C2 syndrome includes an operation of partially cancelling the complete C2 syndrome by using the C2 symbol included in the correction target C1 frame before C1-SD correction, and an operation of partially updating the complete C2 syndrome by using the C2 symbol included in the C1-SD-corrected correction target C1 frame.

Figure 44:
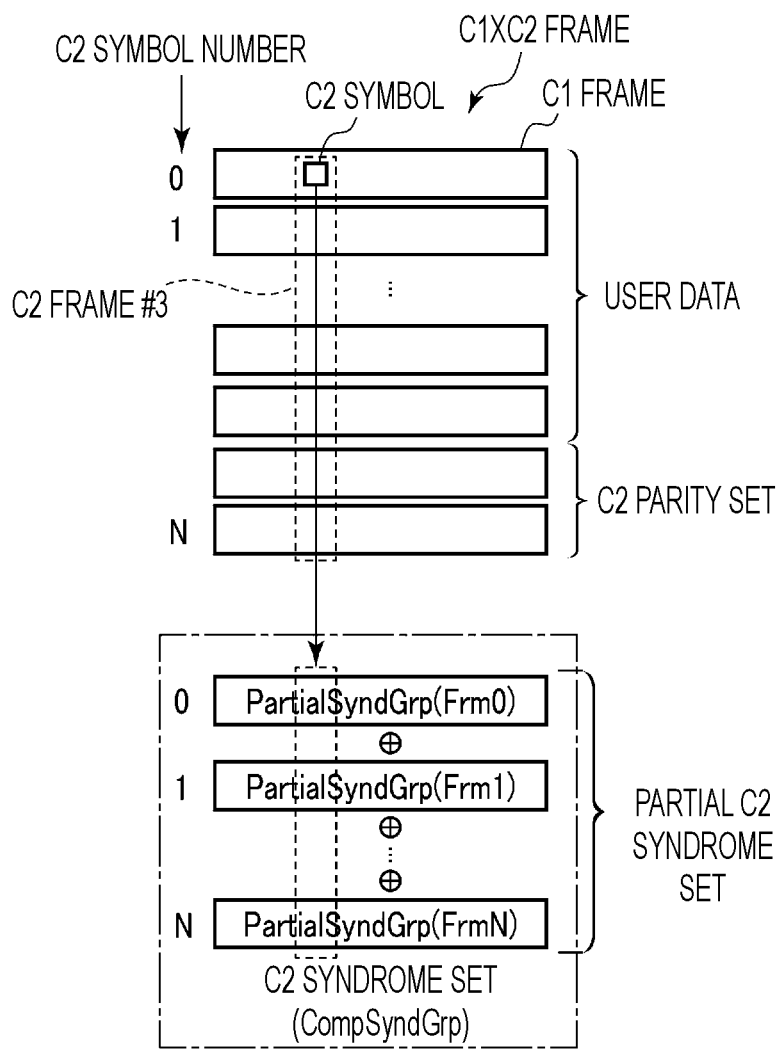
FIG. 44 is a view illustrating a data structure of a C2 syndrome set according to the fourth embodiment.

FIG. 44 is a view illustrating a data structure of a C2 syndrome set according to the embodiment. A C1×C2 frame as a target of iterative correction includes (N+1) C1 frames corresponding to C2 symbol numbers 0 to N. The "N" is, for example, 254.

A C2 syndrome set is generated for the C1×C2 frame. The C2 syndrome set is configured on the basis of (N+1) partial C2 syndrome sets. Each partial C2 syndrome set corresponds to a set of C2 symbols included in one C1 frame. Specifically, from partial C2 syndromes generated for a plurality of (e.g., 4K+α) C2 symbols, respectively, included in a C1 frame corresponding to a C2 symbol number 0, a partial C2 syndrome set (PartialSyndGrp(Frm0)) corresponding to the C1 frame corresponding to the C2 symbol number 0 is generated. Likewise, from partial C2 syndromes generated for a plurality of C2 symbols, respectively, included in a C1 frame corresponding to a C2 symbol number 1, a partial C2 syndrome set (PartialSyndGrp (Frm1)) corresponding to the C1 frame corresponding to the C2 symbol number 1 is generated. From partial C2 syndromes generated for a plurality of C2 symbols, respectively, included in a C1 frame corresponding to a C2 symbol number N, a partial C2 syndrome set (PartialSyndGrp (FrmN)) corresponding to the C1 frame corresponding to the C2 symbol number N is generated. By performing exclusive OR operations on the partial C2 syndrome sets PartialSyndGrp(Frm0) to PartialSyndGrp(FrmN) generated in this manner, a complete C2 syndrome set (CompSyndGrp) of the corresponding C1×C2 frame may be obtained.

In addition, as described in the first embodiment, a complete C2 syndrome is generated for each C2 frame (i.e., for each of columns of C2 symbols in the C1×C2 frame). A set of partial C2 syndromes on a C2 frame number "3" among partial C2 syndromes is surrounded by a broken line.

By performing an exclusive OR operation on the set of partial C2 syndromes surrounded by the broken line, a complete C2 syndrome CompSynd of the C2 frame with the C2 frame number "3" may be obtained.

Figure 45:
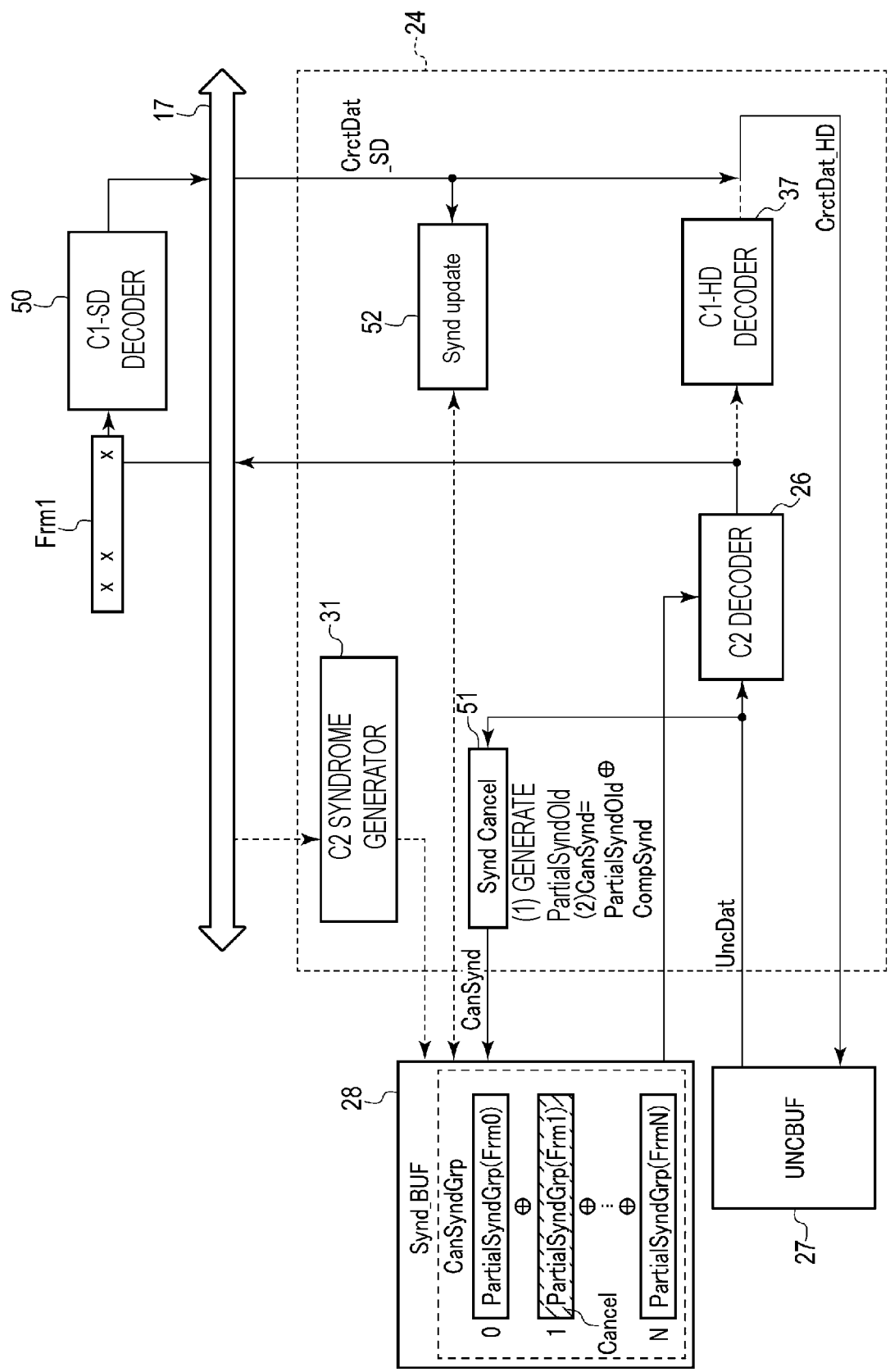
FIG. 45 is a view illustrating an operation of cancelling a syndrome in a soft decision decoding according to the fourth embodiment.

FIG. 45 is a view illustrating an operation of cancelling a complete C2 syndrome in a soft decision decoding according to the embodiment. Here, it is assumed that a C1 frame Frm1 corresponding to a C2 symbol number 1 is corrected.

The syndrome cancelling circuit 51 receives a C2 symbol UncDat included in the C1 frame Frm1 before a correction by the C2 decoder 26, from the UNCBUF 27. The syndrome cancelling circuit 51 generates a partial C2 syndrome PartialSyndOld from the C2 symbol UncDat included in the C1 frame Frm1. The syndrome cancelling circuit 51 receives a complete C2 syndrome CompSynd corresponding to a column where the UncDat is located, in a complete C2 syndrome set CompSyndGrp stored in the Synd_BUF 28. The syndrome cancelling circuit 51 performs an exclusive OR operation on the partial C2 syndrome PartialSyndOld and the complete C2 syndrome CompSynd, so as to generate a cancellation C2 syndrome CanSynd. The cancellation C2 syndrome CanSynd is transferred to the Synd_BUF 28. The generation of the cancellation C2 syndrome CanSynd and the transfer to the Synd_BUF 28 are repeatedly executed on each C2 symbol included in each correction target C1 frame in the UNCBUF 27, in the row direction of the C1×C2 frame. Accordingly, the Synd_BUF 28 stores a cancellation C2 syndrome set CanSyndGrp in which a partial C2 syndrome set corresponding to the C1 frame corresponding to the C2 symbol number 1 is cancelled.

The cancellation C2 syndrome set CanSyndGrp corresponds to a set in which a partial C2 syndrome set PartialSyndGrp generated for the correction target C1 frame Frm1 is cancelled from N+1 partial C2 syndrome sets PartialSyndGrp generated for C1 frames Frm0 to FrmN, respectively. The Synd_BUF 28 in FIG. 45 indicates this state. One of numbers 0 to N attached to the partial C2 syndrome sets PartialSyndGrp, respectively, indicates that a corresponding partial C2 syndrome set PartialSyndGrp is generated by using C2 symbols included in a C1 frame Frm corresponding to the corresponding number. For example, a partial C2 syndrome set PartialSyndGrp accompanied by a number "1" is a partial C2 syndrome set PartialSyndGrp on C2 symbols included in the C1 frame Frm1. Among these partial C2 syndrome sets PartialSyndGrp(Frm0) to PartialSyndGrp (FrmN), a partial C2 syndrome set PartialSyndGrp(Frm1) generated for the C1 frame Frm1 is cancelled.

Figure 46:
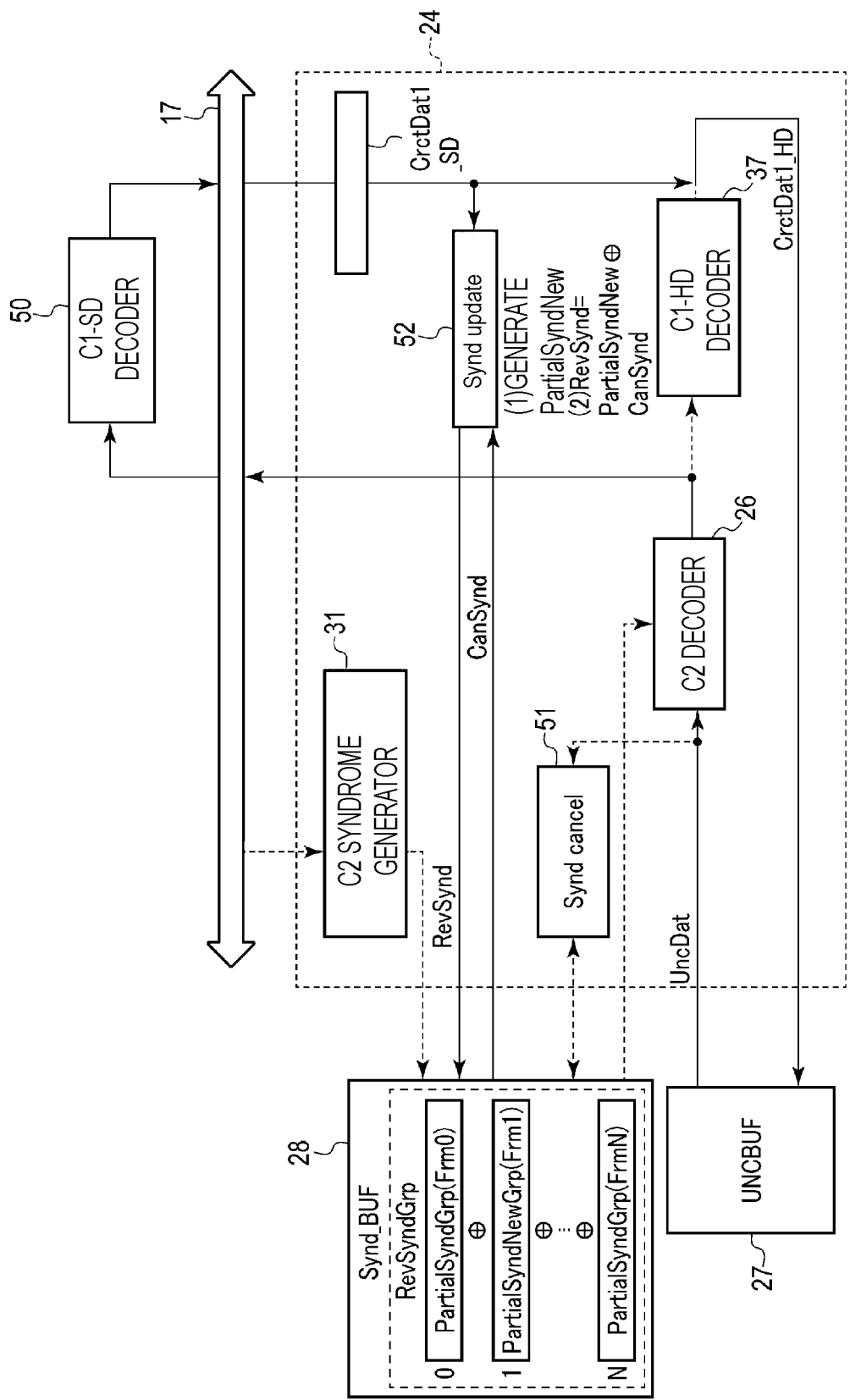
FIG. 46 is a view illustrating an operation of updating a syndrome in the soft decision decoding according to the fourth embodiment.

FIG. 46 is a view illustrating an operation of updating a syndrome in the soft decision decoding according to the embodiment. The syndrome updating circuit 52 receives a C2 symbol CrctDat1_SD included in a C1 frame CrctFrm1_SD corrected by the C1 soft decision decoder 50. The syndrome updating circuit 52 generates an updated partial C2 syndrome PartialSyndNew corresponding to the C2 symbol CrctDat1_SD. The syndrome updating circuit 52 receives a cancellation C2 syndrome CanSynd corresponding to a column where the CrctDat1_SD is located, in a cancellation C2 syndrome set CanSyndGrp stored in the Synd_BUF 28. The syndrome updating circuit 52 performs an exclusive OR operation on the partial C2 syndrome PartialSyndNew and the cancellation C2 syndrome CanSynd so as to generate an updated complete C2 syndrome RevSynd. The updated complete C2 syndrome RevSynd is transferred to the Synd_BUF 28. The generation of the updated complete C2 syndrome RevSynd and the transfer to the Synd_BUF 28 are repeatedly executed on C2 symbols included in the C1 frame Frm1 corresponding to the C2 symbol number 1, in the row direction of the C1×C2 frame. Accordingly, the Synd_BUF 28 stores an updated complete C2 syndrome set RevSyndGrp in which the partial C2 syndrome set corresponding to the C1 frame Frm1 corresponding to the C2 symbol number 1 is updated.

Referring back to FIG. 43, the processor 11 determines whether all the correction target C1 frames in the UNCBUF 27 were correctable (step S506). When it is determined that all the correction target C1 frames in the UNCBUF 27 were correctable (step S506=Yes), the correction processing is ended.

When it is determined that an uncorrectable correction target C1 frame remains in the UNCBUF 27 (step S506=No), the processor 11 determines whether the number of times of iterative correction by the soft decision decoding reaches a specified number of times M2 (step S507). When it is determined that the number of times of iterative correction does not reach the specified number of times M2 (step S507=No), the processor 11 returns to step S504 and repeats the iterative correction using the soft decision decoding. Meanwhile, when it is determined that the number of times of iterative correction reaches the specified number of times M2 (step S507=Yes), the correction processing is ended.

[4-3] Effect of Fourth Embodiment

According to the fourth embodiment, even in a case of a correction by a soft decision decoding, as described below, it is possible to easily generate a C2 syndrome in which a corrected state is reflected. The soft decision decoding is executed by the C1 soft decision decoder 50 located outside of the C2 module. Thus, when an error in a certain correction target C1 frame is corrected by the soft decision decoding, it is required to generate a new C2 syndrome set by using the entire new C1×C2 frame including the error-corrected correction target C1 frame. A processing for this takes time.

In the fourth embodiment, the C2 module 24 stores C2 syndromes generated for a plurality of C1 frames, respectively, in a C1×C2 frame, in the Synd_BUF 28. Then, the C2 module 24 cancels a partial C2 syndrome corresponding to a C2 symbol included in a correction target C1 frame. The C2 module 24 generates an updated partial C2 syndrome on the C2 symbol included in the C1 frame error-corrected by the C1 soft decision decoder 50 outside the C2 module 24. The C2 module 24 updates the cancelled partial C2 syndrome by using the updated partial C2 syndrome. In this manner, it is possible to obtain a C2 syndrome in which the state of the correction target frame C1 processed outside the C2 module 24 is reflected, within a short time, without re-generating the entire C2 syndrome.

Further, it is possible to execute a soft decision decoding having a higher error correction capability than a hard decision decoding. Accordingly, the accuracy of error correction may be improved.

[5] Fifth Embodiment

In a fifth embodiment, when a C1 correction is performed in an iterative correction, a hard decision decoding using an inner module and a soft decision decoding using an outer module may be selected. Then, even when the soft decision decoding using the outer module is performed, the consistency of syndromes after the iterative correction may be secured.

[5-1] Circuit Configuration

FIGS. 47A to 47F are block diagrams of the memory system 2 according to the fifth embodiment. FIGS. 47A to 47F mainly illustrate a circuit configuration related to an error correction.

The memory controller 4 includes the C2 module 24, the C1-SD decoder 50, a DMAC 15A, and a DMAC 15B. The C2 module 24 includes the C2 decoder 26, the C2 syndrome generator 31, the C1 hard decision decoder (C1-HD decoder) 37, and a bus interface circuit (Bus I/F) 53.

The bus interface circuit 53, the DMAC 15A, and the DMAC 15B conform to an advanced extensible interface (AXI) protocol. Using the AXI protocol, a communication of a user-defined signal AxUSER as additional information may be performed. The user-defined signal AxUSER includes a user-defined signal for writing AWUSER, and a user-defined signal for reading ARUSER. In the embodiment, by using the signal AxUSER, a communication of additional information (referred to as C2 syndrome information) for generating a C2 syndrome is performed.

The DMAC 15A and the DMAC 15B add signals AxUSER including C2 syndrome information, to data to be transferred to perform a data transfer. The DMAC 15A transfers an uncorrected C1 frame UncFrm_SD stored in the UNCBUF 27 to the C1 soft decision decoder 50 and the bus interface circuit 53. The DMAC 15B transfers a corrected C1 frame CrctFrm_SD output from the C1 soft decision decoder 50, to the UNCBUF 27 and the bus interface circuit 53.

The bus interface circuit 53 is connected to a bus between the DMAC 15A and the C1 soft decision decoder 50. The bus interface circuit 53 is also connected to a bus between the DMAC 15B and the UNCBUF 27. The bus interface circuit 53 sequentially obtains by a snooping operation data output from the DMAC 15A, that is, C2 symbols UncDat_SD included in the uncorrected C1 frame UncFrm_SD. The bus interface circuit 53 sequentially snoops through data output from the DMAC 15B, that is, C2 symbols CrctDat_SD included in the corrected C1 frame CrctFrm_SD. Here, the bus interface circuit 53 performs a snoop processing with reference to the signals AxUSER accompanying the data output from the DMAC 15A and the DMAC 15B. The signal AxUSER includes write transfer information WTI. The write transfer information WTI is information used for generating a C2 parity. Specifically, the write transfer information WTI indicates in which row of a C1×C2 frame the C2 symbol obtained through snooping is located, that is, in which C1 frame, the C2 symbol is included.

The C2 syndrome generator 31 sequentially receives the C2 symbols UncDat_SD included in the C1 frame UncFrm_SD before a correction by the C1 soft decision decoder 50, from the bus interface circuit 53. Further, the C2 syndrome generator 31 sequentially receives the C2 symbols CrctDat_SD included in the C1 frame CrctFrm_SD corrected by the C1 soft decision decoder 50, from the bus interface circuit 53. The configuration of the C2 syndrome generator 31 is the same as that in the first embodiment. That is, the C2 syndrome generator 31 includes the syndrome cancelling circuit 42 and the syndrome updating circuit 43. The C2 syndrome generator 31 performs a cancellation and an update of syndromes by using the C2 symbols UncDat_SD included in the uncorrected C1 frame and the C2 symbols CrctDat_SD included in the corrected C1 frame.

[5-2] Operation

Next, an operation of the memory system 2 of the embodiment will be described. In the operation of the memory system 2 of the embodiment, a preparation of an iterative correction and an iterative correction using a hard decision decoding subsequent thereto are the same as those in the fourth embodiment, but a subsequent iterative correction using a soft decision decoding is different from that in the fourth embodiment.

In the iterative correction using the soft decision decoding in the embodiment, a C2 correction and a C1-SD correction are separately performed. That is, first, only a C2 correction is performed on a C2 symbol included in each correction target C1 frame stored in the UNCBUF 27, and a processing of cancelling and updating a partial C2 syndrome in a complete C2 syndrome stored in the Synd_BUF 28 is performed accordingly (hereinafter, this will be referred to as a soft decision pre-processing). Then, only a C1-SD correction is performed on each correction target C1 frame stored in the UNCBUF 27, and a processing of cancelling and updating a partial C2 syndrome in the complete C2 syndrome stored in the Synd_BUF 28 is performed accordingly (hereinafter, this will be referred to as a soft decision post-processing).

Figure 47A:
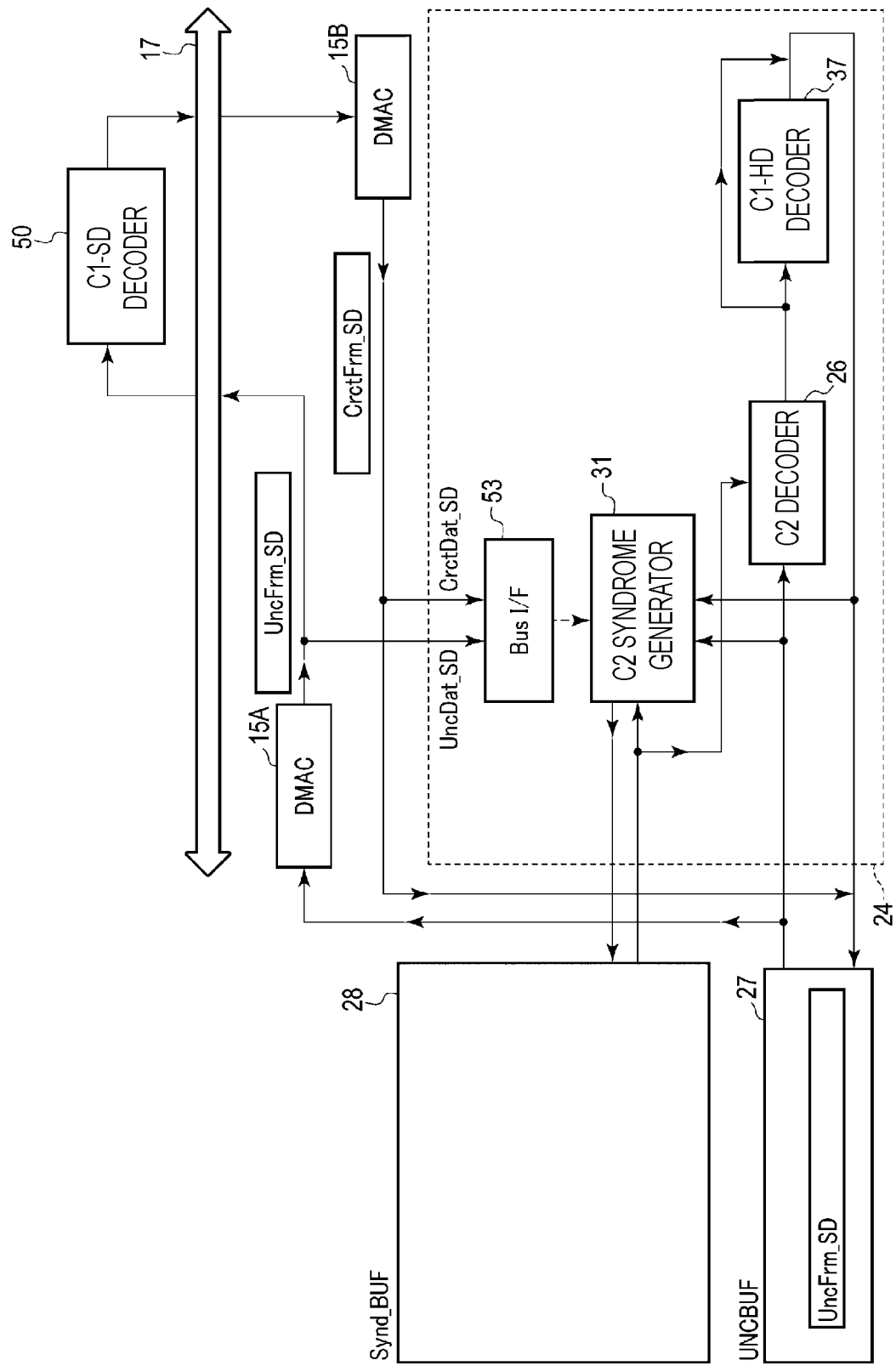
FIG. 47A is a block diagram of a memory system according to a fifth embodiment.
Figure 47B:
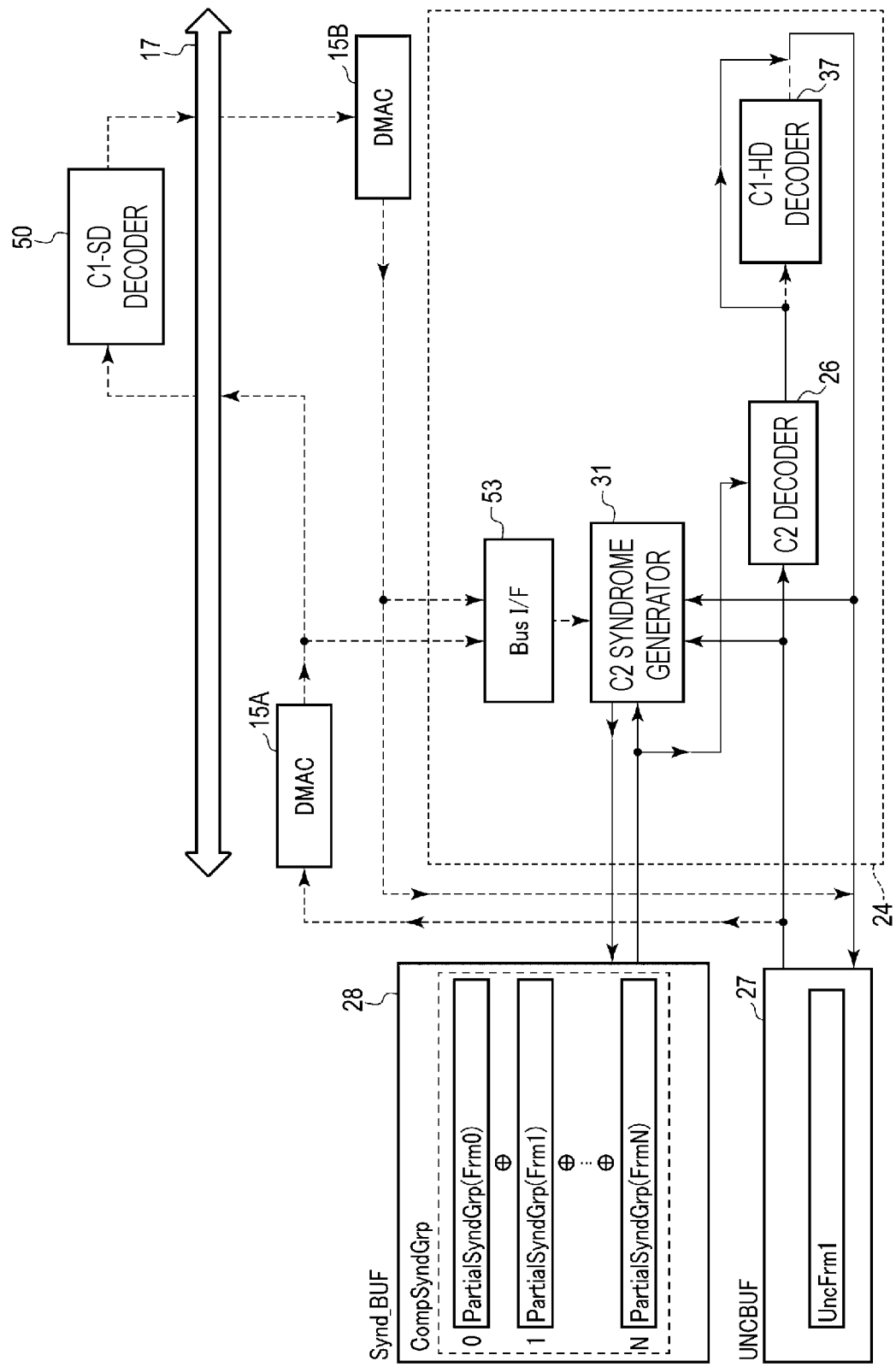
FIG. 47B is a block diagram illustrating a state before a start of a soft decision pre-processing according to the fifth embodiment.

FIG. 47B is a view illustrating a state before a start of a soft decision pre-processing. It is assumed that in the Synd_BUF 28, a complete C2 syndrome set CompSyndGrp corresponding to a C1×C2 frame C1×C2Frm_HD (not illustrated) obtained by an iterative correction using a hard decision decoding is stored. It is assumed that PartialSyndGrp(Frm0) to PartialSyndGrp(FrmN) illustrated in the drawing are partial C2 syndrome sets generated from C1 frames, respectively, corresponding to C2 symbol numbers 0 to N constituting the C1×C2Frm_HD. It is assumed that the complete C2 syndrome set CompSyndGrp is obtained by exclusive OR operations on these partial C2 syndrome sets. Further, in the UNCBUF 27, UncFrm1 that is a C1 frame corresponding to a C2 symbol number 1 in the C1×C2Frm_HD is stored. Hereinafter, it is assumed that the UncFrm1 is corrected by the soft decision pre-processing and the soft decision post-processing.

The soft decision pre-processing corresponds to a case in which a correction processing by the C1 decoder 37 is bypassed in the first embodiment. The soft decision pre-processing consists of a C2 correction and a partial C2 syndrome cancelling processing and a C2 syndrome updating processing subsequent thereto.

Figure 47C:
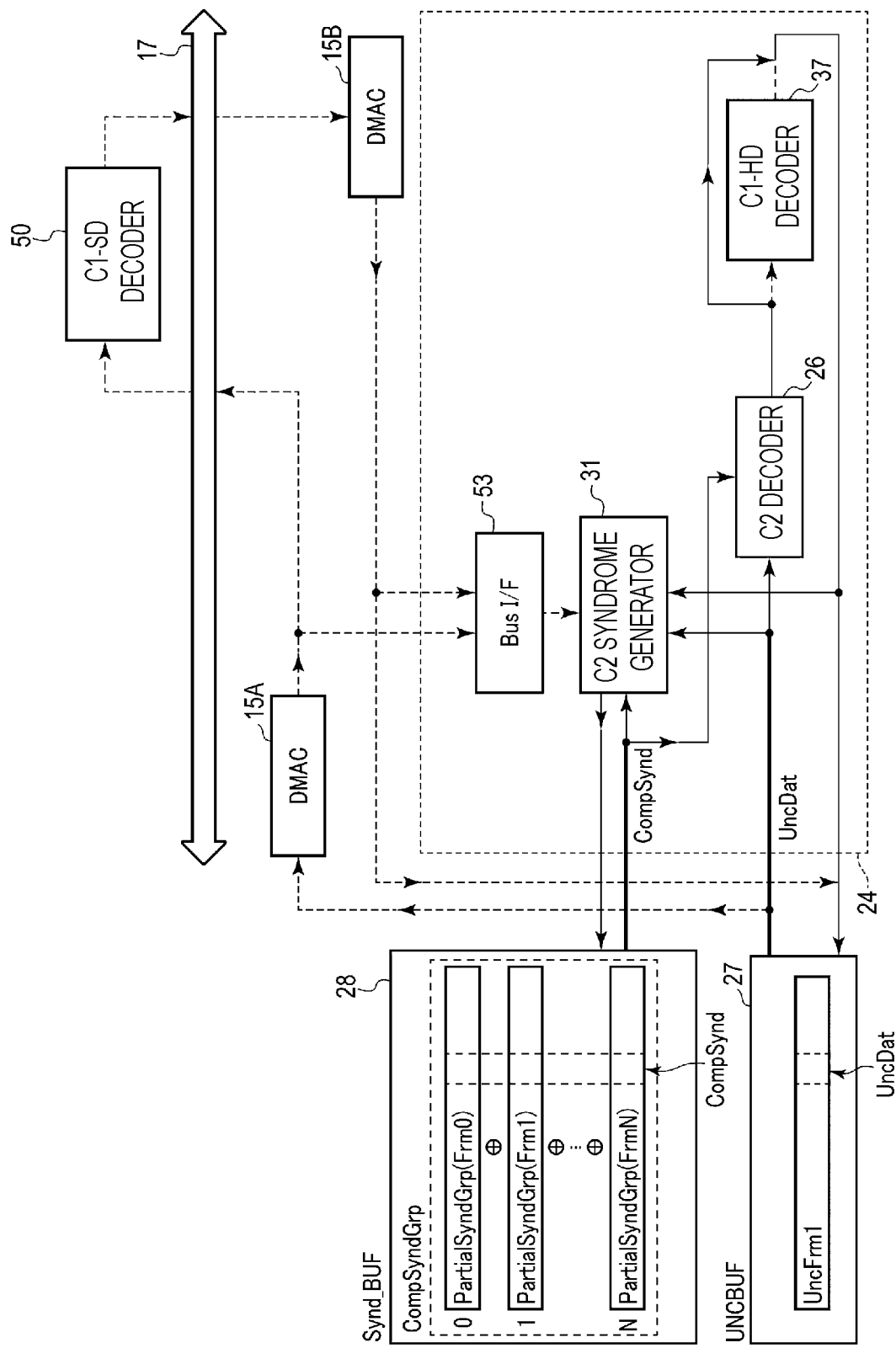
FIG. 47C is a block diagram illustrating a data flow of the soft decision pre-processing according to the fifth embodiment.

As illustrated in FIG. 47C, the C2 module 24 receives a C2 symbol UncDat included in the UncFrm1, from the UNCBUF 27, in order to perform a C2 correction on the UncFrm1. At the same time, the C2 module 24 receives a complete C2 syndrome CompSynd corresponding to the UncDat, from the Synd_BUF 28.

Figure 47D:
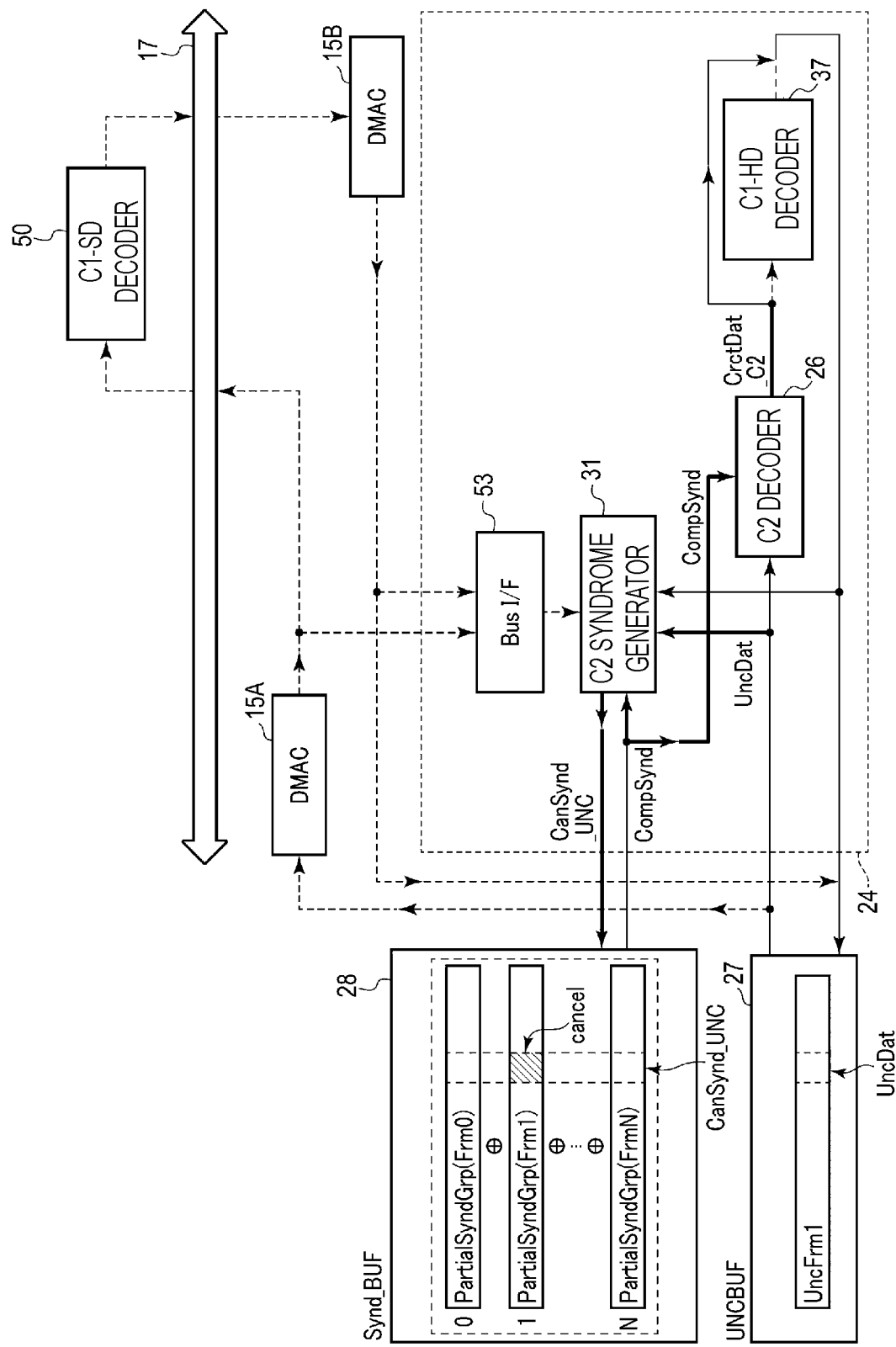
FIG. 47D is a block diagram illustrating a data flow of the soft decision pre-processing according to the fifth embodiment.
Figure 47E:
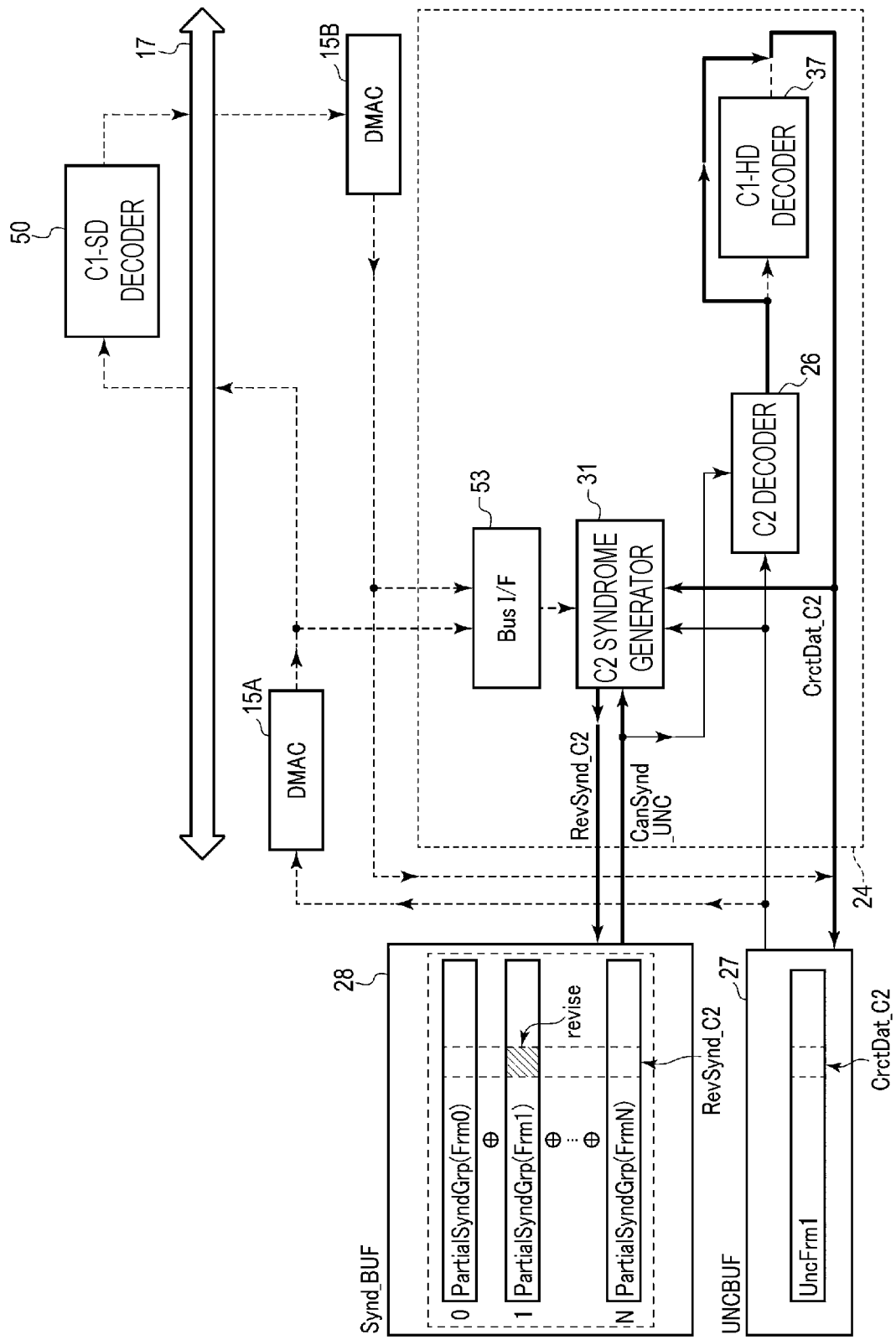
FIG. 47E is a block diagram illustrating a data flow of the soft decision pre-processing according to the fifth embodiment.

Subsequently, as illustrated in FIG. 47D, the C2 decoder 26 generates CrctDat_C2, that is C2-corrected UncDat, by using the complete C2 syndrome CompSynd. Further, in parallel to this, the C2 syndrome generator 31 generates a cancellation C2 syndrome CanSynd_UNC by performing an exclusive OR operation on the complete C2 syndrome CompSynd and a partial C2 syndrome generated from the C2 symbol UncDat. The C2 syndrome generator transfers the generated cancellation C2 syndrome CanSynd_UNC to the Synd_BUF 28. By this processing, the complete C2 syndrome CompSynd in the Synd_BUF 28 as illustrated in FIG. 47C is replaced with the cancellation C2 syndrome CanSynd_UNC illustrated in FIG. 47D.

The C2 module 24 sequentially receives complete C2 syndromes CompSynd corresponding to C2 symbols UncDat, respectively, included in the UncFrm1, from the Synd_BUF 28. Further, subsequently to this, the generation of the C2-corrected CrctDat_C2, and the generation of the cancellation C2 syndrome CanSynd_UNC and the transfer to the Synd_BUF 28 are also sequentially performed on C2 symbols UncDat included in the UncFrm1.

As illustrated in FIG. 47D, the C2-corrected CrctDat_C2 is transferred to the UNCBUF 27 without being processed by the C1-HD decoder 37. Further, in parallel to this, the C2 module 24 reads the cancellation C2 syndrome CanSynd_UNC stored in the Synd_BUF 28. The read cancellation C2 syndrome CanSynd_UNC, and the CrctDat_C2 are transferred to the C2 syndrome generator 31. The C2 syndrome generator 31 generates an updated complete C2 syndrome RevSynd_C2 by performing an exclusive OR operation on the cancellation C2 syndrome CanSynd_UNC, and a partial C2 syndrome generated from the CrctDat_C2. The generated updated complete C2 syndrome RevSynd_C2 is transferred to the Synd_BUF 28. By this processing, the cancellation C2 syndrome CanSynd_UNC in the Synd_BUF 28 as illustrated in FIG. 47D is replaced with the updated complete C2 syndrome RevSynd_C2 illustrated in FIG. 47E.

The generation of the updated complete C2 syndrome RevSynd_C2 and the transfer to the Synd_BUF 28 are sequentially repeated on the CrctDat_C2 sequentially output by the C2 decoder 26. As illustrated in FIG. 47F, when the C2 correction is performed on all C2 symbols included in the UncFrm1, the UncFrm1 stored in the UNCBUF 27 is replaced with CrctFrm1_C2 that is a C1 frame in which all the C2 symbols are C2-corrected. In addition, for all the complete C2 syndromes CompSynd included in the complete C2 syndrome set CompSyndGrp, a cancellation processing using the C2 symbols UncDat included in the UncFrm1 and an updating processing using the C2 symbols CrctDat_C2 included in the CrctFrm1_C2 are performed. Accordingly, PartialSyndGrp(Frm1) that is one of partial C2 syndrome sets used when the complete C2 syndrome set CompSyndGrp is generated by exclusive OR operations becomes PartialSyndNewC2Grp(Frm1) in which partial C2 syndromes constituting the PartialSyndGrp(Frm1) are replaced with partial C2 syndromes corresponding to the CrctFrm1_C2. In this manner, the complete C2 syndrome set CompSyndGrp is replaced with an updated complete C2 syndrome set RevSyndC2Grp.

The updated complete C2 syndrome set RevSyndC2Grp corresponds to a complete C2 syndrome set of a C1×C2 frame C1×C2Frm_C2 (not illustrated), in which in the C1×C2 frame C1×C2Frm_HD obtained by the iterative correction using the hard decision decoding, the UncFrm1 as the C1 frame corresponding to the C2 symbol number 1 is replaced with a C2-corrected C1 frame CrctFrm1_C2. When there is a plurality of correction target C1 frames in the UNCBUF 27, this soft decision pre-processing is repeated on each of the correction target C1 frames.

FIG. 47F is a view illustrating a state after the soft decision pre-processing is performed on the UncFrm1, and also a view illustrating a state before the soft decision post-processing is performed on the CrctFrm1_C2. In the soft decision post-processing, the C1 frame CrctFrm1_C2 stored in the UNCBUF 27 is corrected by the C1-SD decoder 50, and the updated complete C2 syndrome set RevSyndC2Grp stored in the Synd_BUF 28 is also updated according to the correction.

Next, descriptions will be made on a data flow of a soft decision post-processing according to the embodiment with reference to FIGS. 48A to 48E.

Figure 48A:
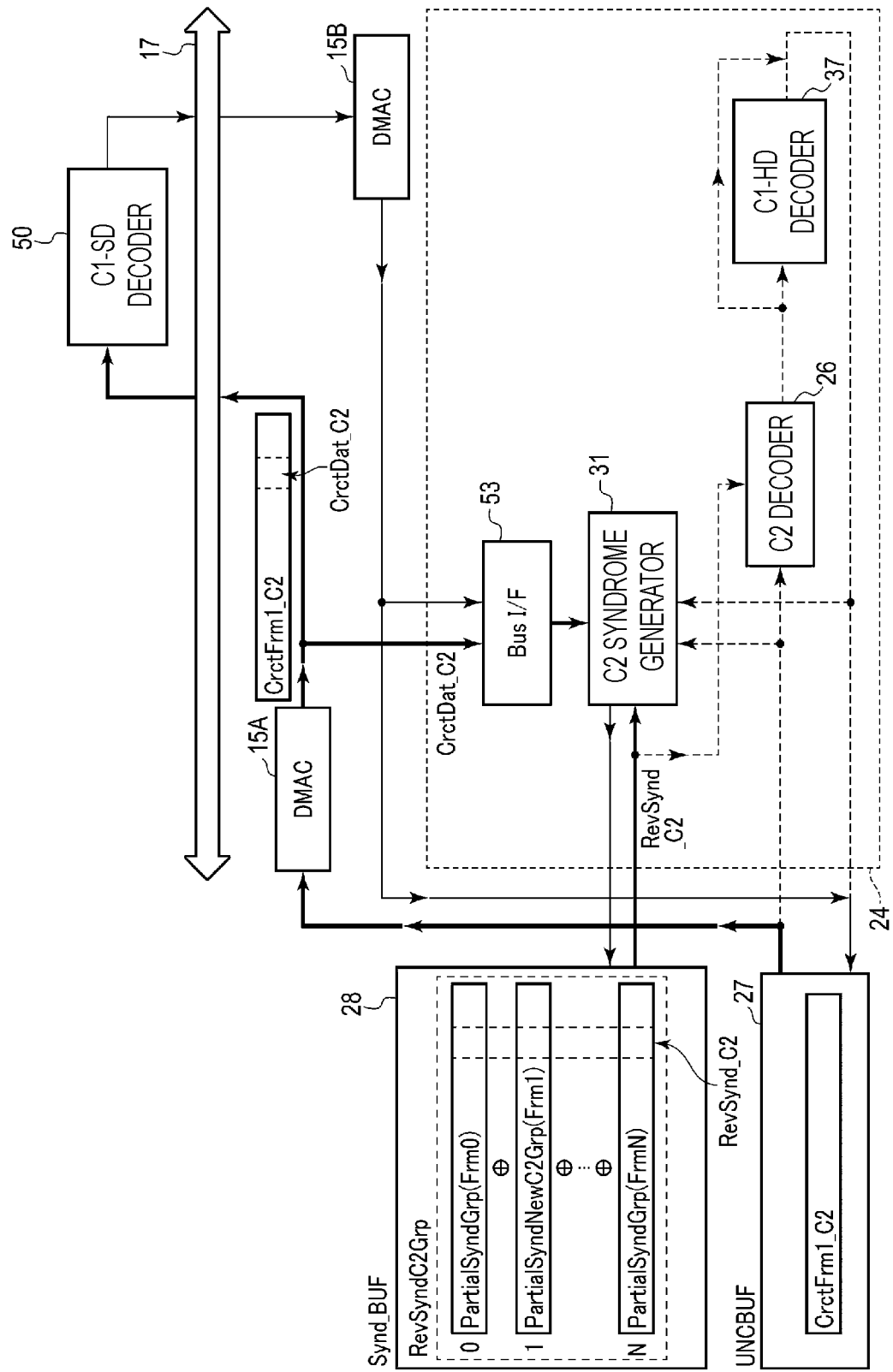
FIG. 48A is a block diagram illustrating a data flow of a soft decision post-processing according to the fifth embodiment.

As illustrated in FIG. 48A, the DMAC 15A transfers all C2 symbols included in the correction target C1 frame CrctFrm1_C2 stored in the UNCBUF 27 to the C1-SD decoder 50. Accordingly, the bus interface circuit 53 sequentially obtains by a snooping operation the C2 symbols CrctDat_C2 included in the C1 frame CrctFrm1_C2 with reference to a signal AxUSER transmitted from the DMAC 15A, and transfers the C2 symbols CrctDat_C2 to the C2 syndrome generator 31. The C2 syndrome generator 31 reads the updated complete C2 syndrome RevSynd_C2 corresponding to the received C2 symbol CrctDat_C2, from the updated complete C2 syndrome set RevSyndC2Grp.

Figure 48B:
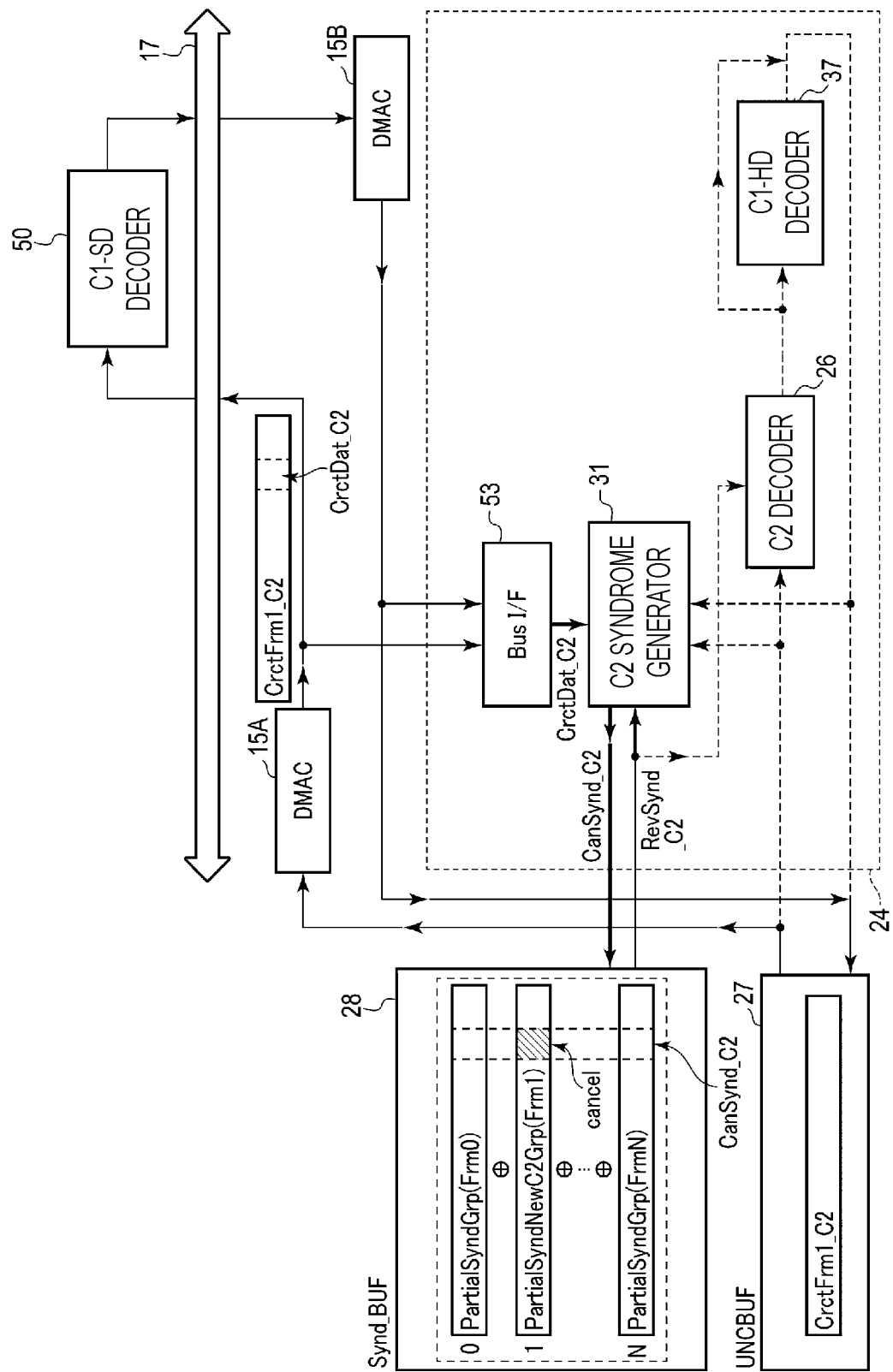
FIG. 48B is a block diagram illustrating a data flow of the soft decision post-processing according to the fifth embodiment.

FIG. 48B is a view illustrating a cancellation of the updated complete C2 syndrome RevSynd_C2. The C2 syndrome generator 31 generates a partial C2 syndrome from the C2 symbol CrctDat_C2, and performs an exclusive OR operation on the partial C2 syndrome and the updated complete C2 syndrome RevSynd_C2 so as to generate a cancellation C2 syndrome CanSynd_C2. The generated cancellation C2 syndrome CanSynd_C2 is transferred to the Synd_BUF 28.

Figure 48C:
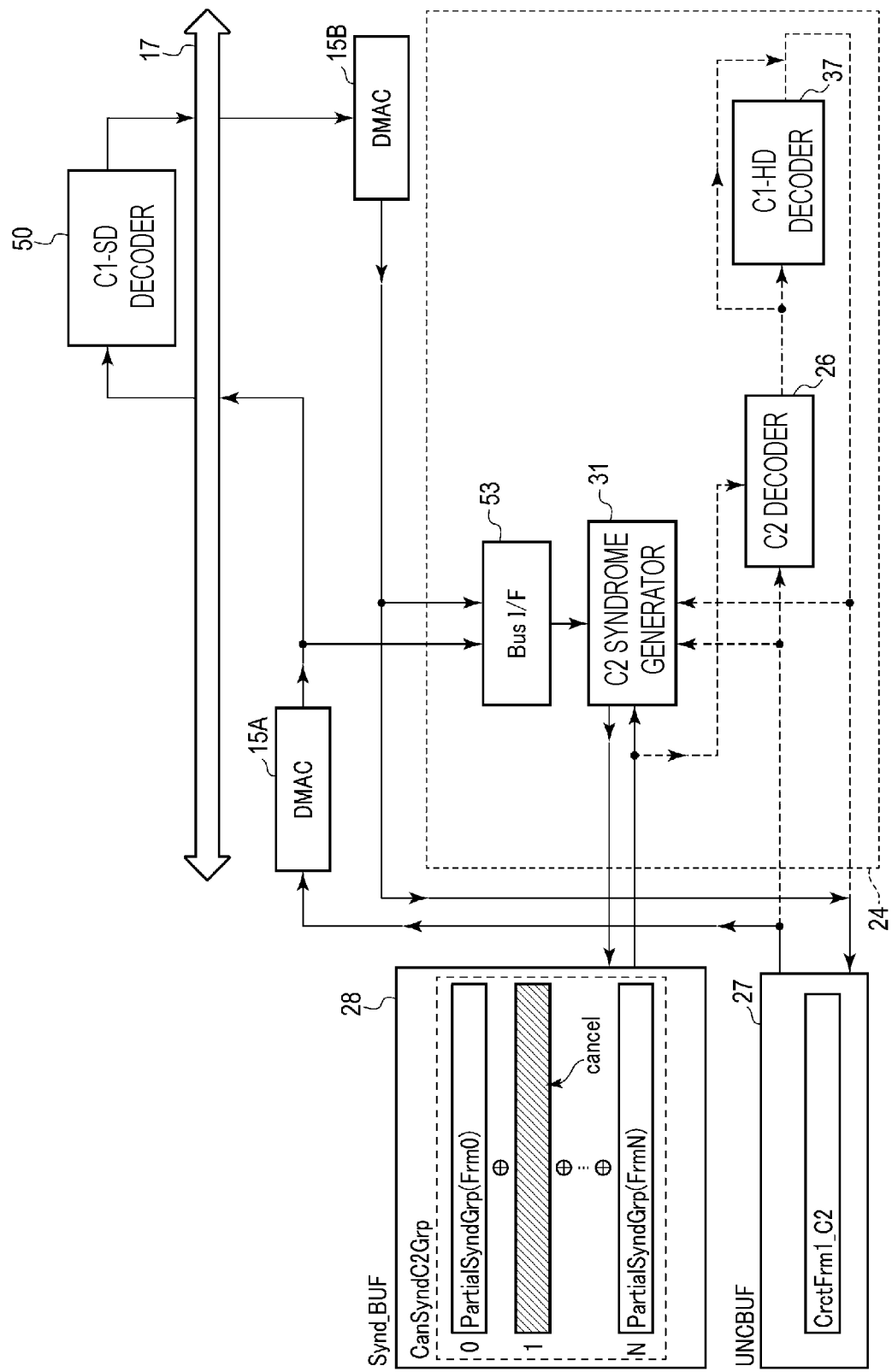
FIG. 48C is a block diagram illustrating a data flow of the soft decision post-processing according to the fifth embodiment.

The generation of the cancellation C2 syndrome CanSynd_C2 and the transfer to the Synd_BUF 28 are performed on each C2 symbol CrctDat_C2 included in the C1 frame CrctFrm1_C2. Accordingly, as illustrated in FIG. 48C, a cancellation C2 syndrome set CanSyndC2Grp is generated, in which PartialSyndNewC2Grp(Frm1) is cancelled among partial C2 syndrome sets PartialSyndGrp (Frm0), PartialSyndNewC2Grp(Frm1), and PartialSyndGrp (Frm2) to PartialSyndGrp(FrmN) used when the updated complete C2 syndrome set RevSyndC2Grp is generated by exclusive OR operations.

Figure 48D:
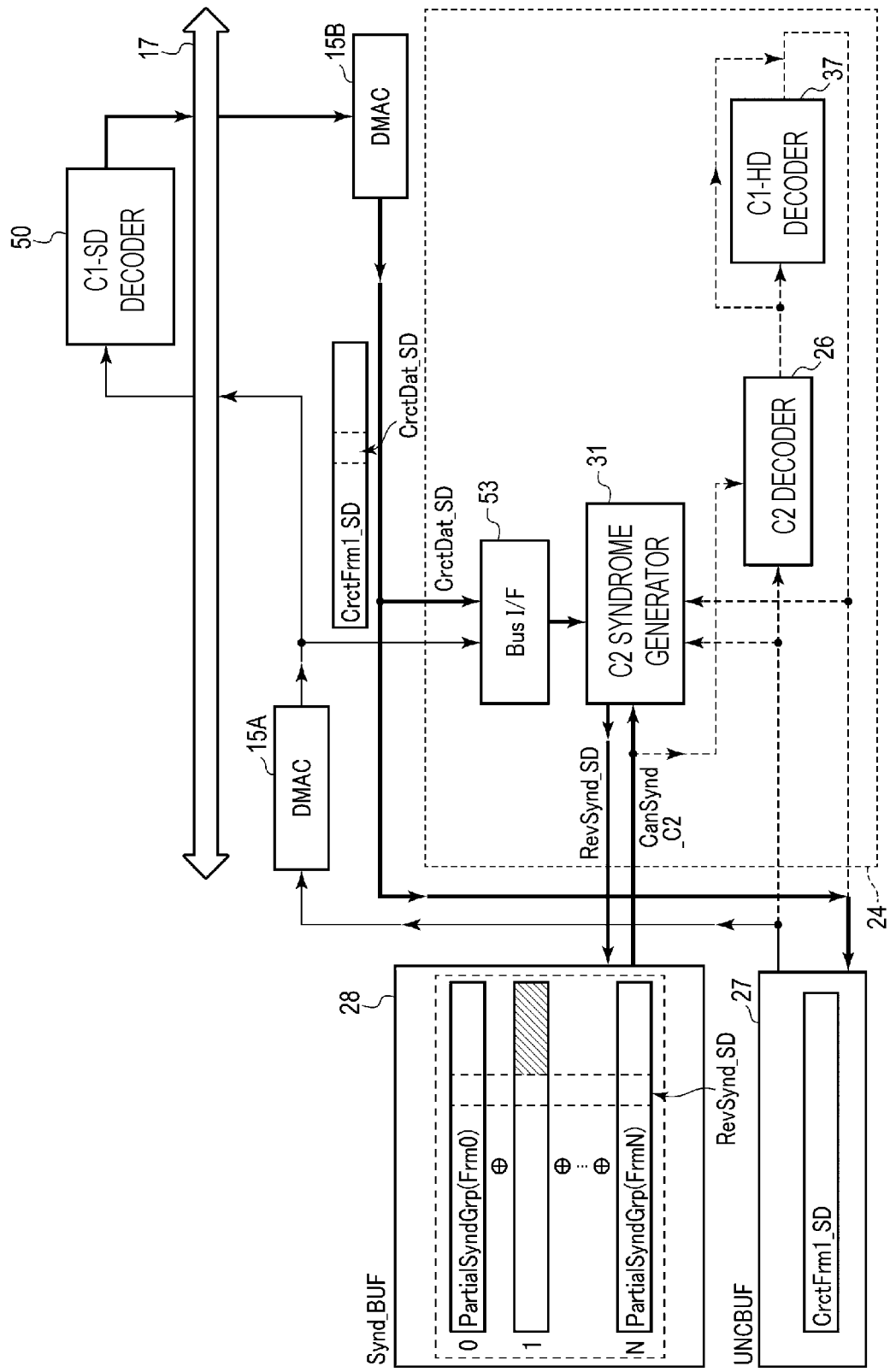
FIG. 48D is a block diagram illustrating a data flow of the soft decision post-processing according to the fifth embodiment.

FIG. 48D is a view illustrating the transfer of a C1 frame CrctFrm1_SD after a C1-SD correction to the UNCBUF 27, and a C2 syndrome updating processing. As illustrated in FIG. 48D, the DMAC 15B transfers all C2 symbols included in the C1 frame CrctFrm1_SD corrected by the C1-SD decoder 50 to the UNCBUF 27. Accordingly, the bus interface circuit 53 sequentially obtains by a snooping operation C2 symbols CrctDat_SD included in the CrctFrm1_SD with reference to a signal AxUSER transmitted from the DMAC 15B, and transfers the C2 symbols CrctDat_SD to the C2 syndrome generator 31. The C2 syndrome generator 31 reads the cancellation C2 syndrome CanSynd_C2 corresponding to the received C2 symbol CrctDat_SD, from the cancellation C2 syndrome set CanSyndC2Grp. Then, the C2 syndrome generator 31 generates a partial C2 syndrome from the CrctDat_SD, and performs an exclusive OR operation on the partial C2 syndrome and the CanSynd_C2 so as to generate an updated complete C2 syndrome RevSynd_SD. The generated updated complete C2 syndrome RevSynd_SD is transferred to the Synd_BUF 28.

Figure 48E:
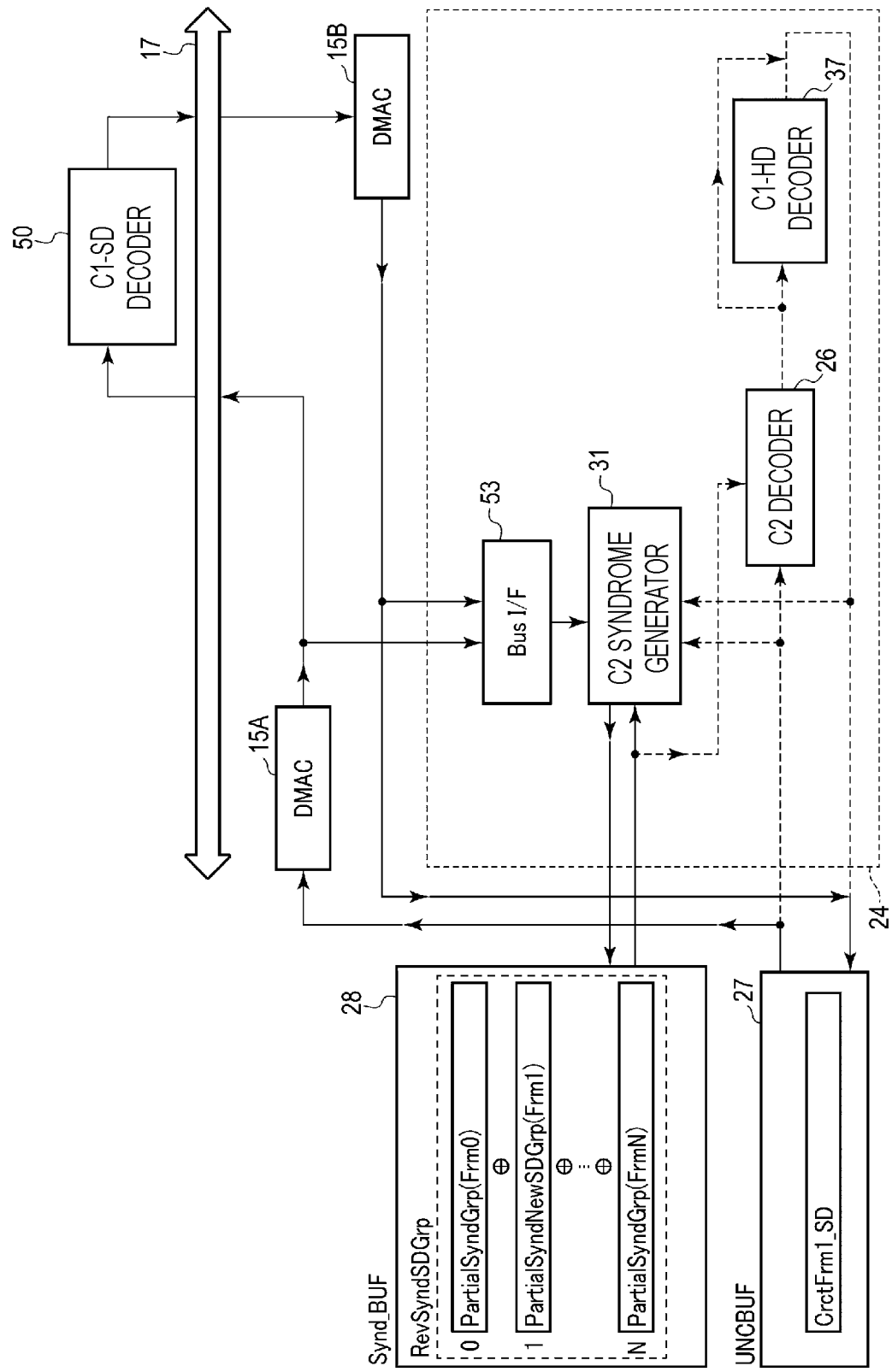
FIG. 48E is a block diagram illustrating a data flow of the soft decision post-processing according to the fifth embodiment.

The generation of the updated complete C2 syndrome RevSynd_SD and the transfer to the Synd_BUF 28 are sequentially repeated on the C2 symbols CrctDat_SD included in the CrctFrm1_SD. Accordingly, a syndrome updating processing is performed on all cancellation C2 syndromes CanSynd_C2 included in the cancellation C2 syndrome set CanSyndC2Grp. Accordingly, as illustrated in FIG. 48E, the cancellation C2 syndrome set CanSyndC2Grp becomes an updated complete C2 syndrome set RevSyndSDGrp in which a partial C2 syndrome set PartialSyndNewSDGrp(Frm1) generated by the C2 symbols included in the CrctFrm1_SD is added by exclusive OR operations.

The updated complete C2 syndrome set RevSyndSDGrp corresponds to a complete C2 syndrome set of a C1×C2 frame C1×C2Frm_SD (not illustrated), in which the C1×C2 frame C1×C2Frm_C2 obtained by the soft decision pre-processing, the CrctFrm1_C2 as the C1 frame corresponding to the C2 symbol number 1 is replaced with a C1-SD-corrected C1 frame CrctFrm1_SD. When there is a plurality of correction target C1 frames in the UNCBUF 27, this soft decision post-processing is repeated on each of the correction target C1 frames.

[5-3] Effect of Fifth Embodiment

According to the fifth embodiment, the consistency of syndromes is secured after the C2 correction and at the C1 correction by the soft decision decoding. With reference to additional information (e.g., a signal AxUSER) at the data transfer, snooping to obtain C2 symbols included in a correction target C1 frame may be performed, and accordingly, a cancellation and an update of a C2 syndrome set may be performed. By this method as well, even after the soft decision decoding, it is possible secure the consistency of a C2 syndrome set in the same manner as in the fourth embodiment.

[6] Sixth Embodiment

In a sixth embodiment, each time a C1 correction is performed, a syndrome for C2 correction is partially updated.

[6-1] Circuit Configuration

Figure 49:
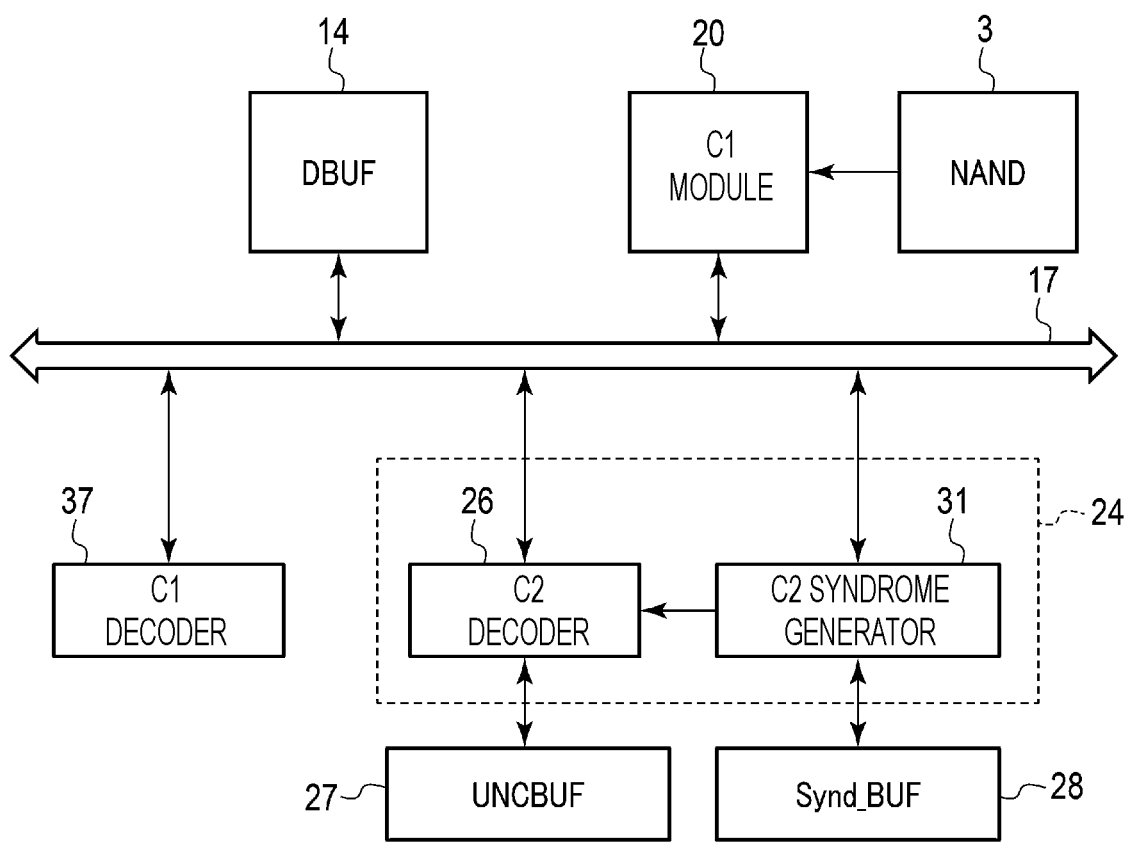
FIG. 49 is a block diagram of a memory system according to a sixth embodiment.

FIG. 49 is a block diagram of the memory system 2 according to a sixth embodiment. FIG. 49 mainly illustrates a circuit configuration related to an error correction.

The C1 module 20 performs, for example, a C1-HD correction.

The C1 decoder 37 is connected to the bus 17. The C1 decoder 37 performs, for example, a C1-SD correction.

The C2 module 24 includes the C2 syndrome generator 31, and the C2 decoder 26. The C2 syndrome generator 31 has a function of generating a complete C2 syndrome (i.e., a function by the C2 syndrome generating circuit 41), a function of generating a cancellation C2 syndrome (i.e., a function by the syndrome cancelling circuit 42), and a function of generating an updated complete C2 syndrome (i.e., a function by the syndrome updating circuit 43), as in the first embodiment. The C2 module 24 is connected to the UNCBUF 27 and the Synd_BUF 28.

[6-2] Operation

Figure 50:
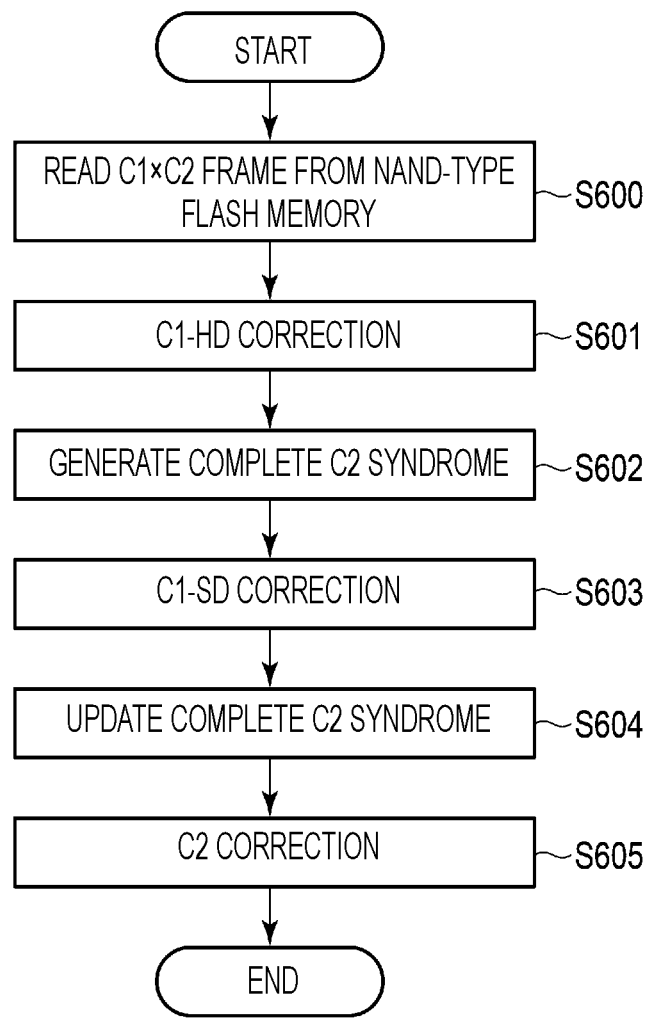
FIG. 50 is a flowchart illustrating an error correction operation according to the sixth embodiment.

Next, descriptions will be made on an operation of the memory system 2 in the embodiment. FIG. 50 is a flowchart illustrating an error correction operation according to the embodiment. It is assumed that correction target C1 frames are stored in the UNCBUF 27. That is, a preparation for an iterative correction is the same as that in the first embodiment.

The processor 11 reads a C1×C2 frame from the NAND-type flash memory 3 in C1 frame units (step S600).

The C1 module 20 (specifically, the C1 decoder 22) performs a C1-HD correction on each C1 frame included in the read C1×C2 frame (step S601). All C1 frames output from the C1 module 20 are stored in the DBUF 14. The C1 frames stored in the DBUF 14 include C1 frames whose errors were correctable by the C1-HD correction and C1 frames whose errors were uncorrectable by the C1-HD correction.

The C2 syndrome generator 31 snoops the bus to obtain 255 C1 frames constituting the C1×C2 frame transferred through the bus. The C2 syndrome generator 31 generates a complete C2 syndrome by using a C2 symbol included in the C1 frame obtained by snooping (step S602). The complete C2 syndrome generated by the C2 syndrome generator 31 is stored in the Synd_BUF 28.

The C1 decoder 37 performs a C1-SD correction on the uncorrectable C1 frames stored in the DBUF 14 (step S603). The C2 syndrome generator 31 updates the complete C2 syndrome by using a C2 symbol included in the corrected C1 frame (step S604).

Figure 51:
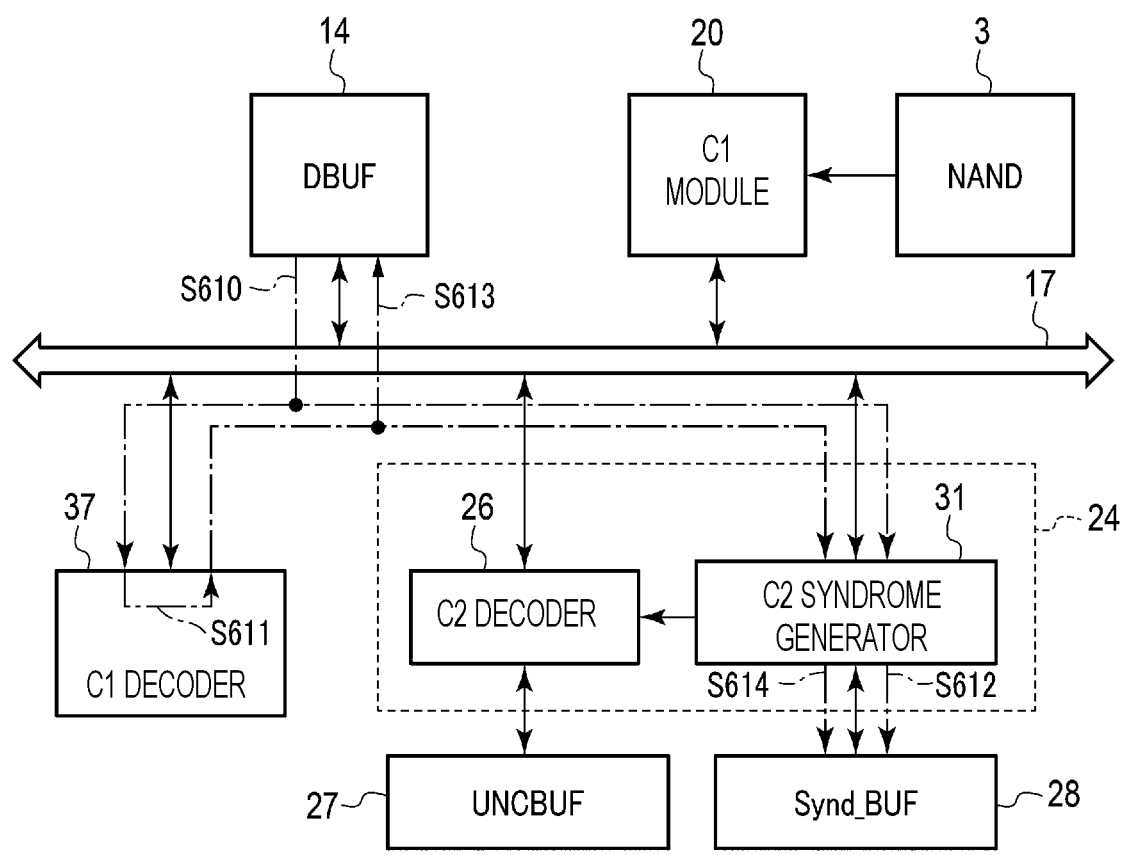
FIG. 51 is a view illustrating a flow of a C1-SD correction and a syndrome updating processing according to the sixth embodiment.

FIG. 51 is a view illustrating a flow of a C1-SD correction and a syndrome updating processing according to the embodiment (steps S603 and S604 in FIG. 50). In the drawing, the data flow is indicated by the alternate long and short dash line.

The processor 11 transfers the correction target C1 frames whose errors were uncorrectable by the C1-HD correction by the C1 module 20, in the C1×C2 frame stored in the DBUF 14, to the C1 decoder 37 and the C2 syndrome generator 31 (step S610).

The C1 decoder 37 performs the C1-SD correction on the correction target C1 frame transferred from the DBUF 14 (step S611). In parallel to this, the C2 syndrome generator 31 generates a partial C2 syndrome by using the C2 symbol included in the corrected correction target C1 frame transferred from the DBUF 14. Then, the C2 syndrome generator 31 partially cancels the complete C2 syndrome stored in the Synd_BUF 28 by using the generated partial C2 syndrome, and generates a cancellation C2 syndrome (step S612).

The processor 11 transfers the correction target C1 frame C1-SD-corrected by the C1 decoder 37, to the DBUF 14 and the C2 syndrome generator 31 (step S613).

The C2 syndrome generator 31 generates an updated partial C2 syndrome by using the C2 symbol included in the C1 frame (i.e., the C1-SD-corrected C1 frame) transferred from the C1 decoder 37. Then, the C2 syndrome generator 31 partially updates the cancellation C2 syndrome stored in the Synd_BUF 28 by using the generated updated partial C2 syndrome (step S614). That is, the partial C2 syndrome corresponding to the correction target C1 frame, in the cancellation C2 syndrome, is replaced with the updated partial C2 syndrome. In this manner, the complete C2 syndrome is updated.

Referring back to FIG. 50, the C2 decoder 26 performs a C2 correction by using the updated complete C2 syndrome stored in the Synd_BUF 28 (step S605). Further, in the C2 correction in step S605, either normal correction or erasure correction may be applied according to the number of errors.

[6-3] Effect of Sixth Embodiment

In the sixth embodiment, only by reading a C1×C2 frame as a correction target from the non-volatile memory once, after that, an iterative correction of a C1 correction and a C2 correction may be performed. Accordingly, it is possible to reduce the number of accesses to the non-volatile memory.

In addition, the C2 syndrome may be partially updated every C1-SD correction by the C1 decoder 37. Accordingly, an iterative correction of a C1-SD correction and a C2 correction may be performed.

[7] Seventh Embodiment

In a seventh embodiment, at an encoding operation and at a syndrome generating operation, additional information (read transfer information RTI and write transfer information WTI) is used.

[7-1] Encoding Operation

Figure 52:
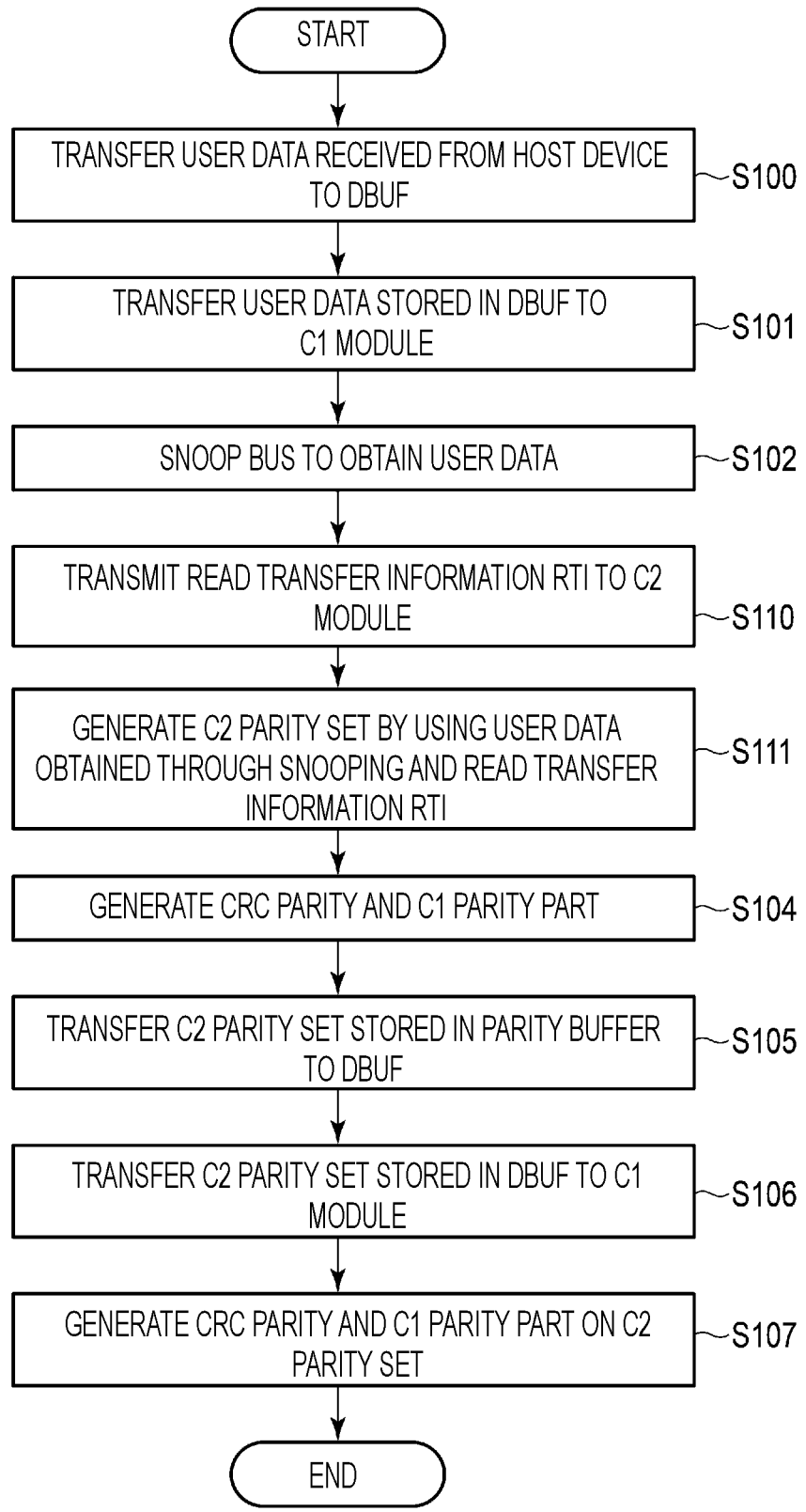
FIG. 52 is a flowchart illustrating an encoding operation according to a seventh embodiment.
Figure 53:
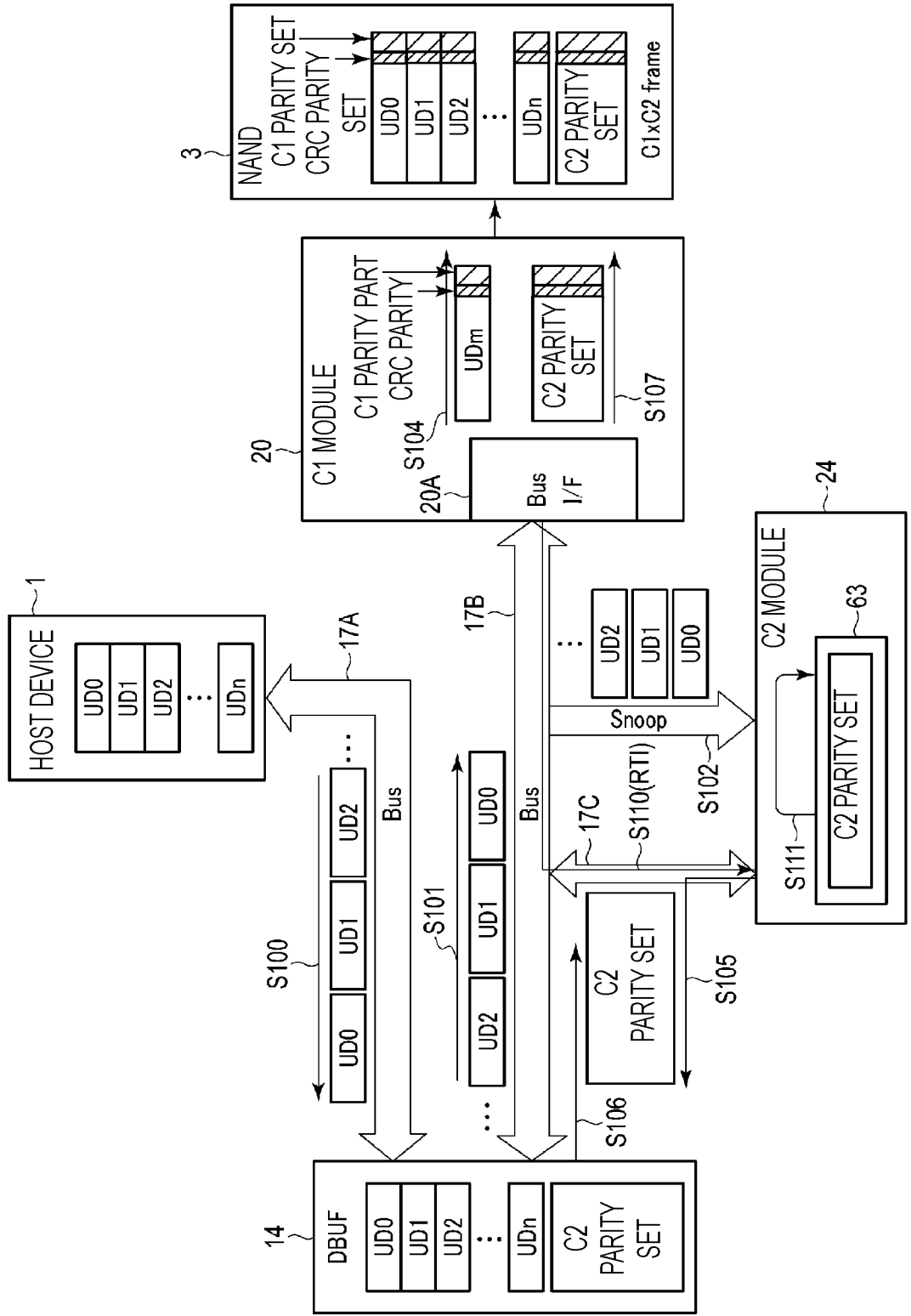
FIG. 53 is a view illustrating a data flow of the encoding according to the seventh embodiment.

FIG. 52 is a flowchart illustrating an encoding operation according to a seventh embodiment. FIG. 53 is a view illustrating a data flow of an encoding according to the embodiment. The circuit configuration in FIG. 53 is the same as that in FIG. 15. Meanwhile, the bus 17 (17A, 17B, and 17C) in the embodiment conforms to an AXI protocol.

The operation in steps S100 to S102 is the same as that in the first embodiment described above with reference to FIGS. 14 and 15. A bus interface circuit 20A in the C1 module 20 transmits read transfer information RTI to the C2 module 24 via the bus 17B and the bus 17C (step S110). The read transfer information RTI is included in, for example, a user-defined signal for reading ARUSER. The read transfer information RTI is information used to generate a C2 parity set. Specifically, the read transfer information RTI indicates in which row of a product code information part user data obtained through snooping the bus 17B (as described above) is located, in other words, which one of user data UD0 to UDn is the user data.

The C2 module 24 generates a C2 parity set by using the user data obtained through snooping and the read transfer information RTI (step S111). Here, the C2 module 24 specifies which one of user data UD0 to UDn is the user data obtained through snooping, with reference to the read transfer information RTI. The C2 module 24 generates the C2 parity set by using the specified information. The operation subsequent to step S111 (steps S104 to S107) is the same as that in FIGS. 14 and 15.

[7-2] Syndrome Generating Operation

Figure 54:
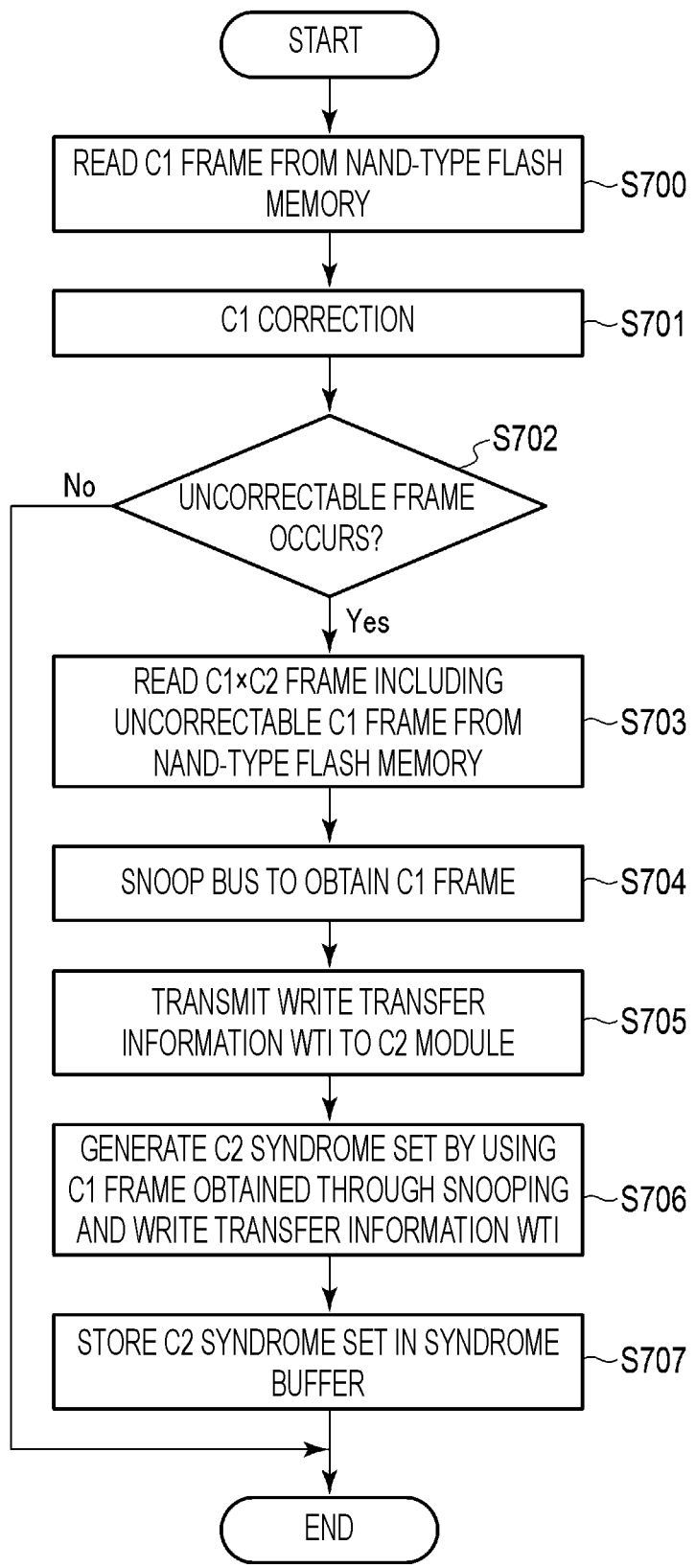
FIG. 54 is a flowchart illustrating a syndrome generating operation according to the seventh embodiment.
Figure 55:
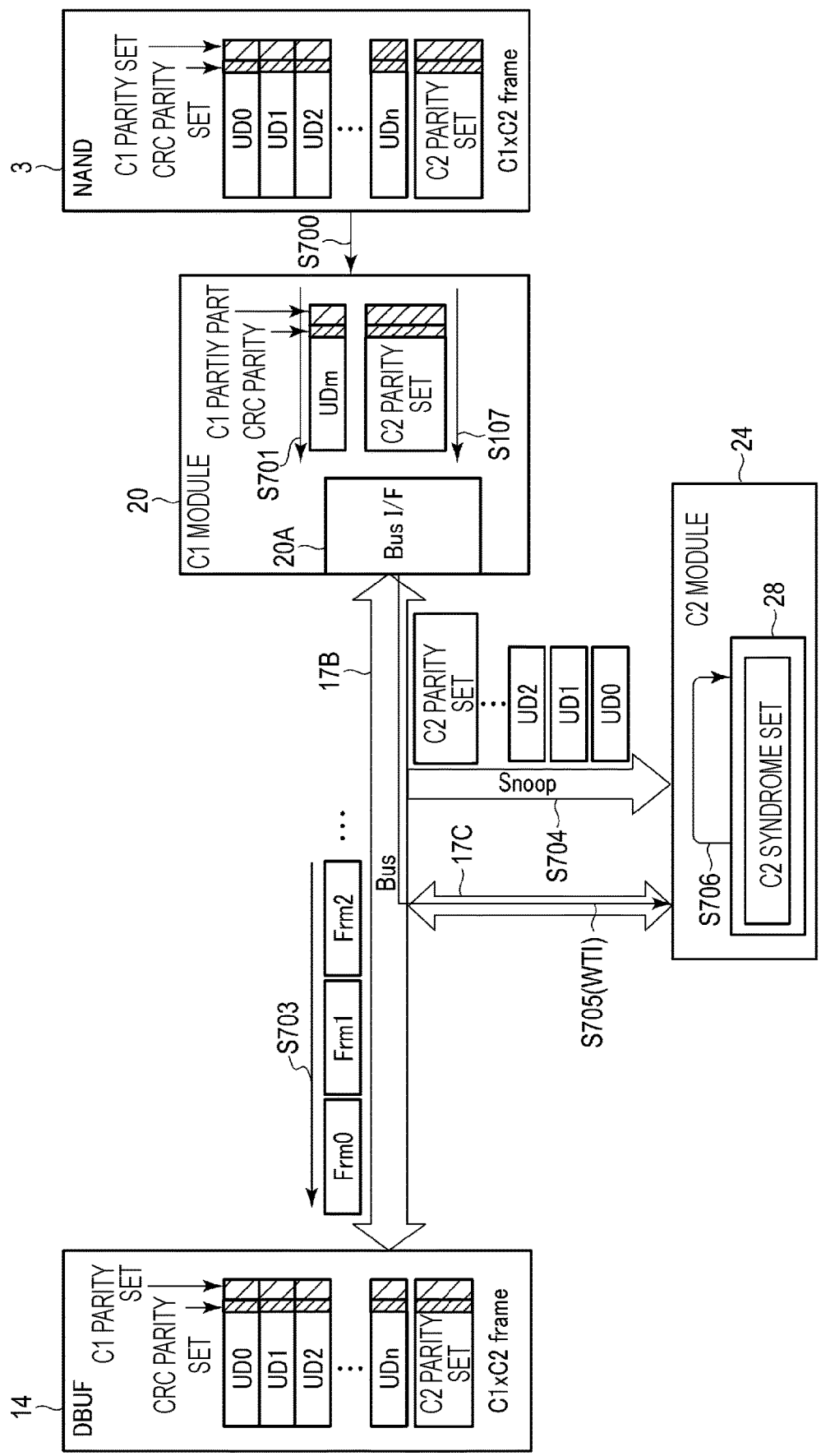
FIG. 55 is a view illustrating a data flow of the syndrome generation according to the seventh embodiment.

Next, a syndrome generating operation will be described. The syndrome generating operation described herein is performed as a preparation of an iterative correction, that is, prior to the iterative correction. FIG. 54 is a flowchart illustrating a syndrome generating operation according to the embodiment. FIG. 55 is a view illustrating a data flow of a syndrome generation according to the embodiment. FIG. 55 illustrates a configuration where the syndrome buffer (Synd_BUF) 28 is provided in the C2 module 24.

The processor 11 reads data from the NAND-type flash memory 3, in C1 frame units (step S700). The C1 module 20 performs a C1 correction and a CRC verification in C1 frame units (step S701).

The processor 11 determines whether an uncorrectable C1 frame occurs (step S702). When it is determined that an uncorrectable C1 frame does not occur (step S702=No), the processor 11 ends the syndrome generating operation. When it is determined that an uncorrectable C1 frame occurs (step S702=Yes), the processor 11 reads a C1×C2 frame including the corresponding uncorrectable C1 frame in C1 frame units, from the NAND-type flash memory 3, and transfers the frame to the DBUF 14 (step S703).

The C2 module 24 obtains by a snooping operation 255 C1 frames (Frm0, Frm1, Frm2, . . . in FIG. 55) constituting the C1×C2 frame transferred through the bus 17B (step S704). Here, the C2 module 24 obtains by a snooping operation only user data UD and a C2 parity set in the C1 frames. That is, a snooping operation to obtain a CRC parity and a C1 parity part is not performed.

The bus interface circuit 20A in the C1 module 20 transmits write transfer information WTI to the C2 module 24 via the buses 17B and 17C (step S705). The write transfer information WTI is included in, for example, a user-defined signal for writing AWUSER. The write transfer information WTI is information used to generate a C2 syndrome. Specifically, the write transfer information WTI indicates in which row of the C1×C2 frame the C1 frame obtained through snooping is located.

The C2 module 24 generates a C2 syndrome set by using the C1 frame obtained through snooping and the write transfer information WTI (step S706). Here, the C2 module 24 specifies to which row of the C1×C2 frame the C1 frame obtained through snooping belongs, that is, which one of the C1 frames Frm0 to FrmN is the C1 frame, with reference to the write transfer information WTI. The C2 module 24 generates the C2 syndrome set by using the specified information. The C2 module 24 stores the generated C2 syndrome set in the Synd_BUF 28 (step S707).

[7-3] Effect of Seventh Embodiment

According to the seventh embodiment, when a C2 parity set is generated, read transfer information RTI may be used. The read transfer information RTI includes information indicating a location of user data, that is, information that makes it possible to specify one of a plurality of user data to be transferred. Accordingly, it is possible to efficiently perform an encoding operation.

In addition, when a C2 syndrome set is generated, write transfer information WTI may be used. The write transfer information WTI includes information indicating a location of a C1 frame, that is, information that makes it possible to specify one of a plurality of C1 frames to be transferred. Accordingly, it is possible to efficiently perform a syndrome generating operation.

[8] Eighth Embodiment

A direction of an encoding processing and a decoding processing of a C2 code is orthogonal to a direction of an encoding processing and a decoding processing of a C1 code. Therefore, a generation of a C2 parity set requires the entire product code information part, and a generation of a C2 syndrome set requires the entire C1×C2 frame. Thus, it takes time to generate the C2 parity set and the C2 syndrome set. Accordingly, it is desirable to generate a plurality of C2 parity parts in parallel. The same also applies to the C2 syndrome. In the eighth embodiment, data transferred through a plurality of channels is processed in parallel.

[8-1] Circuit Configuration of Encoding

Figure 56A:
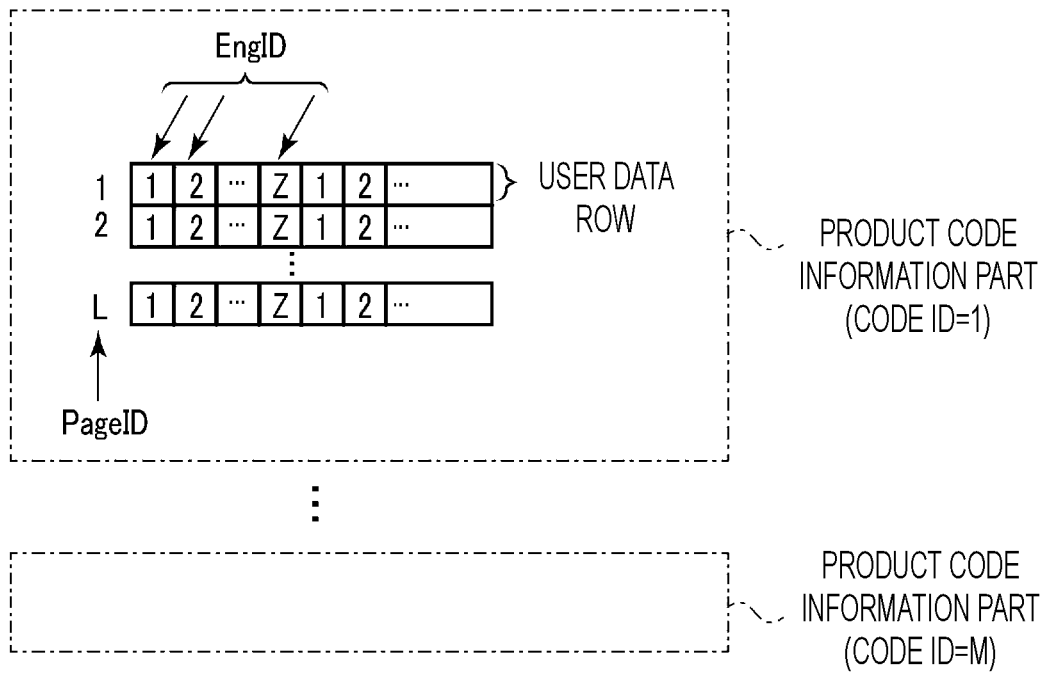
FIG. 56A is a view illustrating a data structure according to an eighth embodiment.
Figure 56B:
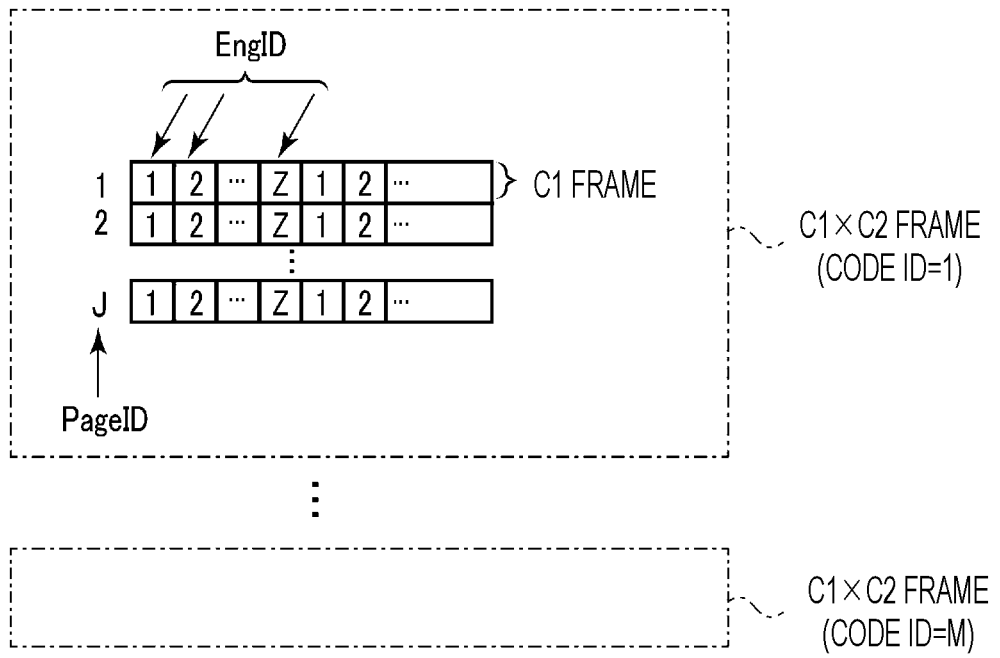
FIG. 56B is a view illustrating a data structure according to the eighth embodiment.

First, various information used in the embodiment will be described. FIGS. 56A and 56B are views illustrating data structures according to the embodiment.

As illustrated in FIG. 56A, code IDs (CodeID) 1 to M are allocated to product code information parts (i.e., user data). The "M" is an integer of 2 or more. Page IDs (PageID) 1 to L are allocated to a plurality of user data rows included in one product code information part. The "L" is an integer of 2 or more.

As illustrated in FIG. 56B, code IDs (CodeID) 1 to M are allocated to C1×C2 frames. Page IDs (PageID) 1 to J are allocated to a plurality of C1 frames included in one C1×C2 frame. The "J" is an integer of 2 or more.

In the embodiment, as described later, Z sets of C2 encoders and C2 parity buffers are prepared. Likewise, Z sets of C2 decoders and C2 syndrome buffers are prepared. Engine IDs (EngID) 1 to Z are allocated to the plurality of sets of C2 encoders and C2 parity buffers. The "Z" is an integer of 2 or more. The EngID is commonly used for the C2 encoder and the C2 decoder. As illustrated in FIG. 56A, a product code information part is divided into a plurality of C2 symbols, and any one EngID (1 to Z) is allocated to each C2 symbol. As illustrated in FIG. 56B, a C1×C2 frame is divided into C2 symbols, and any one EngID (1 to Z) is allocated to each C2 symbol. One square included in each of a user data row in FIG. 56A and a C1 frame of FIG. 56B indicates one divided C2 symbol.

Figure 57:
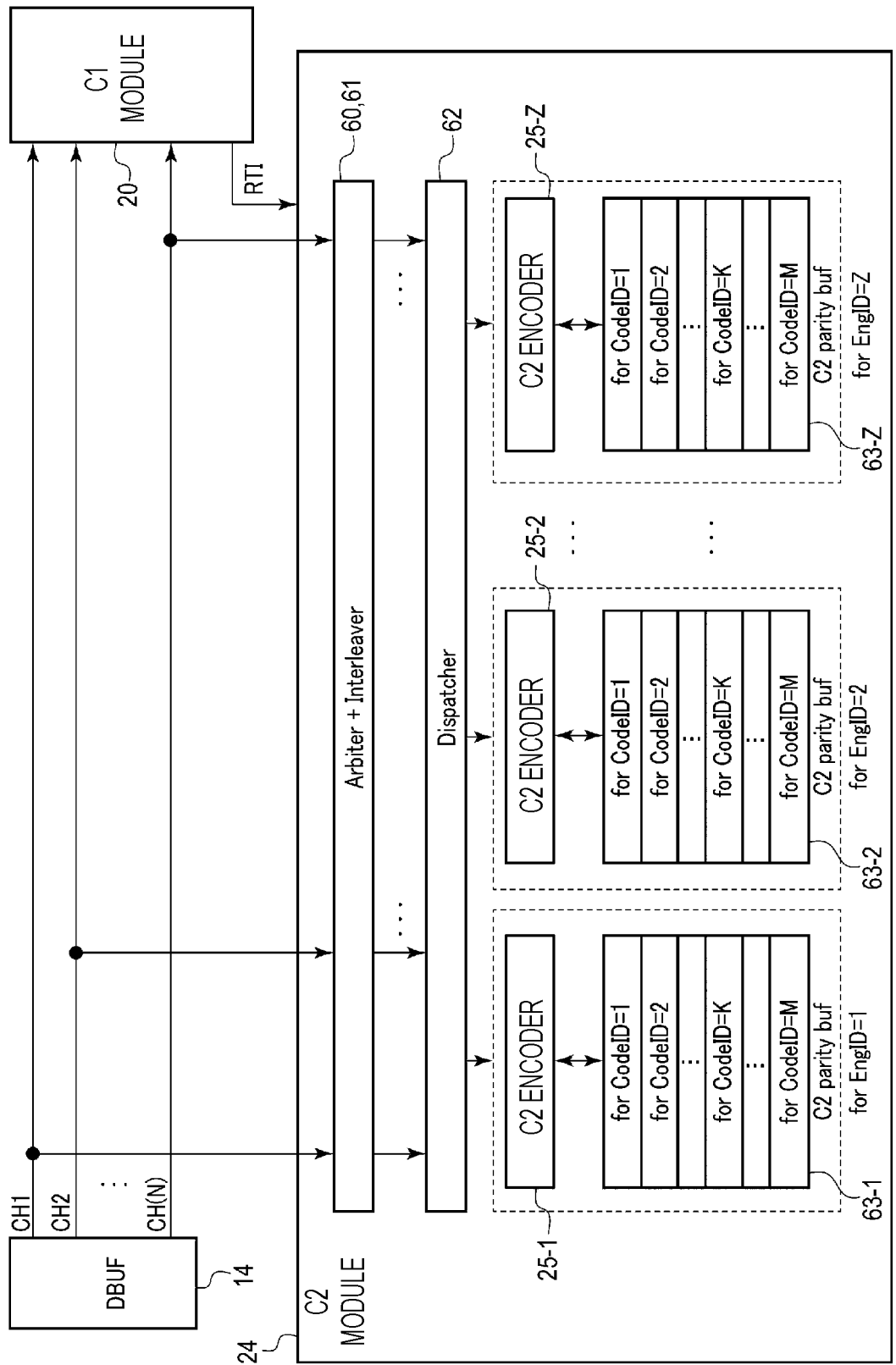
FIG. 57 is a block diagram of a memory controller according to the eighth embodiment.

FIG. 57 is a block diagram of the memory controller 4 according to the embodiment. FIG. 57 mainly illustrates a circuit configuration related to an encoding.

The C1 module 20 is connected to the data buffer (DBUF) 14 via N channels CH1 to CH(N). The channels CH1 to CH(N) constitute a bus. The "N" is an integer of 2 or more.

The C1 module 20 transmits read transfer information RTI to the C2 module 24. The read transfer information RTI is included in, for example, a user-defined signal for reading ARUSER. The user-defined signal ARUSER conforms to an AXI protocol. The read transfer information RTI includes a CodeID related to data being transferred via a bus, a page ID in a product code information part (i.e., information specifying a location of a user data row (e.g., a row number in the product code information part)), and information specifying a location (e.g., a column number in the product code information part) of a set (also referred to as a user data column) of C2 symbols constituting a C2 frame, in the product code information part. The information specifying the location of the user data column will be referred to as user data column location information.

The C2 module 24 is connected to the C1 module 20 and the DBUF 14 via the channels CH1 to CH(N). The C2 module 24 includes an arbiter 60, an interleaver 61, a dispatcher 62, Z C2 encoders 25-1 to 25-Z corresponding to EngID=1 to Z, and Z C2 parity buffer groups (C2 parity buf) 63-1 to 63-Z corresponding to EngID=1 to Z.

The arbiter 60 is connected to the channels CH1 to CH(N). The arbiter 60 is capable of receiving N data in parallel via the channels CH1 to CH(N). The arbiter 60 and the interleaver 61 perform interleaving processings on N data to be sent from the arbiter 60, by using the read transfer information RTI.

The dispatcher 62 transmits C2 symbols corresponding to EngIDs, to the C2 encoders 25-1 to 25-Z, respectively, according to priorities determined by the arbiter 60.

The C2 encoder 25-1 generates C2 parity parts by using sets of C2 symbols corresponding to EngID=1. That is, the C2 encoder 25-1 generates a corresponding C2 parity part from a set of L C2 symbols with EngID=1, which is included in one product code information part. Likewise, the C2 encoder 25-1 generates another C2 parity part from a set of L C2 symbols with EngID=1, which is included in another product code information part. That is, the C2 encoder 25-1 generates a plurality (M) of C2 parity parts corresponding to EngID=1 on the plurality (M) of product code information parts. Likewise, each of the C2 encoders 25-2 to 25-Z generates a plurality (M) of C2 parity parts corresponding to EngID=2 to Z on the plurality (M) of product code information parts. Each of the C1 encoders 25-1 to 25-Z transfers the generated C2 parity parts to each of the C2 parity buffer groups 63-1 to 63-Z.

Each of the C2 parity buffer groups 63-1 to 63-Z includes M C2 parity buffers corresponding to CodeID=1 to M. Each of the M C2 parity buffers temporarily stores the C2 parity part corresponding to CodeID=1 to M.

[8-2] Encoding Operation

Figure 58:
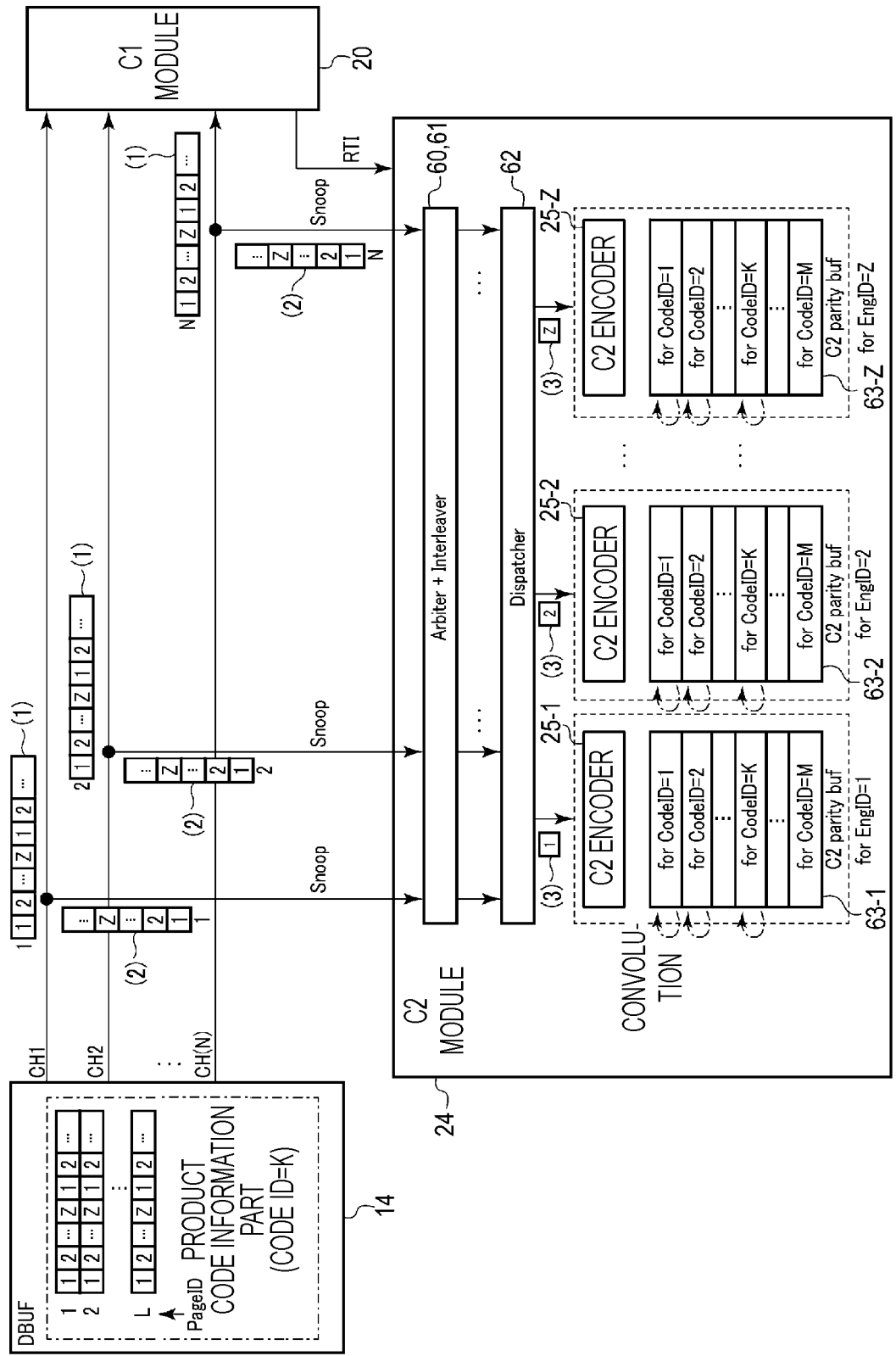
FIG. 58 is a view illustrating a data flow of an encoding according to the eighth embodiment.

Next, an encoding operation will be described. FIG. 58 is a view illustrating a data flow of an encoding according to the embodiment.

The processor 11 transfers a product code information part transmitted from the host device 1, to the DBUF 14. In FIG. 58, the DBUF 14 stores a product code information part corresponding to CodeID=K. The "K" is an integer of 1 to M.

The processor 11 selects N user data rows among L user data rows constituting the product code information part, and transfers the N user data rows from the DBUF 14 to the C1 module 20 via the channels CH1 to CH(N) ((1) in FIG. 58). FIG. 58 illustrates an example in which the N user data rows corresponding to PageID=1 to N are selected.

The C2 module 24 obtains by a snooping operation the N user data rows transferred through the channels CH1 to CH(N) ((2) in FIG. 58). The arbiter 60 and the interleaver 61 perform an interleaving processing on the N user data rows obtained through snooping.

The dispatcher 62 determines a C2 encoder that generates a C2 parity part, by using user data column location information determined from read transfer information RTI. Then, a plurality of C2 symbols transferred from the arbiter 60 and the interleaver 61 is distributed to one C2 encoder determined on the basis of the user data column location information, among the C2 encoders 25-1 to 25-Z. Specifically, the dispatcher 62 distributes C2 symbols corresponding to EngID=1 to the C2 encoder 25-1, and similarly, distributes C2 symbols corresponding to EngID=α (α is an integer of 2 to Z) to the C2 encoder 25-α ((3) in FIG. 58).

Each of the C2 encoders 25-1 to 25-Z generates partial C2 parities in C2 symbol units corresponding to EngID. The partial C2 parity is a component for generating a C2 parity part (i.e., a C2 parity part generated from one user data column). For example, the C2 encoder 25-1 corresponding to EngID=1 determines which C2 parity buffer to use among the M C2 parity buffers in the C2 parity buffer group 63-1, by using a CodeID included in the read transfer information RTI. Then, the C2 encoder 25-1 transfers the generated partial C2 parity to a C2 parity buffer for CodeID=K, which is included in the C2 parity buffer group 63-1. The partial C2 parity takes an incomplete (unfinished) form of a C2 parity part to be generated in a user data column corresponding to EngID=1. Then, the C2 encoder 25-1 generates a corresponding partial C2 parity each time a C2 symbol corresponding to EngID=1 is received, and transfers the generated partial C2 parity to the C2 parity buffer determined on the basis of the CodeID of the corresponding C2 symbol (in this case, CodeID=K). In the C2 parity buffer, an exclusive OR operation is performed on a partial C2 parity that is already stored, and a newly transferred partial C2 parity. Accordingly, a plurality of partial C2 parities constituting the C2 parity part is sequentially updated (that is, partial C2 parities are convoluted into an incomplete C2 parity part). Here, the C2 encoder 25-1 specifies the location of the user data column of C2 symbols as a processing target by using the user data column location information included in the read transfer information RTI so as to generate the partial C2 parity required for convolution. The same also applies to the C2 encoders 25-2 to 25-Z.

(Operation of Transferring Single Product Code Information Part)

Figure 59:
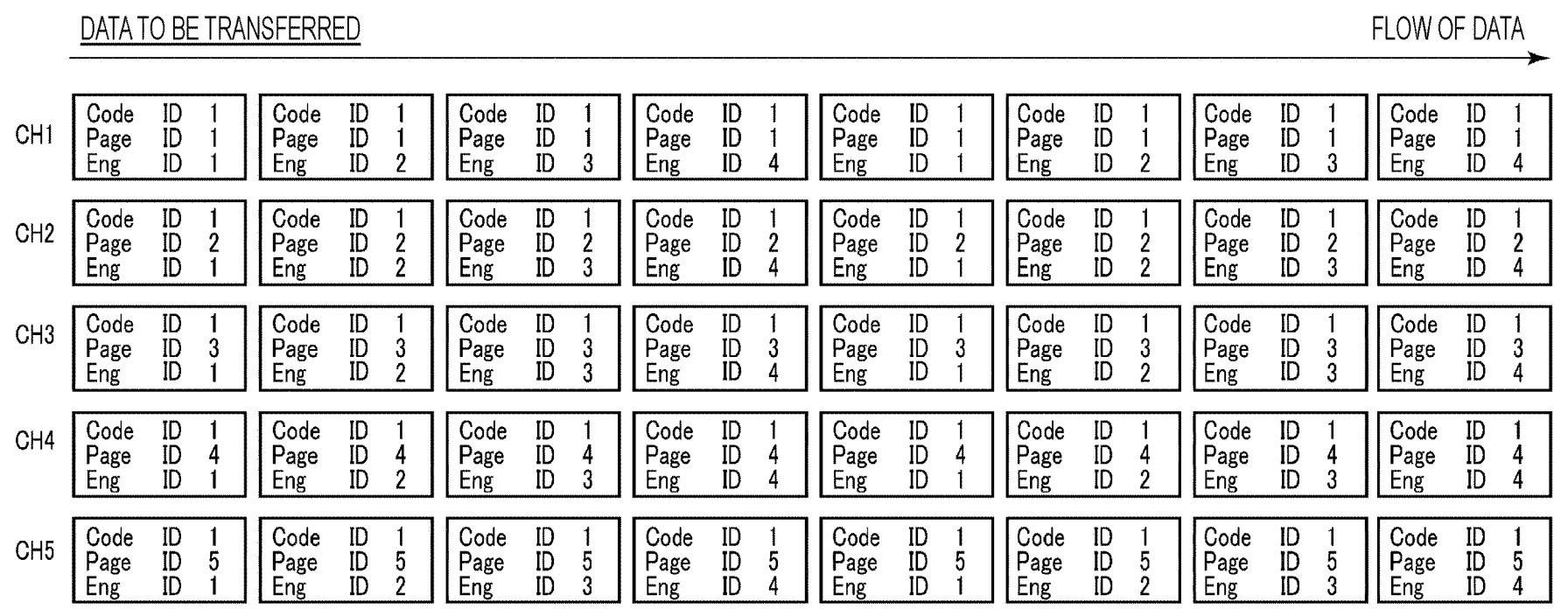

Hereinafter, descriptions will be made on a specific operation of transferring a single product code information part. FIG. 59 is a view illustrating an example of a product code information part to be transferred to a bus, according to the embodiment. It is assumed that CodeID=1, the number of channels N=5 (channels CH1 to CH5), and the number of engine IDs Z=4 (EngID=1 to 4). Data indicated by one square in FIG. 59 indicates each of C2 symbols obtained by dividing one user data row by the number of engine IDs Z=4.

Since a single product code information part is transferred, CodeIDs of all C2 symbols are 1.

To the channel CH1, a user data row with PageID=1 is transferred as eight C2 symbols divided to correspond to EngID=1, 2, 3, 4, 1, 2, 3, 4.

To the channel CH2, a user data row with PageID=2 is transferred as eight C2 symbols divided to correspond to EngID=1, 2, 3, 4, 1, 2, 3, 4.

To the channel CH3, a user data row with PageID=3 is transferred as eight C2 symbols divided to correspond to EngID=1, 2, 3, 4, 1, 2, 3, 4.

To the channel CH4, a user data row unit with PageID=4 is transferred as eight C2 symbols divided to correspond to EngID=1, 2, 3, 4, 1, 2, 3, 4.

To the channel CH5, a user data row with PageID=5 is transferred as eight C2 symbols divided to correspond to EngID=1, 2, 3, 4, 1, 2, 3, 4.

Figure 60:
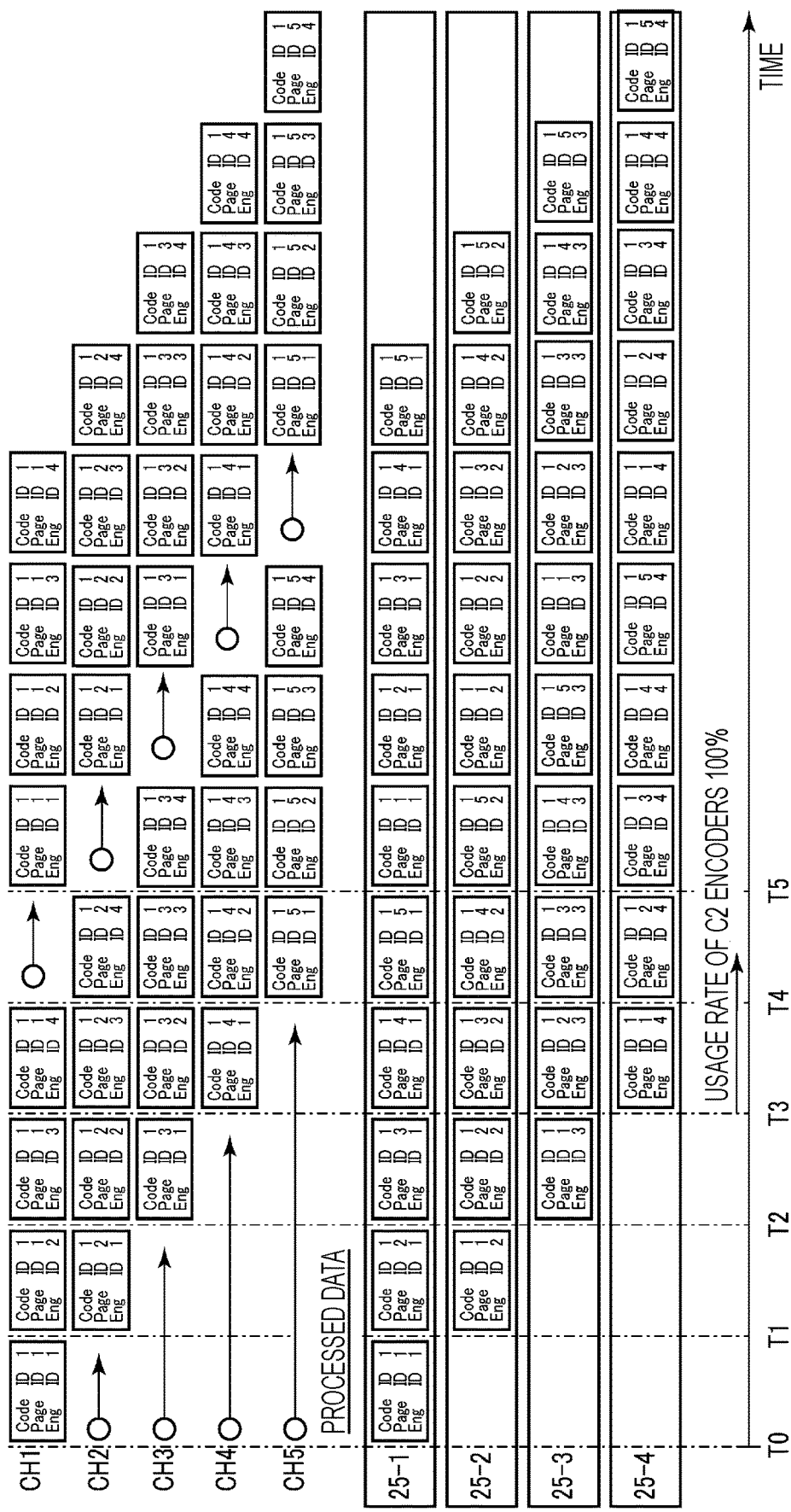
FIG. 60 is a view illustrating a flow of data when the product code information part in FIG. 59 is actually transferred through the bus.

FIG. 60 is a view illustrating a flow of data when the product code information part in FIG. 59 is actually transferred through the bus. In the drawing, white circles indicate periods when the C2 encoders and the C2 parity buffer groups are not used. In FIG. 60, the start time of the processing is set to T0.

From time T0, a C2 symbol with PageID=1 and EngID=1 is transmitted by the channel CH1. The dispatcher 62, the arbiter 60, and the interleaver 61 (hereinafter, also referred to as the dispatcher 62, etc.) transfer the C2 symbol with PageID=1 and EngID=1 on the channel CH1 to the C2 encoder 25-1, from time T0. The C2 encoder 25-1 generates a partial C2 parity on the received C2 symbol, from time T0. From time T0, in the remaining channels CH2, CH3, CH4, and CH5, C2 symbols are not transferred, and the C2 encoders 25-2, 25-3, and 25-4 do not operate.

From time T1, a C2 symbol with PageID=1 and EngID=2 is transmitted by the channel CH1, and a C2 symbol with PageID=2 and EngID=1 is transmitted by the channel CH2. The dispatcher 62, etc. transfer the C2 symbol with PageID=1 and EngID=2 on the channel CH1 to the C2 encoder 25-2 and transfer the C2 symbol with PageID=2 and EngID=1 on the channel CH2 to the C2 encoder 25-1, from time T1. The C2 encoders 25-1 and 25-2 generate partial C2 parities on the received C2 symbols, from time T1. From time T1, in the remaining channels CH3, CH4, and CH5, C2 symbols are not transferred, and the C2 encoders 25-3 and 25-4 do not operate.

From time T2, a C2 symbol with PageID=1 and EngID=3 is transmitted by the channel CH1, a C2 symbol with PageID=2 and EngID=2 is transmitted by the channel CH2, and a C2 symbol with PageID=3 and EngID=1 is transmitted by the channel CH3. The dispatcher 62, etc. transfer the C2 symbol with PageID=1 and EngID=3 on the channel CH1 to the C2 encoder 25-3, transfer the C2 symbol with PageID=2 and EngID=2 on the channel CH2 to the C2 encoder 25-2, and transfers the C2 symbol with PageID=3 and EngID=1 on the channel CH3 to the C2 encoder 25-1, from time T2. The C2 encoders 25-1, 25-2, and 25-3 generate partial C2 parities on the received C2 symbols, from time T2. From time T2, in the remaining channels CH4 and CH5, C2 symbols are not transferred, and the C2 encoder 25-4 does not operate.

From time T3, a C2 symbol with PageID=1 and EngID=4 is transmitted by the channel CH1, a C2 symbol with PageID=2 and EngID=3 is transmitted by the channel CH2, a C2 symbol with PageID=3 and EngID=2 is transmitted by the channel CH3, and a C2 symbol with PageID=4 and EngID=1 is transmitted by the channel CH4. The dispatcher 62, etc. transfer the C2 symbol with PageID=1 and EngID=4 on the channel CH1 to the C2 encoder 25-4, transfer the C2 symbol with PageID=2 and EngID=3 on the channel CH2 to the C2 encoder 25-3, transfer the C2 symbol with PageID=3 and EngID=2 on the channel CH3 to the C2 encoder 25-2, and transfer the C2 symbol with PageID=4 and EngID=1 on the channel CH4 to the C2 encoder 25-1, from time T3. The C2 encoders 25-1, 25-2, 25-3, and 25-4 generate partial C2 parities on the received C2 symbols, from time T3. From time T3, in the remaining channel CH5, no C2 symbol is transferred.

At time T3, all the C2 encoders 25-1 to 25-4 operate in parallel. After time T3, the C2 encoders 25-1 to 25-4 and the C2 parity buffer groups 63-1 to 63-4 operate in parallel. That is, the usage rate of the C2 encoders and the C2 parity buffer groups becomes 100%.

From time T4, a C2 symbol with PageID=2 and EngID=4 is transmitted by the channel CH2, a C2 symbol with PageID=3 and EngID=3 is transmitted by the channel CH3, a C2 symbol with PageID=4 and EngID=2 is transmitted by the channel CH4, and a C2 symbol with PageID=5 and EngID=1 is transmitted by the channel CH5. The dispatcher 62, etc. transfer the C2 symbol with PageID=2 and EngID=4 on the channel CH2 to the C2 encoder 25-4, transfer the C2 symbol with PageID=3 and EngID=3 on the channel CH3 to the C2 encoder 25-3, transfer the C2 symbol with PageID=4 and EngID=2 on the channel CH4 to the C2 encoder 25-2, and transfer the C2 symbol with PageID=5 and EngID=1 on the channel CH5 to the C2 encoder 25-1, from time T4. The C2 encoders 25-1 to 25-4 generate partial C2 parities on the received C2 symbols, from time T4. From time T4, in the remaining channel CH1, no C2 symbol is transferred. From time T4, among C2 symbols with EngID=1, a C2 symbol with PageID=5 is transferred by the channel CH5, and this C2 symbol is processed by the C2 encoder 25-1. Therefore, even when a C2 symbol with EngID=1 is transmitted through the channel CH1, the C2 encoder 25-1 cannot accept the C2 symbol.

The operation from time T5 is the same as that from time T1.

In addition, when the number of engine IDs Z=5 and the number of channels N=5, since the number of engine IDs and the number of channels are the same, there is no gap in data transfer in each channel. When the number of engine IDs Z=4 and the number of channels N=6, in each channel, the gap in data transfer corresponds to the time for generating two partial C2 parities.

(Operation of Transferring a Plurality of Product Code Information Parts)

Figure 61:
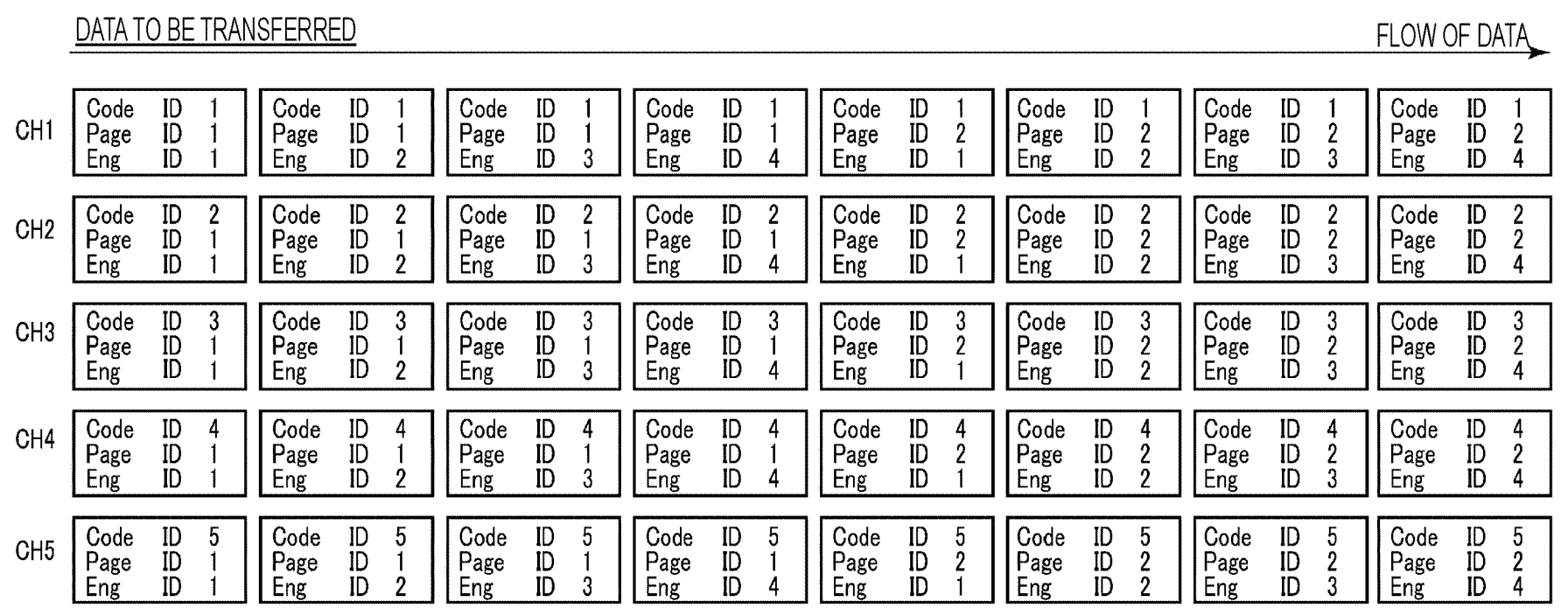

Next, descriptions will be made on a specific operation of transferring a plurality of product code information parts. FIG. 61 is a view illustrating another example of a product code information part to be transferred to a bus, according to the embodiment. It is assumed that the number of code IDs M=5 (CodeID=1 to 5), the number of channels N=5 (channel CH1 to CH5), and the number of engine IDs Z=4 (EngID=1 to 4).

To the channel CH1, a product code information part with CodeID=1 is transferred. More specifically, to the channel CH1, C2 symbols corresponding to EngID=1, 2, 3, 4 in a user data row with PageID=1 are sequentially transferred, and then, C2 symbols corresponding to EngID=1, 2, 3, 4 in a user data row with PageID=2 are sequentially transferred. Likewise, to the channel CH1, C2 symbols corresponding to EngID=1, 2, 3, 4 in each PageID are sequentially transferred in ascending order of PageID=3, 4 . . . for CodeID=1.

To the channel CH2, a product code information part with CodeID=2 is transferred. More specifically, to the channel CH2, C2 symbols corresponding to EngID=1, 2, 3, 4 in a user data row with PageID=1 are sequentially transferred, and then, C2 symbols corresponding to EngID=1, 2, 3, 4 in a user data row with PageID=2 are sequentially transferred. Likewise, to the channel CH2, C2 symbols corresponding to EngID=1, 2, 3, 4 in each PageID are sequentially transferred in ascending order of PageID=3, 4 . . . for CodeID=2.

To the channel CH3, a product code information part with CodeID=3 is transferred. More specifically, to the channel CH3, C2 symbols corresponding to EngID=1, 2, 3, 4 in a user data row with PageID=1 are sequentially transferred, and then, C2 symbols corresponding to EngID=1, 2, 3, 4 in a user data row with PageID=2 are sequentially transferred. Likewise, to the channel CH3, C2 symbols corresponding to EngID=1, 2, 3, 4 in each PageID are sequentially transferred in ascending order of PageID=3, 4 . . . for CodeID=3.

To the channel CH4, a product code information part with CodeID=4 is transferred. More specifically, to the channel CH4, C2 symbols corresponding to EngID=1, 2, 3, 4 in a user data row with PageID=1 are sequentially transferred, and then, C2 symbols corresponding to EngID=1, 2, 3, 4 in a user data row with PageID=2 are sequentially transferred. Likewise, to the channel CH4, C2 symbols corresponding to EngID=1, 2, 3, 4 in each PageID are sequentially transferred in ascending order of PageID=3, 4 . . . for CodeID=4.

To the channel CH5, a product code information part with CodeID=5 is transferred. More specifically, to the channel CH5, C2 symbols corresponding to EngID=1, 2, 3, 4 in a user data row with PageID=1 are sequentially transferred, and then, C2 symbols corresponding to EngID=1, 2, 3, 4 in a user data row with PageID=2 are sequentially transferred. Likewise, to the channel CH5, C2 symbols corresponding to EngID=1, 2, 3, 4 in each PageID are sequentially transferred in ascending order of PageID=3, 4 . . . for CodeID=5.

Figure 62:
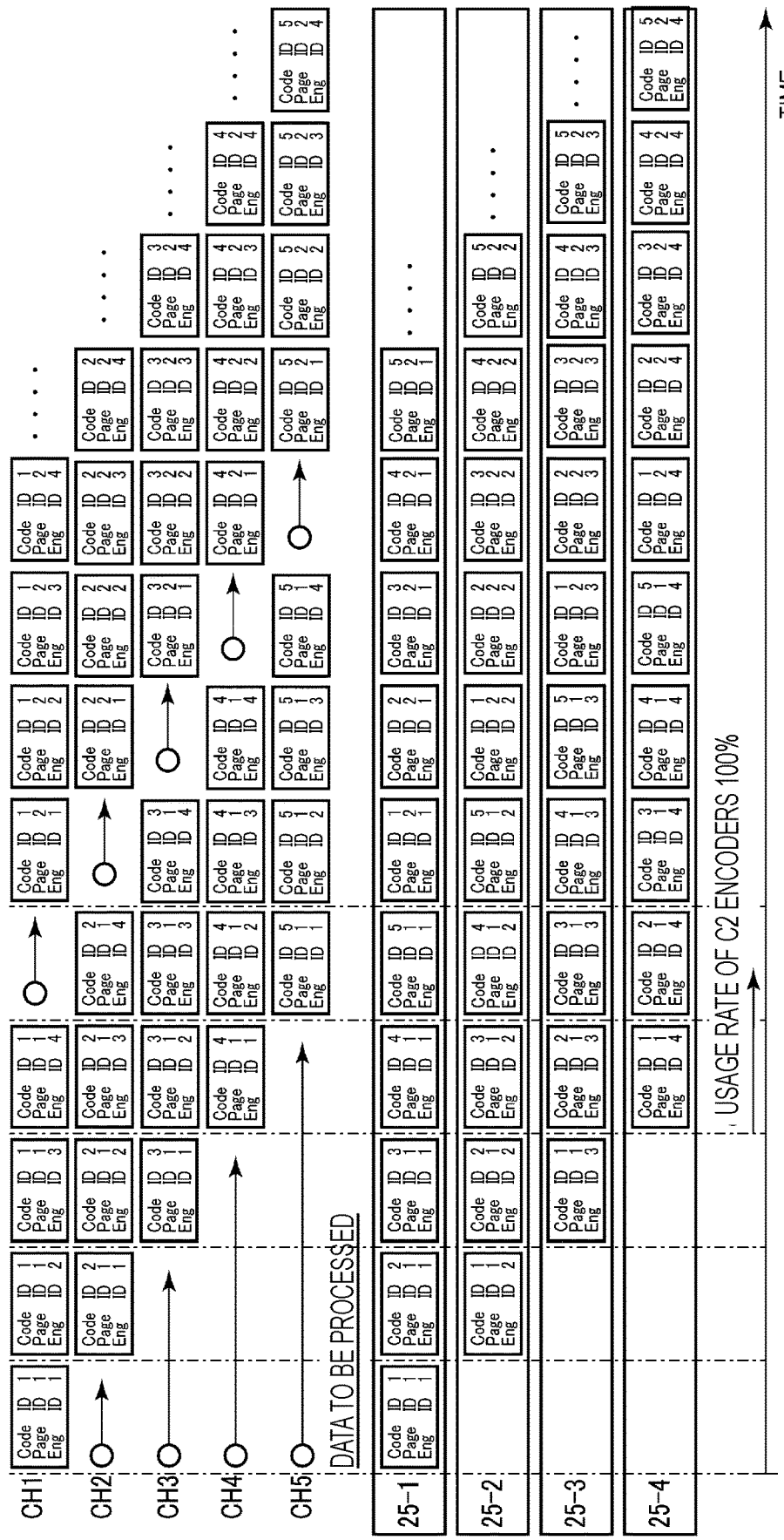
FIG. 62 is a view illustrating a flow of data when the product code information part in FIG. 61 is actually transferred through the bus.

FIG. 62 is a view illustrating a flow of data when the product code information part in FIG. 61 is actually transferred through the bus as in FIG. 60.

From time T0, a C2 symbol with CodeID=1, PageID=1, and EngID=1 is transmitted by the channel CH1. From time T0, the dispatcher 62, etc. transfer the C2 symbol with CodeID=1, PageID=1, and EngID=1 on the channel CH1 to the C2 encoder 25-1. From time T0, the C2 encoder 25-1 generates a partial C2 parity on the received C2 symbol. From time T0, in the remaining channels CH2, CH3, CH4, and CH5, C2 symbols are not transferred, and the C2 encoders 25-2, 25-3, and 25-4 do not operate.

From time T1, a C2 symbol with CodeID=1, PageID=1, and EngID=2 is transmitted by the channel CH1, and a C2 symbol with CodeID=2, PageID=1, and EngID=1 is transmitted by the channel CH2. From time T1, the dispatcher 62, etc. transfer the C2 symbol with CodeID=1, PageID=1, and EngID=2 on the channel CH1 to the C2 encoder 25-2, and transfer the C2 symbol with CodeID=2, PageID=1, and EngID=1 on the channel CH2 to the C2 encoder 25-1. From time T1, the C2 encoders 25-1 and 25-2 generate partial C2 parities on the received C2 symbols. From time T1, in the remaining channels CH3, CH4, and CH5, C2 symbols are not transferred, and the C2 encoders 25-3 and 25-4 do not operate.

From time T2, a C2 symbol with CodeID=1, PageID=1, and EngID=3 is transmitted by the channel CH1, a C2 symbol with CodeID=2, PageID=1, and EngID=2 is transmitted by the channel CH2, and a C2 symbol with CodeID=3, PageID=1, and EngID=1 is transmitted by the channel CH3. From time T2, the dispatcher 62, etc. transfer the C2 symbol with CodeID=1, PageID=1, and EngID=3 on the channel CH1 to the C2 encoder 25-3, transfer the C2 symbol with CodeID=2, PageID=1, and EngID=2 on the channel CH2 to the C2 encoder 25-2, and transfer the C2 symbol with CodeID=3, PageID=1, and EngID=1 on the channel CH3 to the C2 encoder 25-1. From time T2, the C2 encoders 25-1, 25-2, and 25-3 generate partial C2 parities on the received C2 symbols. From time T2, in the remaining channels CH4 and CH5, C2 symbols are not transferred, and the C2 encoder 25-4 does not operate.

From time T3, a C2 symbol with CodeID=1, PageID=1, and EngID=4 is transmitted by the channel CH1, a C2 symbol with CodeID=2, PageID=1, and EngID=3 is transmitted by the channel CH2, a C2 symbol with CodeID=3, PageID=1, and EngID=2 is transmitted by the channel CH3, and a C2 symbol with CodeID=4, PageID=1, and EngID=1 is transmitted by the channel CH4. From time T3, the dispatcher 62, etc. transfer the C2 symbol with CodeID=1, PageID=1, and EngID=4 on the channel CH1 to the C2 encoder 25-4, transfer the C2 symbol with CodeID=2, PageID=1, and EngID=3 on the channel CH2 to the C2 encoder 25-3, transfer the C2 symbol with CodeID=3, PageID=1, and EngID=2 on the channel CH3 to the C2 encoder 25-2, and transfer the C2 symbol with CodeID=4, PageID=1, and EngID=1 on the channel CH4 to the C2 encoder 25-1. From time T3, the C2 encoders 25-1, 25-2, 25-3, and 25-4 generate partial C2 parities on the received C2 symbols. From time T3, in the remaining channel CH5, no C2 symbol is transferred.

When the plurality of product code information parts is transferred as well, after time T3, all of the C2 encoders 25-1 to 25-4 and the C2 parity buffer groups 63-1 to 63-4 operate in parallel. That is, the usage rate of the C2 encoders and the C2 parity buffer groups becomes 100%.

From time T4, a C2 symbol with CodeID=2, PageID=1, and EngID=4 is transmitted by the channel CH2, a C2 symbol with CodeID=3, PageID=1, and EngID=3 is transmitted by the channel CH3, a C2 symbol with CodeID=4, PageID=1, and EngID=2 is transmitted by the channel CH4, and a C2 symbol with CodeID=5, PageID=1, and EngID=1 is transmitted by the channel CH5. From time T4, the dispatcher 62, etc. transfer the C2 symbol with CodeID=2, PageID=1, and EngID=4 on the channel CH2 to the C2 encoder 25-4, transfer the C2 symbol with CodeID=3, PageID=1, and EngID=3 on the channel CH3 to the C2 encoder 25-3, transfer the C2 symbol with CodeID=4, PageID=1, and EngID=2 on the channel CH4 to the C2 encoder 25-2, and transfer the C2 symbol with CodeID=5, PageID=1, and EngID=1 on the channel CH5 to the C2 encoder 25-1. From time T4, the C2 encoders 25-1, 25-2, 25-3, and 25-4 generate partial C2 parities on the received C2 symbols. From time T4, in the remaining channel CH1, no C2 symbol is transferred. From time T4, among C2 symbols with EngID=1, a C2 symbol with CodeID=5 and PageID=1 is transferred by the channel CH5, and this C2 symbol is processed by the C2 encoder 25-1. Therefore, even when a C2 symbol with EngID=1 is transmitted through the CH1, the C2 encoder 25-1 cannot accept the C2 symbol.

The operation from time T5 is the same as that from time T1 to time T4, except that the page ID is 2. The operation from time T1 to time T4 is repeated while the PageID is incremented.

[8-3] On Decoding

Figure 63:
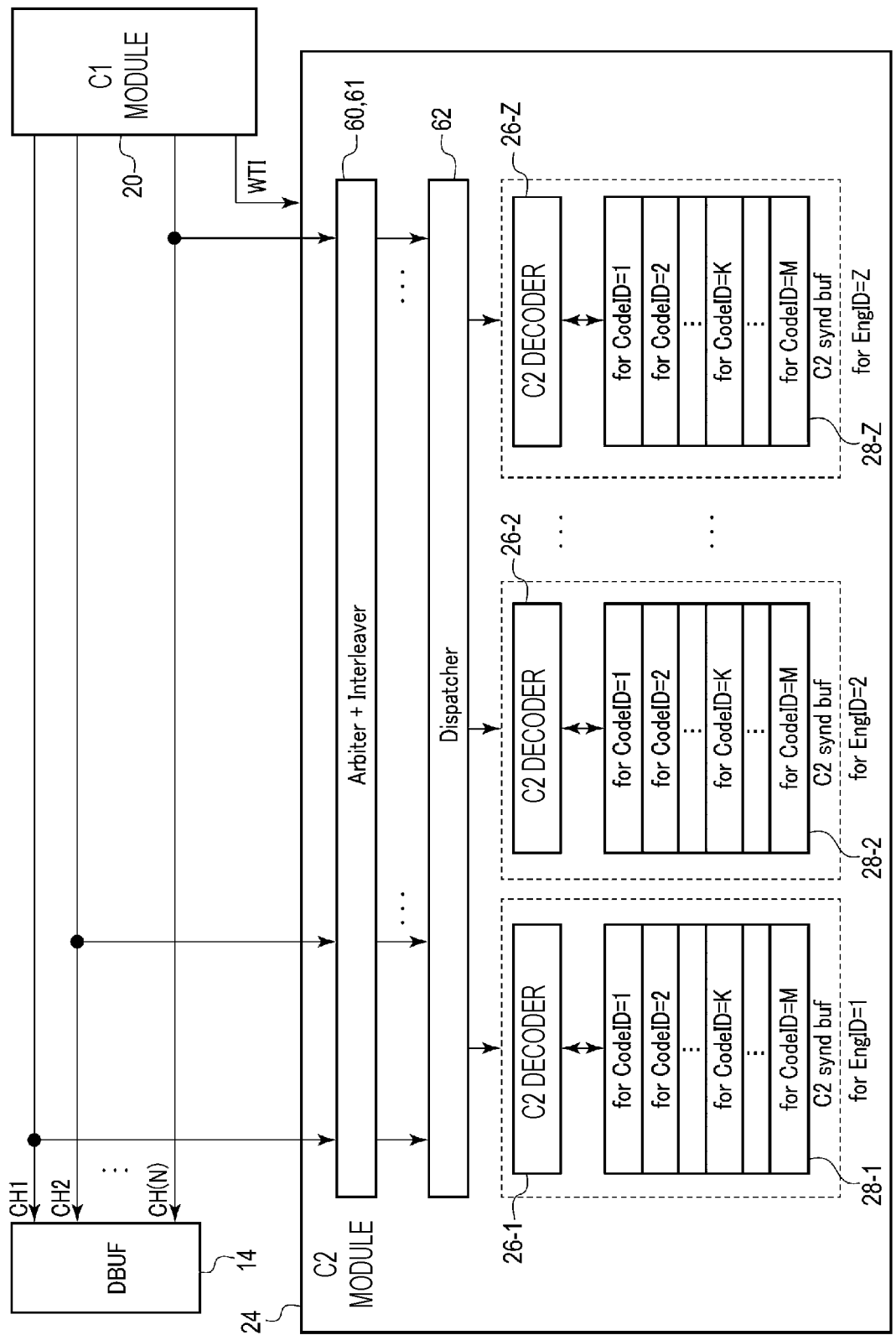
FIG. 63 is a block diagram illustrating a circuit configuration related to a decoding according to the eighth embodiment.

An interleaving processing is also performed on a decoding, as in an encoding. FIG. 63 is a block diagram illustrating a circuit configuration related to a decoding according to the embodiment.

The C1 module 20 transmits write transfer information WTI to the C2 module 24. The write transfer information WTI includes a CodeID, a page ID, and a C2 location information on data being currently transferred. The C2 location information is information that specifies a column in a C1×C2 frame, that is, which column one C2 frame corresponds to, in the C1×C2 frame.

The C2 module 24 includes the arbiter 60, the interleaver 61, the dispatcher 62, Z C2 decoders 26-1 to 26-Z corresponding to EngID, and Z C2 syndrome buffer groups (C2 synd buf) 28-1 to 28-Z corresponding to EngID.

The C2 decoder 26-1 generates a C2 syndrome by using a set of C2 symbols corresponding to EngID=1. That is, the C2 decoder 26-1 generates a corresponding C2 syndrome from a set of J C2 symbols corresponding to EngID=1 included in one C1×C2 frame. Likewise, the C2 decoder 26-1 generates another C2 syndrome from a set of J C2 symbols corresponding to EngID=1 included in another C1×C2 frame. Likewise, each of the C2 decoders 26-2 to 26-Z generates a C2 syndrome corresponding to EngID. Each of the C2 decoders 26-1 to 26-Z transfers the generated C2 syndrome to each of the C2 syndrome buffer groups 28-1 to 28-Z.

Each of the C2 syndrome buffer groups 28-1 to 28-Z includes M C2 syndrome buffers corresponding to CodeID=1 to M. Each of the M C2 syndrome buffers temporarily stores the C2 syndrome corresponding to CodeID=1 to M.

Figure 64:
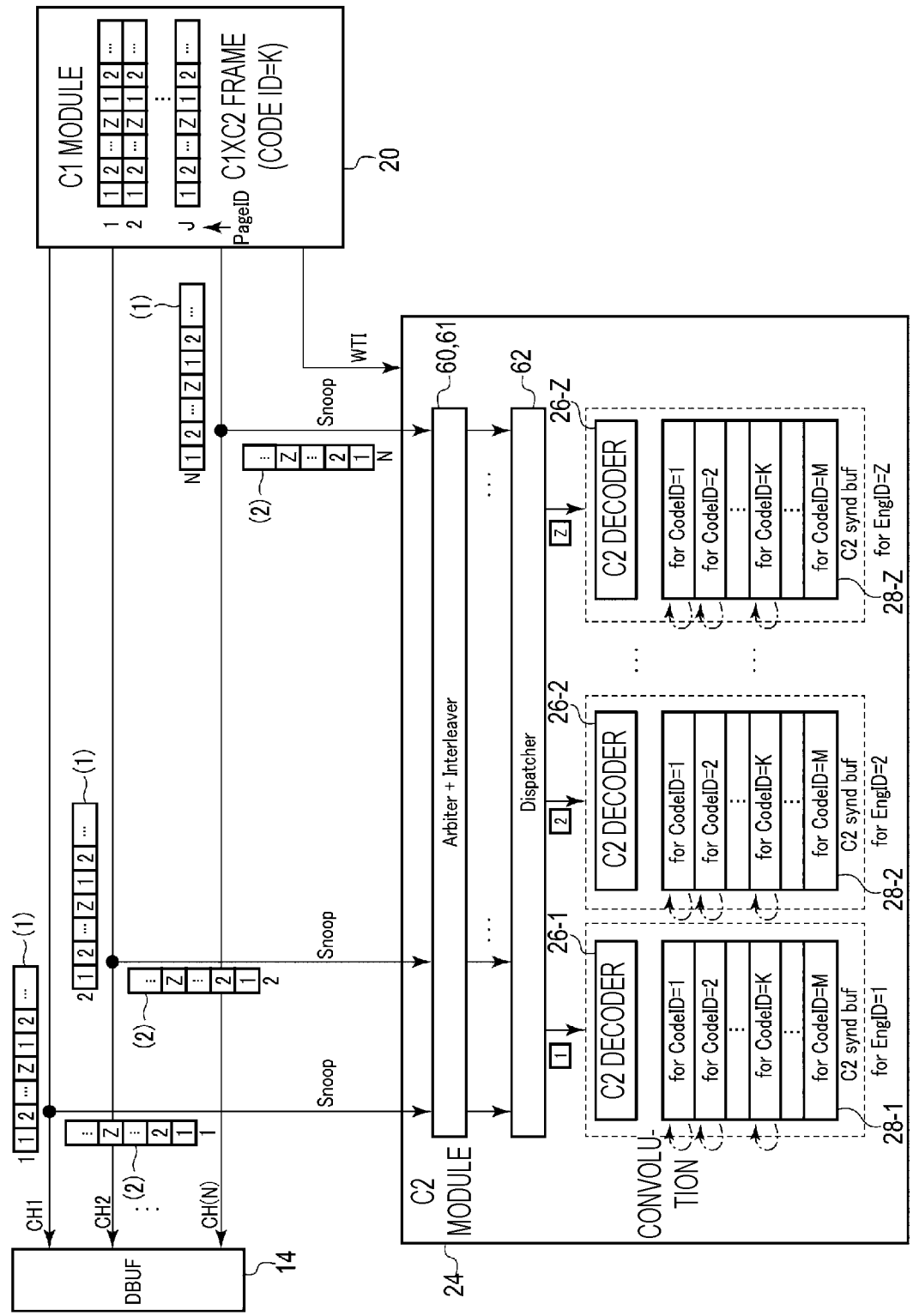
FIG. 64 is a view illustrating a data flow of the decoding according to the eighth embodiment.

FIG. 64 is a view illustrating a data flow of the decoding according to the embodiment.

The processor 11 selects N frames among J C1 frames constituting the C1×C2 frame, and transfers the N frames from the C1 module 20 to the DBUF 14 via the channels CH1 to CH(N) ((1) in FIG. 64). FIG. 64 illustrates an example in which the N C1 frames corresponding to PageID=1 to N are selected.

The C2 module 24 obtains by a snooping operation the N C1 frames transferred through the channels CH1 to CH(N) ((2) in FIG. 64). The arbiter 60, the interleaver 61, and the dispatcher 62 perform an interleaving processing on the N C1 frames obtained through snooping. The interleaving processing at the decoding is the same as the interleaving processing at the above described encoding.

[8-4] Effect of Eighth Embodiment

According to the eighth embodiment, it is possible to process data transferred through the channels CH1 to CH(N), in parallel.

Further, during a period when the usage rate of the C2 encoders and the C2 parity buffer groups is 100%, the throughput of execution between the DBUF and the C1 module is approximately equivalent to the processing speed of all of the C2 encoders and the C2 parity buffer groups. Accordingly, it is possible to increase the data transfer speed. The same effect may also be obtained at the decoding.

[9] Other Modifications

In the above embodiments, as an example of the non-volatile memory, the NAND-type flash memory is described. However, the present disclosure is not limited to this, and is applicable to other types of non-volatile memories and non-volatile semiconductor memories. In addition, the above embodiments are not limited to the non-volatile memory, and may be applied to a volatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A controller configured to perform iterative correction on a plurality of frames of data read from non-volatile memory, wherein
the iterative correction includes performing a first error correction on each of the plurality of frames including a first frame having errors not correctable by the first error correction, generating a syndrome on a set of second frames that include the first frame, performing a second error correction on the second frames using the syndrome, and performing a third error correction on the first frame,
each of the plurality of frames includes first parity data used in the first error correction, the first parity data of the first frame also being used in the third error correction,
each of the second frames includes at least a first symbol and a second symbol,
the syndrome includes first and second syndromes, the second error correction being performed on the first symbols of the second frames using the first syndrome and on the second symbols of the second frames using the second syndrome,
the first syndrome contains information for correcting an error in a first one of the first symbols and information for correcting an error in a second one of the first symbols,
the second syndrome contains information for correcting an error in a first one of the second symbols and information for correcting an error in a second one of the second symbols,
the first one of the first symbols and the first one of the second symbols are parts of a third frame, the third frame being one of the second frames, and
the second one of the first symbols and the second one of the second symbols are parts of a fourth frame, the fourth frame being one of the second frames that is not the third frame.

2. The controller according to claim 1, wherein at least one of the second frames includes second parity data that is used in the second error correction.

3. The controller according to claim 1, wherein the iterative correction further includes:
after performing the third error correction on the first frame, generating another syndrome on the second frames, and performing a fourth error correction on the second frames using said another syndrome.

4. The controller according to claim 3, wherein said another syndrome includes a third syndrome used in the fourth error correction performed on the first symbols of the second frames and a fourth syndrome used in the fourth error correction performed on the second symbols of the second frames.

5. The controller according to claim 4, wherein
the third syndrome contains information for correcting an error in a third one of the first symbols and information for correcting an error in a fourth one of the first symbols, and
the fourth syndrome contains information for correcting an error in a third one of the second symbols and information for correcting an error in a fourth one of the second symbols.

6. The controller according to claim 5, wherein the third one of the first symbols and the third one of the second symbols are parts of a fifth frame, the fifth frame being one of the second frames, and the fourth one of the first symbols and the fourth one of the second symbols are parts of a sixth frame, the sixth frame being one of the second frames that is not the fifth frame.

7. The controller according to claim 1, wherein the third and fourth frames have errors not correctable by performing an error correction using the first parity data.

8. The controller according to claim 7, wherein the third and fourth frames are the only two frames of the second frames having errors not correctable by performing an error correction using the first parity data.

9. The controller according to claim 1, wherein the controller is further configured to update at least a portion of the syndrome by using symbols that are included in the first frame, so as to generate an updated syndrome.

10. The controller according to claim 1, wherein the third error correction uses a soft decision decoding.

11. The controller according to claim 1, wherein the third error correction uses a hard decision decoding.

12. The controller according to claim 1, wherein
the first error correction uses a hard decision decoding, and
the third error correction uses a soft decision decoding.

13. A controller configured to perform iterative correction on a plurality of frames of data read from non-volatile memory, wherein
the iterative correction includes performing a first error correction on each of the plurality of frames including a first frame having errors not correctable by the first error correction, generating a syndrome on a set of second frames that include the first frame, performing a second error correction on the second frames using the syndrome, and performing a third error correction on the first frame,
each of the plurality of frames includes first parity data used in the first error correction, the first parity data of the first frame also being used in the third error correction,
the first error correction uses a hard decision decoding, and
the third error correction uses a soft decision decoding.

14. The controller according to claim 13, wherein
at least one of the second frames includes second parity data that is used in the second error correction.

15. The controller according to claim 13, wherein the iterative correction further includes:
after performing the third error correction on the first frame, generating another syndrome on the second frames, and performing a fourth error correction on the second frames using said another syndrome.

16. The controller according to claim 13, wherein the controller is further configured to update at least a portion of the syndrome by using symbols that are included in the first frame, so as to generate an updated syndrome.

* * * * *